United States Patent
Vick et al.

(10) Patent No.: US 10,833,228 B2
(45) Date of Patent: *Nov. 10, 2020

(54) ENHANCED COLOR-PREFERENCE LED LIGHT SOURCES USING YAG, NITRIDE, AND PFS PHOSPHORS

(71) Applicant: Consumer Lighting (U.S.), LLC, Norwalk, CT (US)

(72) Inventors: Kevin James Vick, East Cleveland, OH (US); Gary Robert Allen, East Cleveland, OH (US); Ashfaqul I. Chowdhury, East Cleveland, OH (US)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,781

(22) Filed: Aug. 12, 2019

(65) Prior Publication Data
US 2020/0083407 A1    Mar. 12, 2020

Related U.S. Application Data

(63) Continuation of application No. 15/509,554, filed on Mar. 8, 2017, now Pat. No. 10,381,527, which is a
(Continued)

(51) Int. Cl.
*H01L 33/50* (2010.01)
*C09K 11/64* (2006.01)

(52) U.S. Cl.
CPC ............ *H01L 33/502* (2013.01); *C09K 11/64* (2013.01); *H01L 33/504* (2013.01); *H01L 33/507* (2013.01)

(58) Field of Classification Search
CPC ........ F21V 29/70; F21V 19/0015; F21V 9/08; G02B 5/206; F21K 9/56; F21K 9/233; F21K 9/64; H05B 33/0857; F21Y 2101/02
See application file for complete search history.

(56) References Cited

U.S. PATENT DOCUMENTS

| 7,358,542 | B2 ‡ | 4/2008 | Radkov | ................ | C09K 11/771 |
| | | | | | 257/98 |
| 7,497,973 | B2 ‡ | 3/2009 | Radkov | ................ | C09K 11/617 |
| | | | | | 252/30 |

(Continued)

FOREIGN PATENT DOCUMENTS

| EP | 2 426 186 A1 ‡ | 3/2012 | ........... C09K 11/671 |
| JP | 1173923 A ‡ | 3/1993 | |

(Continued)

OTHER PUBLICATIONS

Rea, M.S., and Freyssibier, J.P., "White Lighting," Color Research and Application, vol. 38, Issue 2, pp. 82-92 (Apr. 26, 2011).‡
(Continued)

*Primary Examiner* — Tracie Y Green
(74) *Attorney, Agent, or Firm* — Wood IP LLC

(57) ABSTRACT

Aspects of the present disclosure are directed to a composite light source which includes at least one blue light source having peak wavelength in the range of about 400 nm to about 460 nm; at least one yellow-green garnet phosphor; and at least one narrow-band red-emitting down-converter. Such composite light source may have a Lighting Preference Index (LPI) of at least 120. In other aspects the disclosure is directed to composite light source comprising at least one blue light source having peak wavelength in the range of about 400 nm to about 460 nm; at least one yellow-green garnet phosphor; and at least one broad red down-converter.

(Continued)

In this latter aspect the composite light source may have a Lighting Preference Index (LPI) of at least 120. Numerous other aspects are provided.

13 Claims, 106 Drawing Sheets

Related U.S. Application Data continuation of application No. PCT/US2015/012240, filed on Jan. 21, 2015, which is a continuation-in-part of application No. PCT/US2014/054868, filed on Sep. 9, 2014.

(56) References Cited

U.S. PATENT DOCUMENTS

| | | | | |
|---|---|---|---|---|
| 7,648,649 | B2 ‡ | 1/2010 | Radkov | C09K 11/0838 252/30 |
| 8,252,613 | B1 ‡ | 8/2012 | Lyons | C09K 11/617 438/46 |
| 9,611,237 | B2 * | 4/2017 | Nammalwar | C07C 29/132 |
| 10,381,527 | B2 * | 8/2019 | Vick | H01L 33/502 |
| 2010/0091215 | A1 ‡ | 4/2010 | Fukunaga | C09K 11/664 349/61 |
| 2011/0220929 | A1 ‡ | 9/2011 | Collins | C09K 11/7734 257/98 |
| 2011/0255265 | A1 ‡ | 10/2011 | Nammalwar | C09K 11/0883 362/84 |
| 2014/0167601 | A1 ‡ | 6/2014 | Harry | C09K 11/7734 313/50 |
| 2014/0231847 | A1 ‡ | 8/2014 | Watanabe | H01L 33/504 257/98 |
| 2015/0295144 | A1 * | 10/2015 | Weiler | H01L 33/502 362/84 |
| 2016/0049388 | A1 ‡ | 2/2016 | Marutani | H01L 33/62 257/88 |
| 2017/0233649 | A1 ‡ | 8/2017 | Vick | F21K 9/64 313/503 |

FOREIGN PATENT DOCUMENTS

| | | | | |
|---|---|---|---|---|
| JP | 09120797 | A ‡ | 6/1997 | |
| JP | 2012104814 | A ‡ | 5/2012 | C09K 11/0883 |
| WO | WO-2011/097379 | A1 ‡ | 8/2011 | C09K 11/774 |
| WO | WO-2013/018041 | A1 ‡ | 2/2013 | F21K 9/64 |
| WO | WO-2013031942 | A1 ‡ | 3/2013 | H01L 33/504 |
| WO | WO-2013/048865 | A1 ‡ | 4/2013 | C09K 11/7734 |
| WO | WO-2014/179000 | A1 ‡ | 11/2014 | H01L 33/504 |
| WO | WO-2013118206 | A1 ‡ | 5/2015 | F21K 9/27 |
| WO | WO-2016/039800 | A1 ‡ | 3/2016 | H05B 33/14 |

OTHER PUBLICATIONS

Setlur, A.A., et al., "Energy-Efficient, High-Color-Rendering LED Lamps Using Oxyfluoride and Fluoride Phosphors," Chemistry of Materials, vol. 22, Issue 13, pp. 4076-4082 (Jul. 13, 2010).‡

Ohno, Y., "Color Quality Design for Solid State Lighting," LEDs, pp. 1-25 (Oct. 11-12, 2012).‡

International Search Report and and Written Opinion issued in connection with corresponding PCT Application No. PCT/US2015/012240 dated Apr. 29, 2015.‡

International Preliminary Report on Patentability issued in connection with corresponding PCT Application No. PCT/US2015/012240 dated Mar. 14, 2017.‡

Zukauskas, A., et al., "Statistical Approach to Color Quality of Solid-State Lamps," IEEE Journal of Selected Topics in Quantum Electronics, vol. 15, No. 6, pp. 1753-1762 (Nov./Dec. 2009).‡

Houser, K.W., et al., "Review of measures for light-source color rendition and considerations for a two-measure system for characterizing color rendition," Optics Express, vol. 21, No. 8, pp. 10393-10411 (2013).‡

Mahy, M., et al., "Evaluation of Uniform Color Spaces Developed after the Adoption of CIELAB and CIELUV," Color Research and Application, vol. 19, No. 2, pp. 105-121 (Apr. 1994).‡

Freyssinier, J.P., and Rea, M.S., "Class A Color Designation for Light Sources Used in General Illumination," Journal of Light and Visual Environment, vol. 37, No. 2 & 3, pp. 46-50 (2013).‡

Derhak, M.W., et al., "Analysis and Correction of the Joensuu Munsell Glossy Spectral Database," 20th Color and Imaging Conference Final Program and Proceedings, Society for Imaging Science and Technology, pp. 191-194 (2012).‡

Allen, G.R., et al., Enhanced color contrast led lamps, GE co-pending U.S. Appl. No. 61/875,403, filed on Sep. 9, 2013.‡

First examination report issued in connection with related AU application No. 2015315833 dated Oct. 8, 2018.‡

Non-Final Office Action issued in connection with related U.S. Appl. No. 15/454,831 dated Mar. 27, 2018.‡

JP Office Action issued in connection with corresponding JP application No. 2017512013 dated Jan. 29, 2019.‡

Office Action issued in connection with related CN application No. 201580048476.5 dated Oct. 9, 2018.‡

Notice of Preliminary Rejection issued in connection with the related JP application No. 2017-510659 dated Jun. 8, 2018.‡

Notice of Preliminary Rejection issued in connection with the related JP application No. 2017-510659 dated Nov. 21, 2018.‡

First Examination Report issued in connection with corresponding AU Application No. 2015315832 dated Dec. 21, 2018.‡

\* cited by examiner
‡ imported from a related application

ENHANCED COLOR-PREFERENCE LED LIGHT SOURCES USING YAG, NITRIDE, AND PFS PHOSPHORS

CROSS-REFERENCE TO RELATED APPLICATIONS

This application is a continuation of U.S. patent application Ser. No. 15/509,554, filed Mar. 8, 2017, which will issue as U.S. Pat. No. 10,381,527 on Aug. 13, 2019, which is a Continuation of PCT International Application PCT/US2015/012240, filed Jan. 21, 2015, now expired, which is a Continuation-In-Part of PCT International Application PCT/US2014/054868, filed on Sep. 9, 2014, now expired, all of which are hereby incorporated herein by reference in its entirety for all purposes.

FIELD OF THE INVENTION

The present disclosure generally relates to providing light sources that emit light having enhanced color spectrum characteristics such that human observers perceive enhanced color preference.

BACKGROUND OF THE INVENTION

Reveal® is a trademarked term used by the General Electric Company to refer to light sources, such as a light bulb, having enhanced red-green color contrast lighting characteristics and enhanced whiteness relative to an unmodified incandescent or halogen light source. Reveal® incandescent and halogen bulbs filter light by placing a particular type of glass (namely, glass impregnated with neodymium (Nd) oxide) in front of the light emitted by the filament to absorb some of the yellow light. The glass impregnated with Nd oxide causes a "depression" in the yellow region of the color spectrum, so that objects viewed under this light have an enhanced color contrast, especially red and green objects which are contrasted readily by an observer, such as a person in a room of a house. The removal of some yellow light via the filter also shifts the location of the chromaticity on the 1931 International Commission of Illumination (Commission Internationale de l'Eclairage, or CIE) color diagram to a point slightly below the blackbody locus, which generally creates the impression of whiter light to most observers.

The significance of yellow light and how it impacts the perception of color is illustrated in FIG. 1a-1c. FIG. 1a provides a graph of three color matching functions, known as the XYZ tristimulus values that represent the chromatic response of a standard observer. The perceived color of an object is determined by the product of the illumination source spectrum, the reflectance spectrum of the object, and the three color matching functions. These functions are related to the response of the photoreceptors in the human eye, and can be thought of as the perception of blue (102), green (104), and red (106) light. FIG. 1b provides a graph for a product of a standard incandescent spectrum with the color matching functions for blue (132), green (134), and red (136) responses. As can be seen, the green (134) and red (136) components overlap significantly and the peaks are only separated by 34 nm. FIG. 1c provides a graph for a product of a Reveal® incandescent spectrum with the color matching functions for blue (162), green (164), and red (166) responses. As can be seen, the green (164) and red (166) components are more distinct, with a peak separation of 53 nm, as compared to the red and green components of FIG. 1b. This distinction allows observers to more easily distinguish reds and greens with greater contrast and results in a more saturated appearance when yellow light is suppressed.

Spectrally enhanced lighting products have enjoyed decades of commercial success. Traditional color quality metrics or conventional measurements may not reward such enhanced lighting products, yet consumers often prefer them to their unaltered counterparts. With the advent of solid-state lighting (SSL), particularly the customizability of light-emitting diode (LED) spectra, it has become apparent that current metrics are inadequate to evaluate and reflect the quality of LED products. SSL light sources, for example LEDs or organic light-emitting diodes (OLEDs), may produce light directly from the semiconductor, e.g. a blue or red or other colored LED. Alternatively, the light may be produced by conversion of the high-energy light from the SSL, e.g. a blue or violet LED, by a down-converter such as a phosphor or quantum dot or other energy converting material. The range of peak emission wavelengths for semiconductors, and the range of the peaks and widths of the emission of down-converters have been extended by recent technological development to cover a nearly continuous range throughout the visible wavelengths (about 380 nm to about 750 nm), enabling broad flexibility in tailoring the visible spectrum in order to enhance color preference for an observer.

For nearly a half-century, the color rendering index (CRI) has been the primary method of communicating the color quality of a light source. However, its effectiveness is inherently limited due to its method of calculation, particularly when dealing with spectral power distributions (SPDs) containing steep slopes versus wavelength, as often seen with LEDs. The shortcomings of CRI are well documented, and a wide variety of alternative metrics have been proposed. However, alternate color quality metrics struggle to accurately quantify consumer preference of lighting products. Houser and colleagues provide a detailed overview and comparison of a large fraction of the various color quality metrics developed in "Review of measures for light-source color rendition and considerations for a two-measure system for characterizing color rendition", Optics Express, volume 21, #8, 10393-10411 (2013), authors K. W. Houser, M. Wei, A. David, M. R. Krames, and X. S. Shen. In general, the various metrics can be broken down into three broad categories pertaining to their intent and method of calculation: fidelity, discrimination, and preference. Fidelity metrics, which include CRI, quantify an absolute difference from a reference illuminant, regardless of whether the test illuminant is perceived as being better or worse than the reference illuminant, and without consideration to whether the reference illuminant is actually preferred by most observers. Discrimination metrics quantify the total area of color space that may be rendered under the test illuminant, and are maximized at extreme levels of saturation and hue distortion. The existing color preference metrics have been developed to provide a quantitative measure of user color preference, but none provides a sufficient correlation to observer data, along with a target value to enable optimization of a light source; therefore, the metric cannot be used as a target parameter in a design optimization.

In general, it has been found that observers prefer an enhanced level of saturation, rendering colors more appealing. However, high levels of saturation, or shifts in hue, can result in unnatural rendering of colors and objects. For example, the Gamut Area Index (GAI) and the Gamut Area Scale ($Q_g$), both of which are discrimination metrics, provide a very good correlation with observer preference up to some limit of color saturation, beyond which GAI and $Q_g$ continue to increase, while observer preference sharply declines. It therefore appears that some adjustment may be necessary to a color saturation metric such as GAI or $Q_g$ to better align it with observer preference. Furthermore, observers also tend to prefer light sources that appear whiter, driven by the color point of the illuminant relative to the Planckian (blackbody) locus, somewhat independent of the color saturation. As is generally recognized in the lighting industry, color preference cannot be adequately quantified by any single existing color metric. Several attempts have been published recently to combine two or more color metrics to better describe color preference. However, it does not appear that anyone other than the present Applicants has proposed a color preference metric that defines color preference with sufficient quantitative rigor to enable the optimization of the color preference of a light source by numerical tailoring of the spectrum. Even though the prior existing color preference metrics are quantitative, each is limited in some way to disqualify their use as an optimization parameter when designing a light source or a spectrum to achieve optimum color preference for a typical observer.

Some of the more well-known metrics in the color preference category include Flattery Index ($R_f$), Color Preference Index (CPI), and Memory Color Rendering Index (MCRI). All three of these metrics have "ideal" configurations for the chromaticity coordinates of eight to ten test color samples, and each quantifies the deviation from these target values. The Flattery Index was the first metric to target preference and used ten color samples with unequal weighting. However, in order to maintain similarity with the Color Rendering Index (CRI), the target chromaticity shifts were reduced to one-fifth of their experimental values, greatly reducing its correlation with observer responses to color preference. CPI maintained the experimental values for preferred chromaticity shifts, resulting in a better representation of color preference. However, CPI is very limited in its selection of test color samples, using the same eight, unsaturated test colors as CRI. Unsaturated (pastel) test colors may be incapable of evaluating the impact of a highly saturated light source. MCRI uses observers' memory to define the ideal chromaticity configuration of only ten colors of familiar objects. Furthermore, none of the metrics above factor in the "whiteness", or color point, of the test source. To this point, authors J. P. Freyssinier and M. S. Rea, in "Class A color designation for light sources used in general illumination," *Journal of Light and Visual Environment*, volume 37, #2&3, pp. 46-50 (2013), recommended a series of criteria for "Class A Lighting", which places constraints on CRI (>80), GAI (80-100), and color point (near "white" line). While these conditions define a recommended design space, they cannot be quantitatively optimized to prescribe a spectrum or light source that maximizes color preference, as there is no optimal value identified, and no weighting of the three characteristics recommended.

Solid-state lighting technologies such as LEDs and LED-based devices often have superior performance when compared to incandescent lamps. This performance may be quantified by the useful lifetime of the lamp, lamp efficacy (lumens per watt), color temperature and color fidelity, and other parameters. It may be desirable to make and use an LED lighting apparatus also providing enhanced color preference qualities.

Commercial lamp types including incandescent, halogen, and LED employing Nd-doped glass to absorb some of the yellow light from the spectrum emitted by the light source may enhance the color preference relative to their counterpart lamps without the Nd absorption. GE Lighting, and some other manufacturers, has products of each of these three types. The GE Lighting products have the Reveal® brand name.

Some special formulations of phosphor for compact fluorescent (CFL), linear fluorescent (LFL), and LED lamps are known to enhance the color preference relative to their counterpart lamps that employ standard phosphors. GE Lighting has products of each of the first two types, also under the Reveal® brand name LED light sources of the third type are known, for example in grocery applications to enhance the colors of meats, vegetables, and produce (e.g. fruit).

Each of these existing light sources has employed either Nd-doped glass, or customized phosphors that reduce the amount of yellow light emitted by the light source in order to enhance color preference. However, none of these products achieves a level of color preference exceeding that of the GE Lighting Reveal® incandescent, and the other existing products. The Nd filter in these existing light sources may typically be comprised of $Nd_2O_3$-doped glass. In other embodiments the yellow filter may be comprised of one of several other compounds of Nd or of Didymium (a mixture of the elements praseodymium and Nd) or other rare earths that preferentially absorb yellow light, embedded in various matrix host materials, for example glass, crystal, polymer, or other materials; or by some other dopant or coating on the glass that absorbs preferentially in the yellow range of wavelengths; or by the addition of a yellow absorber to any of the optically active components of the lamp or lighting system, such as a reflector or diffuser or lens, which may be a glass or polymer or metal or any other material that accommodates the yellow absorber. The exact peak wavelength and width of the yellow absorption may vary depending on the particular Nd or rare-earth compound and host material, but many combinations of Nd, Didymium and other rare-earth compounds and host materials may be suitable substitutions for the combination of $Nd_2O_3$-doped glass, as are some other yellow filters. The Nd or other yellow filter may be in the shape of a dome enclosing the light source, or may be any other geometric form enclosing the light source, such that most or all of the light in the yellow range of wavelengths passes through the filter.

SUMMARY OF THE INVENTION

In one embodiment, a composite light source includes at least one blue light source having peak wavelength in the range of about 400 nanometer (nm) to about 460 nm; at least one yellow-green garnet phosphor; at least one narrow-band red emitting down-converter; and wherein the composite light source has a Lighting Preference Index (LPI) of at least 120.

In another embodiment, a composite light source includes at least one blue light source having peak wavelength in the range of about 400 nanometer (nm) to about 460 nm; at least one YAG:Ce phosphor; at least one narrow red down-converter; and wherein a color appearance of the composite light source is represented as $$Dom_{YAG} < 13.3\sqrt{1-\left(\frac{Duv+.0095}{.0070}\right)^2}+569.8-0.004*CCT,$$

where Duv is a measure of the whiteness of the composite light source and $\text{Dom}_{YAG}$ is the dominant wavelength of the at least one YAG:Ce phosphor.

In yet another embodiment, a composite light source includes at least one blue light source having peak wavelength in the range of about 400 nanometer (nm) to about 460 nm; at least one yellow-green garnet phosphor; at least one broad red down-converter; and wherein the composite light source has a Lighting Preference Index (LPI) of at least 120.

In another embodiment, a composite light source includes at least one blue light source having peak wavelength in the range of about 400 nanometer (nm) to about 460 nm; at least one YAG:Ce phosphor; at least one broad-band red-emitting nitride phosphor; and wherein a color appearance of the composite light source is represented as $$Dom_{YAG} < \left(-0.155(Peak_{Nit} - 630) + 2.91\sqrt{Peak_{Nit} - 630} + 1.6\right)$$
$$\sqrt{1 - \left(\frac{Duv + .0099 - .00001*(Peak_{Nit} - 630)}{0.00001(Peak_{Nit} - 630) + 0.0014\sqrt{Peak_{Nit} - 630} - 0.0010}\right)^2}$$
$$+ 569.8 - 0.004 * CCT,$$

where Duv is a measure of the whiteness of the composite light source, $\text{Peak}_{Nit}$ is the peak wavelength of the at least one broad red nitride phosphor, and $\text{Dom}_{YAG}$ is the dominant wavelength of the at least one YAG:Ce phosphor.

In still another embodiment, a composite light source includes at least one blue light source having peak wavelength in the range of about 400 nanometer (nm) to about 460 nm; at least one yellow-green garnet phosphor; at least one narrow red down-converter; at least one broad red down-converter; and wherein the composite light source has a Lighting Preference Index (LPI) of at least 120.

BRIEF DESCRIPTION OF THE DRAWINGS

Features and advantages of some embodiments, and the manner in which the same are accomplished, will become more readily apparent with reference to the following detailed description taken in conjunction with the accompanying drawings, which illustrate exemplary embodiments (not necessarily drawn to scale), wherein:

FIG. 7b is an exploded view of the light source of FIG. 7a.

FIG. 8 illustrates a graph including a plot of the SPD of a warm-white LED lamp comprising multiple blue LEDs each exciting a YAG phosphor and a red phosphor, and a plot of the SPD of a Reveal® type LED light source of FIG. 7a.

FIGS. 32a-h illustrate the contour plots at 2700 K of LPI versus dominant wavelength of the YG YAG phosphor on the x-axis, and Duv on the y-axis, where the red emitter is comprised of 75% the NR phosphor of FIGS. 16 and 25% the broad red nitride phosphor of FIG. 15 having peak wavelength of 610 nm (FIG. 32a), 620 nm (FIG. 32b), 630 nm (FIG. 32c), 640 nm (FIG. 32d), 650 nm (FIG. 32e), 660 nm (FIG. 32f), 670 nm (FIG. 32g), 680 nm (FIG. 32h) according to some embodiments.

DETAILED DESCRIPTION

Figure 1A:
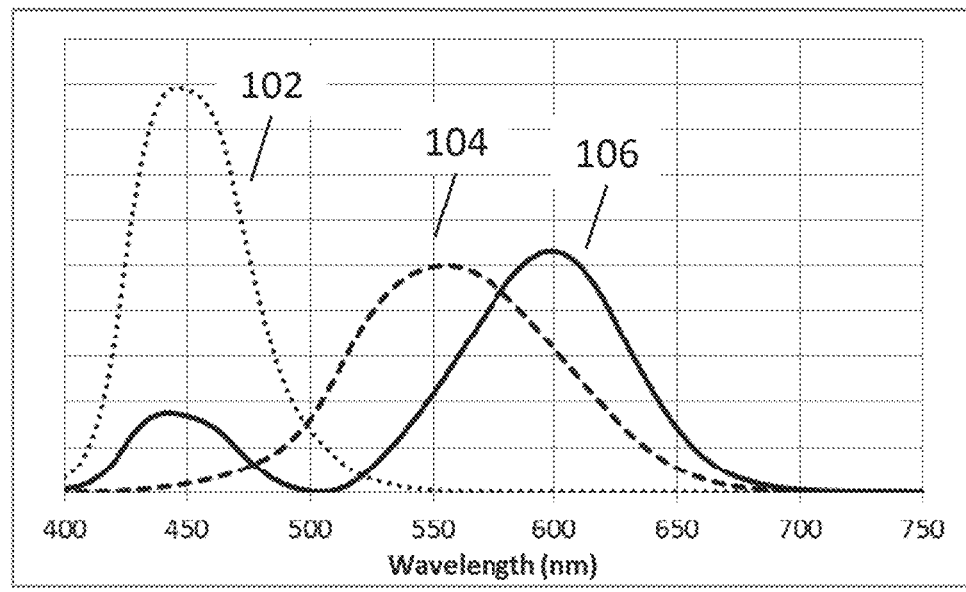
FIG. 1a illustrates a graph of the three color matching functions, the XYZ tristimulus values, or the chromatic response of a standard observer.
Figure 1B:
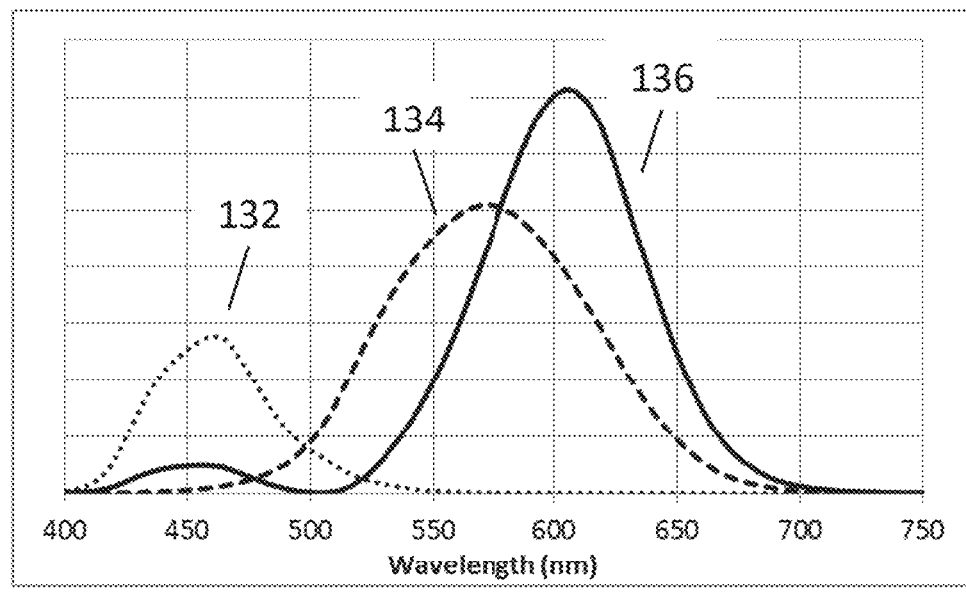
FIG. 1b illustrates a graph of the products of the three color matching functions with the spectrum for a standard incandescent lamp.
Figure 1C:
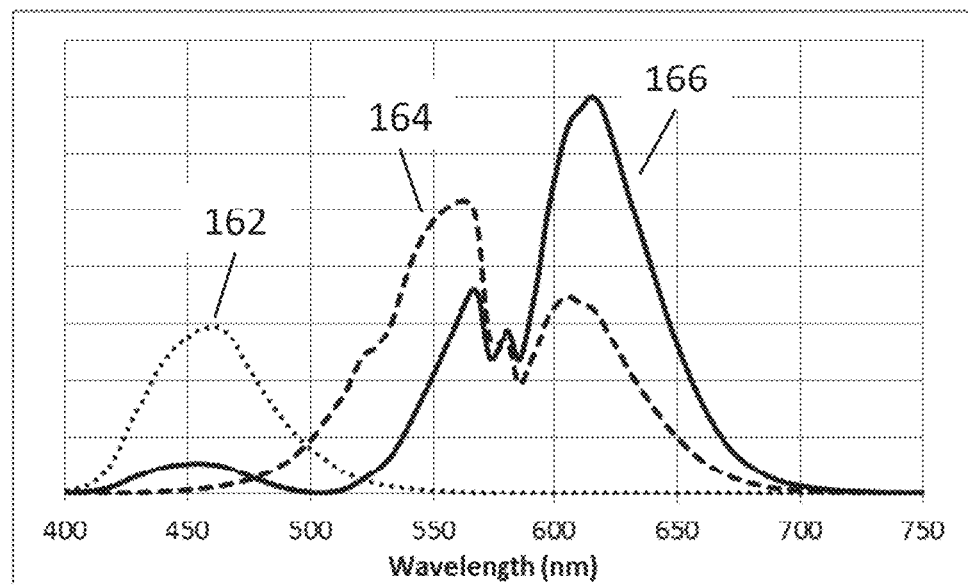
FIG. 1c illustrates a graph of the products of the three color matching functions with the spectrum for a Reveal® incandescent lamp.

As used herein the term "light source" may mean any source of visible light, e.g. the semiconductor, or LED, or OLED; or the down-converter such as a phosphor or quantum dot; or remote down-converter, or down-converter coated onto or embedded into a reflector or refractor; or a multi-channel combination or composite of several such light sources; or a system such as a lamp or luminaire or fixture comprising such light sources.

A new quantitative, validated color preference metric, called the Lighting Preference Index (LPI) is here presented. LPI may be used as a quantitative metric to provide design rules to maximize color preference characteristics of light sources, and/or to design multiple-response optimizations of a spectrum that include color preference, along with other photometric, colorimetric, and other design responses. The resulting spectra, light sources, and lamps demonstrate unexpectedly high LPI values that exhibit significantly higher color preference than existing Reveal® type light sources and/or similar conventional products.

The enhanced color preference may be due to a combination of enhanced color contrast and enhanced whiteness, and the LPI color metric may enable quantitative optimization of color preference by tailoring the spectral power distribution of the light source.

In one or more embodiments, the individual light sources may be commercially available or easily manufactured blue LEDs, yellow-green garnet phosphors, broad red nitride phosphors, and narrow red phosphors, but combined in novel ways as described in the present disclosure. This may be in contrast to the light sources described in patent application U.S. 61/875,403 and PCT/US2014/054868, incorporated herein by reference, wherein the light sources were represented as combinations of an actual blue LED, plus green and red light sources each represented by Gaussian distribution of wavelength that are characterized by a peak wavelength and a full-width at half-maximum (FWHM). The Gaussian distributions in the U.S. 61/875,403 and PCT/US2014/054868 patent applications are hypothetical approximations to real phosphors and LEDs. As such, none of the SPDs in these prior applications are exactly equal to SPDs of real LEDs and phosphors, whereas embodiments of the present invention provide SPDs of real yellow-green and red phosphors. In one or more embodiments of the present disclosure, the combined light sources may be combinations of a commercially available blue or violet LED, a yellow-green garnet phosphor, and either a broad red nitride phosphor or a narrow red phosphor, or a combination of a broad and narrow red phosphor. Other suitable light sources may be used. The blue LED may comprise a nitride compound semiconductor represented by the formula: $In_iGa_jAl_kN$, where i≥0, j≥0, k≥0, and i+j+k=1. In one or more embodiments, the well-known InGaN blue or violet LED is used, where k=0, i is in the range of about 0.1 to about 0.4, and the peak emission wavelength is the range from about 400 nm to about 460 nm, with FWHM of about 10 nm to about 20 nm. The yellow-green (YG) phosphor may contain a garnet fluorescent material comprising 1) at least one element selected from the group consisting of Y, Lu, Sc, La, Gd, Tb, and Sm, and 2) at least one element selected from the group consisting of Al, Ga, and In, and being activated with Ce. In one or more embodiments, the garnet phosphor may be further restricted to yttrium aluminum garnet (YAG, $Y_3Al_5O_{12}$) doped with Ce, i.e. YAG:Ce'. Red phosphors may be defined for the purpose of this invention as having FWHM in two ranges: narrow FWHM<about 60 nm and broad FWHM>about 60 nm. In general, BR nitride phosphors materials may absorb UV and blue light strongly and may emit efficiently between about 600 nm and 670 nm, with FWHM of about 80 nm to about 120 nm, providing very strong emission in the deep red, but at the expense of relatively poor luminous efficacy (lumens per watt, LPW). One example of a broad red (BR) nitride phosphor is typically represented by the general formula $CaAlSiN_3:Eu^{2+}$. In general, narrow red (NR) phosphors may absorb blue light strongly and may emit efficiently between about 610 nm and 660 nm with little deep red or near-infrared emission. Some examples of known NR phosphors include those based on complex fluoride materials activated by $Mn^{4+}$, such as those described in U.S. Pat. No. 7,358,542. U.S. Pat. Nos. 7,497,973, and 7,648,649. The $Mn^{4+}$ doped phosphors have the formula $A_x[MF_y]:Mn^{4+}$ wherein A (alkali) is Li, Na, K, Rb, Cs, or a combination thereof; M (metal) is Si, Ge, Sn, Ti, Zr, Al, Ga, In, Sc, Hf, Y, La, Nb, Ta, Bi, Gd, or a combination thereof; x is the absolute value of the charge of the $[MF_y]$ ion; y is 5, 6 or 7. Therefore, LPW may be maximized compared to red phosphors that have significant emission in the deeper red where eye sensitivity is poor. Color saturation may also typically be enhanced, especially if the peak of the NR phosphor lies beyond about 620 nm. In one or more embodiments, a NR phosphor may comprise $K_2[SiF_6]:Mn^{4+}$ (manganese-doped potassium fluoro-silicate, termed "PFS") which, when excited by an InGaN blue emitter at about 400 nm to about 460 nm, may generate a strong red emission line at about 631 nm, having a FWHM<about 10 nm.

Figure 2:
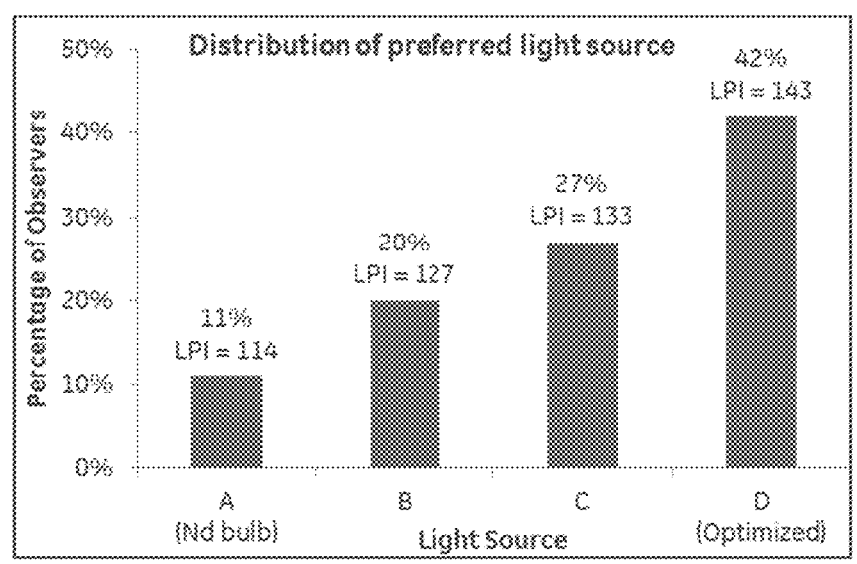
FIG. 2 illustrates a chart displaying the percentage of observers that selected each LED system.

LPI as disclosed herein accounts for both preferred color appearance (saturation and hue distortion) as well as preferred shifts in color point away from the Planckian (blackbody) locus. LPI is a predictive metric that quantifies consumer preference. Thus, LPI can be used as a design tool for optimizing spectra for color preference. Of note, a strong correlation for LPI has been found with preliminary observer testing, and the optimization capability of LPI as an accurate predictive preference metric is proven through additional studies. In an observer study with 86 participants, four discrete LED systems were designed to different enhanced levels of LPI, ranging from 114 to 143. All observers in this study were within the age range of 17 to 28 years, with a gender distribution of 40% male and 60% female, a race distribution of 57% Caucasian, 30% Asian, 8% Hispanic, and 5% African American, and a geographical distribution of 94% North America, 5% Asia, and 1% Europe. Each LED system illuminated a separate booth containing household items, such as colorful fabrics, fruit, wood flooring, and a mirror. Observers were asked to select which lighting environment they preferred overall. Results indicate that the LED system with the highest LPI value was preferred the most by observers, while the second, third, and fourth highest LPI values were preferred the second, third, and fourth most, respectively. FIG. 2 illustrates the percentage of observers that selected each LED system as their preferred environment. As shown, the highest percentage of observers (42%) preferred light source D having an LPI of 143, while the smallest percentage of observers (11%) preferred light source A having an LPI of 114.

Conventional or existing colorimetric and photometric quantities or metrics may be derived from the responses of relatively small groups of observers, and thus may not be representative of the entire human population, nor of every demographic and cultural group. However, such metrics are being used decades after they were created to design, evaluate, and optimize lighting products. Light sources are still being designed based on these metrics, e.g. lumens and color rendering index (CRI or Ra).

The formula for LPI as described herein is based on an observer set within the age range of 21 to 27 years, with a gender distribution of 58% male and 42% female, a race distribution of 92% Caucasian and 8% Asian, and a geographical distribution within North America. However, this does not diminish the effectiveness of LPI, as presently defined herein, to quantify and optimize the level of color preference for an arbitrary light source spectrum such that if that test light source is built and the test illuminant is observed by a population having color preferences similar to those of a particular test population, then the test light source will be preferred relative to other light sources that score lower on the LPI scale by that test population. Furthermore, spectra or light sources optimized for high LPI, and having LPI greater than conventional light sources, exhibit higher color preference among observers (having similar color preference bias to those in our dataset) than any of the conventional light sources. As an analogy, if a variation of the lumen, for example the scotopic lumen, is defined that differs from the traditional photopic lumen, and the definition of the scotopic lumen enables the discovery and development of light sources having increased or optimized scotopic lumen efficiency, that would not invalidate the effectiveness of the discoveries and developments of light sources that had provided, and continue to provide, increased or optimized photopic lumens, since the photopic lumen had been rigorously defined, even though it was not universally appropriate in all lighting applications.

While existing color quality metrics struggle to accurately quantify consumer preference of lighting products, LPI objectively defines a quantitative color preference metric that most closely correlates with a limited population of observers for which color preference data was available. The LPI metric is a function of two parameters: the Whiteness of the illumination source and the Color Appearance of objects illuminated by the source. The specific LPI function is defined below, after explanation of Whiteness and Color Appearance.

As used herein, Whiteness refers to the proximity of the color point to the "White Line" on the chromaticity diagram, where the "White Line" is defined in the following publication: "White Lighting", *Color Research & Application*, volume 38, #2, pp. 82-92 (2013), authors M. S. Rea & J. P. Freyssinier (henceforth, the "Rea reference"). The Rea reference is hereby incorporated by reference. As used herein, the "White Line" is defined by the color points in Table 1 below, as reported in CCX and CCY color coordinates for selected color temperatures from 2700 K to 6500 K.

TABLE 1

| Color Temp. (CCT) | CCx | CCy |
| --- | --- | --- |
| 2700 K | 0.4431 | 0.3806 |
| 3000 K | 0.4212 | 0.3716 |
| 3500 K | 0.3980 | 0.3710 |
| 4100 K | 0.3773 | 0.3788 |
| 5000 K | 0.3458 | 0.3628 |
| 6500 K | 0.3114 | 0.3389 |

Figure 3:
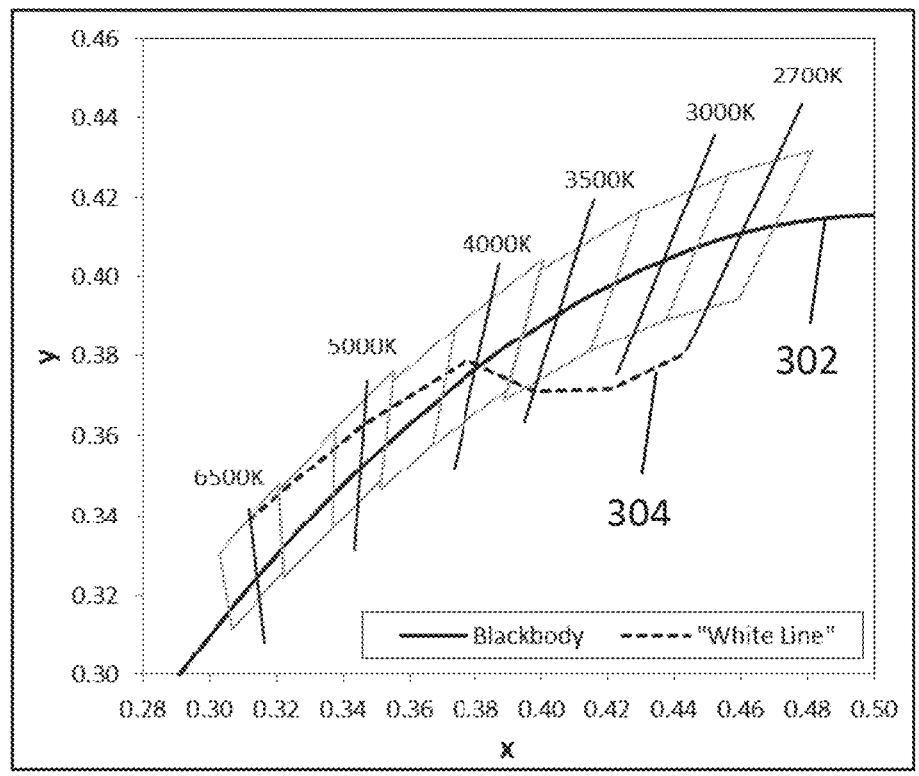
FIG. 3 illustrates a graph of the "White Line" (sometimes also called the "white-body curve" or "white-body locus") and a graph of the blackbody curve (or blackbody locus, or BBL).

As seen in FIG. 3, and defined in Table 1, the "White Line" 304 (sometimes also called the "white-body line", "white-body curve", or "white-body locus") is slightly above the blackbody curve 302 at high color temperatures (e.g., above 4000 K) and significantly below it at lower color temperatures. Studies indicate that illumination on the "White Line" may correspond to human perception of what is "white" light. The "White Line" is proposed for a wide range of color temperatures, but for color temperatures between about 2700 K and about 3000 K (these are Correlated Color Temperature (CCT) values that consumers often prefer), the "White Line" is about 0.010 Duv below the blackbody locus, wherein Duv represents the distance from the blackbody locus in u-v chromaticity space.

The following equation is scaled to provide a Whiteness metric for any color point having CCT between about 2700 K and about 3000 K. This Whiteness metric will be zero, or substantially 0, for any point on the Planckian locus, and will be unity (substantially 1) for any point on the "White Line":

$$\text{Whiteness} = 1 - 100\sqrt{(Duv+0.010)^2}, \quad \text{Equation (1):}$$

where Duv, for purposes of Equation (1), is the distance of the color point from the Planckian locus in u-v space (note: values below the blackbody line are negative in Equation (1)). For example, for a point at 0.010 below the blackbody, one would insert −0.010 into Equation (1). (For color points having a CCT outside the range of about 2700 K and about 3000 K, the Whiteness can be approximated by inspection of the position of the color point in FIG. 3, without undue experimentation; e.g., if the illumination source has a color point on the "White Line", it will similarly have a Whiteness value of unity). As will be explained in further detail below, LPI increases as the color point of the illumination source approaches the "White Line", and decreases as it moves away in either direction.

As used herein, Color Appearance is a composite measure of color rendering, which is a function of the Net Saturation Value (NSV) of the illumination source (e.g., relatively higher LPI values are obtained for NSV that show an enhanced saturation, but are not overly saturated), and the Hue Distortion Value (HDV); (e.g., relatively higher LPI values are obtained for HDV that show a minimal or zero hue distortion). Both NSV and HDV will be explained in more detail below.

The lighting preference index (LPI) metric was developed using an unbiased selection of test color samples, by selecting an array of colors using the complete database of 1600 corrected Munsell glossy spectral reflectances. These 1600 colors would be understood by the person of ordinary skill in the art, especially in view of M. W. Derhak & R. S. Berns, "Analysis and Correction of the Joensuu Munsell Glossy Spectral Database," *Color and Imaging Conference,* 2012 (1), 191-194 (2012). Using this array of colors allows for coverage of a significant fraction of color space utilizing the Munsell classification system of hue, value, and chroma.

Figure 4A:
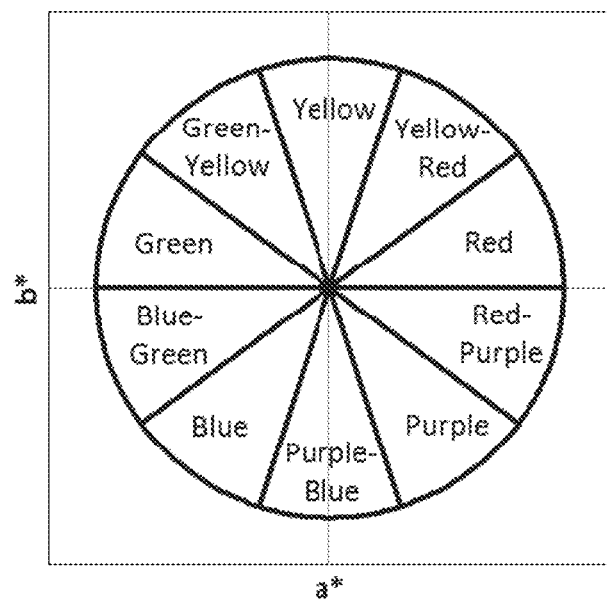
FIG. 4a illustrates the ten main categories of hue in the a*-b* chromaticity plane, as prescribed in the Munsell classification system for color.

As also would be understood by those skilled in the art, each color in this array is defined by the Munsell system in terms of its hue (which has 10 categories with 4 subcategories in each, for 40 total items), chroma (ranging from 0 to 16), and value (ranging from 0 to 10). The 10 categories of hue are depicted and labeled in FIG. 4a. All levels of saturation, or chroma, and hue are weighted equally and treated in a statistical count approach, following a similar method as discussed in "Statistical approach to color quality of solid-state lamps," *IEEE J. Sel. Top. Quantum Electron.,* 15(6), 1753 (2009), authors A. Zukauskas, R. Vaicekauskas, F. Ivanauskas, H. Vaitkevicius, P. Vitta, and M. S. Shur.

The color points of all 1600 color samples are calculated, as rendered by both the illumination source (i.e., the test illuminant) and by a CIE reference illuminant, or Planckian radiator, at the same color temperature. The CIE reference illuminant has a spectrum which is determined from the CCT of the illumination source, using Planck's law for blackbody radiation. Planck's law defines radiance of the light source B (in W/sr·m³) as a function of wavelength λ (in meters) and absolute temperature T (in K) as:

$$B_\lambda = \frac{2hc^2}{\lambda^5} \frac{1}{e^{\frac{hc}{\lambda k_B T}} - 1}$$

where h is the Planck constant and $k_B$ is the Boltzmann constant. As used herein, and as well known in the art, a blackbody is a physical body that is an ideal absorber, that is, it absorbs all incident electromagnetic radiation, regardless of frequency or angle of incidence. It is also an ideal emitter: at every frequency, it emits as much energy as—or more energy than—any other body at the same temperature.

Figure 4B:
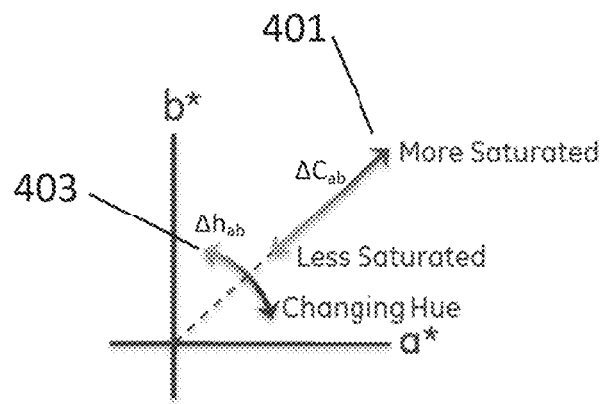
FIG. 4b illustrates the radial and azimuthal components in the a*-b* chromaticity plane that comprise each Color Rendering Vector.
Figure 4C:
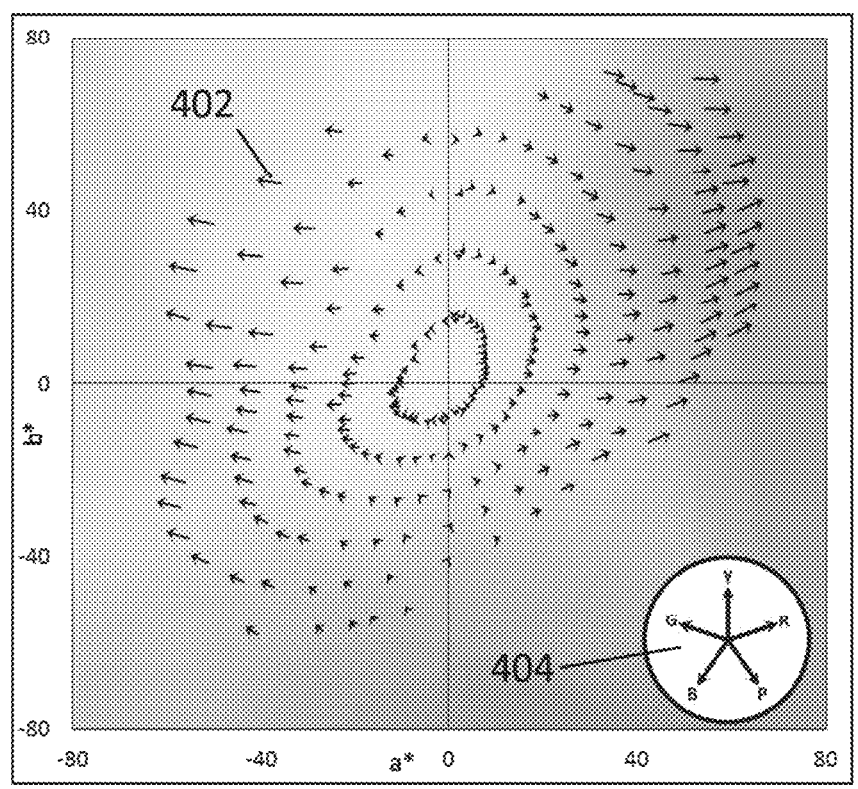
FIG. 4c illustrates the Color Rendering Vectors (CRVs) at Munsell value 5 for a neodymium incandescent lamp.

All of these color points (also referred to as color coordinates) are then converted to the CIE L*a*b* (CIELAB) color space and color rendering vectors (CRVs) are generated. A CRV is a representation of the magnitude and direction of a color appearance shift with respect to the reference illuminant FIG. 4b illustrates the components contained in each CRV. The radial component 401, or $\Delta C_{ab}$, quantifies the shift in chroma, or saturation, where shifts away from the origin signify increases in saturation and shifts toward the origin signify decreases in saturation. The azimuthal component 403, or $\Delta h_{ab}$, quantifies the change in hue and can be represented by an angular change, in radians. A vector plot of the CRVs at a particular Munsell value can be produced as a visual representation of the color shifts on the a*-b* chromaticity plane. FIG. 4c represents the CRVs 402 at Munsell value 5 for a neodymium incandescent lamp, a product commonly preferred by consumers. As seen in the vector plot, the neodymium lamp produces enhanced saturation, particularly in the red and green components (at the right and left sides, respectively, of the vector plot). The approximate vector directions corresponding to the colors yellow Y, red R, purple P, blue B, and green G, are indicated in the insert 404.

The radial 401 and azimuthal 403 components of each CRV for all 1600 Munsell colors are then determined to quantify the shift in chroma and hue, respectively. With such a large sample size, the magnitude and direction of the CRVs can be represented by statistical counts.

The Net Saturation Value (NSV) represents the percentage of test samples with improved saturation, reduced by the percentage of samples with decreased saturation. Improved levels of saturation are indicated by increases in chroma ($\Delta C_{ab} > 0$) beyond a threshold of average perceptual difference, but below an over-saturation limit. Decreased saturation levels ($\Delta C_{ab} < 0$) are only counted if chroma is reduced beyond the same threshold of average perceptual difference. The average perceptual difference value is based on the following publication: "Evaluation of Uniform Color Spaces Developed after the Adoption of CIELAB and CIELUV", *Color Research and Application,* volume 19, #2, pp. 105-121 (1994), authors M. Mahy, L. Van Eycken, & A. Oosterlinck, which found the average perceptibility radius to be 2.3 in CIELAB space. For the over-saturation limit, a value of $\Delta C_{ab} = 15$ is chosen based on the following publication: "Color Quality Design for Solid State Lighting", Presentation at LEDs 2012, Oct. 11-12, San Diego, Calif. (2012), author Y. Ohno. In this work, an increase in preference was found for saturated colors, to a limit, and preference response declined for high levels of saturation. Around a value of approximately $\Delta C_{ab}$, =15, the preference response was comparable to no saturation, or $\Delta C_{ab} = 0$, with increased preference response in between these two values.

Individual NSV values ($NSV_i$) are calculated for the 10 main hue categories in the Munsell system, and a total NSV is taken as the average over the 10 hues. As used in this disclosure, NSV is defined by Equation (2) and Equation (3):

$NSV_i$=(percent of CRVs in hue $i$ with $2.3 < \Delta C_{ab} < 15$)−(percent of CRVs in hue $i$ with $\Delta C_{ab} < -2.3$),  Equation (2):

$NSV = \sum_{i=1}^{10} NSV_i / 10$,  Equation (3):

where $\Delta C_{ab}$, is the radial component of the CRV and represents the shift in perceived chroma, or saturation, and i represents the hue category for the 10 main hue categories of the Munsell system. For the region $-2.3 < \Delta C_{ab} < 2.3$, the change in saturation may not be perceived by a typical observer and is therefore not counted as either improved or worsened.

The Hue Distortion Value (HDV) represents a weighted percentage of test samples that are changing hue. While increased chroma (up to a limit) generally does contribute to attaining relatively higher LPI values, changes in hue are generally undesirable (although changes in hue are a relatively weaker contributory factor to the final LPI value than are chroma changes).

As would be understood by those skilled in the art, the Munsell color system is typically divided into 40 hue subcategories (4 subcategories in each of the 10 main hue categories). To calculate HDV, the percentage of test colors that change to the next hue subcategory, where $\Delta h_{ab} > \pi/20$ radians (or $1/40^{th}$ of a circle), is weighted by the average $\Delta h_{ab}$ value, scaled by the separation between hue sublevels ($\pi/20$ radians). This additional weighting is used to account for very large amounts of hue distortion, where the percentage alone approaches a limit at very high percentage, as nearly all test colors experience hue distortion of surpassing the threshold to be counted. For these calculations, the direction of hue distortion is unimportant, so $\Delta h_{ab} > 0$ for distortion in both the clockwise and counterclockwise directions. As with NSV, individual HDV values (HDV) are calculated for the 10 main hue categories in the Munsell system, and a total HDV is taken as the average over the 10 hues. As used in this disclosure, HDV is defined by Equation (4) and Equation (5):

$$HDV_i = (\text{percent of } CRVs \text{ in hue } i \text{ with } \Delta h_{ab} > \frac{\pi}{20}) \times \frac{\Delta h_{ab,avg,i}}{\pi/20}, \quad \text{Equation (4)}$$

$$HDV = \sum_{i=10}^{10} HDV_i / 10, \quad \text{Equation (5)}$$

where $\Delta h_{ab}$ is the azimuthal component of the CRV and represents the shift in perceived hue, i represents the hue category for the 10 main hue categories of the Munsell system, and $\Delta h_{ab,avg,i}$ is the average $\Delta h_{ab}$ value for all colors within hue i.

Next, the NSV and HDV are merged into a Color Appearance value as per Equation (6):

Color Appearance=(NSV−HDV/2.5)/50  Equation (6):

Note that in Equation (6), the HDV is weighted (i.e., divided by a factor) relative to NSV to provide the best match to observer preference responses. Realistically, the highest value of Color Appearance that is usually attained is about 1, although theoretically it can reach a value of 2, at a NSV=100 and a HDV=0.

Finally, the LPI equation is defined by Equation 7:

LPI=100+50×[0.38×Whiteness+0.62×Color Appearance],  Equation (7):

where Whiteness is defined in Equation (1) and Color Appearance is defined in Equation (6). The parameter of "100" is chosen so that a reference blackbody illuminant scores a baseline value of 100 as with other lighting metrics. The parameter of "50" is chosen in order to scale LPI changes to a similar magnitude as CRI. For example, a typical neodymium incandescent lamp may be penalized by about 20 points in the CRI system, having CRI of about 80 relative to CRI=100 for the reference, while the same neodymium incandescent lamp may be rewarded by about 20 points in the LPI system, having LPI of about 120 relative to LPI=100 for the reference. The weighting factors of 38% Whiteness and 62% Color Appearance have been chosen to provide the best fit to observer preference data.

An alternative "master" equation for LPI, which is merely a combination of equations (1), (6) and (7), is shown as Equation (8):

LPI=100+19×[1−100√(Duv+0.010)²]+0.62×[NSV−HDV/2.5]  Equation (8):

The purpose of restating LPI in terms of the master equation illustrated above is to show that this novel index provides a value that the person of ordinary skill in the art can derive from generally understood parameters in color science, using the guidance of the present disclosure, without any undue experimentation. The LPI increases with NSV, but decreases as HDV grows. Separately, the LPI increases as Duv approaches that of the "White Line". In some embodiments, the highest value for LPI that may be attainable is approximately 150, corresponding to Whiteness=1 and Color Appearance=1. In some embodiments, there is a theoretical maximum of LPI=181, where Whiteness=1 and Color Appearance=2.

In summary, the LPI metric may be determined by the following steps (not necessarily in this order):
(a) Provide the spectrum of the light emitted by the test illuminant as its Spectral Power Distribution (SPD) having 1-2 nm, or finer, precision;
(b) Determine the color point (color temperature and Duv) from the SPD of the test illuminant;
(c) Calculate the Whiteness component from Duv using Equation (1);
(d) Determine the reference spectrum from the color temperature of the test illuminant;
(e) Calculate the color points of all 1600 Munsell colors in the CIELAB color space for both the reference and test illuminants;
(f) Calculate the color rendering vectors for the test illuminant, relative to the reference spectrum;
(g) Calculate the Net Saturation Value and the Hue Distortion Value using Equation (3) and Equation (5), respectively;
(h) Calculate the Color Appearance component using Equation (6); and
(i) Merge the Whiteness component from step (c) and the Color Appearance component from step (h) into the LPI using Equation (7).

Of note, in one or more embodiments, the whiteness of step (c) is calculated in parallel with the calculation of color appearance in steps (d)-(h). Then the whiteness and color appearance serve as inputs to the final step (i).

Although the LPI objectively defines a quantitative color preference metric that most closely correlates with a limited population of observers for which color preference data was available, color preference may also be quantified using a novel combination of existing color metrics, although with somewhat weaker, but acceptably strong, correlation to color preference data of observers. As suggested by the formula for LPI, existing color metrics that separately represent saturation and color point relative to the BBL can be expected to approximate the color preference responses of observers within some limits of color space. Those limitations are incorporated into the LPI metric definition by use of numerical penalties applied in the LPI algorithm if any of several limitations are violated, as described above in the description of LPI. LPI furthermore may combine the effects of saturation and color point with an optimal weighting of each to provide a single metric, rather than multiple metrics, which has been validated to be useful as a single-parameter optimization response that enables the design of spectra that will predictively elicit a targeted color preference response from observers. Although none of the existing color metrics, taken alone, provides correlation to observers' color preferences as well as the LPI metric, the separation between the peak or dominant wavelength of the YG phosphor and the red phosphor provides a close approximation to the color saturation portion of the LPI metric, and the Duv measure is a close approximation to the color point portion (i.e., whiteness) of the LPI metric. In some embodiments only a single class of phosphors, limited to YAG:Ce phosphors having various peak and dominant wavelengths, are used to provide the YG emission in the SPD of the light source; whereas two classes of phosphors, narrow having a single peak wavelength, and broad having various peak wavelengths, may be used to provide the red emission in the SPD of the light source. In one or more embodiments, the separation between the peak or dominant wavelength of the YG phosphor and the peak wavelength of the red phosphor is quantified by holding the peak wavelength of the red phosphor fixed, while varying the dominant wavelength of the YG phosphor, thereby providing a direct measure of the separation between the YG and red phosphors. Therefore, we may alternately choose to describe the color preference of a light source comprising a blue LED, a YG YAG:Ce phosphor, and a NR or BR phosphor having a given peak wavelength, by the dominant wavelength of the YG phosphor, and Duv of the color point in the CIE 1960 u-v color space, as approximate substitutes for the more accurate LPI metric, with the advantage that some practitioners may find it easier to calculate the dominant wavelength of the YG phosphor and Duv responses than to calculate the LPI response, even though all of the details necessary to calculate the LPI response have been provided.

Figure 5:
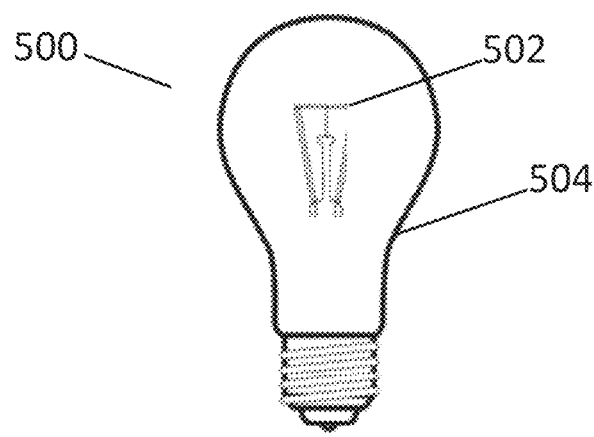
FIG. 5 illustrates an incandescent or halogen light source.

Conventional lamp types include incandescent, halogen, and LED employing Nd-doped glass to absorb some of the yellow light from the spectrum emitted by the light source to enhance the color preference relative to their counterpart lamps without the Nd absorption. FIG. 5 illustrates an incandescent light source or halogen light source 500 that includes one or more incandescent or halogen coils 502 within a glass dome 504. In some embodiments, the glass dome 504 may be doped with neodymium oxide ($Nd_2O_3$), as is provided in GE Reveal® type incandescent and halogen lamps. The light emitted from the coil or coils is similar to that of a blackbody spectrum, typically with a correlated color temperature (CCT) between about 2700 K and about 3200 K. This CCT range may be referred to as warm white. The Nd-doped glass dome 504 may function to filter out light in the yellow portion of the color spectrum, such that the light transmitted through the glass dome 504 of the light source 500 has an enhanced color preference, or color saturation, or color contrast capability that is typically preferred by a human observer relative to light emitted from the same light source without the Nd glass filter.

Figure 6A:
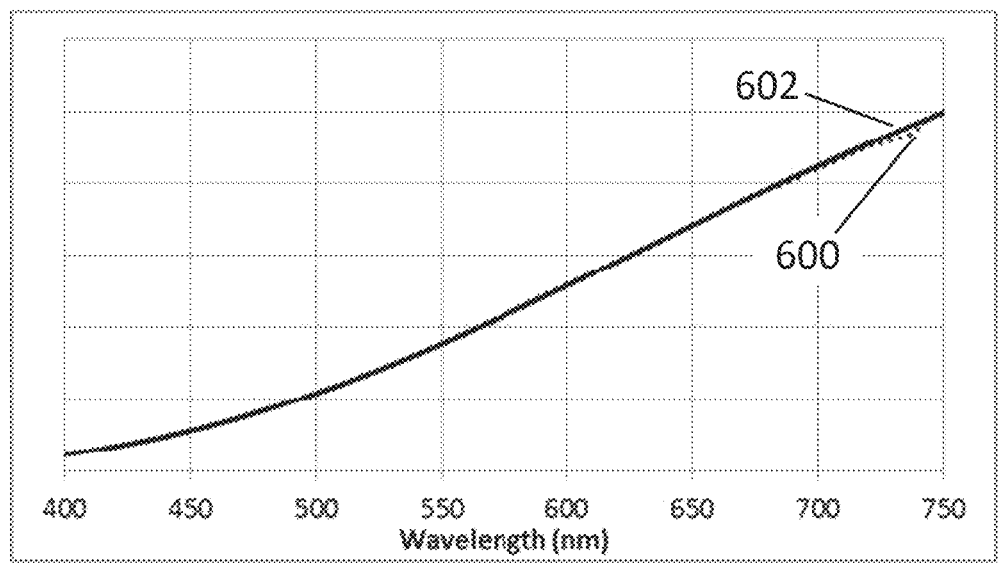
FIG. 6a illustrates a graph of the relative light output versus wavelength (or the spectral power distribution (SPD)) of an incandescent light source of FIG. 5, and a blackbody light source.

FIG. 6a illustrates a plot 600 of the relative light output versus wavelength (or the spectral power distribution (SPD)) of an incandescent light source 500 of FIG. 5 having a CCT=2695 Kelvin (K), and a plot 602 of the SPD of a blackbody light source having the same CCT=2695 K. A blackbody emitter is typically considered to be the reference light source against which any test light source is compared in calculations of colorimetric values of the test light source, for test sources having CCT<5000 K (for CCT>5000 K, the Daylight spectrum is typically used as the reference). As the reference light source, the blackbody emitter is assigned the value of CRI=100. For consistency, the blackbody is likewise assigned the reference value of 100 for the LPI metric. Due to the close similarity of the incandescent SPD to that of the blackbody, the values for the incandescent light source at 2695 K are CRI=99.8 and LPI=99.8. In the case of CRI, a value of 99.8 is nearly equal to the maximum possible value of CRI=100, so the incandescent light source has nearly ideal color rendering (or color "fidelity") per the CRI metric. In the case of LPI, a value of 99.8 is considered to be a neutral value, not a maximum value. In some embodiments, values of LPI much lower than 100 are possible, whereby a typical observer would be expected to prefer such a light source much less than the incandescent source, but there may also be much higher possible values, up to about LPI=150, whereby a typical observer would be expected to prefer such a light source much more than the incandescent source. The CRI metric quantifies the degree to which a light source renders eight pastel test colors exactly the same as the blackbody reference, and so it is a color "fidelity" metric of limited scope in color space.

Figure 6B:
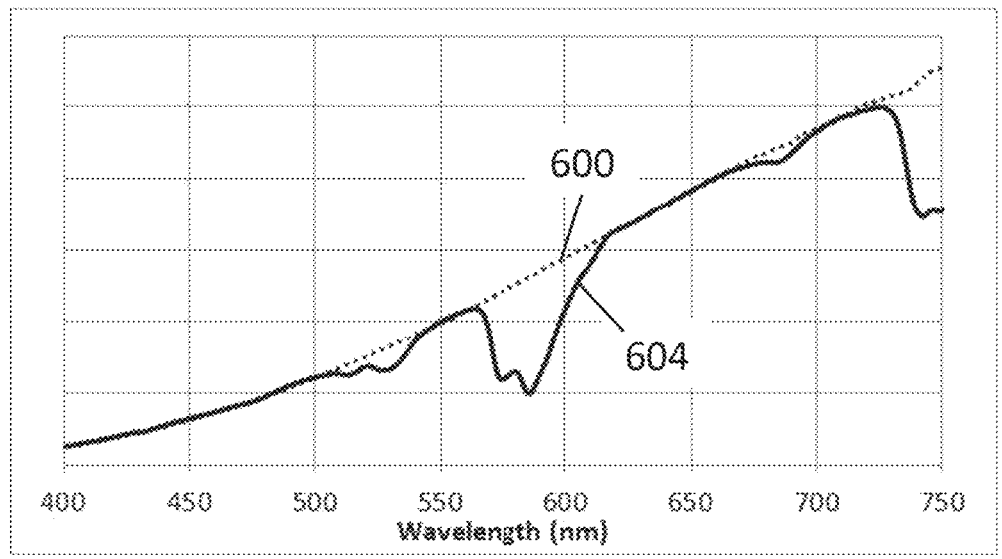
FIG. 6b illustrates a graph including a plot of the SPD of an incandescent light source, and a plot of the SPD of a Reveal® type incandescent light source.

FIG. 6b illustrates a plot 600 of the SPD of an incandescent light source having a CCT=2695 K, and a plot 604 of the SPD of a Reveal® type incandescent light source having a CCT=2755 K, CRI of about 80 and LPI of about 120, obtained by filtering the light of the incandescent light source 500 with Nd-doped glass. The differences between the two SPDs is due entirely to the absorption of light by the Nd-doped glass, most of which occurs in the yellow range from about 570 nm to about 610 nm, and a weaker absorption in the green range from about 510 nm to about 540 nm. In one or more embodiments, the color preference benefits accrued from the Nd absorption are due to the yellow absorption.

An SPD may be plotted with an absolute scale of light intensity, e.g. with dimensions of Watts/nm or $Watts/nm/cm^2$ or other radiometric quantity, or it may be plotted in relative units, sometimes normalized to the peak intensity, as is provided here. A normalized SPD is sufficient for calculation of all colorimetric characteristics of the light source, assuming that the illuminance of the lighted object or space is in the range of normal photopic vision (i.e., greater than about 10-100 lux, up to about 10,000 lux (lux=lumens/$m^2$). The tabulated information in an SPD curve enables precise calculations of all colorimetric and photometric responses of that light source.

The SPD plot 600 of the incandescent lamp shown in FIG. 6a shows it to be an exceptionally well-balanced light source because there are no significant spikes or holes at any wavelengths. Such a smooth curve that matches closely to the blackbody curve having the same CCT indicates outstanding color fidelity abilities. A blackbody spectrum is defined to have perfect color rendering by the CRI scale, i.e., CRI=100. The incandescent lamp typically has a CRI of about 99. The Nd-incandescent lamp typically has a CRI of about 80. In spite of the lower CRI, most observers prefer the color rendering of the Nd-incandescent lamp over the incandescent lamp, especially for applications where organic objects are being illuminated, e.g. people, food, wood, fabrics, and the like.

When compared to some electric light sources, sunlight exhibits large amounts of energy in the blue and green portions of the spectrum, making it a cool (i.e., high CCT) light source with a high color temperature (of about 5500 K). Thus, SPD diagrams are useful in understanding how various lamps differ in the color composition of their light output.

Figure 7A:
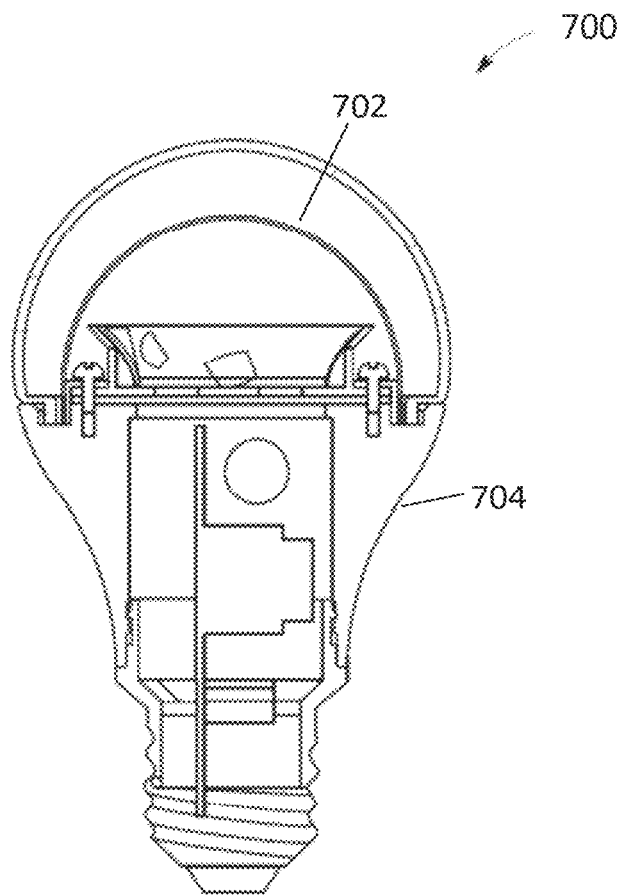
FIG. 7a illustrates a Reveal® type LED light source that includes one or more LEDs.
Figure 7B:
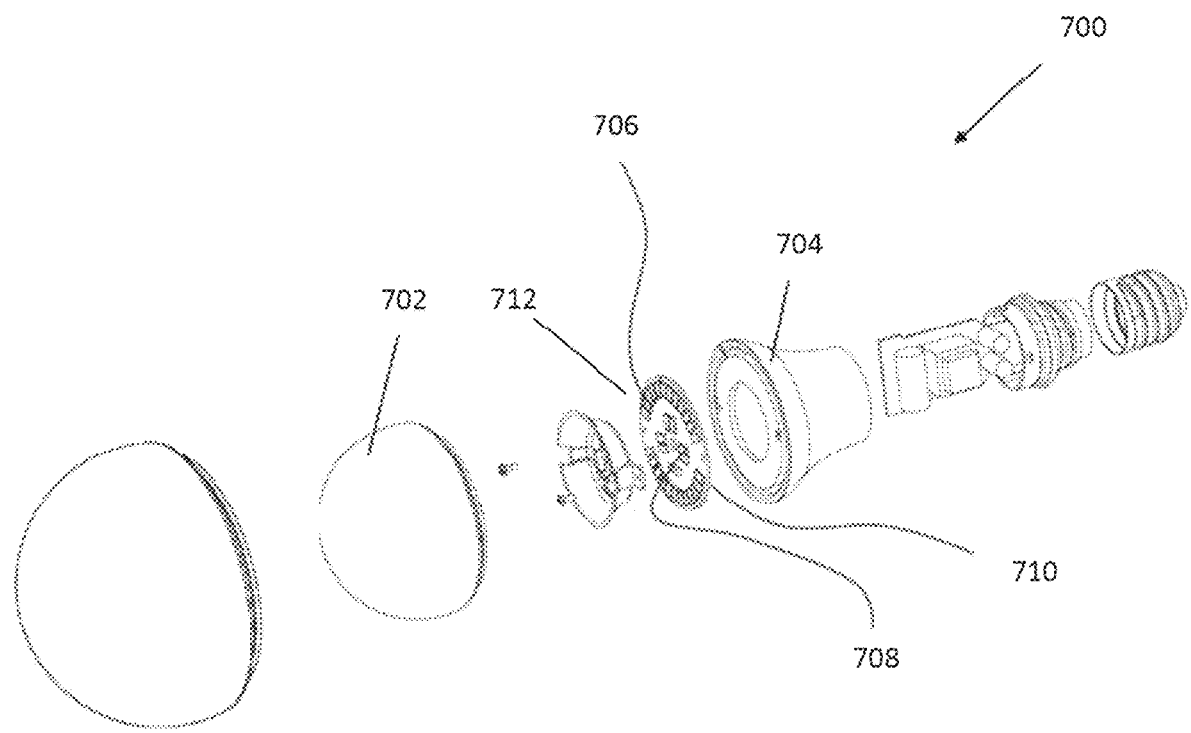

Some conventional lamp types include one or more LEDs employing Nd-doped glass to absorb some of the yellow light from the spectrum emitted by the light source to enhance the color preference relative to their counterpart lamps that lack the yellow absorption. FIG. 7a illustrates a Reveal® type LED light source 700 that includes one or more LEDs (FIG. 7b), and FIG. 7b is an exploded view of the light source 700 of FIG. 7a. An LED (light-emitting diode) is an example of a solid state lighting (SSL) component, which may include semiconductor LEDs, organic LEDs, or polymer LEDs as sources of illumination instead of legacy light sources such as incandescent bulbs that use electric filaments; or fluorescent tubes or high-intensity discharge tubes that use plasma and/or gas.

Referring to FIG. 7b, a light engine 712, comprising LEDs 706 and 708 and a printed circuit board 710 to which the LEDs are mounted, and which is attachable to a housing 704, so that, when assembled, the LEDs 706 and 708 are positioned within a glass dome 702 that is impregnated with neodymium oxide ($Nd_2O_3$), such that most or all of the light emitted by the LEDs 706 and 708 passes through the dome 702. It should be understood that FIGS. 7a and 7b depict just one example of an LED lamp which utilizes one or more solid state lighting components to provide illumination when powered. Accordingly, the specific components depicted in FIGS. 7a and 7b are for illustrative purposes only, and one skilled in the art recognizes that other shapes and/or sizes of various components may be utilized which may depend upon intended use and/or other considerations. For example, the housing 704 may be of different size and/or shape, and the solid state lighting components 706 and 708 may be connected directly and/or indirectly thereto during assembly.

Figure 8:
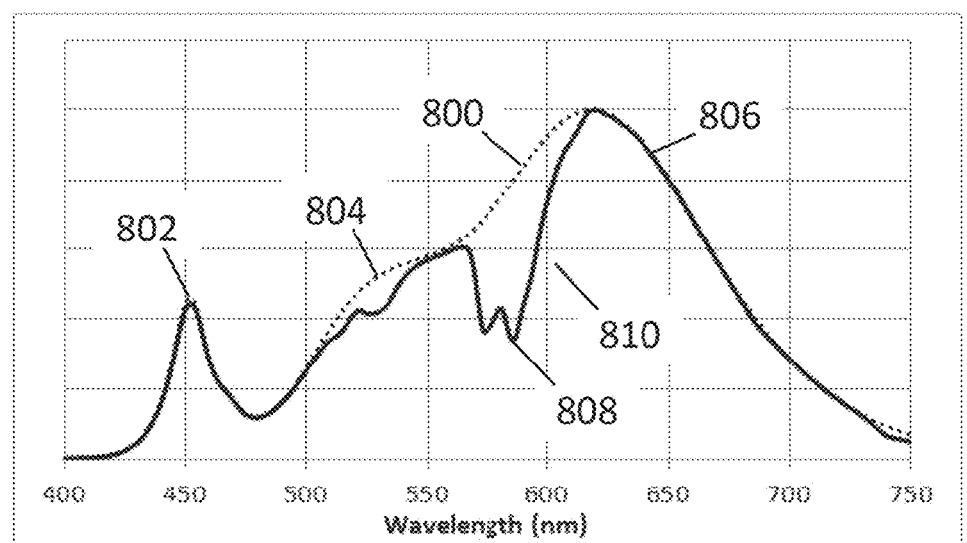

FIG. 8 illustrates a graph including a plot 800 (dotted line) of a known spectral power distribution (SPD) of a warm-white LED lamp comprising multiple blue LEDs each exciting a YG YAG phosphor and a broad red nitride phosphor having emission that strongly overlaps with the YAG phosphor, resulting in very strong emission in the yellow spectrum, the mixed light having a CCT=2766 K, CRI=91, and LPI=97. FIG. 8 also illustrates a plot 810 (solid line) of the SPD of a Reveal® type LED light source having a CCT=2777 K, CRI=91, and LPI=111. The light emitted from the LEDs may be comprised of a mixture of light from a blue LED 802, having peak wavelength in the range of about 400 to about 460 nm (e.g., royal blue InGaN), and YG light 804 having peak emission in the range of about 500 to about 600 nm created by the excitation of a phosphor material (such as a YAG:Ce phosphor) by the blue emission from the LED, and possibly also red light 806 having peak emission in the range of about 600 to about 670 nm created by the excitation of another phosphor (such as nitride or sulfide phosphor) by the blue emission from the LED. The portion of the blue light generated by the blue LED that is not absorbed by the phosphor materials, combined with the light emitted by the phosphor materials, provides light which appears to the human eye as being nearly white in color. The mixed-light spectrum is also similar to that of a blackbody spectrum, but may include a depression in the wavelength range between the blue LED emission and the YG phosphor emission. In some embodiments, the light source may have a correlated color temperature (CCT) between about 2700 K and about 3200 K (warm white), or it may have a higher CCT, perhaps as high as about 10,000 K or higher, or a lower CCT, perhaps as low as about 1800 K or lower. The Nd glass functions to filter out light in the yellow portion 808 of the color spectrum which may have been produced by the YG and red phosphors, such that the light 810 (the entire solid line plot) emitting from the glass dome of the light source 700 has an enhanced color preference, or color saturation or color contrast capability, or whiteness that is typically preferred by a human observer relative to light 800 emitted from the same light source without the Nd glass filter.

Figure 9:
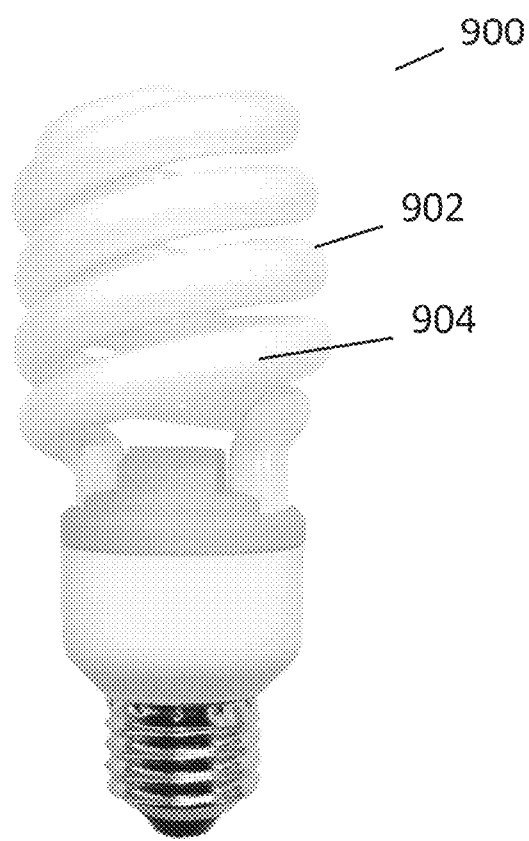
FIG. 9 illustrates a Reveal® type compact fluorescent (CFL) light source.

Some conventional lamp types which include one or more low-pressure mercury (Hg) discharge lamps and special formulations of visible-light emitting phosphors (i.e., fluorescent (FL) or compact fluorescent (CFL) light sources) selected to reduce the amount of yellow light emitted by the light source are also known to enhance the color preference relative to their typical counterpart FL or CFL light source lamps without the special phosphor formulations. FIG. 9 illustrates a Reveal® type CFL light source 900 that includes a low-pressure Hg discharge tube 902 coated with a customized mix of phosphors 904 having relatively low emission in the yellow spectrum.

Figure 10:
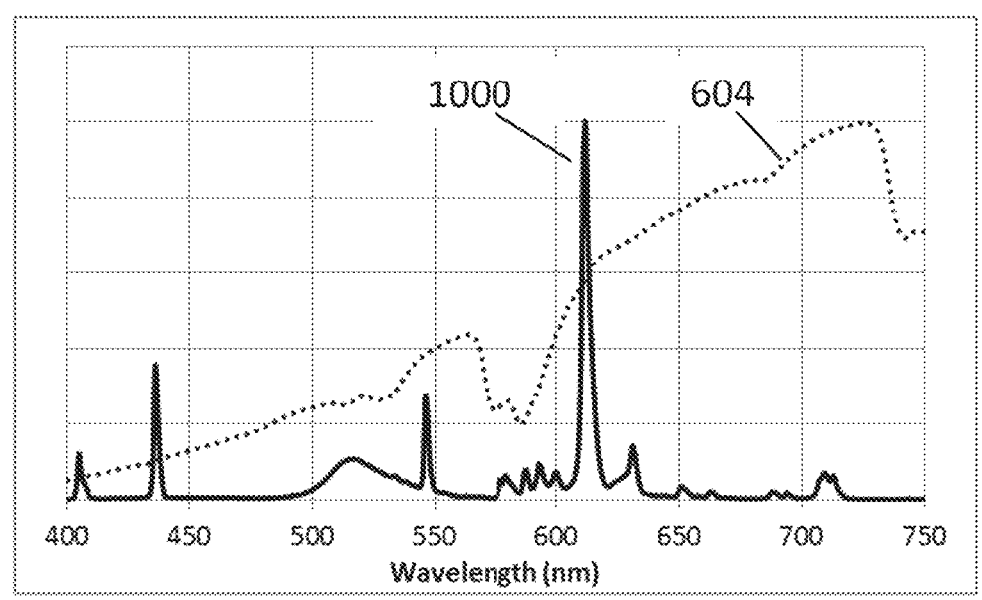
FIG. 10 illustrates a graph including a plot of the spectral power distribution (SPD) of a Reveal® type CFL light source of FIG. 9, and a plot of the SPD of a Reveal® type incandescent light source.

FIG. 10 illustrates a graph including a plot 1000 of the known spectral power distribution (SPD) of the Reveal® type CFL light source 900 of FIG. 9, having a CCT=2582 K, CRI=69, and LPI=116. FIG. 10 also illustrates a plot 604 of the SPD of a Reveal® type incandescent light source of FIG. 5 having a CCT=2755 K. The mixed-light spectrum plot 1000 (from a CFL lamp) consists of many narrow, and some broad, emission bands that are designed to produce a light that approximates a blackbody spectrum having a CCT=2582 K. Compared with the Nd-incandescent SPD plot 604, the enhancement in red and green, and the suppression in yellow, are similar, given the limitations of the red and green phosphors available for the CFL product. The light source may also have a correlated color temperature (CCT) between about 2700 K and about 3200 K (warm white). In some embodiments, the light source may have a higher CCT (e.g., as high as about 10,000 K or higher), or a lower CCT (e.g., as low as about 1800 K or lower). The mixed light spectrum plot 1000 of the light source 900 having a relatively low emission in the yellow portion of the spectrum may have an enhanced color preference, or color saturation, or color contrast capability that is typically preferred by a human observer relative to light emitted from the same light source having a traditional phosphor mix.

Figure 11:
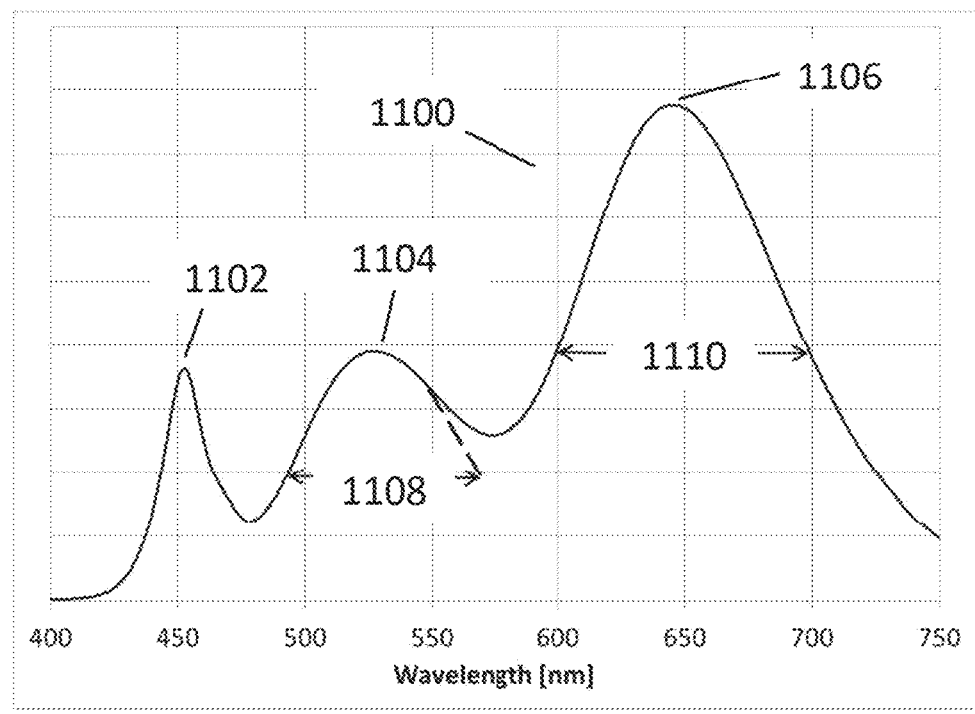
FIG. 11 illustrates a graph of the SPD of a known light source having green and red phosphors having peak wavelengths separated sufficiently to produce a depression in the yellow wavelength range.

Some additional conventional lamp types include one or more LEDs having green and red phosphors having peak wavelengths separated sufficiently to produce a depression in the yellow wavelength range and are used, for example, in grocery applications to enhance the colors of meats, vegetables, and produce (e.g. fruit). FIG. 11 illustrates a graph including a plot 1100 of the SPD of the known light source having green and red phosphors, having peak wavelengths separated sufficiently to produce a depression in the yellow wavelength range, and having a CCT=2837 K, CRI=74, and LPI=124. The light emitted from the LEDs may be comprised of a mixture of light from blue light emission 1102, having peak wavelength in the range of about 400 nm to about 460 nm created by emission from a blue LED, and green light emission 1104 having peak wavelength in the range of about 500 nm to about 580 nm and FWHM 1108 of about 80 nm created by the excitation of a green phosphor by the blue emission from the LED, and red light emission 1106 having peak emission in the range of about 600 nm to about 670 nm and FWHM 1110 of about 100 nm created by the excitation of a red phosphor by the blue emission from the LED. The portion of the blue light generated by the blue LED that is not absorbed by the phosphor materials, combined with the light emitted by the green and red phosphor materials, provides light which appears to the human eye as being nearly white in color. The mixed-light spectrum may have a depression in the wavelength range between the blue LED emission 1102 and the green phosphor emission 1104, and may include a second depression in the yellow wavelength range between the green phosphor emission 1104 and the red phosphor emission 1106. The light source may also have a CCT between about 2700 K and about 6000 K, or it may have a higher CCT, e.g., as high as about 10,000 K or higher, or a lower CCT, e.g., as low as about 1800 K or lower. The reduced emission in the yellow portion of the SPD plot 1100 resulting from the separation of the peak of the green phosphor emission 1104 at 528 nm and the peak of the red phosphor emission 1106 at 645 nm provides a light source spectrum plot 1100 resulting in an LPI of about 124. The relatively high LPI value in this known light source is due to the relatively narrow FWHM (about 80 nm) and the blue-shifted peak (at about 528 nm) of the green phosphor, which is not the same composition of a YG YAG:Ce phosphor of the embodiments of the present disclosure. The FWHM of YG YAG:Ce phosphors in general have FWHM in a slightly broader range of about 110 to about 120 nm, and a range of peak wavelengths from about 530 nm to about 560 nm, as represented by the 25 different YAG phosphor embodiments described in one or more embodiments below.

Figure 12:
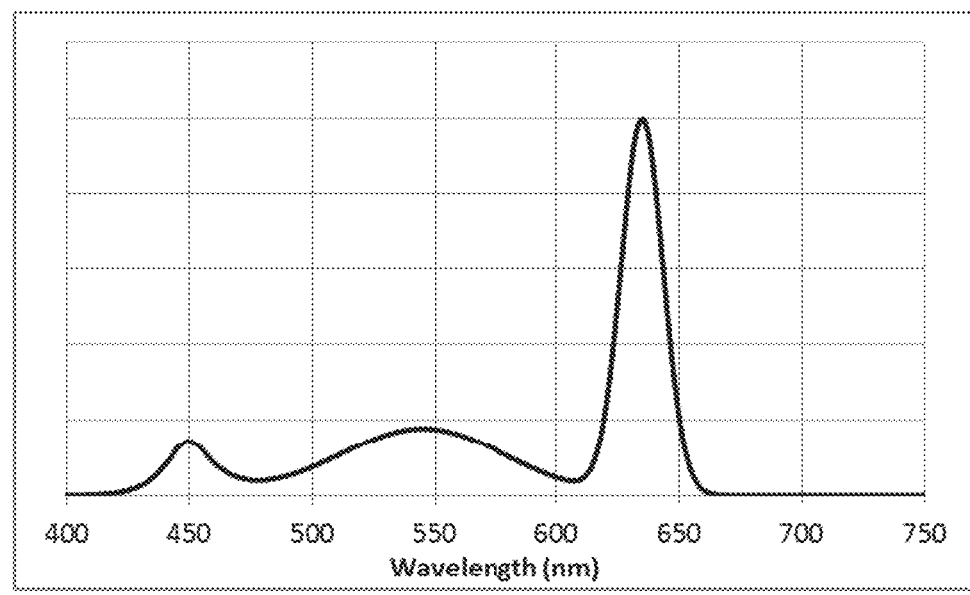
FIG. 12 illustrates a graph of the SPD of an LED light source from the prior art.

FIG. 12 illustrates a graph of the SPD of an idealized LED light source comprising a blue LED that peaks around 450 nm, and Gaussian approximations to a YG phosphor that peaks around 545 nm with a FWHM around 80 nm, and a red LED that peaks around 635 nm with a FWHM around 20 nm, having a CCT=2700 K and Duv=−0.010, and providing approximately the maximum practical LPI value of about 145.

In order to better understand and communicate the impact of spectral component selection on the lighting preference index (LPI) metric, a detailed design of experiments (DoE) has been performed using a spectral model. The experiments allowed for identification of optimal spectral features in order to maximize LPI and the color preference response of a typical observer, and guide the design of future lighting products. This DOE was designed to identify compositions of light emitting components, specifically light emitting components for improving LPI of a light source that include the use of commercially available, or easily manufactured, yellow-green (YG) garnet phosphors, and either narrow red (NR) or broad red (BR) phosphors.

Figure 13:
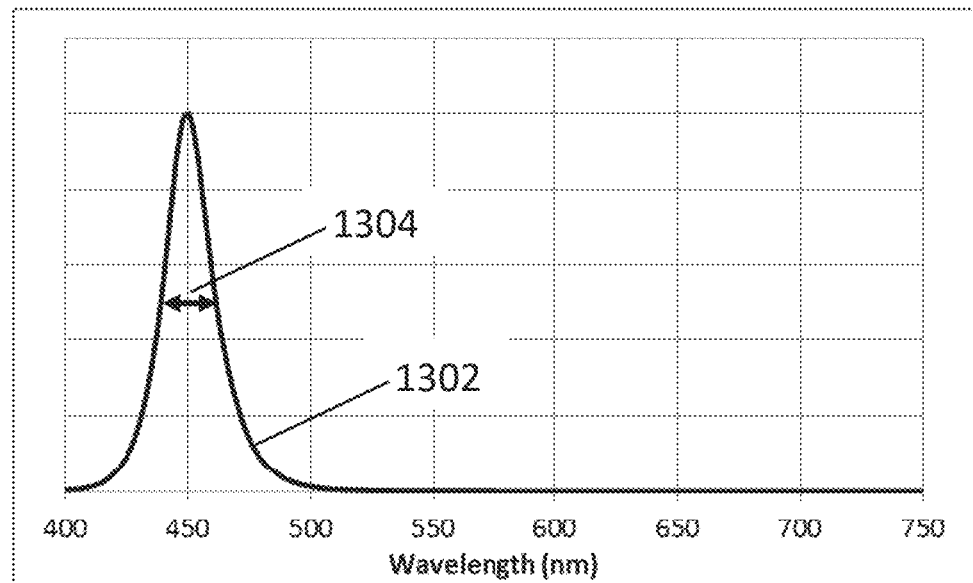
FIG. 13 illustrates a graph of the SPD of the blue LED of a light source according to some embodiments.

Each spectrum is comprised of three components (nominally blue, green, and red) superimposed into a composite spectrum. As shown in FIG. 13, in some embodiments, the blue emission component 1302 is that of a blue LED, peak emission at about 450 nm, and having FWHM 1304 of about 15 nm. This wavelength was chosen to be representative of the typical blue LED presently used in most white light sources. Other suitable blue emission components may be used, having characteristics, such as peak wavelengths in the range of about 400 nm to about 460 nm, and having FWHM<about 50 nm. The LPI color metric is relatively much less sensitive to the blue emission than to the green and red emission. This can be understood from FIG. 1a where the retinal response in the blue 102 is clearly differentiated from the green 104 and red 106, but the green and red responses are not nearly as clearly differentiated from each other. Because of the relative insensitivity of LPI to the blue characteristics, the results of this DOE may be expected to represent the results given by any blue light source having peak wavelength in the blue or violet range (e.g. about 400 to about 460 nm) and having any FWHM less than about 50 nm.

In one or more embodiments, the green component may be modelled using a family of 5 different YG YAG phosphor emissions (FIG. 14), having a range of peak wavelengths from about 540 nm to about 547 nm representing the usual range of commercially available, or easily manufactured YAG phosphors. Furthermore, the emission spectrum of the green component is allowed to vary by +5 nm, −5 nm, +10 nm, and −10 nm from the actual emission spectrum of each of the 5 commercially available phosphors in order to find trends that enable further optimization of the LPI response. Therefore, in total the DoE included 25 (=5 phosphors*(1 un-shifted+4 shifted spectra)) different green components having a total range of peak wavelengths from about 530 nm to about 557 nm. The full-width-at-half-maximum (FWHM), e.g. 1404, of each of the shifted green components is held constant, equal to that of the corresponding un-shifted commercially available phosphor, e.g. 1402, ranging from about 112 nm to about 115 nm FWHM. As used herein, a YG YAG phosphor may include the family of phosphors having a garnet fluorescent material comprising 1) at least one element selected from the group consisting of Y, Lu, Sc, La, Gd, Tb, and Sm, and 2) at least one element selected from the group consisting of Al, Ga, and In, and being activated with Ce, wherein the garnet phosphor is further restricted to yttrium aluminum garnet (YAG, $Y_3Al_5O_{12}$) doped with Ce, i.e. YAG:$Ce^{3+}$.

Figure 15:
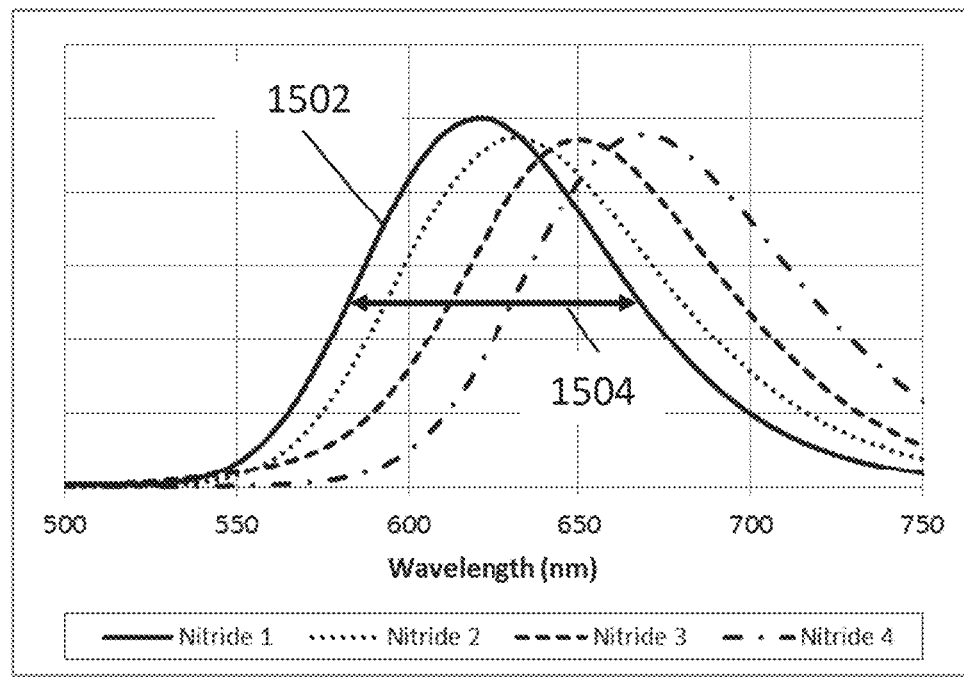
FIG. 15 illustrates a graph of the SPDs of four different broad red (BR) nitride phosphors according to some embodiments.
Figure 16:
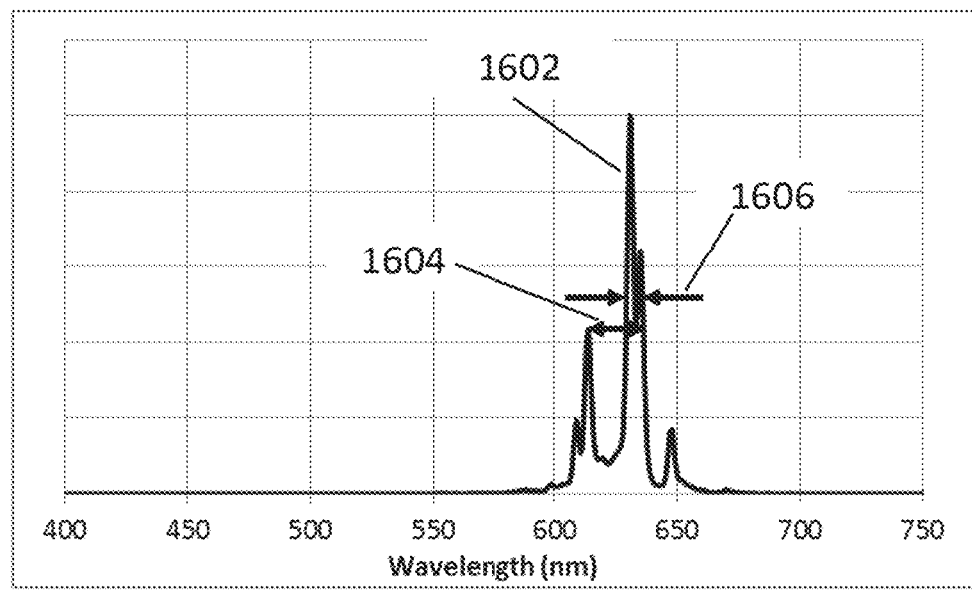
FIG. 16 illustrates the emission spectrum of a narrow red (NR) phosphor according to some embodiments.

In one or more embodiments, the red component may be modelled using a family of four different BR nitride phosphor emissions (FIG. 15) and a NR phosphor (FIG. 16). The BR nitride phosphor is typically represented by general formula of $CaAlSiN_3$:$Eu^{2+}$. These BR nitride phosphor materials absorb UV and blue light strongly and emit efficiently between about 600 nm and about 680 nm, e.g. 1502, with FWHM, e.g. 1504, of about 80 nm to about 120 nm, providing very strong emission in the deep red. NR phosphors (FIG. 16) are known, and some of them are based on complex fluoride materials activated by $Mn^{4+}$, such as those described in U.S. Pat. Nos. 7,358,542; 7,497,973, and 7,648,649. The $Mn^{4+}$ doped phosphors have the formula $A_x[MF_y]$:$Mn^{4+}$ wherein A (alkali) is Li, Na, K, Rb, Cs, or a combination thereof; M (metal) is Si, Ge, Sn, Ti, Zr, Al, Ga, In, Sc, Hf, Y, La, Nb, Ta, Bi, Gd, or a combination thereof; x is the absolute value of the charge of the $[MF_y]$ ion; y is 5, 6 or 7. These materials absorb blue light strongly and emit efficiently between about 610 nm and 660 nm, e.g. 1602, with little deep red or near-infrared emission, since the FWHM is much less than 30 nm, typically about 5 nm as shown 1606. Even though this particular NR phosphor is comprised of several narrow peaks, the full-width encompassing the major peaks is still much less than 30 nm, typically about 20 nm as shown 1604. In one or more embodiments, the NR phosphor of this invention has a peak wavelength at about 631 nm, representing the commercially available PFS as described in U.S. Pat. Nos. 7,358,542, 7,497,973, and 7,648,649. Therefore, in one or more embodiments, in DoE runs that included only a NR phosphor, without a BR phosphor, the NR phosphor comprised only a single, unique red component. In other embodiments, this particular NR phosphor may be substituted by another NR phosphor having similar peak wavelength to provide color preference benefits very similar to those provided by the NR phosphor.

In one or more embodiments, the broad red component may be modelled using a family of 4 different BR nitride phosphor emissions, having a range of peak wavelengths from about 620 nm to about 670 nm, representing the usual range of commercially available, or easily manufactured broad red nitride phosphors. Therefore, in one or more embodiments, runs that included only a BR nitride phosphor, without a NR phosphor, the BR nitride phosphor included 4 different red components. Furthermore, the emission spectrum of the red component is allowed to vary by +5 nm, −5 nm, +10 nm, and −10 nm from the actual emission spectrum of each of the 4 commercially available BR nitride phosphors in order to find trends that enable further optimization of the LPI response. Therefore, in one or more embodiments, 20 (=4 phosphors*(1 un-shifted+4 shifted spectra)) different BR components having a total range of peak wavelengths from about 610 nm to about 680 nm were run. The full-width-at-half-maximum (FWHM) of each of the shifted BR components is held constant, equal to that of the corresponding un-shifted commercially available phosphor, ranging from about 86 nm to about 93 nm FWHM. FIG. 15 displays the SPDs of the four un-shifted red components out of 20 red components that were used.

In one or more embodiments, the DoE was divided into three groups, differentiated by the red phosphor: Group 1 comprising the NR PFS phosphor only (YAG+PFS); Group 2 comprising each of the 20 BR nitride phosphors separately (YAG+Nit) representing the commercially available red nitride phosphors; Group 3 comprising 3 ratios of BR power to NR power (emitted power summed over the full wavelength range of red emission, as provided in FIG. 15 and FIG. 16), in increments of 25%, so that (BR power)/(BR power+NR power) BR/R n=0.25, 0.50, 0.75 for each of the 20 BR nitride phosphors in combination with the single NR phosphor (YAG+PFS+Nit). We will denote these 3 subsets of the Group 3 DoE as Group 3a (n=0.25), Group 3b (n=0.50), and Group 3c (n=0.75). Note that the limiting cases of n=0 and 1 correspond to the Group 1 (YAG+PFS) and Group 2 (YAG+Nit) DoE's, respectively. The division of the DoE into 3 groups is a matter of convenience for communicating the results. In fact the ratio BR/R=n can have a continuous range from 0.0 to 1.0, where the limiting cases of n=0 and n=1 correspond to the Group 1 (YAG+PFS) and Group 2 (YAG+Nit) parts of the DoE, respectively. Group 3, although represented here as having 3 discrete levels of n=0.25, 0.50, and 0.75, actually provides transfer functions for LPI for the continuous range of 0.0<n<1.0; and combining with the results from Groups 1 and 2, provides transfer functions for LPI for the continuous range of 0.0≤n≤1.0. A mixture of red nitride and PFS emitters may be used in one or more embodiments due to trade-offs in colorimetric and photometric capabilities of illuminants having NR vs. BR emitters, whereby the NR emitter may enhance efficacy by reducing the amount of radiation at wavelengths in the far tail of the photopic eye response curve, whereas the BR emitter may enhance color rendering or color preference, at the expense of efficacy.

The ratios of emitted power of the blue, green and red emitters were adjusted, providing the two required degrees of freedom, to uniquely define the color point in the 1931 CIE color space, as well as uniquely defining the SPD. DoE's were performed separately at 10 distinct color points—at each of two CCTs (2700 K and 3000 K); and at each of five Duv values: 0.000 (on the Blackbody locus), −0.005, −0.010 (near the White body line), −0.015, and −0.020.

At each of the 10 color points, in each of the 3 groups, all combinations of blue, green, and red components were generated, resulting in 25 unique combinations (1 blue×25 greens×1 red) at each of 10 color points in the Group 1 DoE; 500 unique combinations (1 blue×25 greens×20 reds) at each of 10 color points in the Group 2 DoE; and 1500 unique combinations (1 blue×25 greens×20 reds×3 red ratios) at each of 10 color points in the Group 3 DoE; in total 2025 unique combinations in the 3 groups at each of 10 color points; in total 20,250 unique combinations (SPDs) across the 10 color points. We will often refer to the entire set of 20,250 combinations as the DoE. Lighting Preference Index (LPI) values were then calculated for each spectrum in the DoE and analyzed for trends and trade-offs for LPI that can be realized from the presently commercially available LED light sources comprising a blue LED, a YG YAG:Ce phosphor, and either a BR nitride phosphor or a NR phosphor.

Figure 17A:
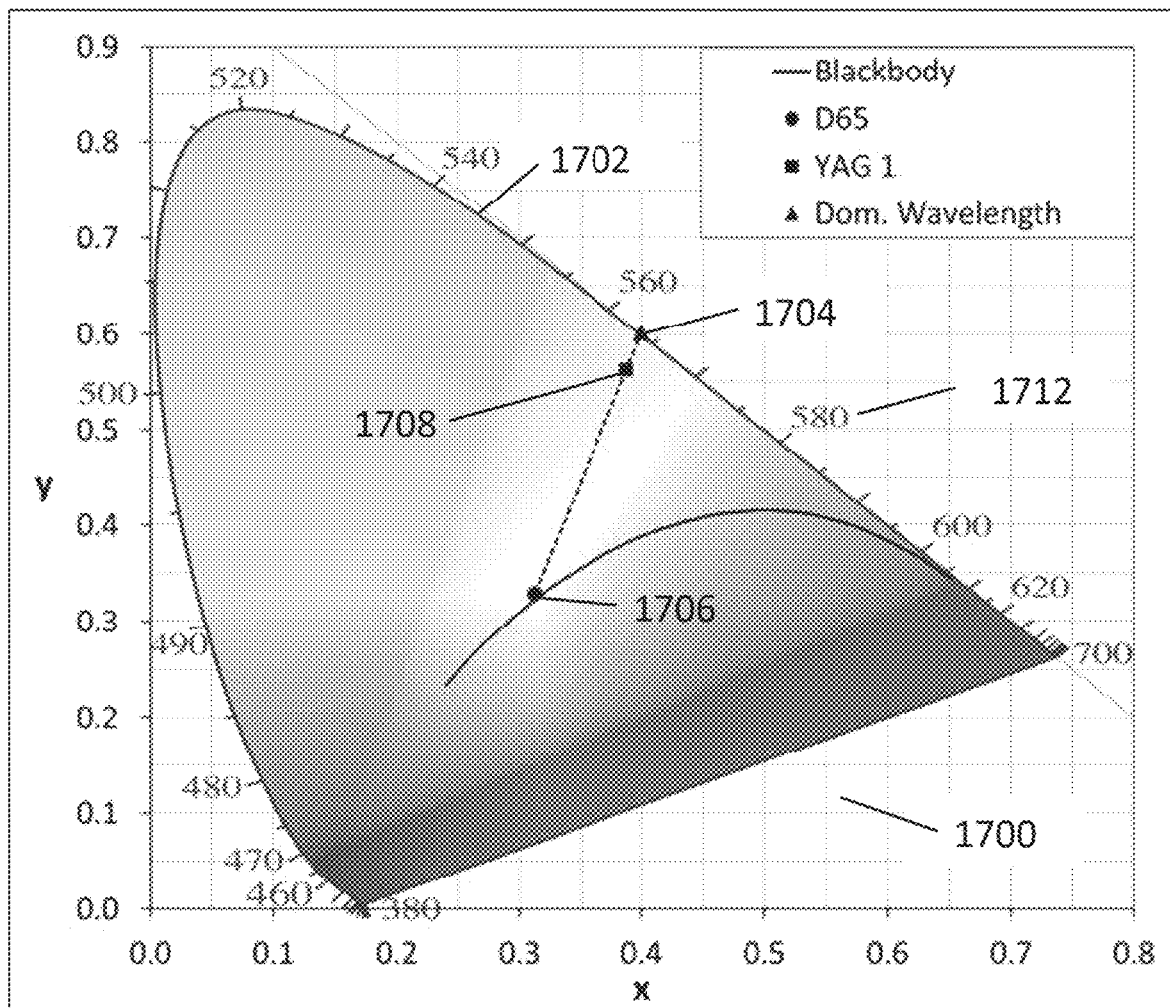
FIG. 17a illustrates the color coordinates in the 1931 CIE color system of the CIE standard illuminant D65, the color point of the YG phosphor YAG1 of FIG. 14, and the point on the spectrum locus (the perimeter of the CIE color space) of the resultant dominant wavelength of YAG1 according to some embodiments.
Figure 17B:
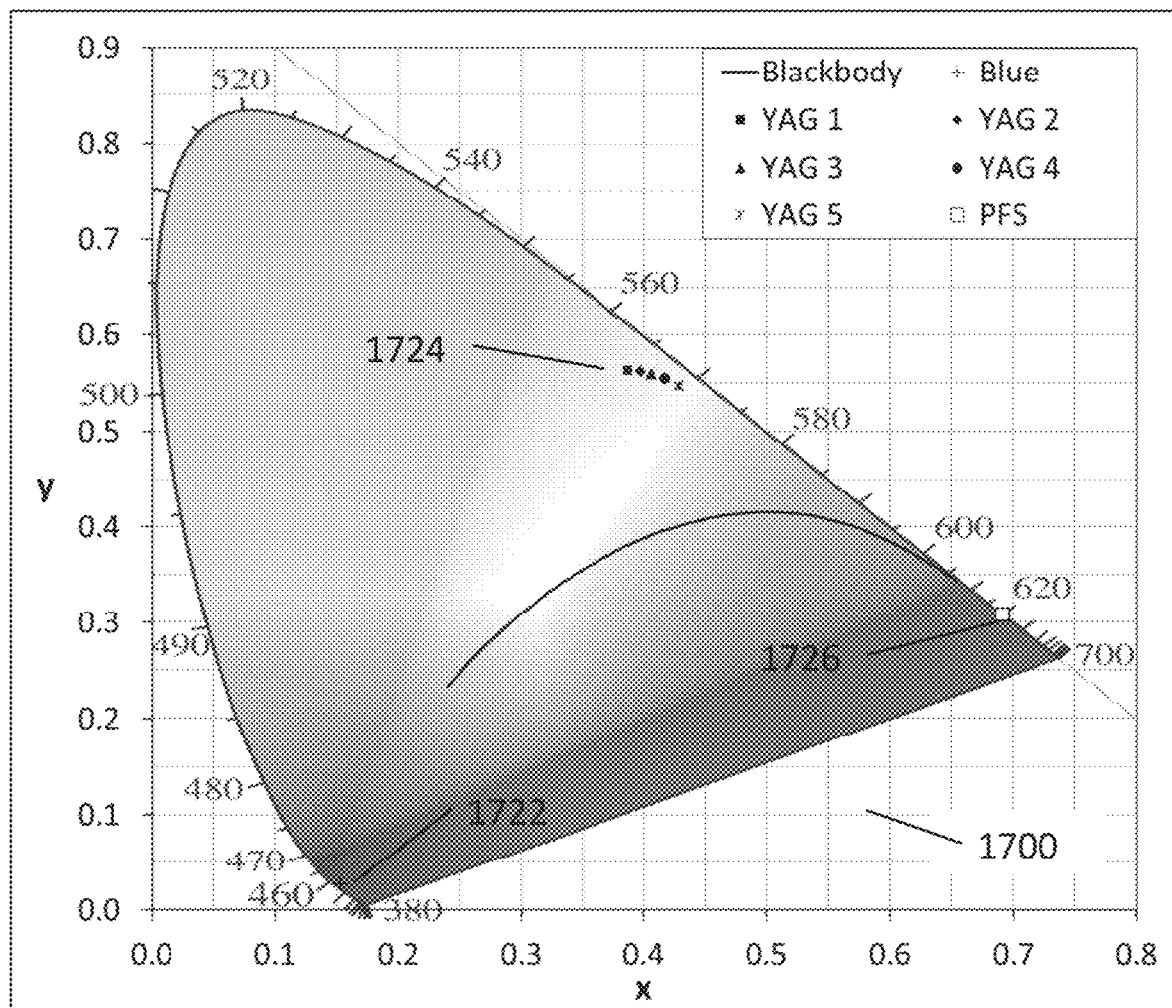
FIG. 17b illustrates the color coordinates in the 1931 CIE color system of the blue LED of FIG. 13, the five YG YAG phosphors of FIG. 14, and the NR phosphor of FIG. 16 according to some embodiments. (YG=yellow-green; NR=narrow red).
Figure 17C:
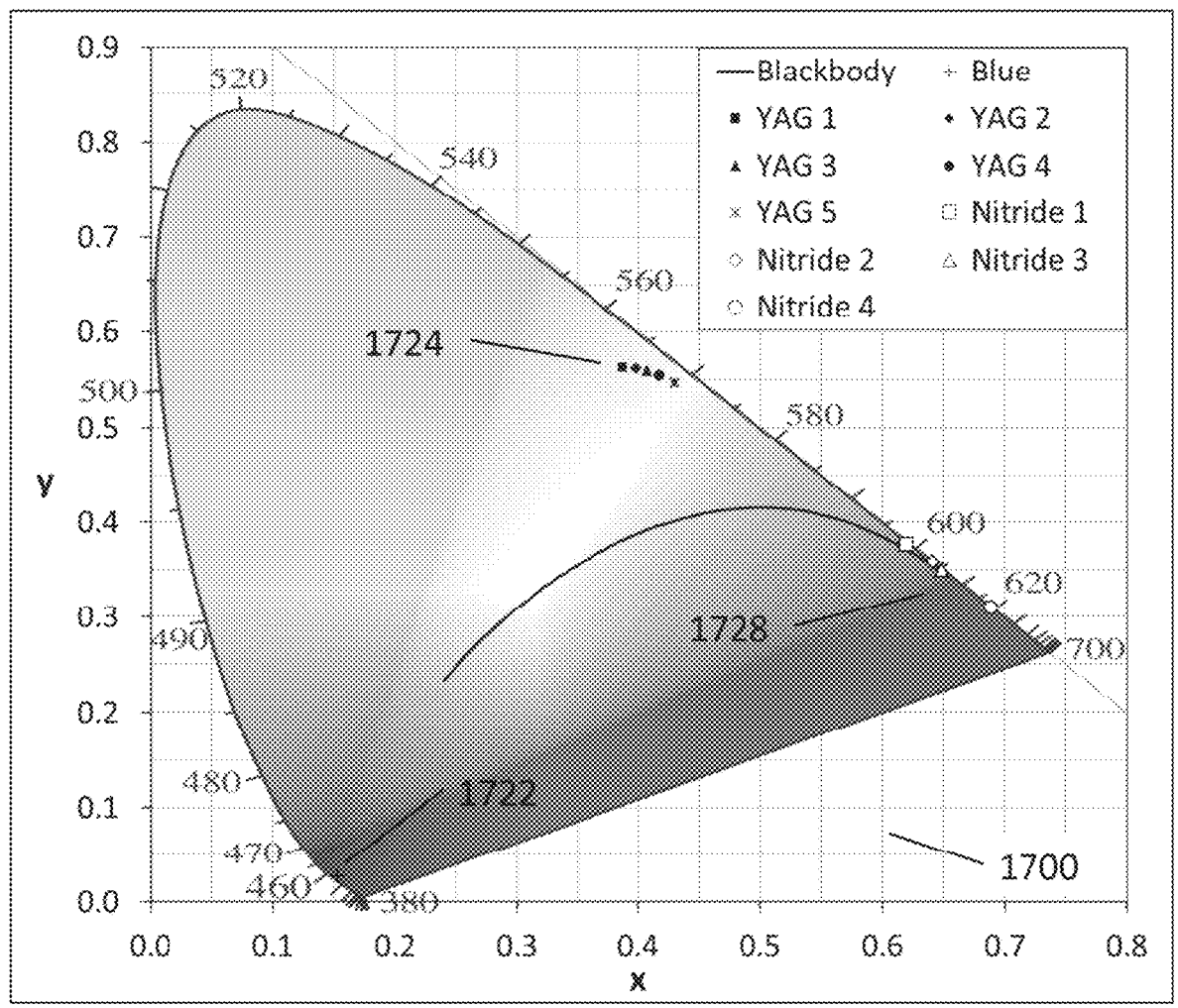
FIG. 17c illustrates the color coordinates in the 1931 CIE color system of the blue LED of FIG. 13, the five YG YAG phosphors of FIG. 14, and the four different broad red nitride phosphors of FIG. 15 according to some embodiments.

A notable, and unexpected, outcome of the DoE as described above is that LPI (and therefore the color preference of observers) can be sufficiently well predicted for any given red emitter in the DoE by closed-form analytic approximations using two of the independent variables in the DoE: dominant wavelength of the YAG phosphor (i.e., $Dom_{YAG}$); and Duv. In order to represent the results of the DoE in terms of dominant wavelength, FIGS. 17-21 serve to define each of the 25 YG and 20 BR phosphors in the DoE by its dominant wavelength. Whereas the peak wavelength of a light source is that wavelength at which the emitted intensity is a maximum, the dominant wavelength is that wavelength of pure monochromatic light that most closely matches the hue (perceived color) of the light source. As depicted in FIG. 17a, the dominant wavelength of a light source is formally defined (see Wyszecki and Stiles, Color Science: Concepts and Methods, Quantitative Data and Formulae, Wiley-Interscience; 2 edition (Aug. 8, 2000)) as the point 1704 on the spectrum locus 1702 (the perimeter of the CIE 1931 color space 1700) where a vector initiating at the achromatic D65 color point 1706, and passing through the color point 1708 of the test light source, intersects the spectrum locus 1702. The wavelengths, e.g., 580 nm 1712, along the spectrum locus 1702 are labeled in increments of 10, or more, nm. In FIG. 17b, the color points of the commercially available emitters used in the DoE are shown in the 1931 CIE color space 1700: a blue LED 1722 having peak wavelength at about 450 nm (as in FIG. 13); the 5 YG YAG:Ce phosphors 1724 (as in FIG. 14); and the single NR phosphor 1726 having peak wavelength at about 631 nm (as in FIG. 16). FIG. 17c is the same as FIG. 17b, but showing the 4 commercially available broad red nitride phosphors 1728 used in the DoE (as in FIG. 15), instead of the single NR phosphor.

Figure 18A:
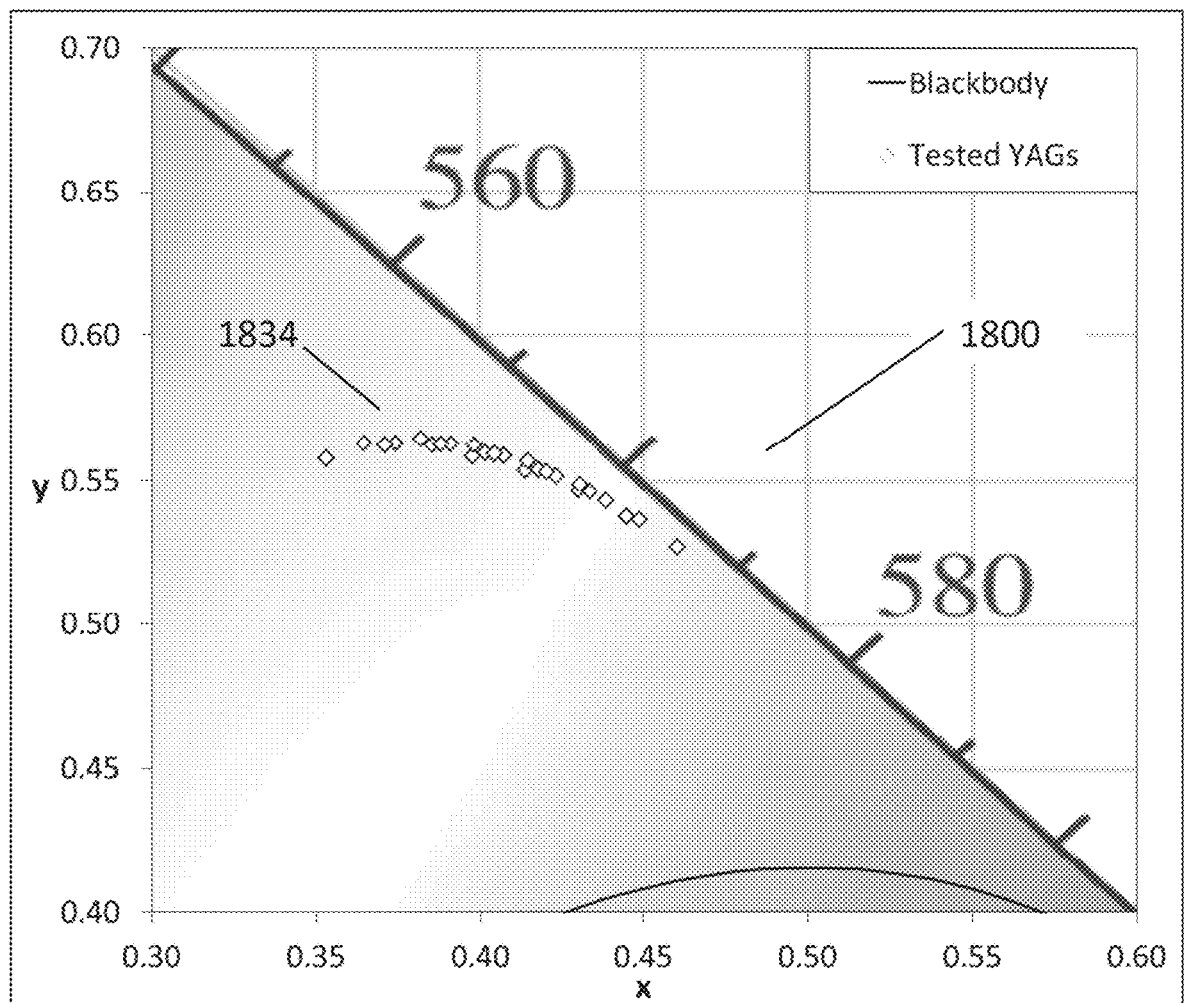
FIG. 18a illustrates the color coordinates in the 1931 CIE color system of the five commercially available YG YAG phosphors of FIG. 14, and also of a modification of each of the five YG YAG phosphors, where the peak wavelength is shifted by +10 nm, +5 nm, -5 nm, and -10 nm, providing a total of 25 SPDs representing a systematically parameterized, broad range of different YG YAG phosphors according to some embodiments.
Figure 18B:
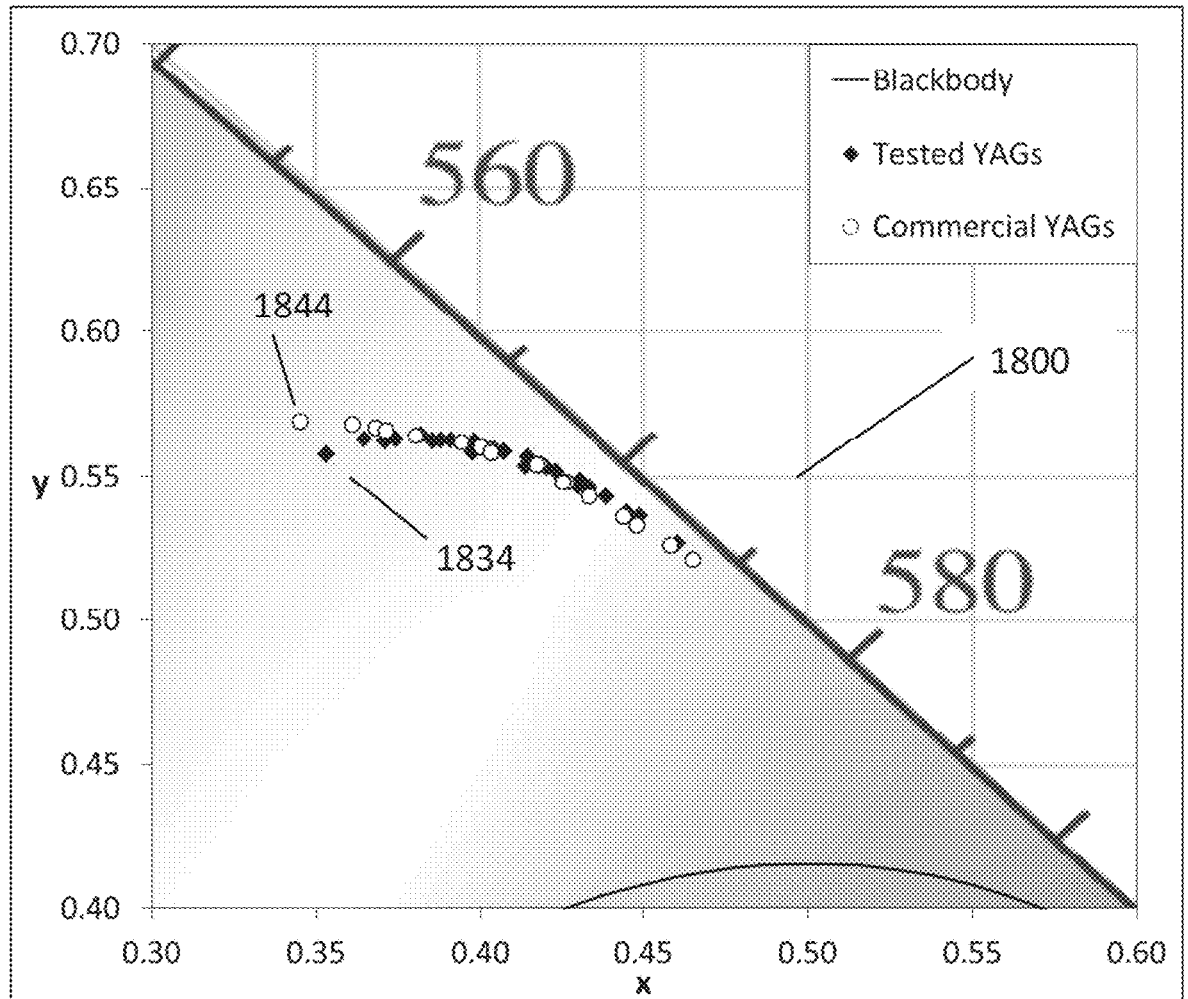
FIG. 18b illustrates the color coordinates in the 1931 CIE color system of the 25 systematically parameterized YG YAG:Ce phosphors of FIG. 18a, and also of 22 commercially available YG YAG phosphors according to some embodiments.

In FIG. 18a, the color points 1834 of the 25 YG phosphors used in the DoE are shown in a zoomed-in view of the 1931 CIE color space 1800: 5 commercially available YG YAG:Ce phosphors, along with a modification of each of the five commercially available YG YAG phosphors, where the emission spectrum is shifted by +10 nm, +5 nm, −5 nm, and −10 nm, representing a systematically parameterized, broad range of different YG YAG phosphors. In FIG. 18b, the color points 1844 of 22 commercially available YG YAG phosphors, representing essentially the full range of YG YAG:Ce phosphors that are presently commercially available, are shown in a zoomed-in view of the 1931 CIE color space 1800, along with the 25 YG phosphors 1834 of FIG. 18a that were used in the DoE. It is apparent from comparison of the color points of the group of 25 systematically parameterized YG phosphors used in the DoE with the 22 commercially available YG YAG:Ce phosphors, that the range of YG YAG:Ce phosphors that are presently commercially available is fully represented in the DoE.

Figure 19A:
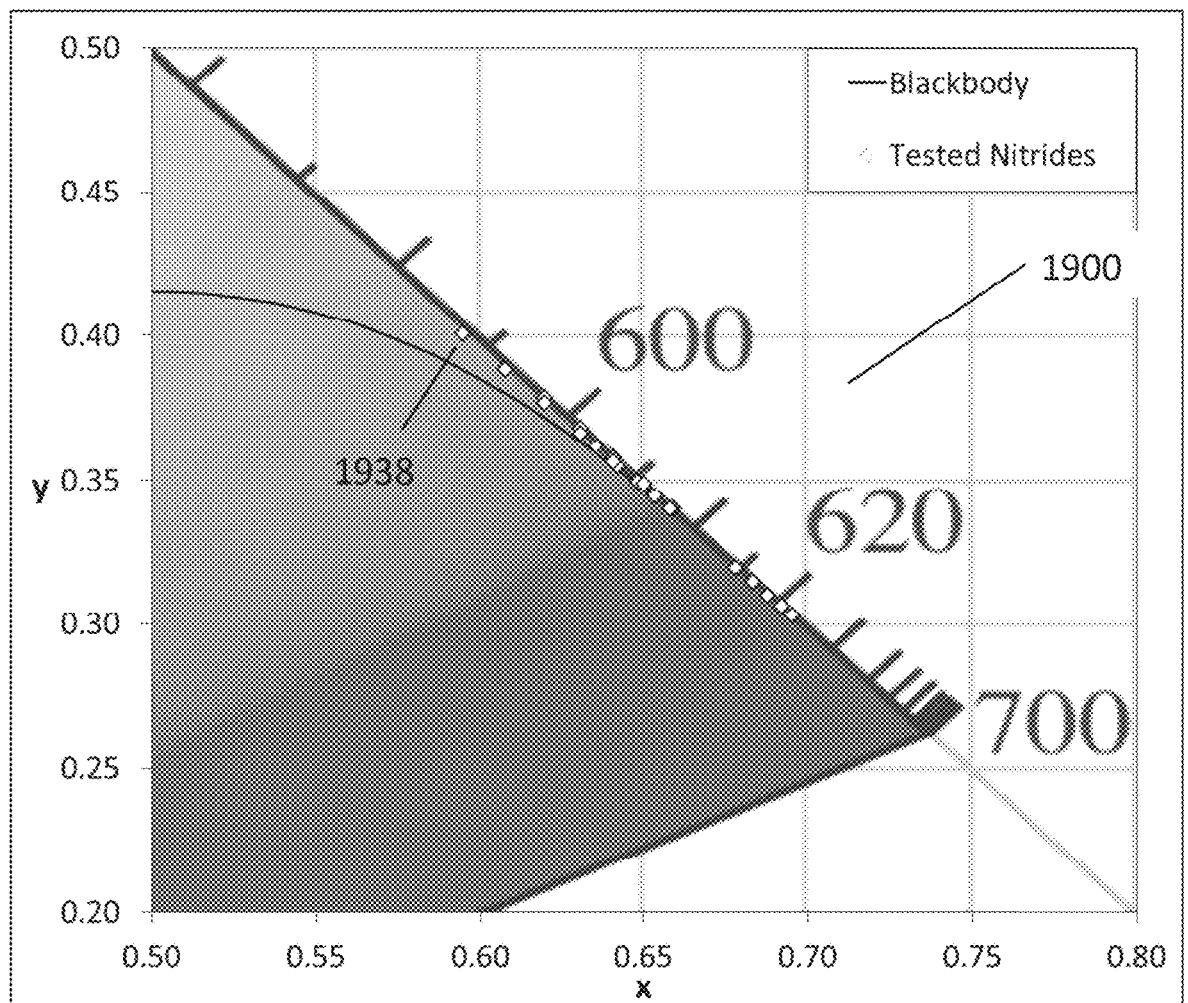
FIG. 19a illustrates the color coordinates in the 1931 CIE color system of the four broad red nitride phosphors of FIG. 15, and also of a modification of each of the four broad red nitride phosphors, where the peak wavelength is shifted by +10 nm, +5 nm, −5 nm, −10 nm, providing a total of 20 SPDs representing a systematically parameterized, broad range of different broad red nitride phosphors according to some embodiments.
Figure 19B:
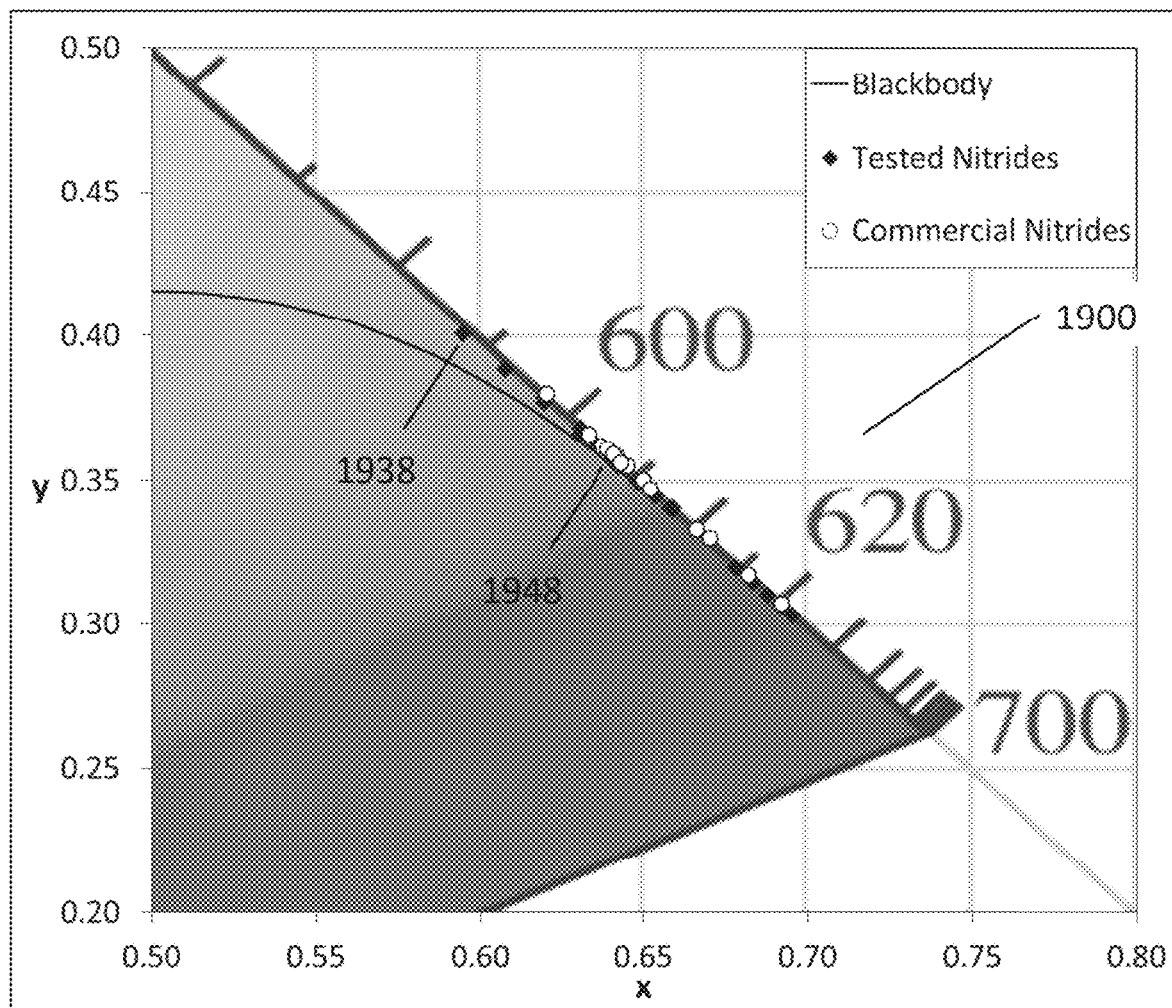
FIG. 19b illustrates the color coordinates in the 1931 CIE color system of the 20 systematically parameterized broad red nitride phosphors of FIG. 19a, and also of 14 presently commercially available broad red nitride phosphors according to some embodiments.

In FIG. 19a, the color points 1938 of the 20 BR phosphors used in the DoE are shown in a zoomed-in view of the 1931 CIE color space 1900: 4 commercially available broad red nitride phosphors, along with a modification of each of the four commercially available broad red nitride phosphors, where the emission spectrum is shifted by +10 nm, +5 nm, −5 nm, and −10 nm, representing a systematically parameterized, broad range of different BR phosphors. In FIG. 19b, the color points 1948 of 14 commercially available broad red nitride phosphors, representing essentially the full range of broad red nitride phosphors that are presently commercially available, are included along with the 20 BR phosphors 1938 of FIG. 19a that were used in the DoE. It is apparent from comparison of the color points of the group of 20 systematically parameterized BR phosphors used in the DoE with the 14 commercially available broad red nitride phosphors indicate that the range of broad red nitride phosphors that are presently commercially available is fully represented in the DoE.

Figure 14:
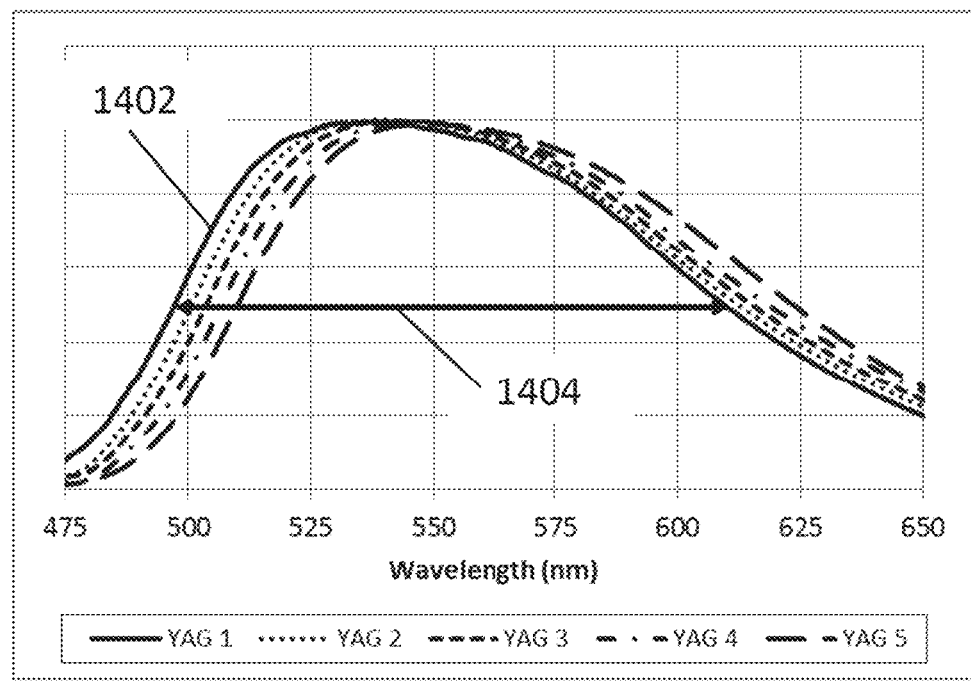
FIG. 14 illustrates a graph of the SPDs of five different yellow-green (YG) YAG:Ce phosphors according to some embodiments.
Figure 20:
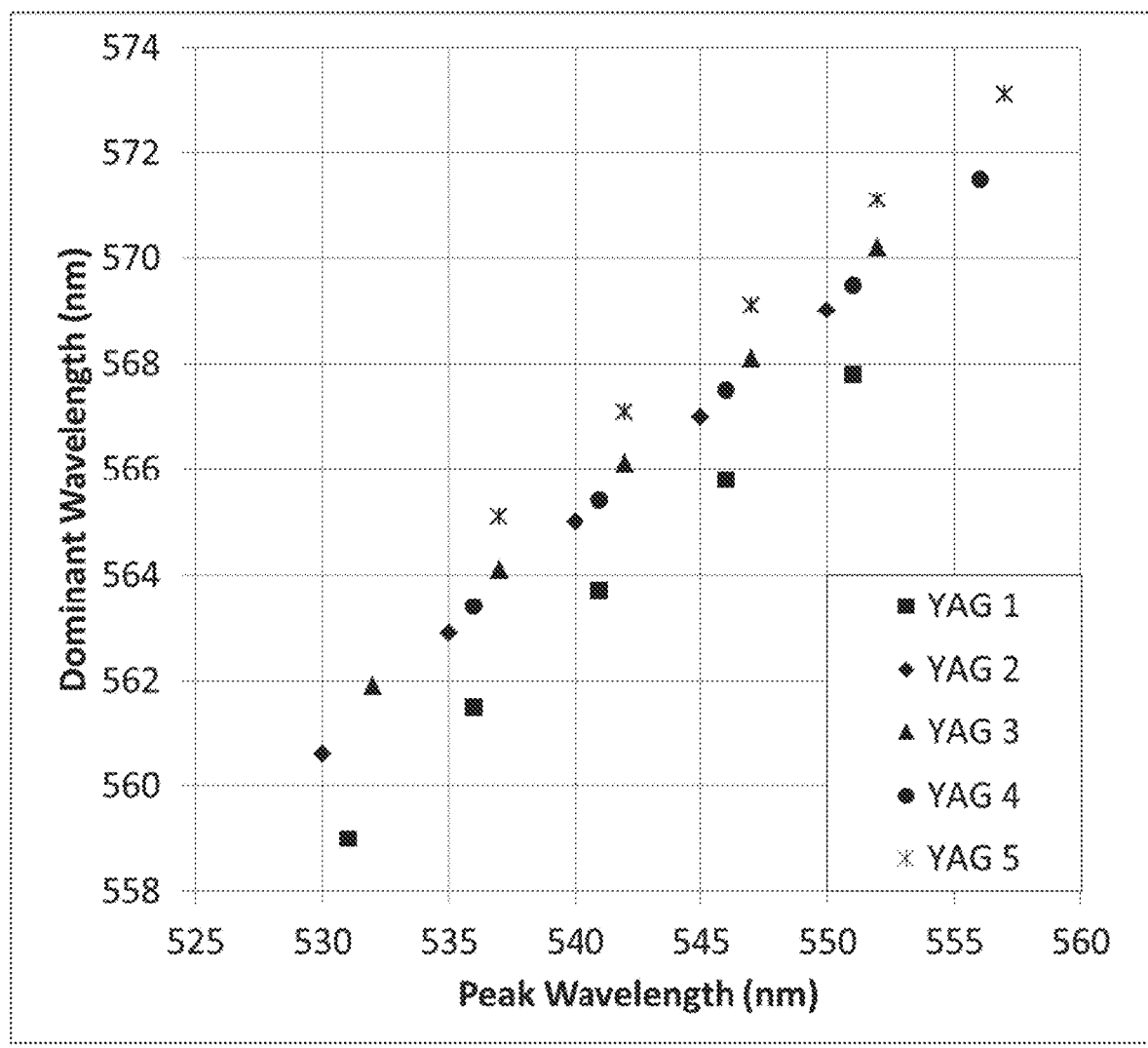
FIG. 20 illustrates the relationship between the peak wavelengths and the dominant wavelengths of the 25 systematically parameterized YG YAG phosphors of FIG. 18a according to some embodiments.
Figure 21:
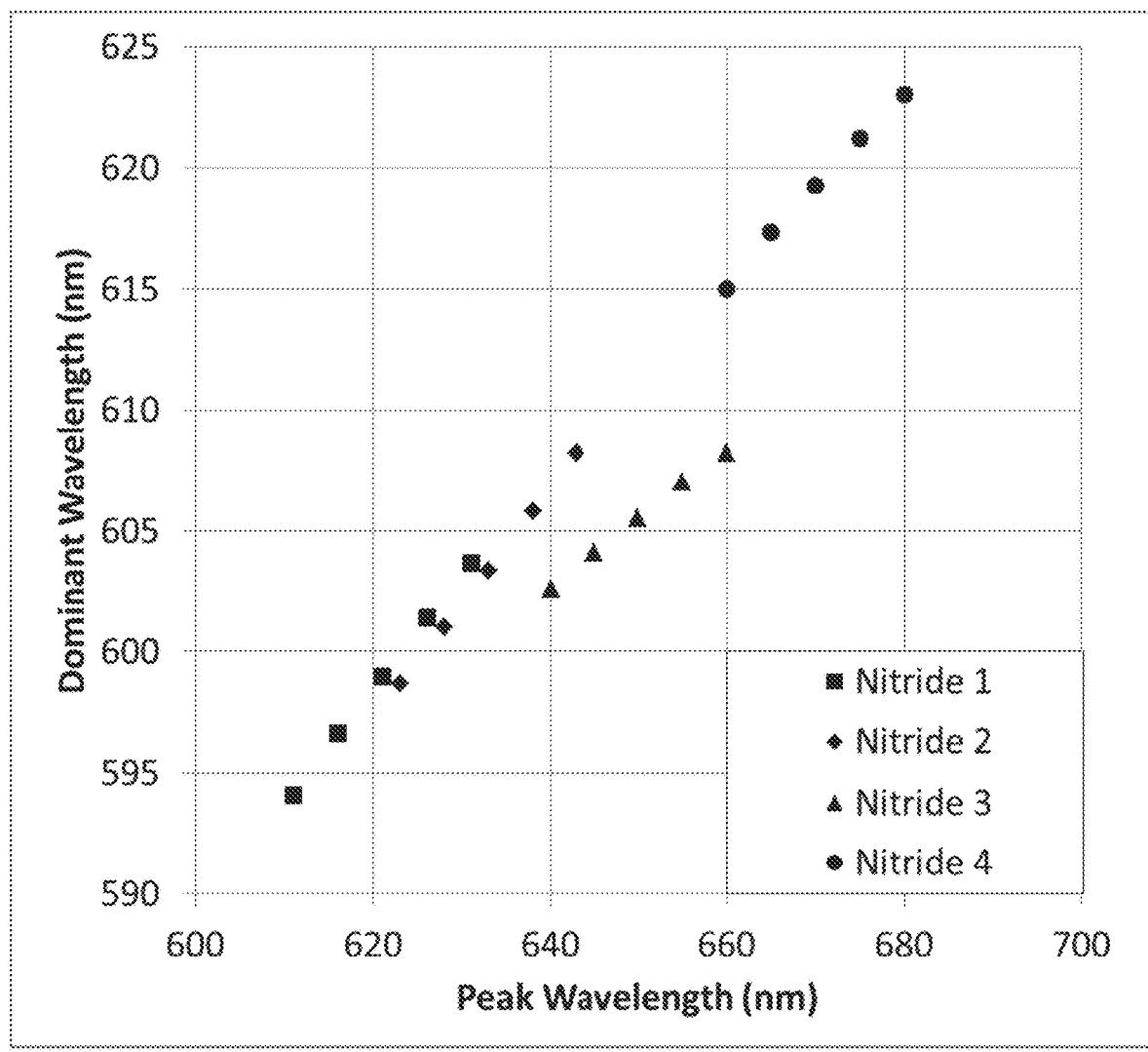
FIG. 21 illustrates the relationship between the peak wavelengths and the dominant wavelengths of the 20 systematically parameterized broad red nitride phosphors of FIG. 19a according to some embodiments.

Given that the peak wavelength of a light source is that wavelength at which the emitted intensity is a maximum, while the dominant wavelength is that wavelength of pure monochromatic light that most closely matches the hue (perceived color) of the light source, it is useful to compare these two wavelength metrics that partially describe the color of a phosphor. FIG. 20 shows the relationship between dominant and peak wavelengths for the 25 YG phosphors used in the DoE. As shown herein, the dominant wavelength is generally longer than the peak wavelength for each of the YG phosphors. This may be primarily due to the asymmetry of the phosphor emission, as seen in FIG. 14, where the long-wavelength tails are broader than the short-wavelength tails of each of the emission spectra, so that the perceived hue of each spectrum might be expected to be best represented by a monochromatic emitter having a wavelength longer than the peak wavelength of each YG phosphor. FIG. 21 shows the relationship between dominant and peak wavelengths for the 20 BR phosphors used in the DoE. As shown herein, the dominant wavelength is generally shorter than the peak wavelength for each of the BR phosphors. This may be primarily due to the extremely long wavelengths of the phosphor emission to the right of each peak wavelength as seen in FIG. 15, where the long-wavelength tails extend far beyond the wavelengths of the eye response (FIG. 1a), so that the left half of the emission spectrum has a stronger impact on the perceived hue than the right half of the spectrum so that each spectrum might be expected to be best represented by a monochromatic emitter having a wavelength shorter than the peak wavelength of each BR phosphor.

While each of the embodiments herein may be described as having a blue light source, a yellow-green garnet phosphor, a narrow red down-converter and/or a broad red down-converter, it is noted that at least one blue light source may be used, at least one yellow-green garnet phosphor may be used, at least one narrow red down-converter may be used, and/or at least one broad red down-converter may be used.

The Group 1 DoE (YAG+PFS) comprised all combinations of 1 blue LED, 25 YG YAG:Ce phosphors, and 1 NR PFS phosphor, resulting in 25 unique combinations of emitters (1 B×25 YG×1 NR) whereby the ratios of the blue:green:red emitted power for each of the 25 unique emitter combinations were varied to achieve each of 10 color points (2700 K and 3000 K; Duv=0.000, −0.005, −0.010, −0.015, −0.020), resulting in 250 unique SPDs. In one or more embodiments, each normalized SPD is sufficient for calculation of all colorimetric characteristics of the light source, assuming that the illuminance of the lighted object or space is in the range of normal photopic vision (i.e., greater than about 10-100 lux, up to about 1,000-10,000 lux (lux=lumens/m$^2$). The colorimetric response of interest, LPI, is plotted in FIG. 22a vs. $Dom_{YAG}$ (x-axis) and Duv (y-axis) of the color point at 2700 K. LPI is plotted in FIG. 22b vs. $Dom_{YAG}$ and Duv of the color point at 3000 K. In one or more embodiments, the dominant wavelength of the yellow-green garnet phosphor (YAG in this example) may be in a range of 559 nm to about 574 nm. In FIG. 23, the $Dom_{YAG}$ and Duv values of the 250 unique SPDs used in the Group 1 DoE are shown as groups of 25 different $Dom_{YAG}$ at each of 5 different Duv, superimposed on the background of the shading of the LPI iso-contours. Other suitable Duv levels may be used. Similar contour plots can be presented for a continuum of Duv levels within the range of Duv presented herein, with similar trends being realized. The smooth curves for LPI shown in FIGS. 22a,b are obtained from the statistically optimized ANOVA regression fit to the data, where LPI=f(CCT, Duv, $Dom_{YAG}$), including polynomial terms as high as quartic, and all resultant variable interactions, providing a transfer function having Adjusted $R^2$>0.99. One skilled in the art will recognize that there is a relative lack of features having higher order than quadratic in the LPI contours having LPI values of 120 and higher (even though terms as high as quartic are included in the transfer function for LPI), and that there are smooth transitions between the contours presented, so that it is reasonable to expect that the transfer function for LPI is a smooth and continuous representation of the underlying 250 discrete DoE runs. One skilled in the art will understand that the solutions representing all 250 combinations of SPDs comprised of a blue LED, a YG YAG:Ce phosphor, and a NR phosphor are quantitatively described with very low error ($R^2$>0.99) by the transfer function LPI=f(CCT, Duv, $Dom_{YAG}$) as represented by the LPI contour plots. Thereby, the transfer function LPI=f(CCT, Duv, $Dom_{YAG}$) as represented by the LPI contour plots is considered to be valid for all CCT, Duv and $Dom_{YAG}$ within the ranges bounded by the discrete runs in the DoE.

Figure 24:
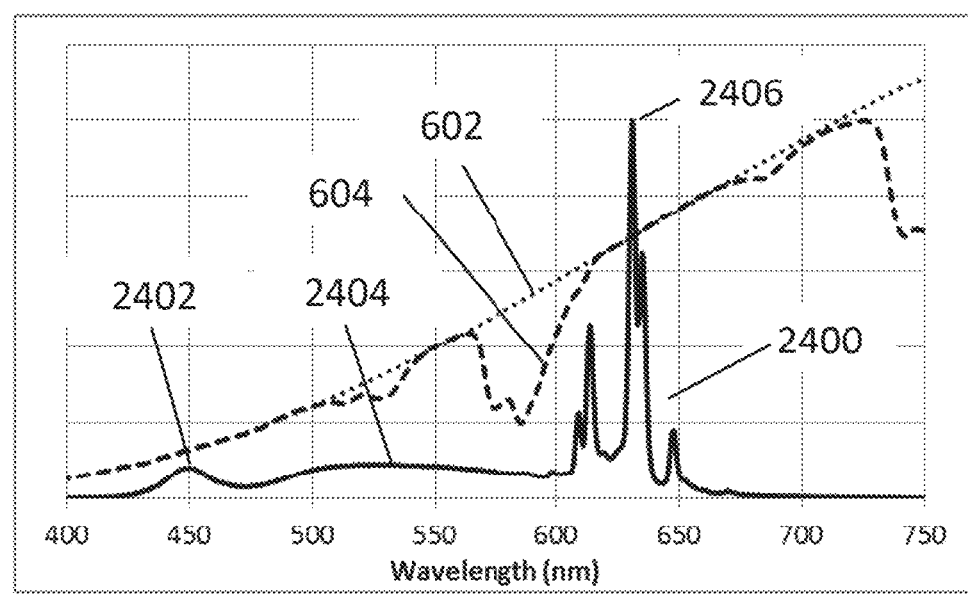
FIG. 24 illustrates the SPD of the discrete run having the highest LPI value for a light source comprising a blue LED, a YG YAG phosphor, and a NR phosphor at 2700 K according to some embodiments.

The particular SPD 2400 in the Group 1 DoE (YAG+PFS) having the highest LPI value of about 137, corresponding to $Dom_{YAG}$ of about 559 nm, and Duv at about −0.010, with CCT=2700 K, is illustrated in FIG. 24, showing the peak wavelength of the blue LED 2402 at about 450 nm, the peak wavelength of the YG YAG:Ce phosphor 2404 at about 531 nm, the peak wavelength of the NR PFS phosphor 2406 at about 631 nm; and is compared with the SPD 604 of a Reveal® incandescent lamp and with the SPD 602 of a blackbody emitter, each having similar CCT. Of note, in one or more embodiments, an LPI of at least 140 may be achieved with YAG and a narrow red down-converter having a more favorable wavelength than the peak wavelength of the PFS phosphor which is fixed at 631 nm, or by using two or more narrow red down-converters, having different peak wavelengths.

Figure 22A:
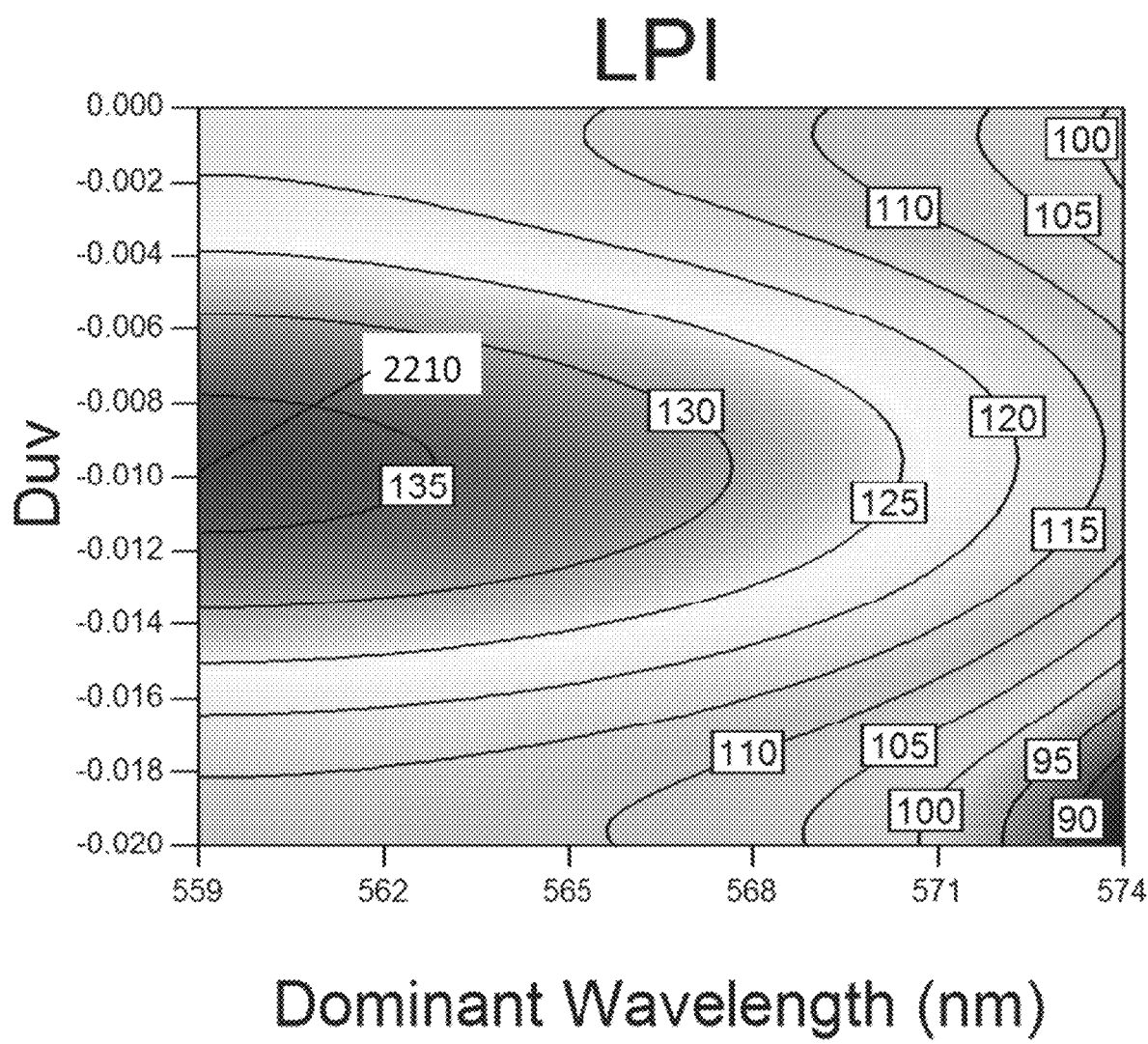
FIG. 22a illustrates the contour plot of Lighting Preference Index (LPI) versus dominant wavelength of the YG YAG phosphor on the x-axis, and the location of the color point of the light source in the CIE 1960 u-v color space, relative to the BBL at 2700 K, as quantified by Duv on the y-axis, where the red emitter is the NR phosphor of FIG. 16 according to some embodiments.
Figure 22B:
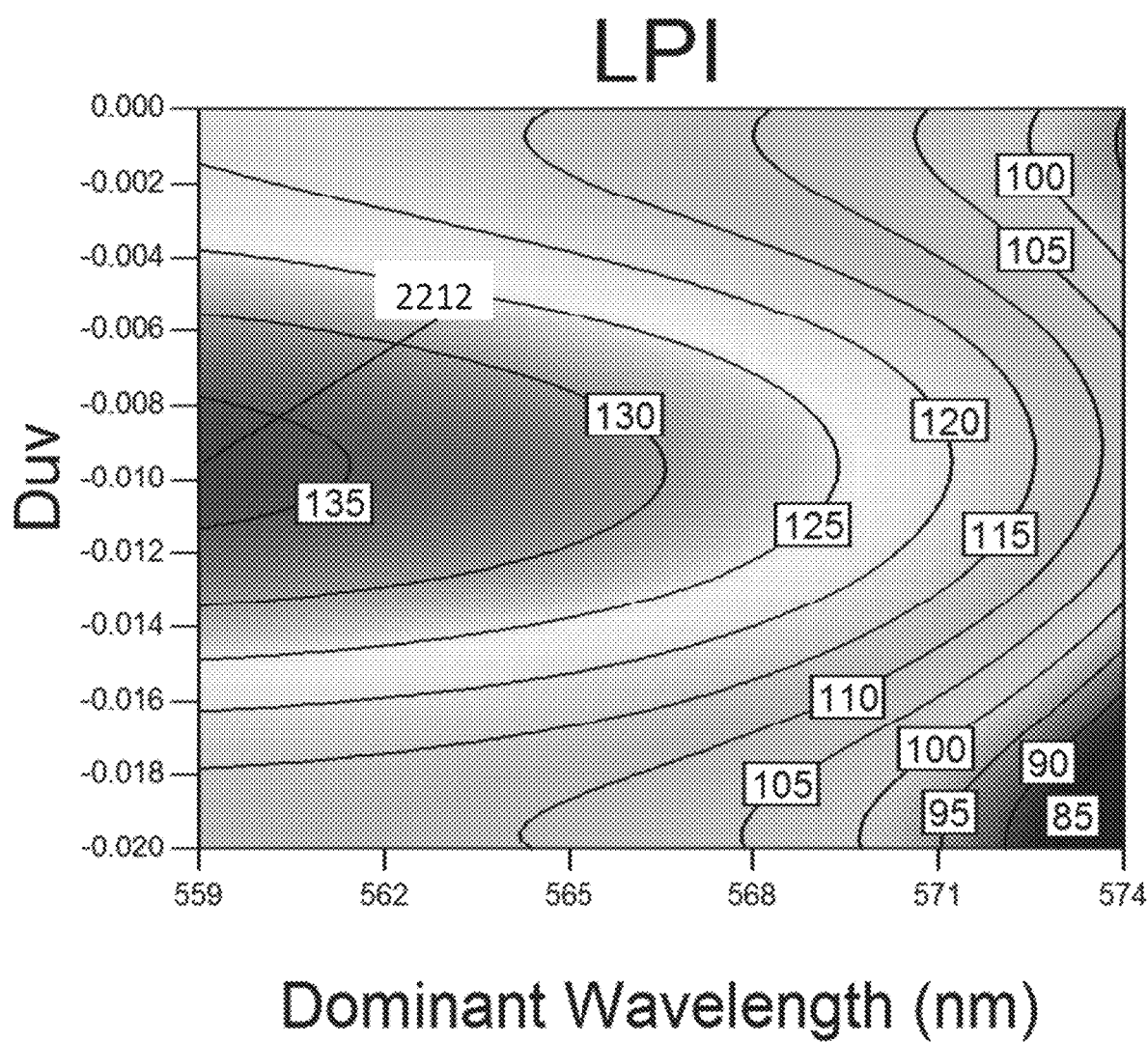
FIG. 22b illustrates the contour plot of LPI versus dominant wavelength of the YG YAG phosphor on the x-axis, and the location of the color point of the light source in the CIE 1960 u-v color space, relative to the BBL at 3000 K, as quantified by Duv on the y-axis, where the red emitter is the NR phosphor of FIG. 16 according to some embodiments
Figure 23:
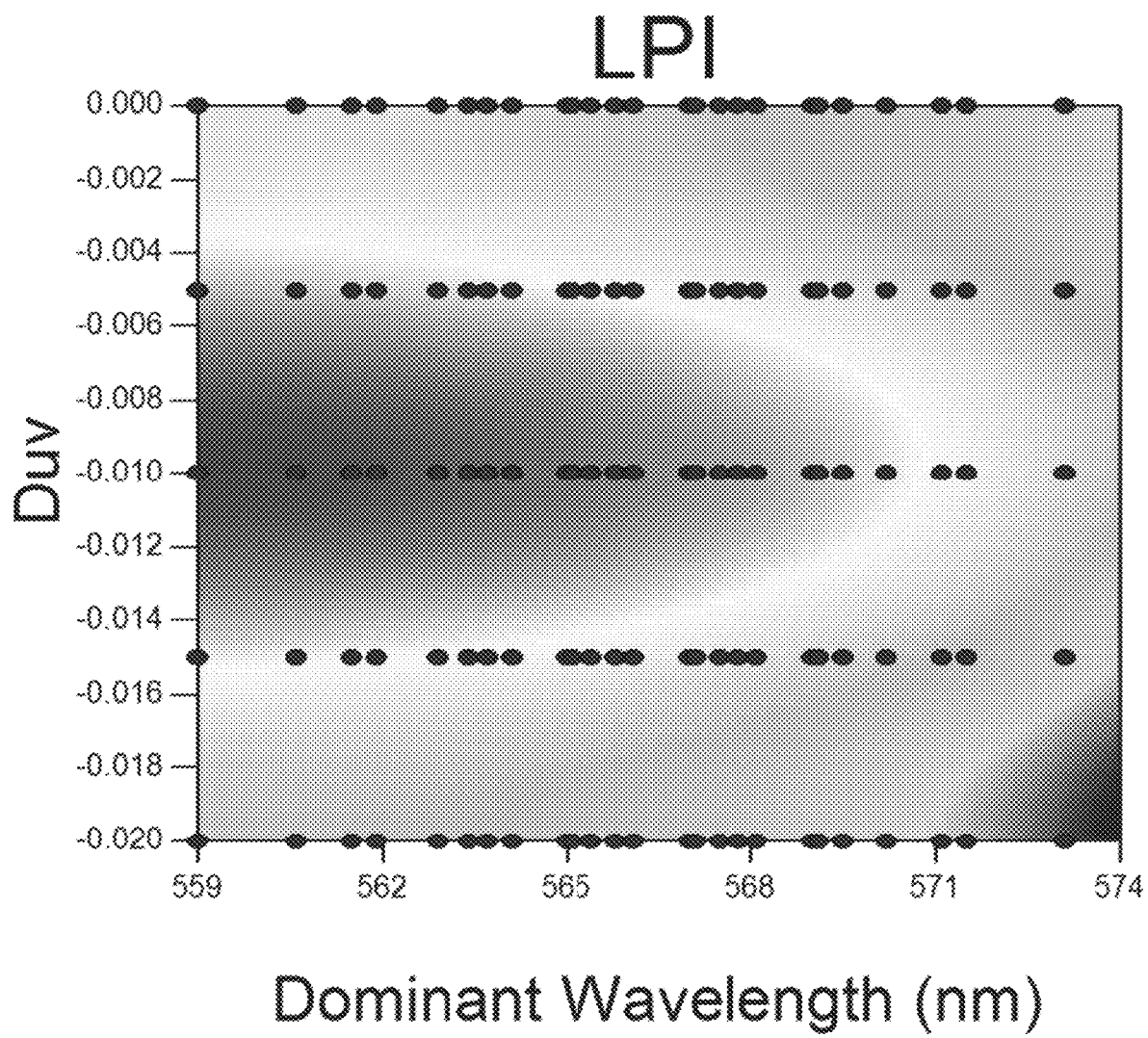
FIG. 23 illustrates the discrete runs represented by the dominant wavelength of the YG YAG phosphor, and by Duv, overlaid on the contour plot of the LPI response from FIG. 22a, where the red emitter is the NR phosphor of FIG. 16 according to some embodiments.

FIGS. 22a,b demonstrate that at both 2700 K and 3000 K, if the color point of the light source is on the blackbody locus (Duv=0.000), then LPI is <120 (approximately the upper limit for LPI found in the prior art), at all $Dom_{YAG}$ (i.e., for any commercially available YG YAG:Ce phosphor). As Duv is reduced, LPI generally increases at all $DOM_{YAG}$, and reaches a maximum value for Duv of about −0.010, the value of Duv where the Whiteness component of LPI is maximized, per Equation (1), resulting in a significant degree of vertical symmetry in the iso-contours of LPI about a horizontal line at about Duv=−0.010. As Duv goes from Duv=0.000 to Duv=−0.010, the Whiteness component of the LPI equation increases from 0 to 1, resulting in a 19 point increase in LPI based on Equation (7). Similarly, as Duv goes from Duv=−0.010 to Duv=−0.20, the Whiteness component decreases from 1 to 0, resulting in a 19 point decrease in LPI.

The nearly monotonically increasing LPI with decreasing $Dom_{YAG}$, at a given Duv, may be primarily due to the separation in wavelength between the YG emitter and the narrow red emitter, diminishing the typically large emission in the yellow, or even creating a depression in the yellow portion of the spectrum (e.g. about 570 to about 600 nm) which enhances the perceived saturation of red-green opponent colors, and blue-yellow opponent colors. Those two dominant trends in FIGS. 22a,b: that LPI tends toward a maximum value at Duv about −0.010; and that LPI tends toward a maximum value at shorter $Dom_{YAG}$, for this set of commercially available emitters (blue LED, YG YAG:Ce phosphor, and NR phosphor) suggest that the LPI contours might be approximated in a closed-form analytical formula containing only the terms Duv to prescribe Whiteness, and $Dom_{YAG}$ as a surrogate for Color Appearance. The general absence of high-order irregularities in the LPI contours having values of 120 and higher suggests that such an analytical approximation to those high-LPI contours might have a relatively simple format that holds for most or all of the LPI contours to be generated in the DoE. In one or more embodiments, the visual appearance of the high-LPI contours suggest that an ellipse might provide the best fit for the high-LPI contours. The general form of Equation (9) below has provided agreement between the exact LPI contour and the elliptical approximation for every LPI contour in FIGS. 22a,b having LPI of 120 or higher:

$$Dom_{YAG} < a\sqrt{1-\left(\frac{Duv+.0095}{b}\right)^2} + 569.8 - 0.004 * CCT \quad \text{Equation (9)}$$

The trend of LPI vs. CCT may be accurately described by the simple linear term in Equation (9). The values for coefficients, a and b, in Equation (9) are given in Table 2 below for each LPI value of 120 and higher for FIGS. 22a,b.

TABLE 2

| | LPI | | | |
|---|---|---|---|---|
| | 120 | 125 | 130 | 135 |
| a | 13.3 | 11.4 | 8.7 | 3.8 |
| b | 0.0070 | 0.0055 | 0.0040 | 0.0020 |

Substituting the values for a and b from the LPI=120 column in Table 2 into Equation (9), the explicit formula for the elliptical approximation to the exact contour for LPI=120, results in Equation (9a) below.

$$Dom_{YAG} < 13.3\sqrt{1-\left(\frac{Duv+.0095}{.0070}\right)^2} + \quad \text{Equation (9a)}$$
$$569.8 - 0.004 * CCT \text{ for } LPI = 120$$

$$Dom_{YAG} < 11.4\sqrt{1-\left(\frac{Duv+.0095}{.0055}\right)^2} + \quad \text{Equation (9b)}$$
$$569.8 - 0.004 * CCT \text{ for } LPI = 125$$

$$Dom_{YAG} < 8.7\sqrt{1-\left(\frac{Duv+.0095}{.0040}\right)^2} + \quad \text{Equation (9c)}$$
$$569.8 - 0.004 * CCT \text{ for } LPI = 130$$

$$Dom_{YAG} < 3.8\sqrt{1-\left(\frac{Duv+.0095}{.0020}\right)^2} + \quad \text{Equation (9d)}$$
$$569.8 - 0.004 * CCT \text{ for } LPI = 135$$

Figure 25A:
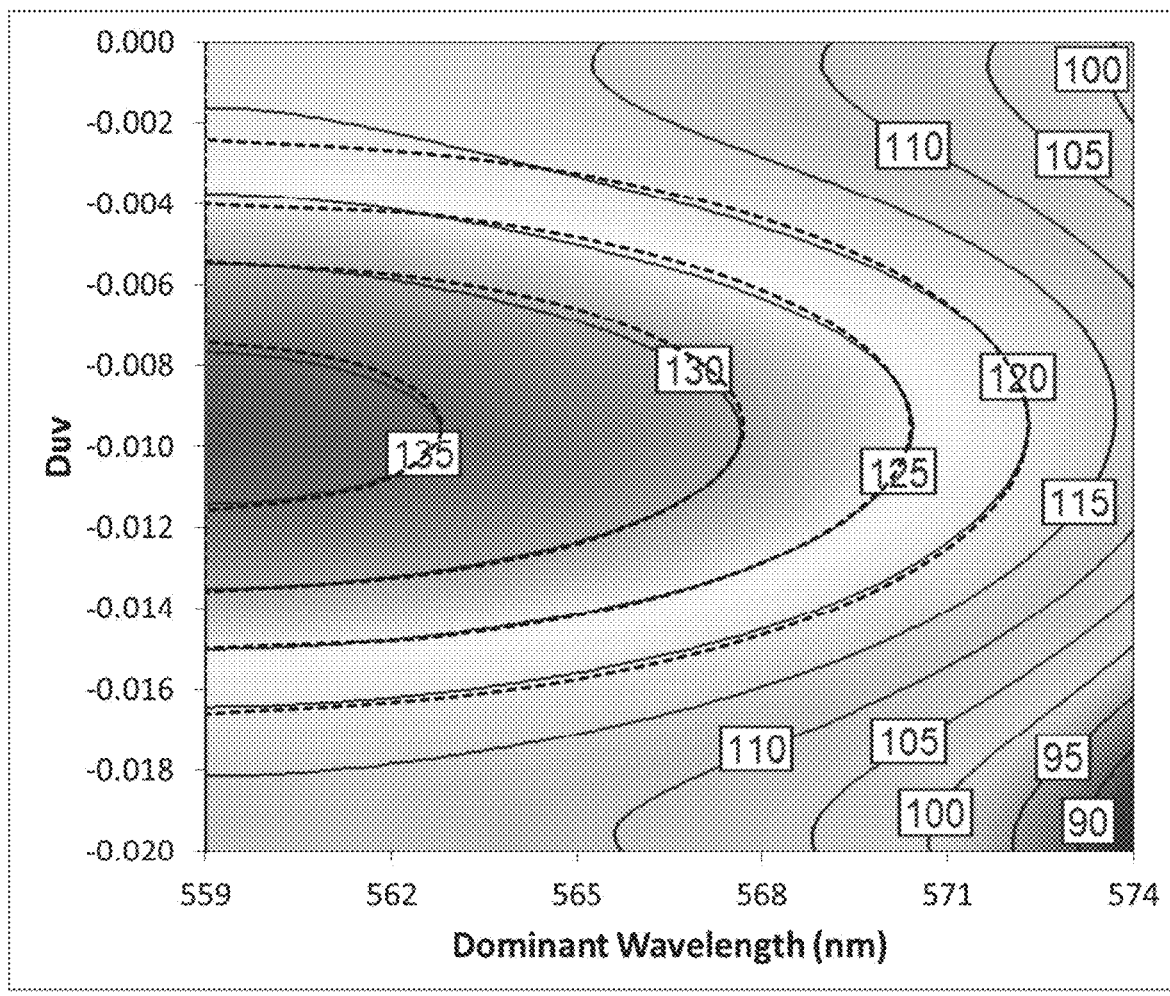
FIG. 25a illustrates a family of analytic approximations to each of the LPI contours at 2700 K from FIG. 22a where the red emitter is the NR phosphor of FIG. 16, overlaid on the actual LPI contours according to some embodiments.
Figure 25B:
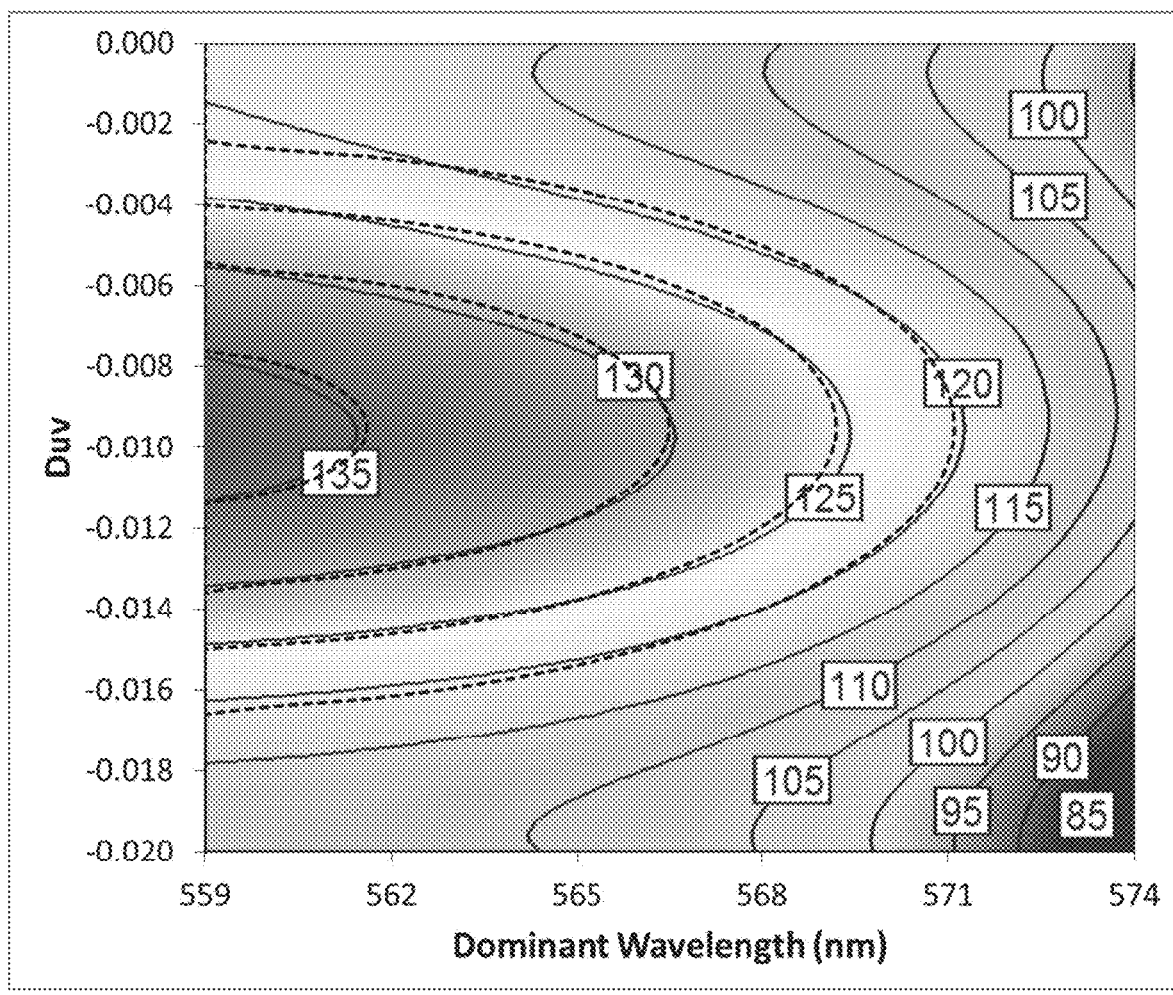
FIG. 25b illustrates a family of analytic approximations to each of the LPI contours at 3000 K from FIG. 22b where the red emitter is the NR phosphor of FIG. 16, overlaid on the actual LPI contours according to some embodiments.

Equations (9a-d) provide the dashed-line ellipses shown in FIG. 25a for CCT=2700, and in FIG. 25b for CCT=3000 K. As seen in FIGS. 25a,b, the dashed-line elliptical approximations deviate from the respective exact LPI contours by an amount not exceeding about 2 points in LPI at any location, on any LPI contour, having a value of 120 or higher. It is known that differences in CRI values of less than about 5 points, and especially less than about 2 points, are generally not perceivable by most observers. It has also been observed in working with LPI, that LPI values of less than about 5 points, and especially less than about 2 points, are generally not perceivable by most observers. This is to be expected, since the LPI scale has been intentionally made proportional to the CRI scale, in order to provide a similar degree of quantitative differentiation with LPI as is obtained with CRI.

Figure 26:
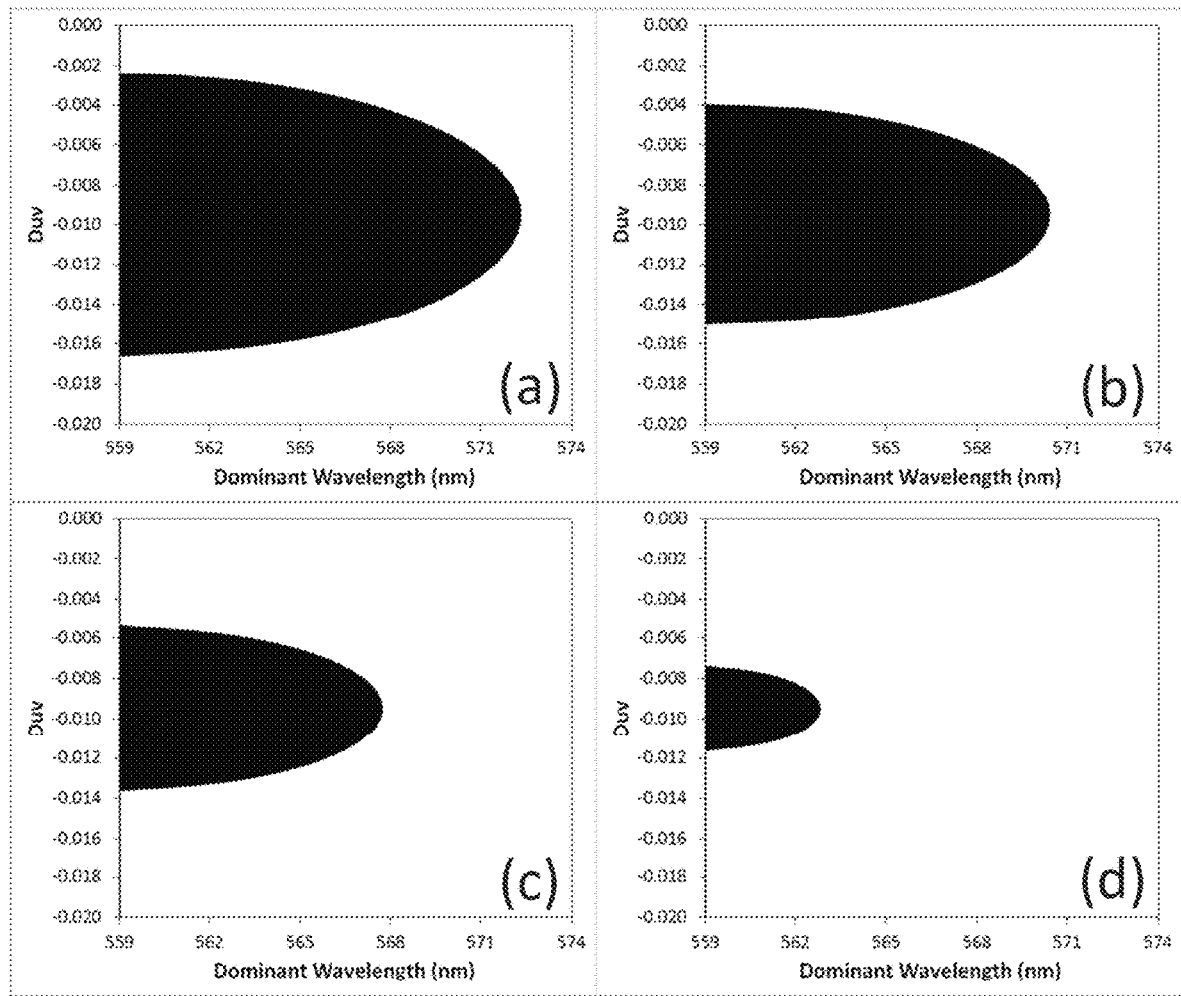
FIG. 26 illustrates the dark shaded region defined by the analytic approximations to the LPI=120 (FIG. 26a), 125 (FIG. 26b), 130 (FIG. 26c), and 135 (FIG. 26d) contours at 2700 K, indicating the design spaces that provide for LPI 120, 125, 130, 135, respectively, where the red emitter is the NR phosphor of FIG. 16 according to some embodiments.

In FIG. 26a, the region described by Equation 9a, for the LPI=120 contour, for CCT=2700, in the Group 1 DoE (YAG+PFS), is shown shaded in black. Likewise, in FIGS. 26b-d, the regions described by Equation 9b-d, for the LPI=125, 130, and 135 contours are shown shaded in black.

The Group 2 DoE (YAG+Nit) comprised all combinations of 1 blue LED, 25 YG YAG:Ce phosphors, and 20 BR Nitride phosphors, resulting in 500 unique combinations of emitters (1 B×25 YG×20 BR), whereby the ratios of the blue:green:red emitted power for each of the 500 unique emitter combinations were varied to achieve each of 10 color points (2700 K and 3000 K; Duv=0.000, −0.005, −0.010, −0.015, −0.020), resulting in 5000 unique SPDs. Each normalized SPD is sufficient for calculation of all colorimetric characteristics of the light source, assuming that the illuminance of the lighted object or space is in the range of normal photopic vision (i.e., greater than about 10-100 lux, up to about 1,000-10,000 lux (lux=lumens/m$^2$). The colorimetric response of interest, LPI, is plotted in FIG. 27a vs. $Dom_{YAG}$ (x-axis) and Duv (y-axis) of the color point at 2700 K, for the case of a BR phosphor having peak wavelength ($Peak_{Nit}$) of 610 nm. The range of $Peak_{Nit}$ that were used in the Group 2 DoE is shown in FIG. 21 to be from about 610 nm to about 680 nm, including 20 different BR phosphors in that range.

Figure 27A:
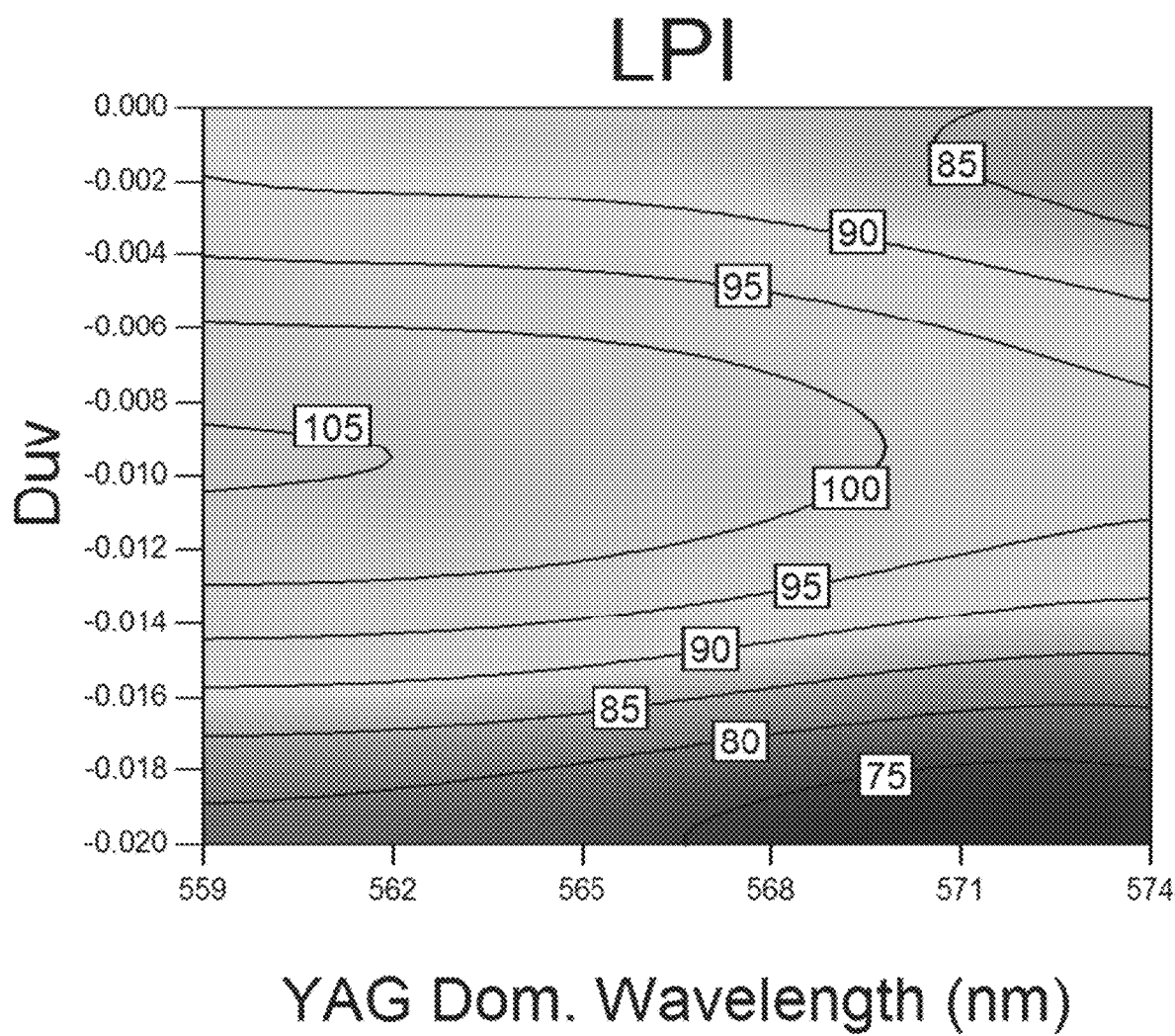
FIGS. 27a-h illustrate the contour plots at 2700 K of LPI versus dominant wavelength of the YG YAG phosphor on the x-axis, and Duv on the y-axis, where the red emitter is the broad red nitride phosphor of FIG. 15 having peak wavelength of 610 nm (FIG. 27a), 620 nm (FIG. 27b), 630 nm (FIG. 27c), 640 nm (FIG. 27d), 650 nm (FIG. 27e), 660 nm (FIG. 27f), 670 nm (FIG. 27g), 680 nm (FIG. 27h) according to some embodiments.
Figure 27B:
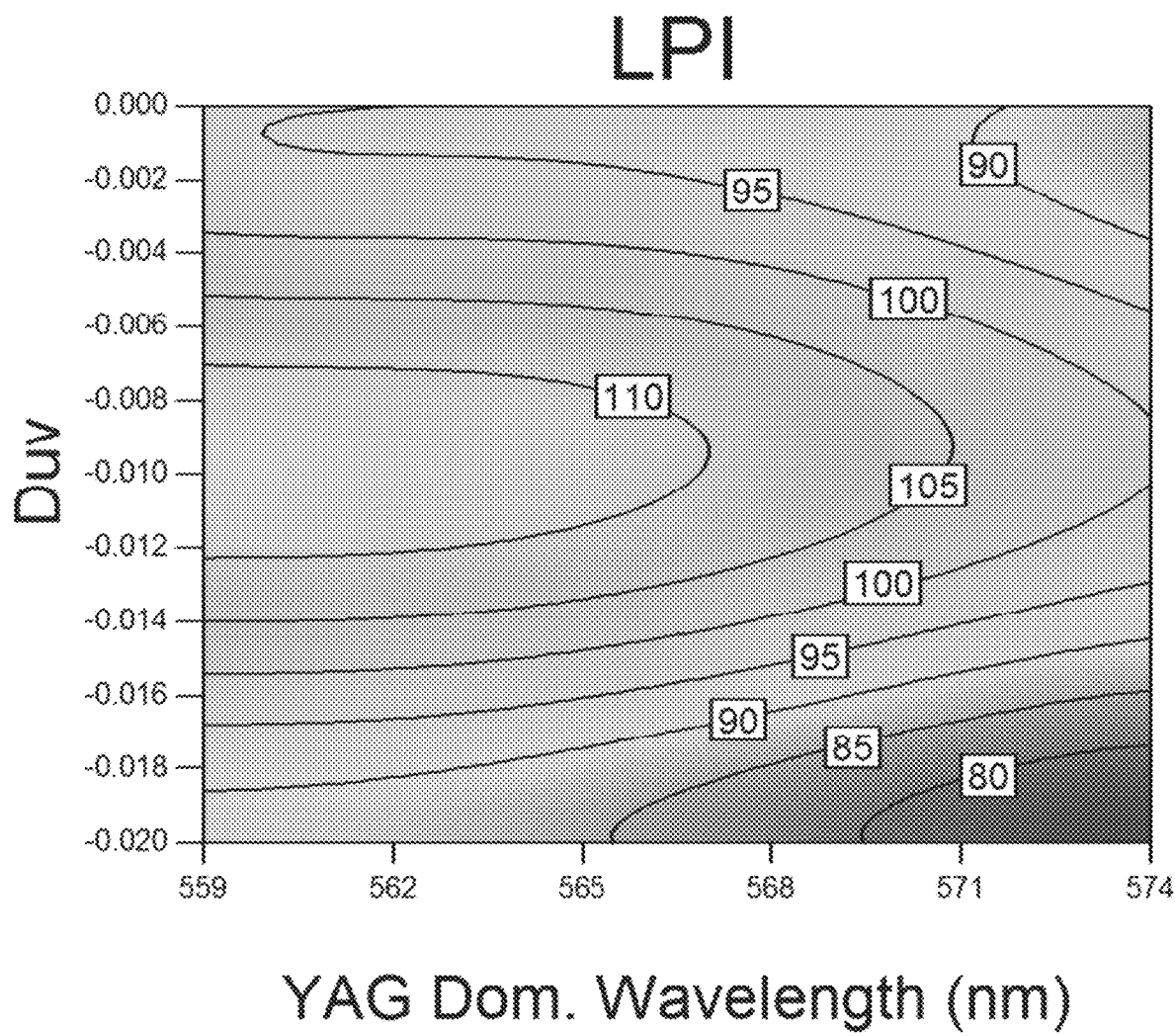
Figure 27C:
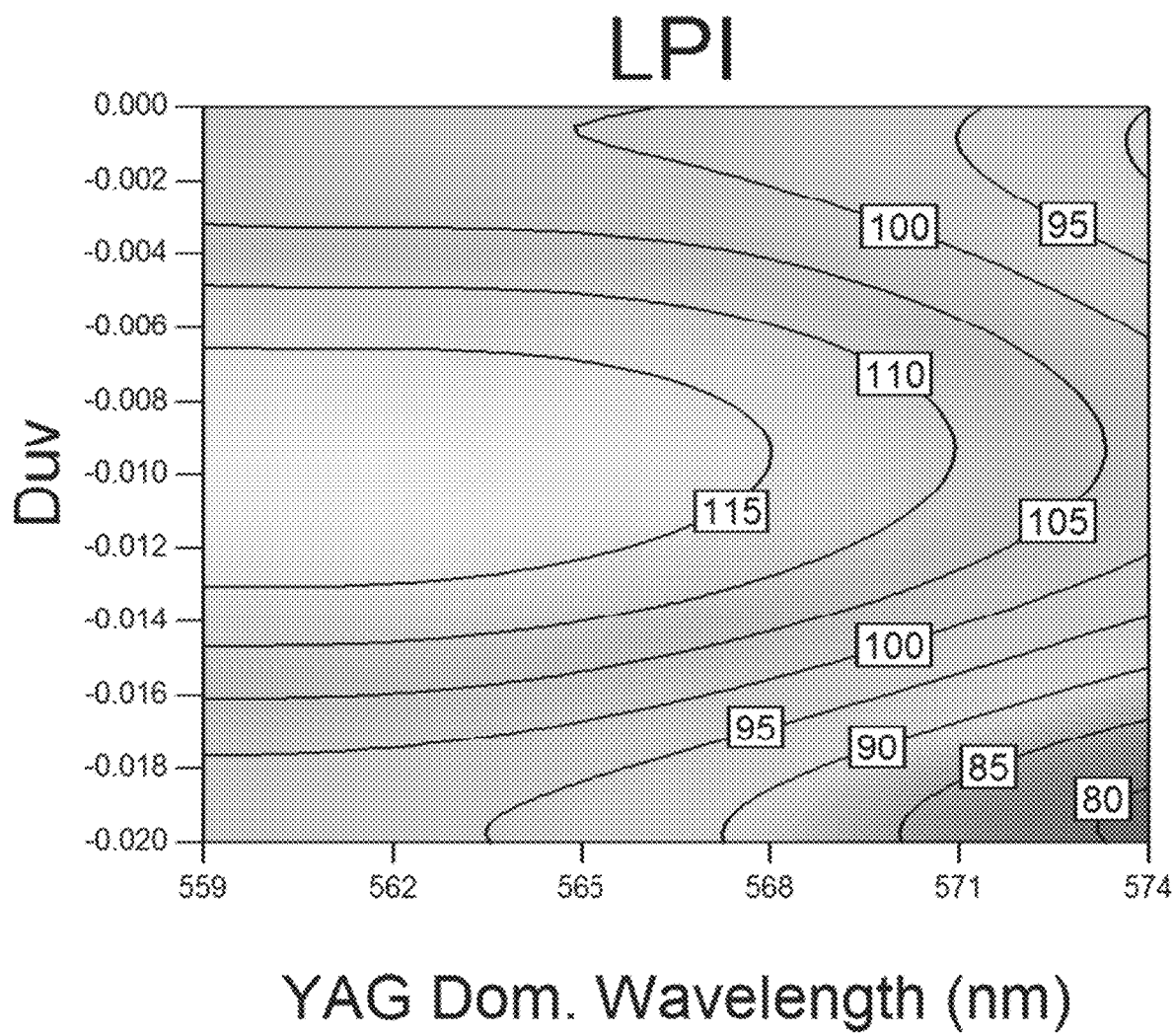
Figure 27D:
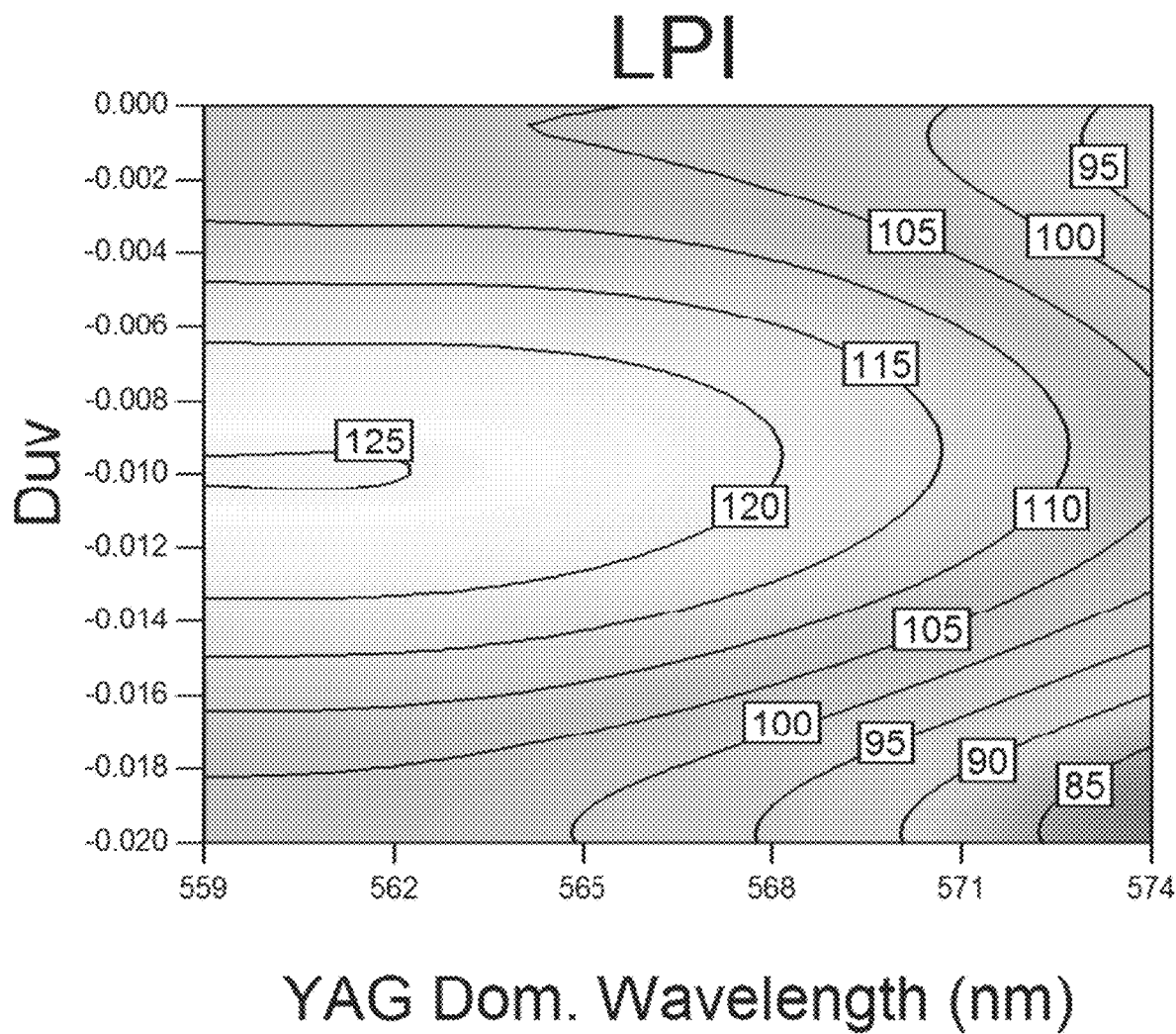
Figure 27E:
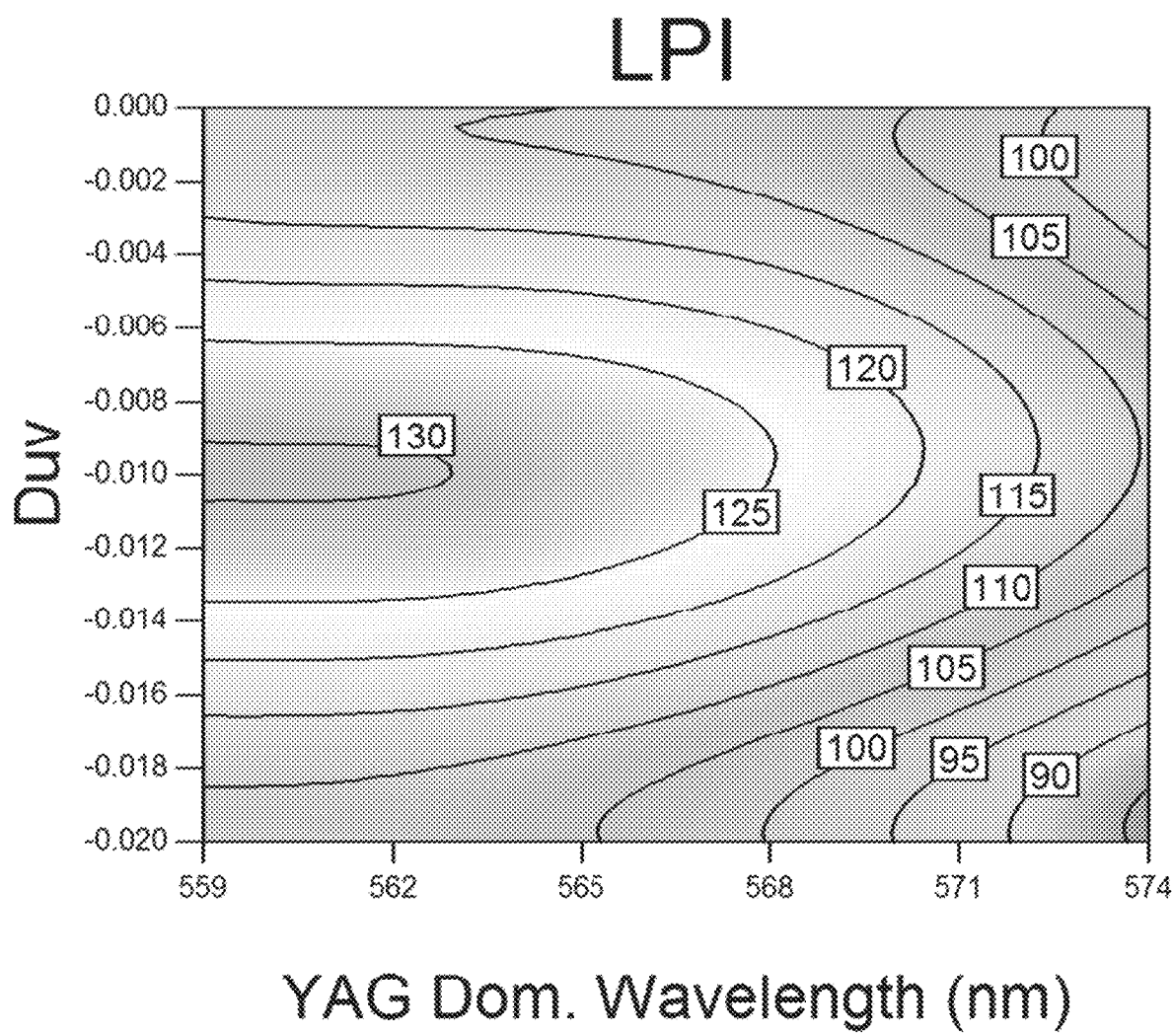
Figure 27F:
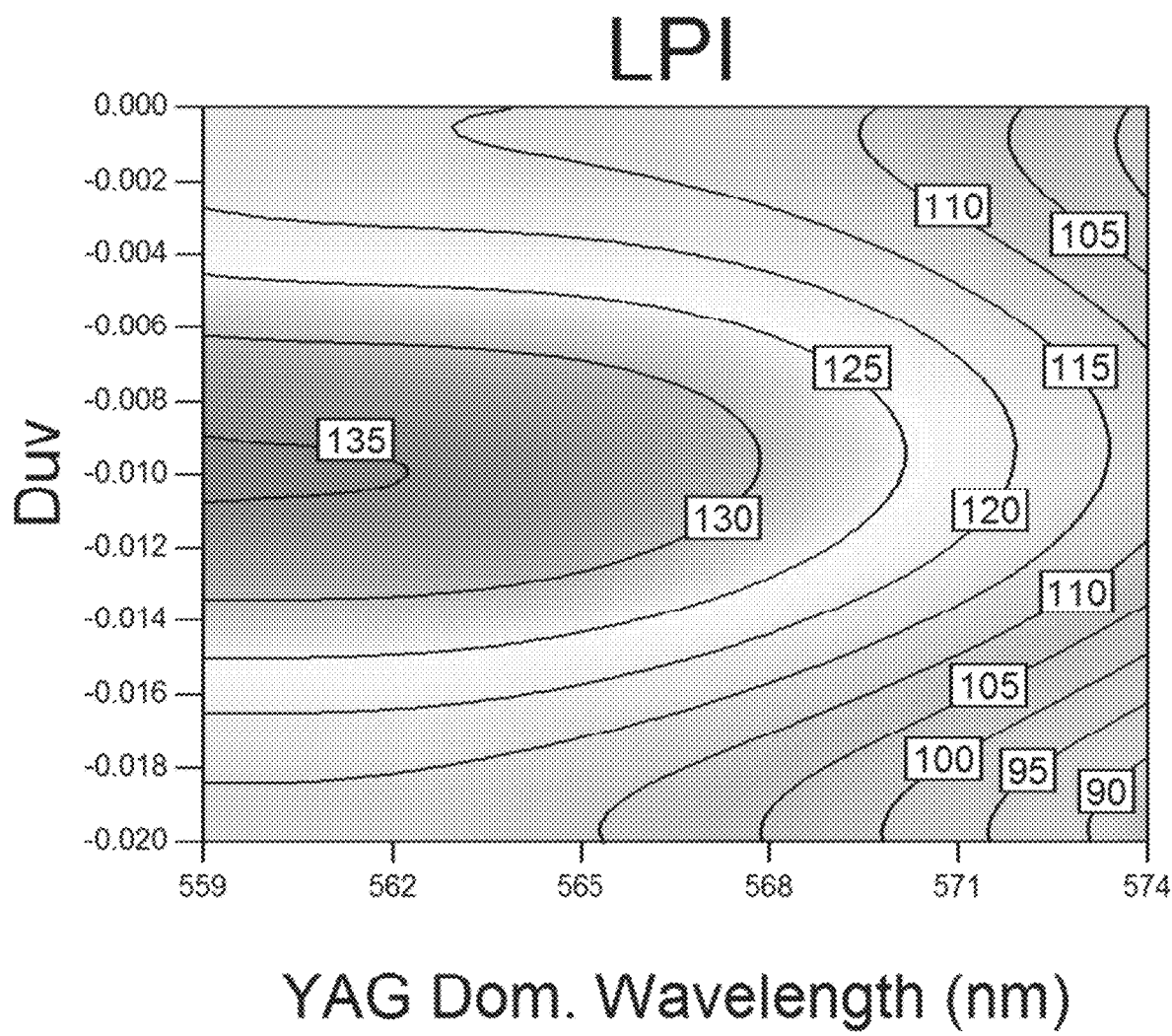
Figure 27G:
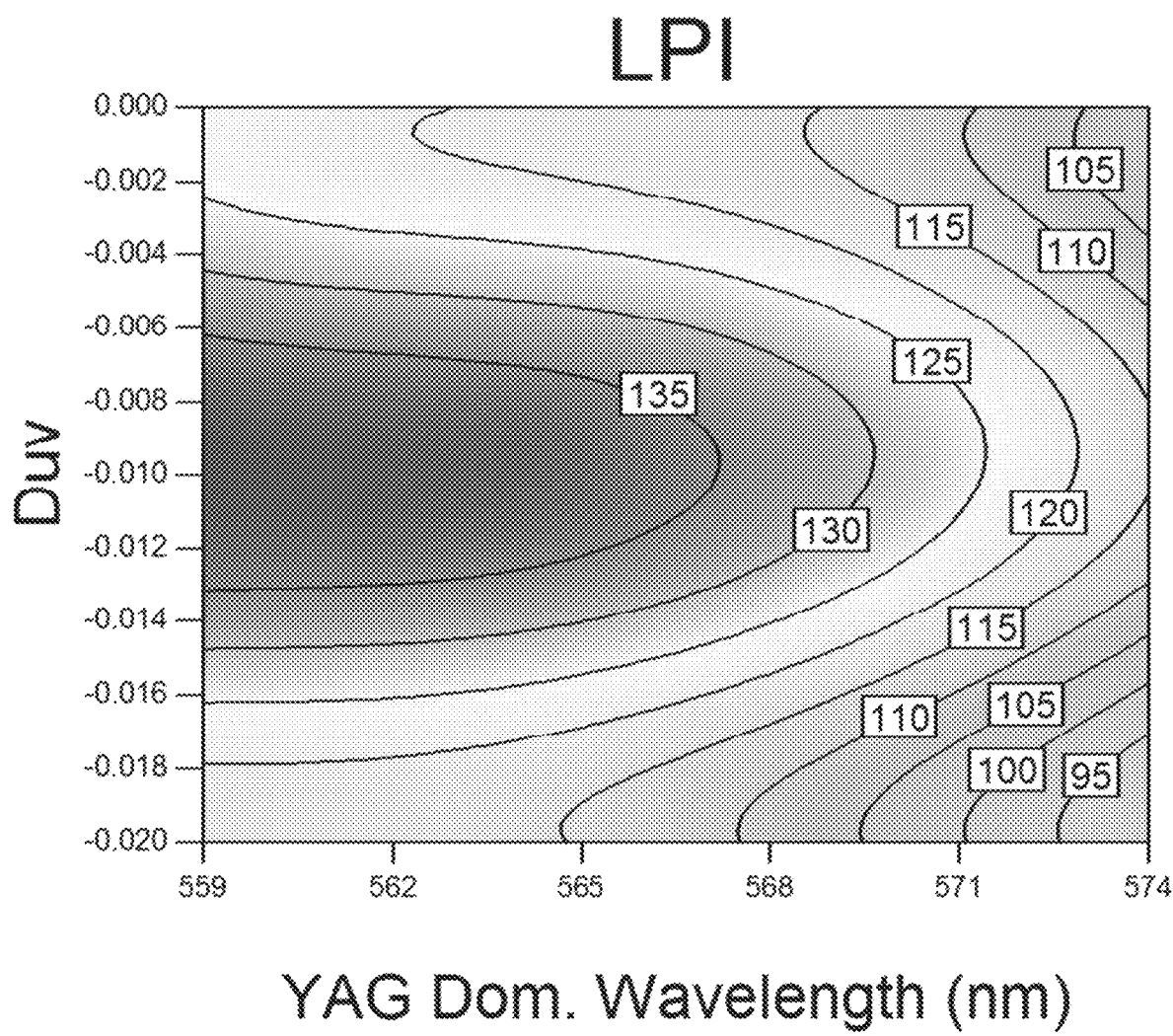
Figure 27H:
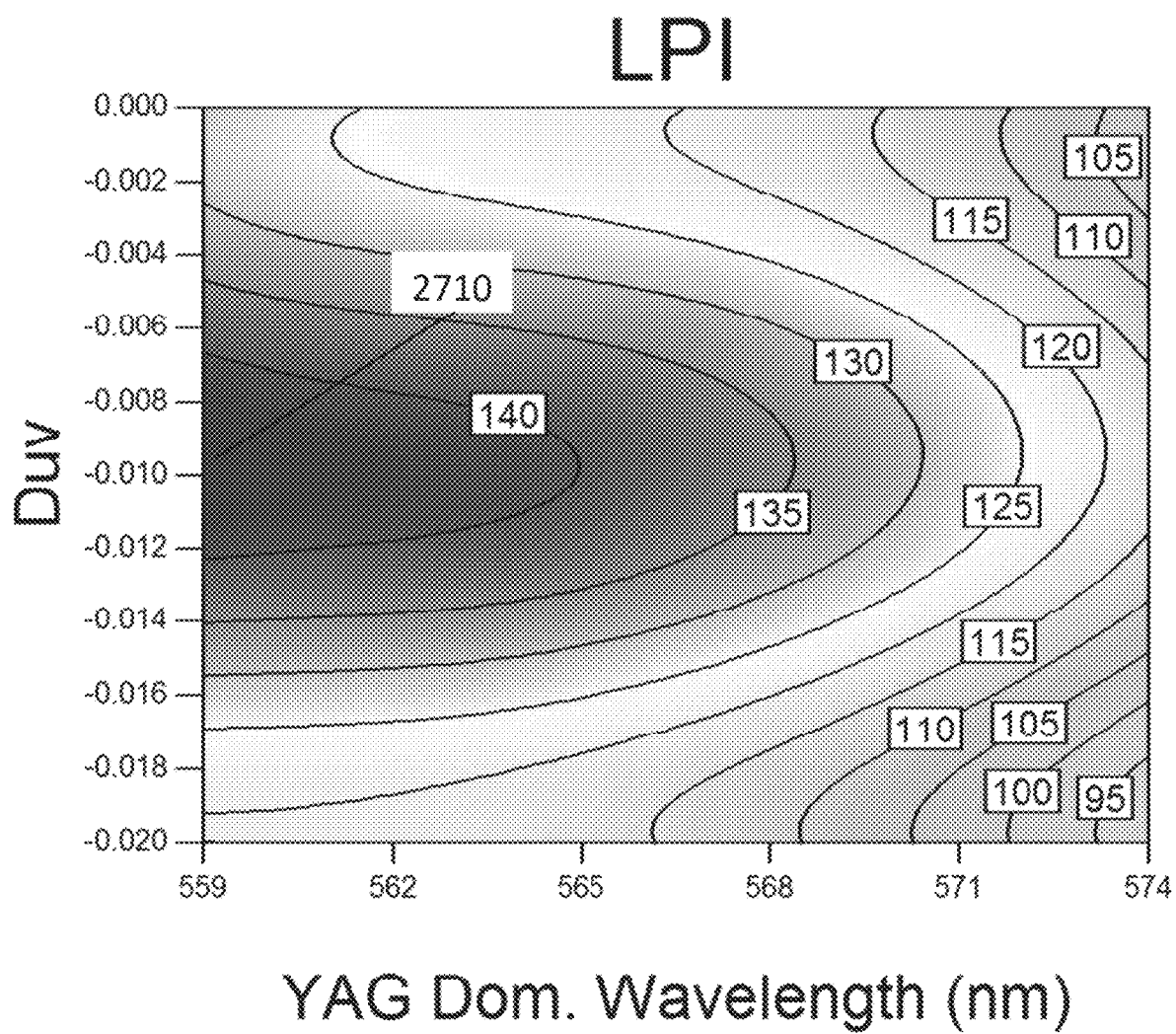
Figure 28A:
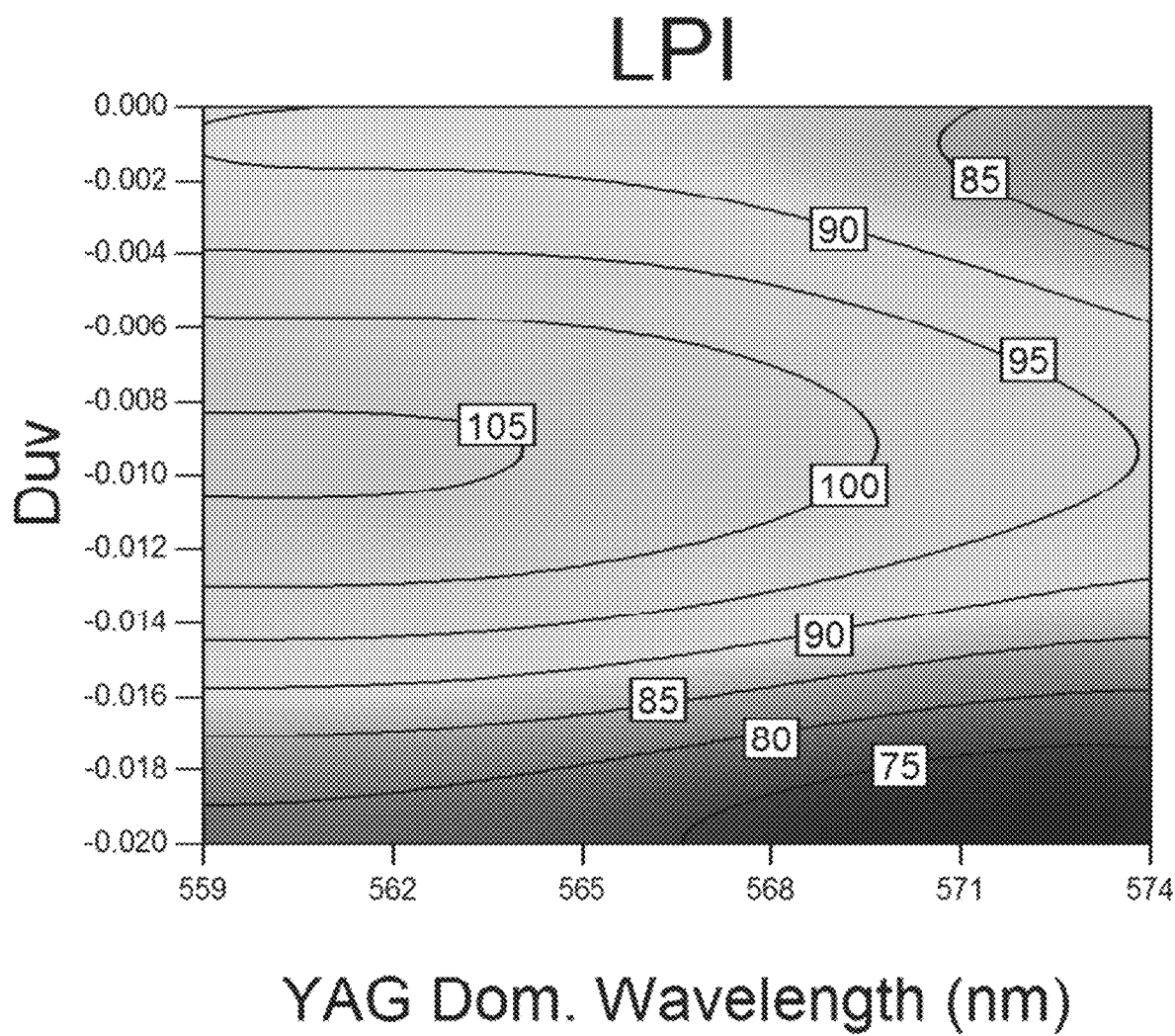
FIGS. 28a-h illustrate the contour plots at 3000 K of LPI versus dominant wavelength of the YG YAG phosphor on the x-axis, and Duv on the y-axis, where the red emitter is the broad red nitride phosphor of FIG. 15 having peak wavelength of 610 nm (FIG. 28a), 620 nm (FIG. 28b), 630 nm (FIG. 28c), 640 nm (FIG. 28d), 650 nm (FIG. 28e), 660 nm (FIG. 28f), 670 nm (FIG. 28g), 680 nm (FIG. 28h) according to some embodiments.
Figure 28B:
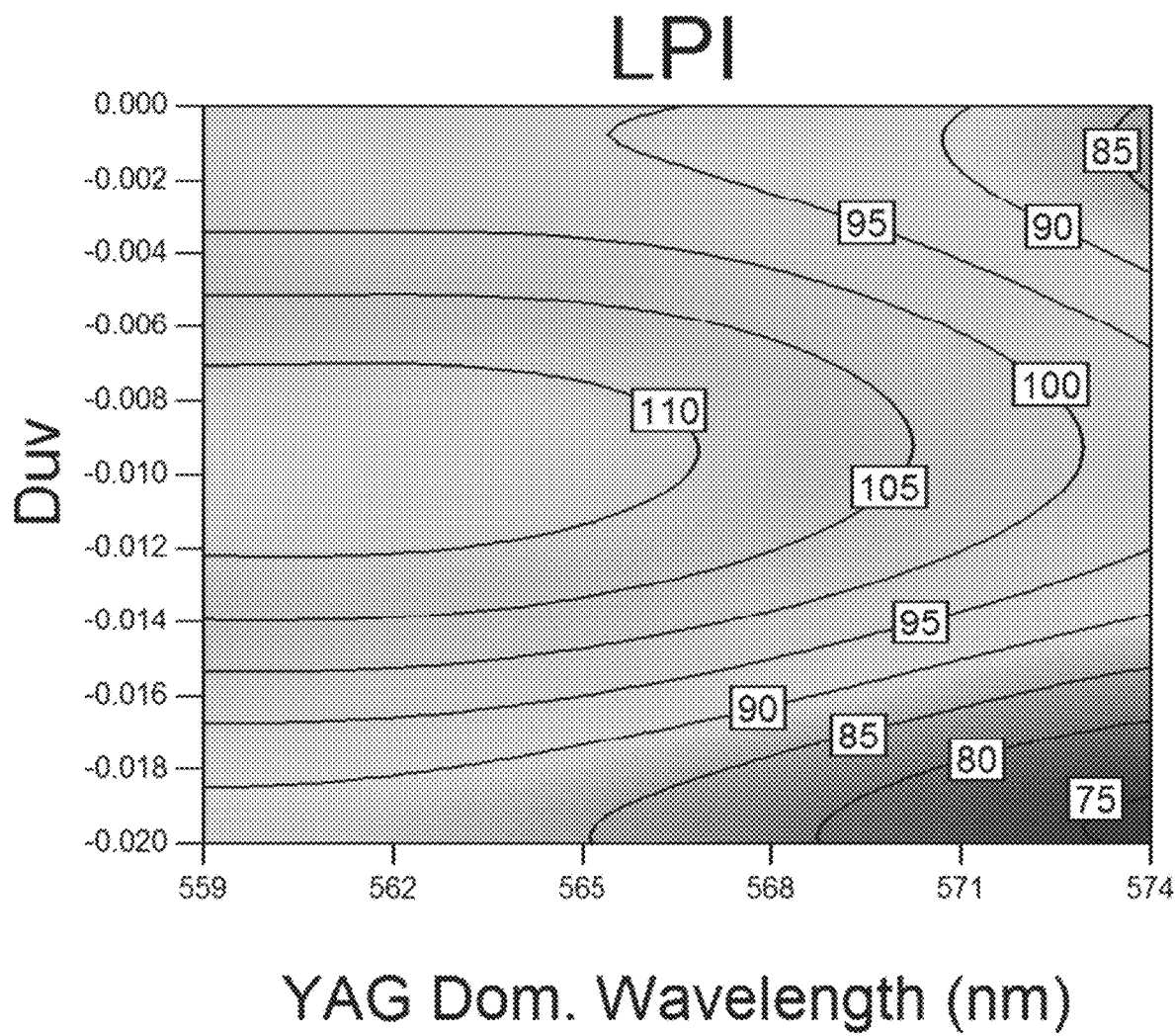
Figure 28C:
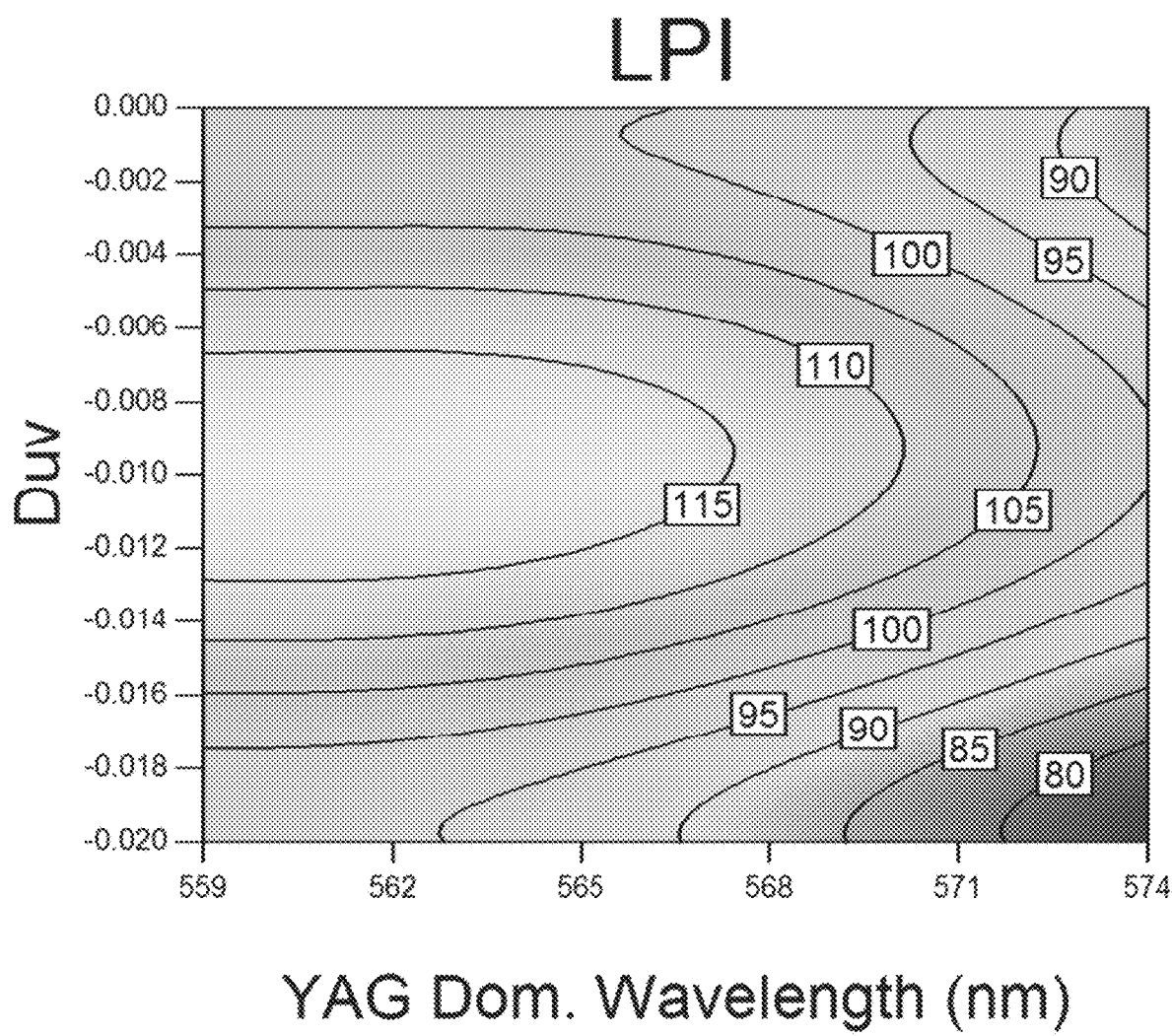
Figure 28D:
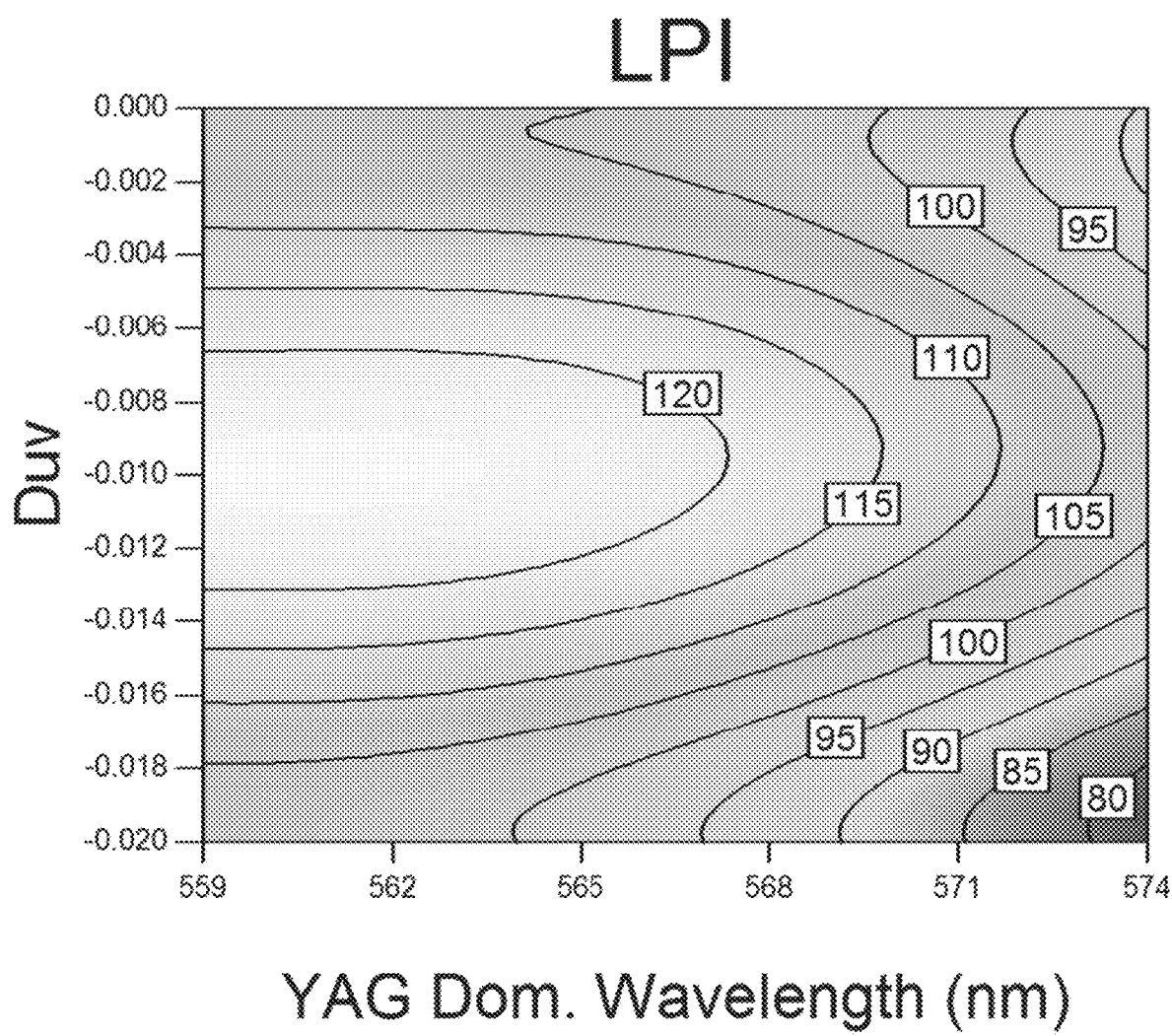
Figure 28E:
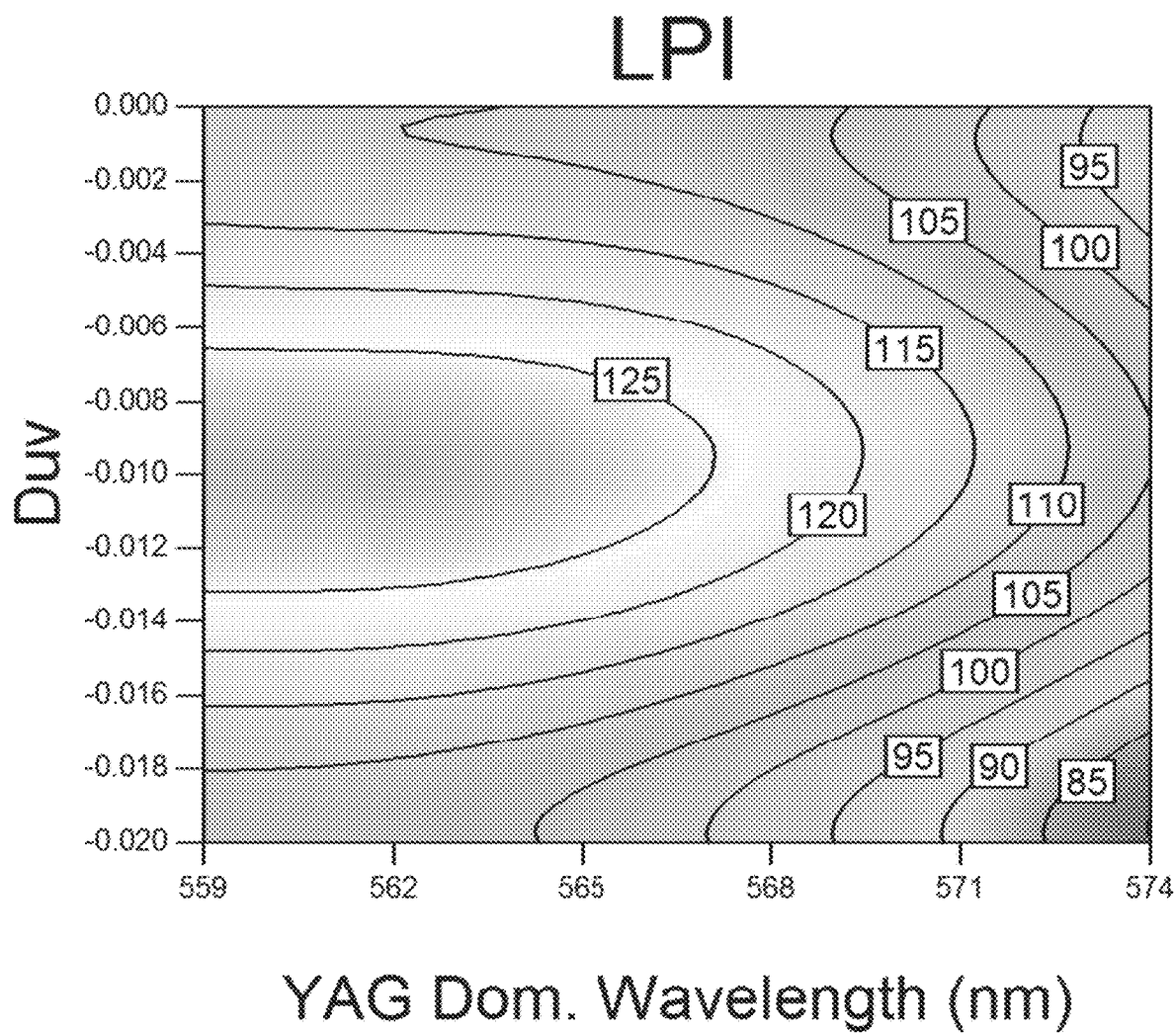
Figure 28F:
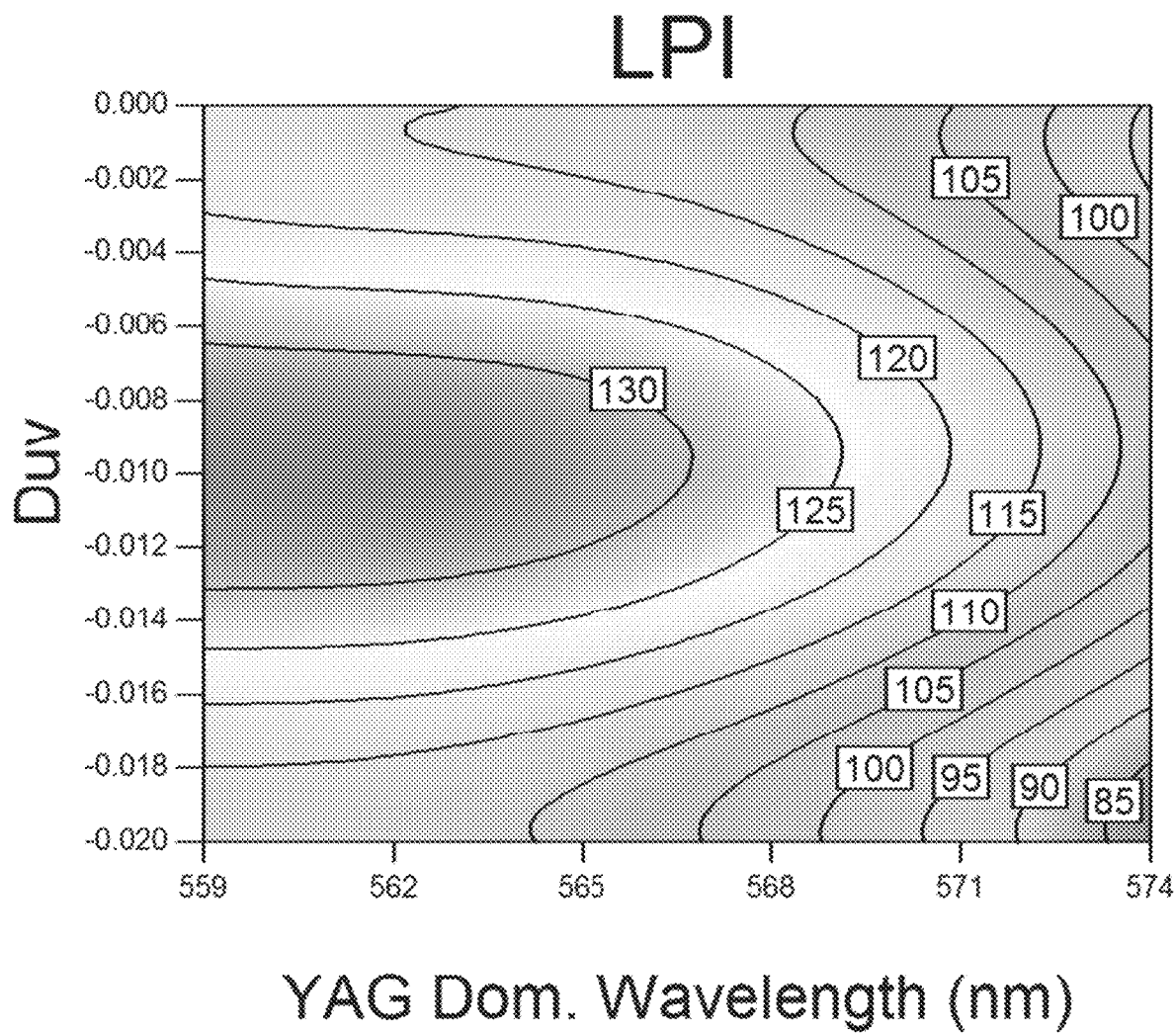
Figure 28G:
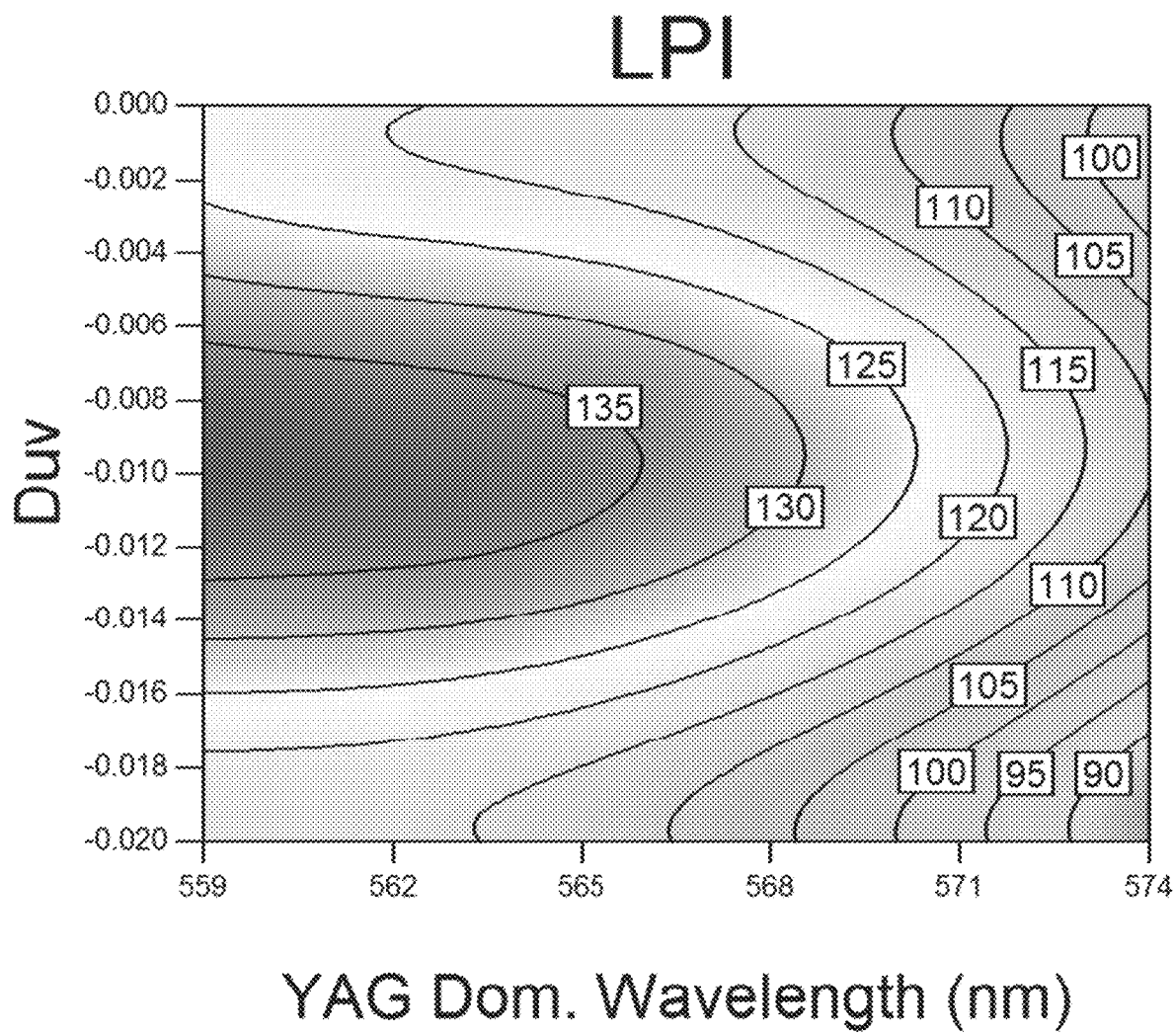
Figure 28H:
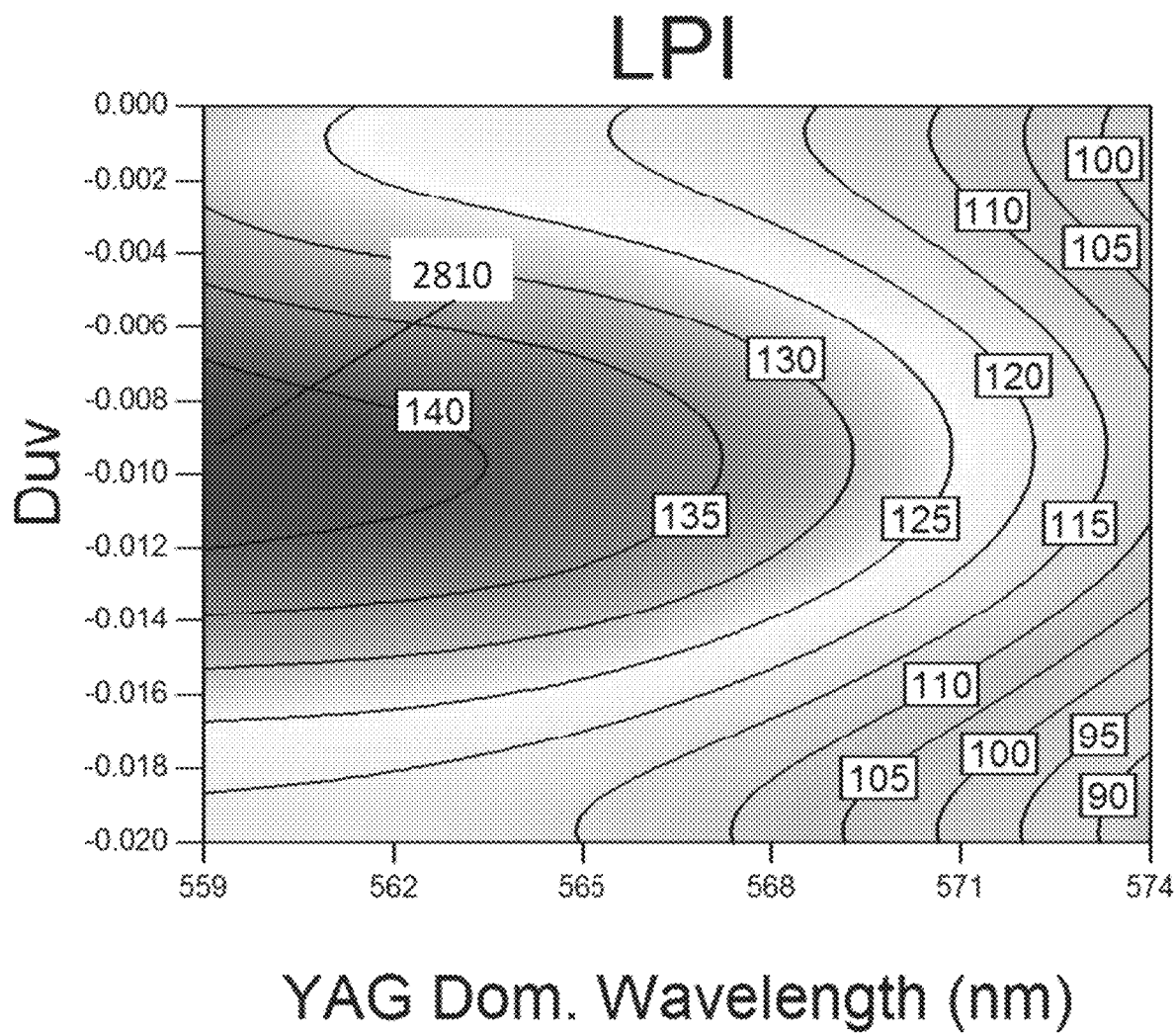

The $Dom_{YAG}$ and Duv values of the 250 unique combinations of 25 different $Dom_{YAG}$ values at each of five different Duv values as shown in FIG. 23 and used in the Group 1 DoE are the same 250 unique combinations of $Dom_{YAG}$ and Duv that were used in the Group 2 DoE in combination with each of the 20 different BR phosphors. The fine spacing between $Dom_{YAG}$ values on the x-axis and the Duv values on the y-axis of the 250 unique SPDs used in the Group 1 DoE have been found to provide smooth interpolations between discrete SPDs actually used in the DoE. The five Duv levels were chosen to illustrate the effect of color point, or Duv, on LPI. Other suitable Duv levels may be used. In one or more embodiments, similar contour plots may be presented for a continuum of Duv levels within the range of Duv presented herein, with similar trends being realized. The smooth curves for LPI shown in FIG. 27a are obtained from the statistically optimized ANOVA regression fit to the data, where LPI=f(CCT, Duv, $Dom_{YAG}$, $Peak_{Nit}$), including polynomial terms as high as quartic, and all resultant variable interactions, provide a transfer function having Adjusted $R^2>0.99$. One skilled in the art will recognize that there is a lack of features having higher order than quadratic in the LPI contours having LPI values of 120 and higher, and that there are smooth transitions between the contours presented; and will understand that the solutions representing all 5000 combinations of SPDs comprised of a blue LED, a YG YAG:Ce phosphor, and a BR phosphor are quantitatively described with very low error ($R^2>0.99$) by the transfer function LPI=f(CCT, Duv, $Dom_{YAG}$, $Peak_{Nit}$) as represented by the LPI contour plots in FIG. 27a for the case of $Peak_{Nit}$=610 nm. Similarly, the transfer function LPI=f (CCT, Duv, $Dom_{YAG}$, $Peak_{Nit}$) solved at 10 nm increments of $Peak_{Nit}$=610, 620, 630, 640, 650, 660, 670, and 680 nm, at CCT=2700 K, are represented by the LPI contour plots in FIGS. 27a-h; and at 3000 K in FIGS. 28a-h.

Figure 29:
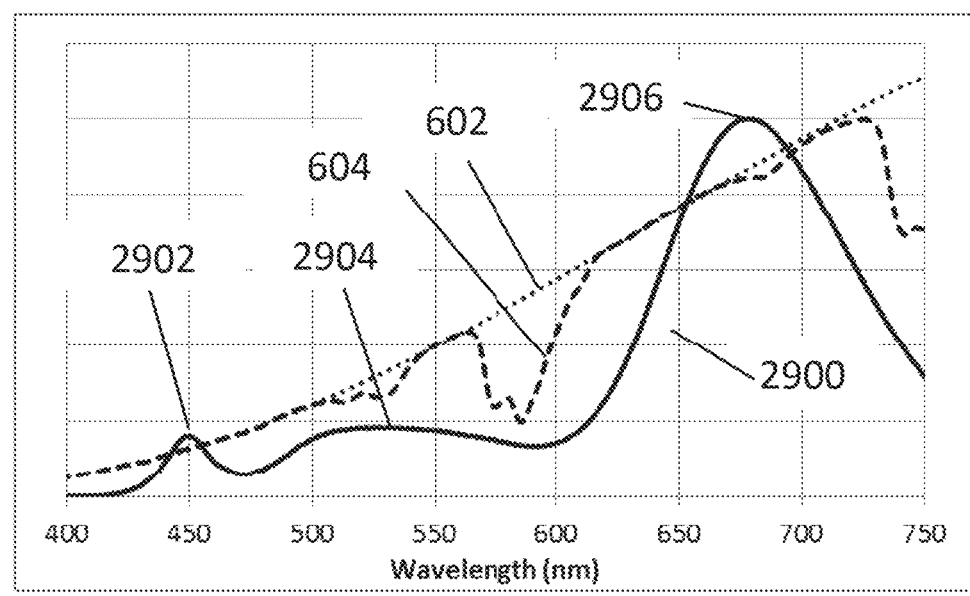
FIG. 29 illustrates the SPD of the discrete run having the highest LPI value for a light source comprising a blue LED, a YG YAG phosphor, and a broad red nitride phosphor at 2700 K according to some embodiments.

The SPD having the highest LPI (about 142) among the 2500 SPDs at 2700 K in the Group 2 DoE is shown in FIG. 29. The particular SPD 2900 in the Group 2 DoE (YAG+Nit) having the highest LPI value of about 142, corresponding to $Dom_{YAG}$ of about 559 nm, and Duv at about −0.010, with CCT=2700 K, is illustrated in FIG. 29, showing the peak wavelength of the blue LED 2902 at about 450 nm, the peak wavelength of the YG YAG:Ce phosphor 2904 at about 531 nm, the peak wavelength of the BR nitride phosphor 2906 at about 680 nm; and is compared with the SPD 604 of a Reveal® incandescent lamp and with the SPD 602 of a blackbody emitter, each having similar CCT.

FIGS. 27a-h and 28a-h demonstrate that at both 2700 K and 3000 K, if the color point of the light source is on the blackbody locus (Duv=0.000), then it is difficult to achieve LPI>120, at all $Dom_{YAG}$ (i.e., for any commercially available YG YAG:Ce phosphor). Only long wavelength nitride ($Peak_{Nit}$>660 nm) and short wavelength YAG ($Dom_{YAG}$<562 nm) will allow for LPI>120 on the blackbody. As Duv is reduced, LPI generally increases at all $Dom_{YAG}$, and reaches a maximum value for Duv of about −0.010, the value of Duv where the Whiteness component of LPI is maximized, per Equation (1), resulting in a significant degree of vertical symmetry in the iso-contours of LPI about a horizontal line at about Duv=−0.010. As Duv goes from Duv=0.000 to Duv=−0.010, the Whiteness component of the LPI equation increases from 0 to 1, resulting in a 19 point increase in LPI based on Equation (7). Similarly, as Duv goes from Duv=−0.010 to Duv=−0.020, the Whiteness component decreases from 1 to 0, resulting in a 19 point decrease in LPI.

The nearly monotonically increasing LPI with decreasing $Dom_{YAG}$ and increasing $Peak_{Nit}$, at a given Duv, may be primarily due to the separation in wavelength between the YG emitter and the BR emitter, diminishing the typically large emission in the yellow, or even creating a depression in the yellow portion of the spectrum (e.g. about 570 to about 600 nm) which enhances the perceived saturation of red-green opponent colors, and blue-yellow opponent colors. Those three dominant trends in FIGS. 27a-h and 28a-h: that LPI tends toward a maximum value at Duv about −0.010; that LPI tends toward a maximum value at shorter $Dom_{YAG}$; and that LPI tends toward a maximum value at longer $Peak_{Nit}$, for this set of commercially available emitters (blue LED, YG YAG:Ce phosphor, and BR nitride phosphor) suggest that the LPI contours might be approximated in a closed-form analytical formula containing only the terms Duv to prescribe Whiteness, and $Dom_{YAG}$ and $Peak_{Nit}$ as a surrogate for Color Appearance.

Similar to Equation (9) for the Group 1 DoE, a general form for an elliptical approximation to the LPI curves of the Group 2 DoE, Equation (10) below provides agreement to within 1 or 2 points in LPI between the exact LPI contour and the elliptical approximation for every LPI contour in FIGS. 27a-h and FIGS. 28a-h having LPI of 120 or higher. Since the transfer function for LPI in Group 2 has an additional variable, $Peak_{Nit}$, relative to Group 1, Equation (10) is necessarily more complex than Equation (9).

$$Dom_{YAG} < \left(a_1(Peak_{Nit} - \lambda_o) + a_2\sqrt{Peak_{Nit} - \lambda_o} + a_3\right)$$
$$\sqrt{1 - \left(\frac{Duv + .0099 - .00001*(Peak_{Nit} - \lambda_o)}{b_1(Peak_{Nit} - \lambda_o) + b_2\sqrt{Peak_{Nit} - \lambda_o} + b_3}\right)^2} +$$
$$569.8 - 0.004*CCT$$

Equation (10)

Figure 30A:
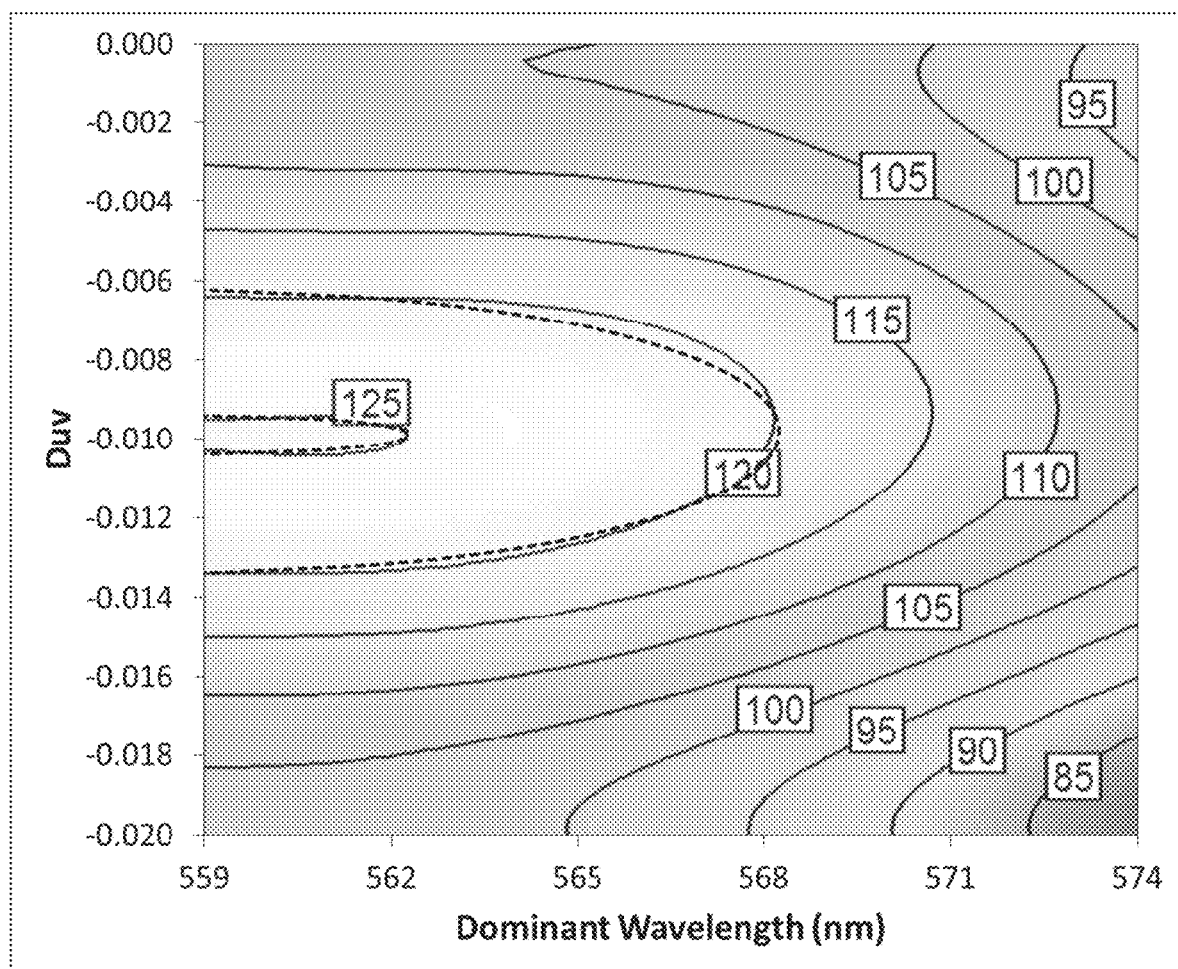
FIGS. 30a-e illustrate a family of analytic approximations to each of the LPI contours at 2700 K from FIGS. 27d-h, overlaid on the actual LPI contours where the red emitter is the broad red nitride phosphor of FIG. 15, having peak wavelength of 640 nm (FIG. 30a), 650 nm (FIG. 30b), 660 nm (FIG. 30c), 670 nm (FIG. 30d), 680 nm (FIG. 30e) according to some embodiments.
Figure 30B:
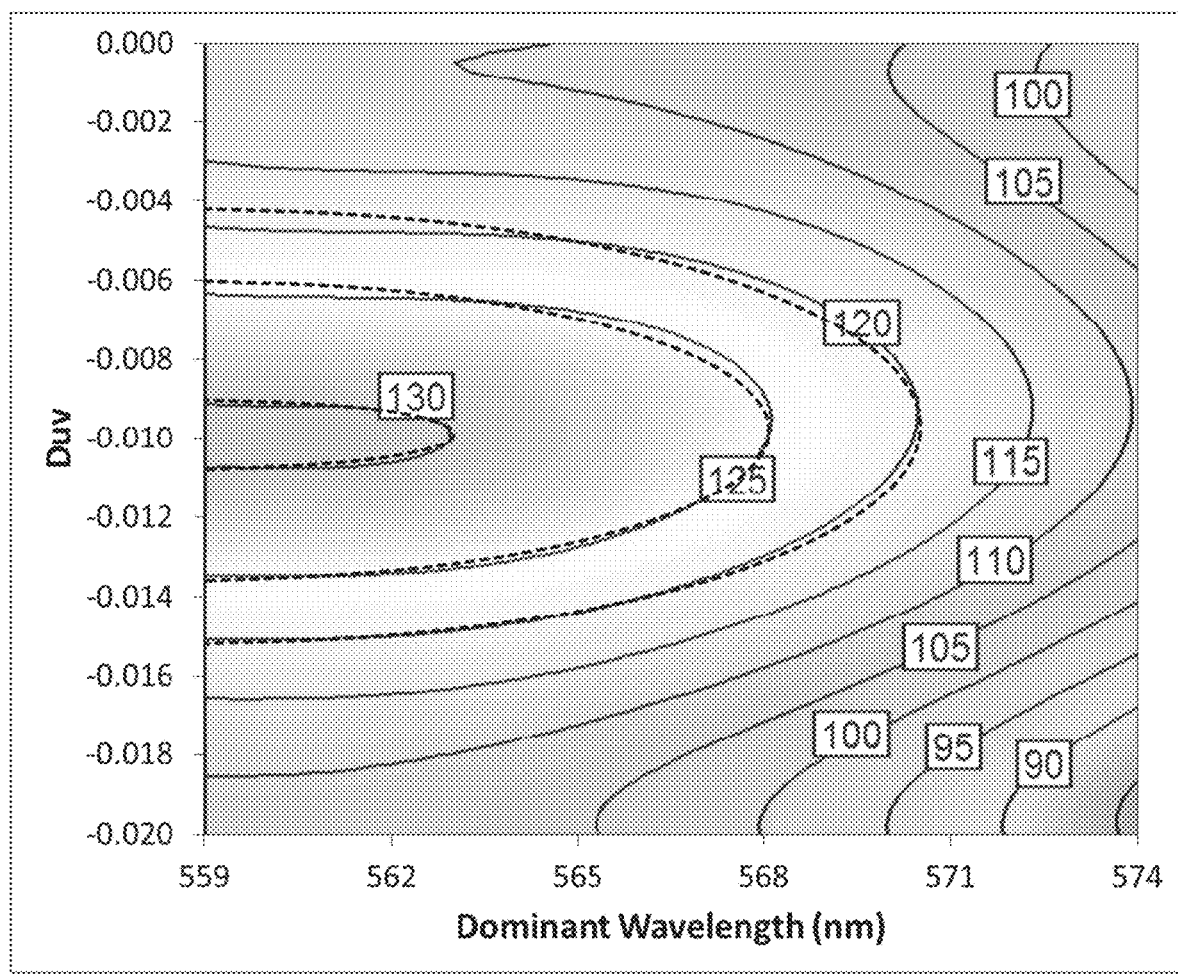
Figure 30C:
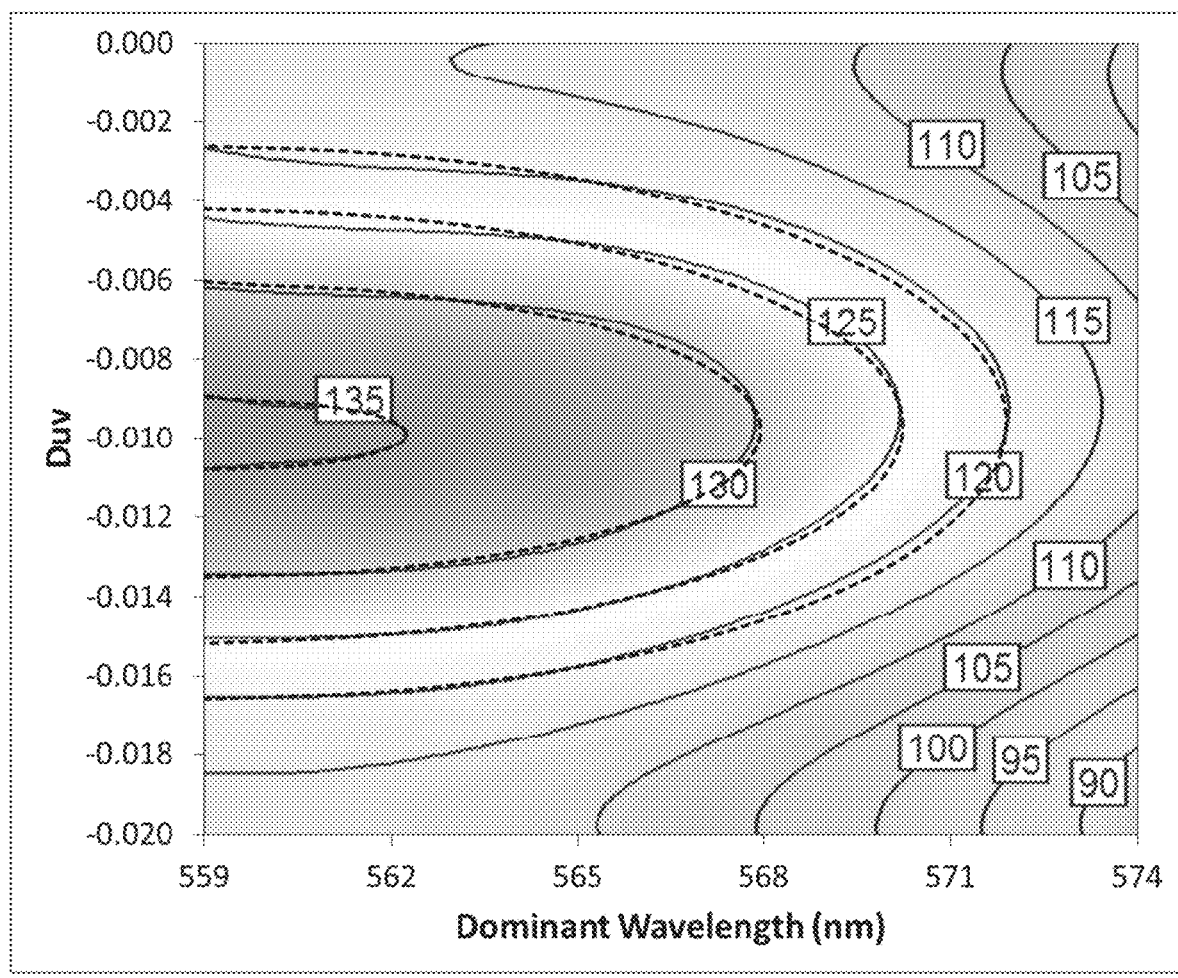
Figure 30D:
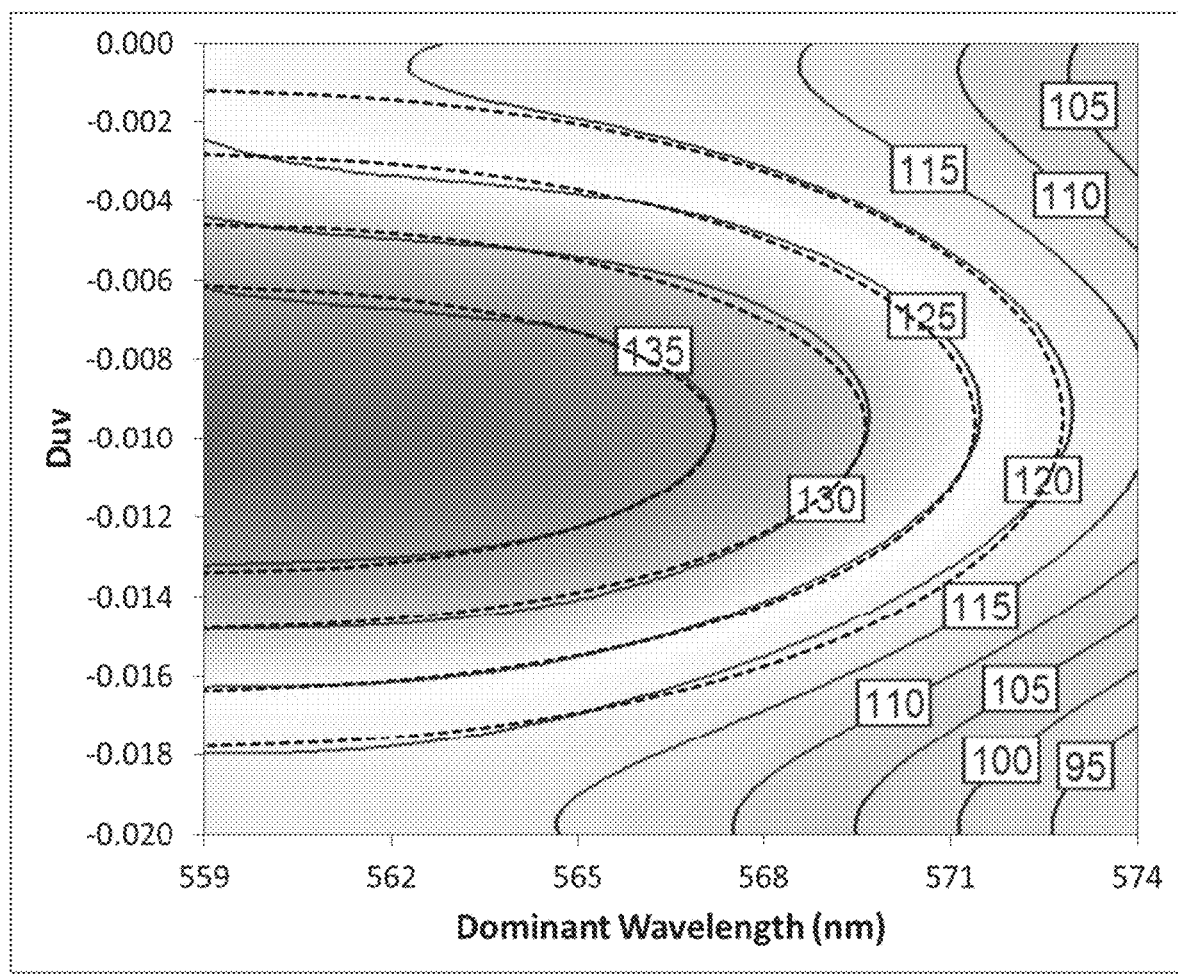
Figure 30E:
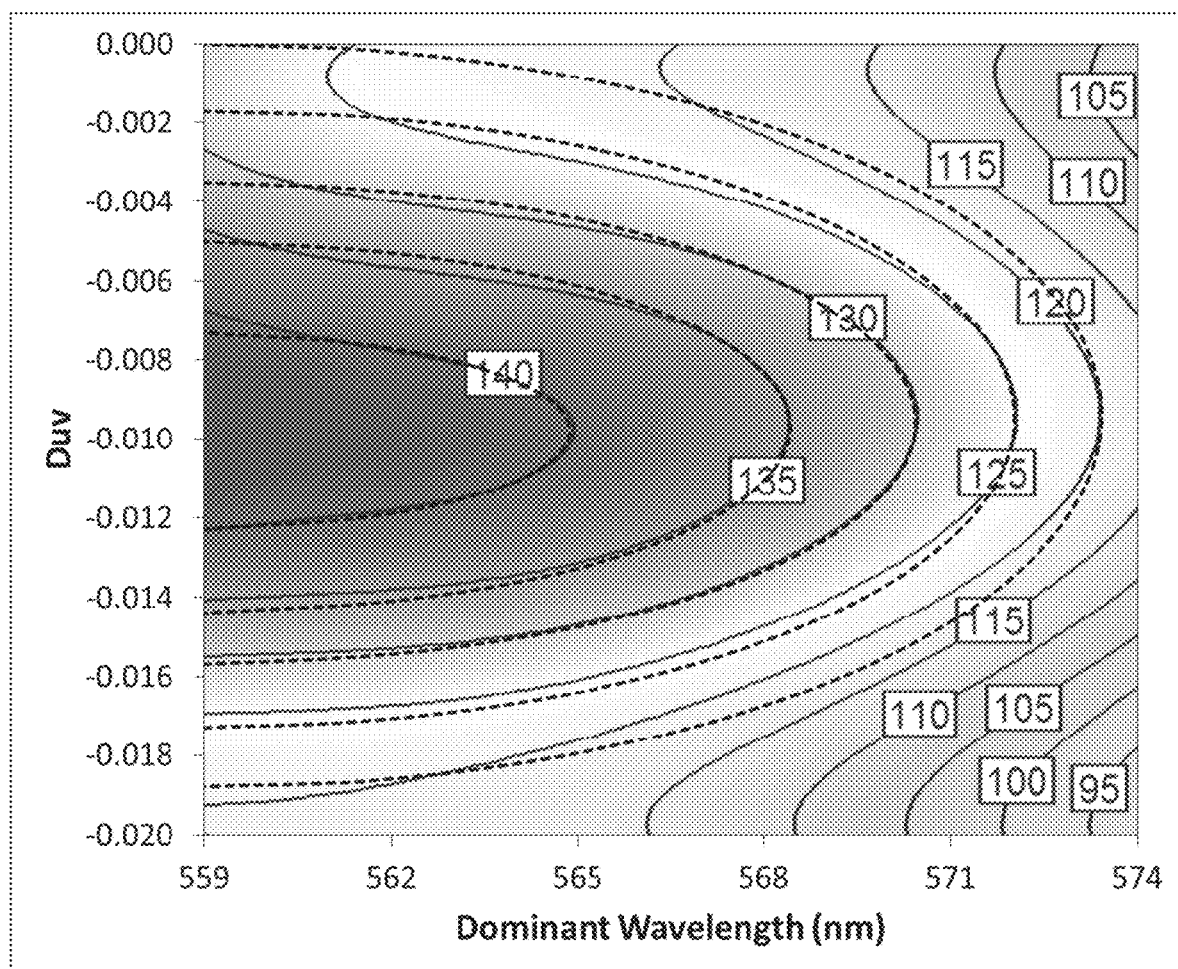
Figure 31A:
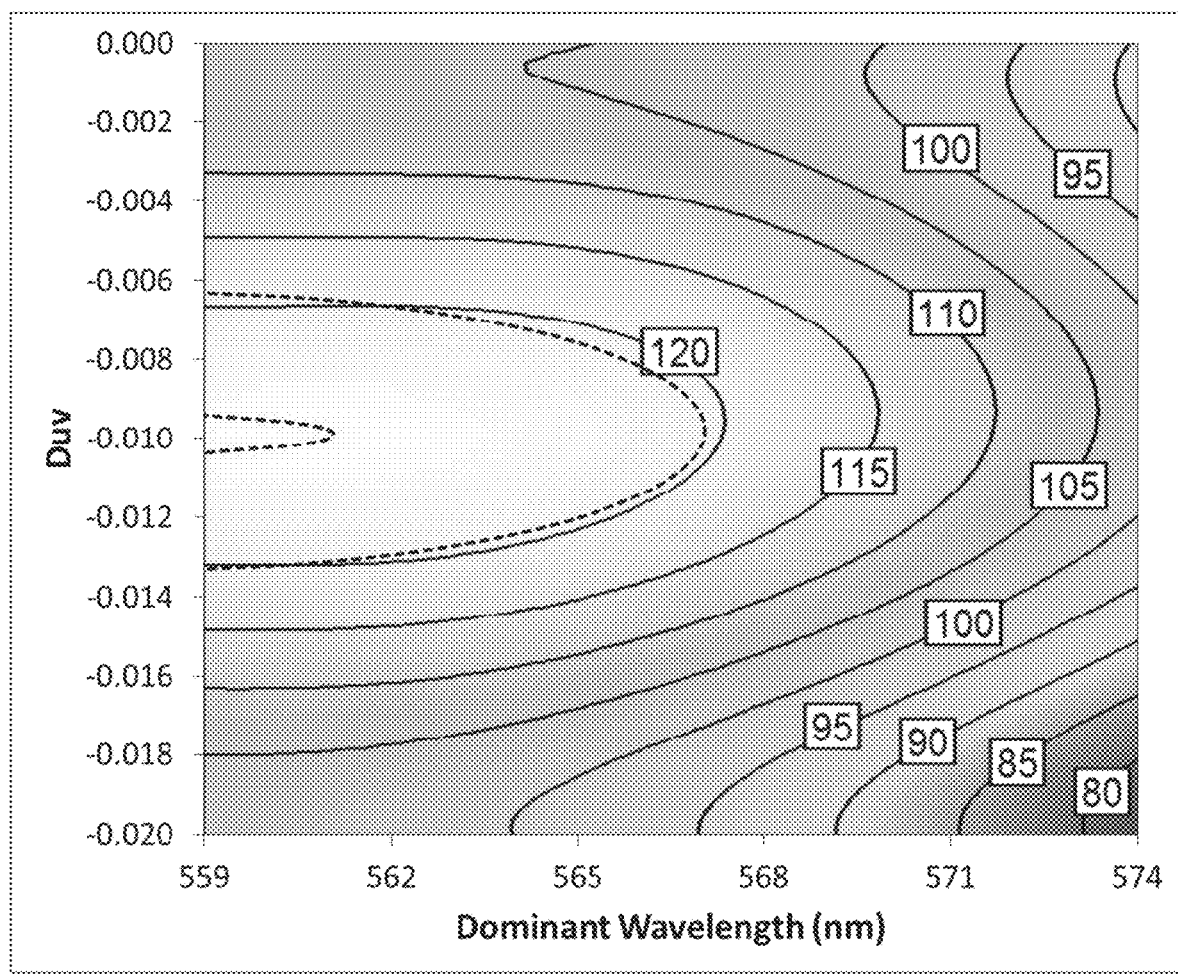
FIGS. 31a-e illustrate a family of analytic approximations to each of the LPI contours at 3000 K from FIGS. 28d-h, overlaid on the actual LPI contours where the red emitter is the broad red nitride phosphor of FIG. 15, having peak wavelength of 640 nm (FIG. 31a), 650 nm (FIG. 31b), 660 nm (FIG. 31c), 670 nm (FIG. 31d), 680 nm (FIG. 31e) according to some embodiments.
Figure 31B:
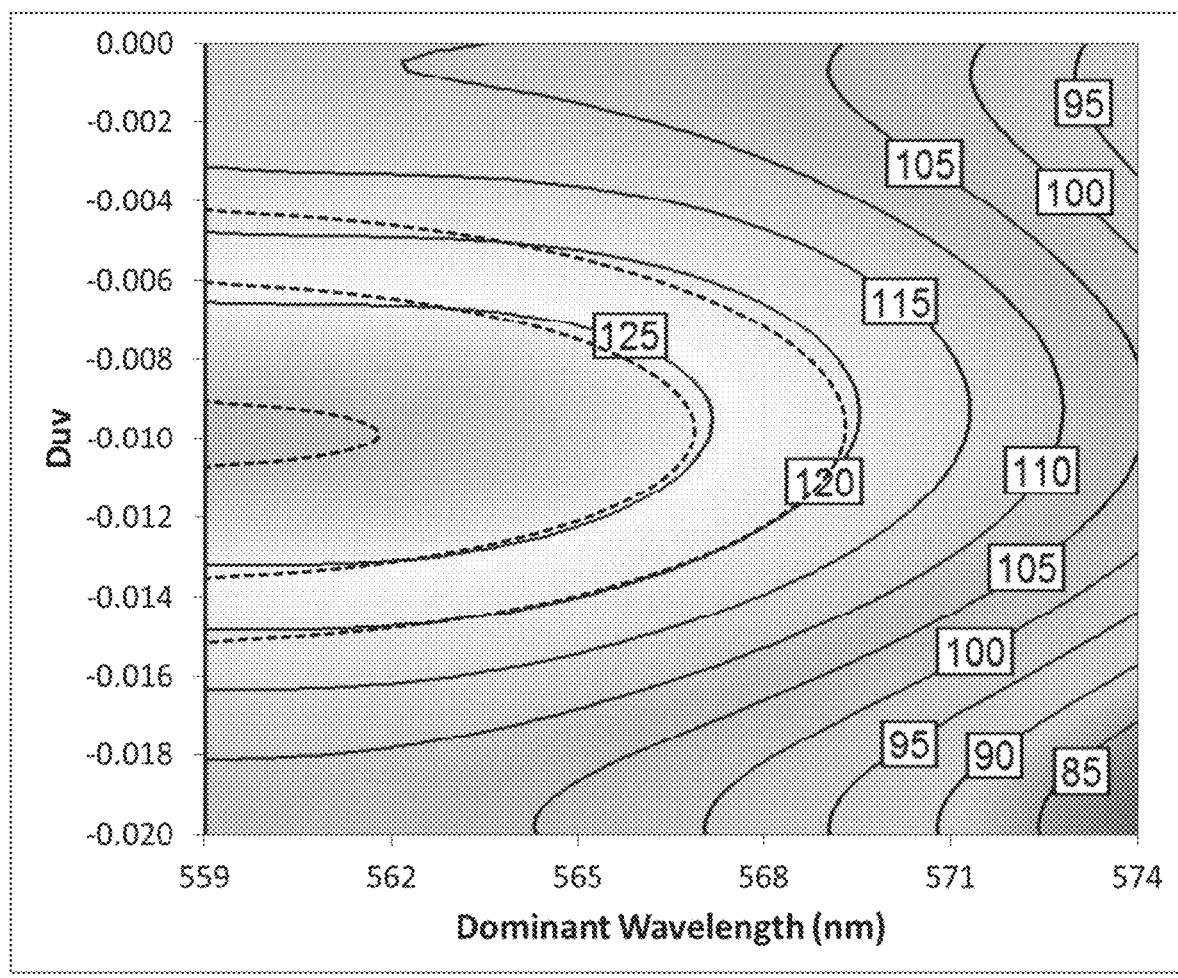
Figure 31C:
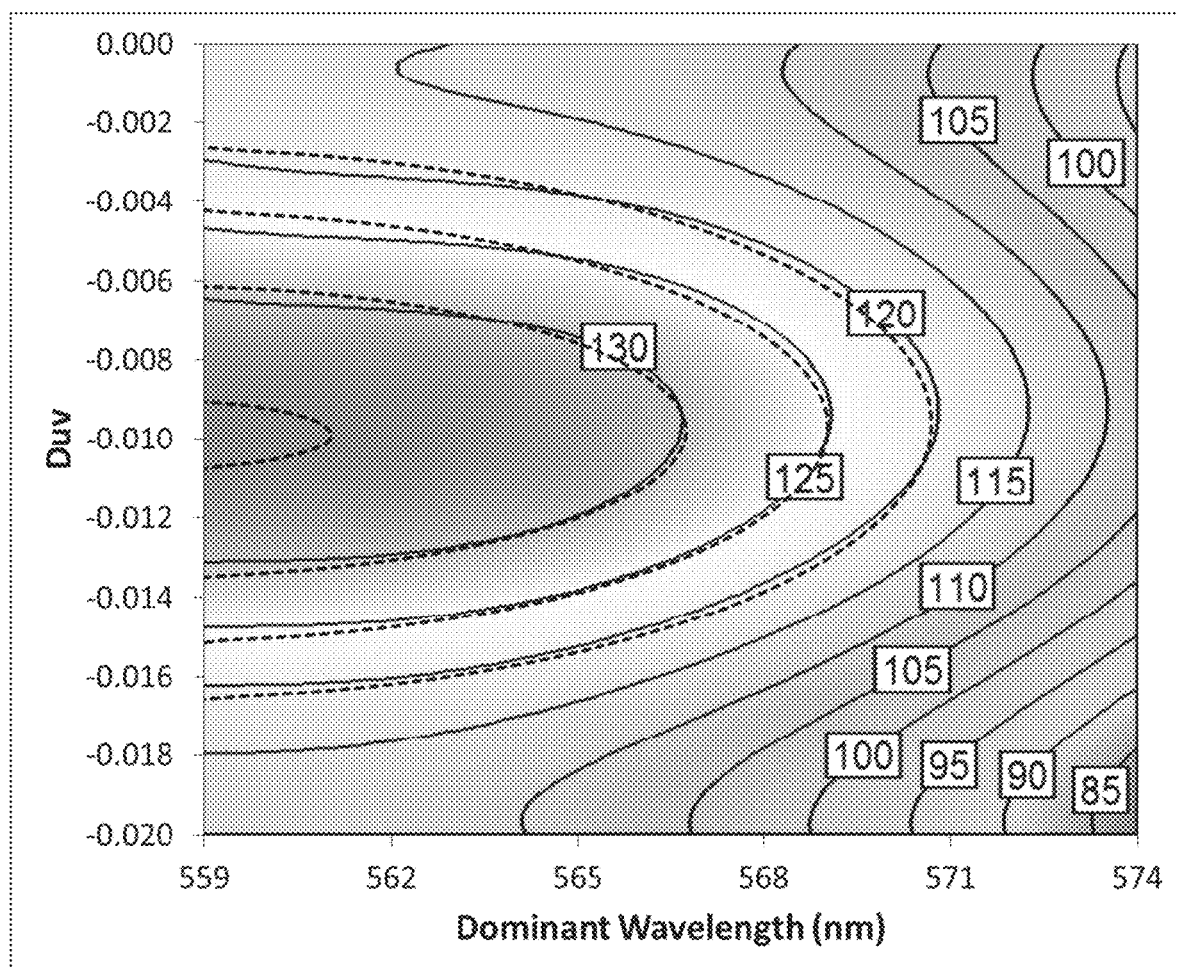
Figure 31D:
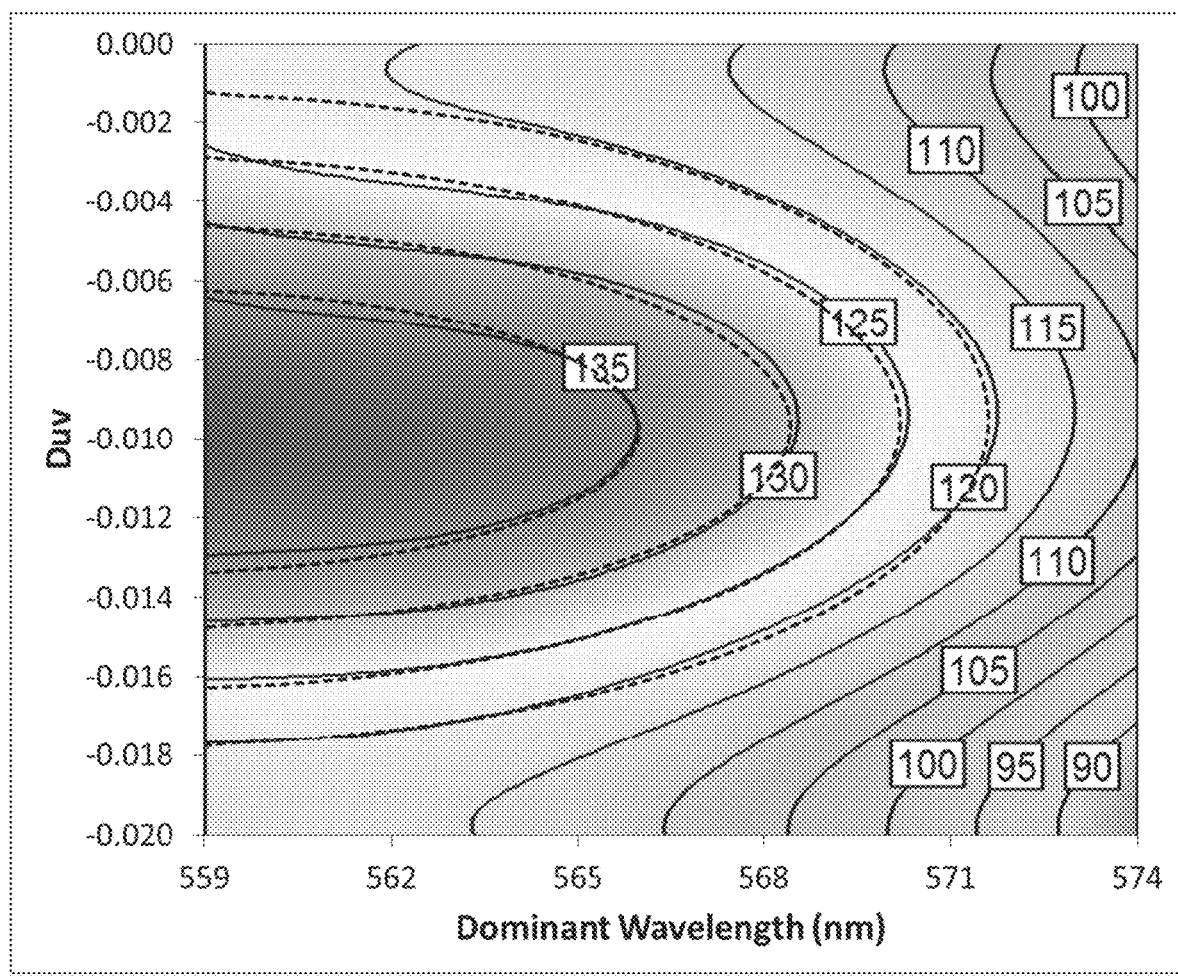
Figure 31E:
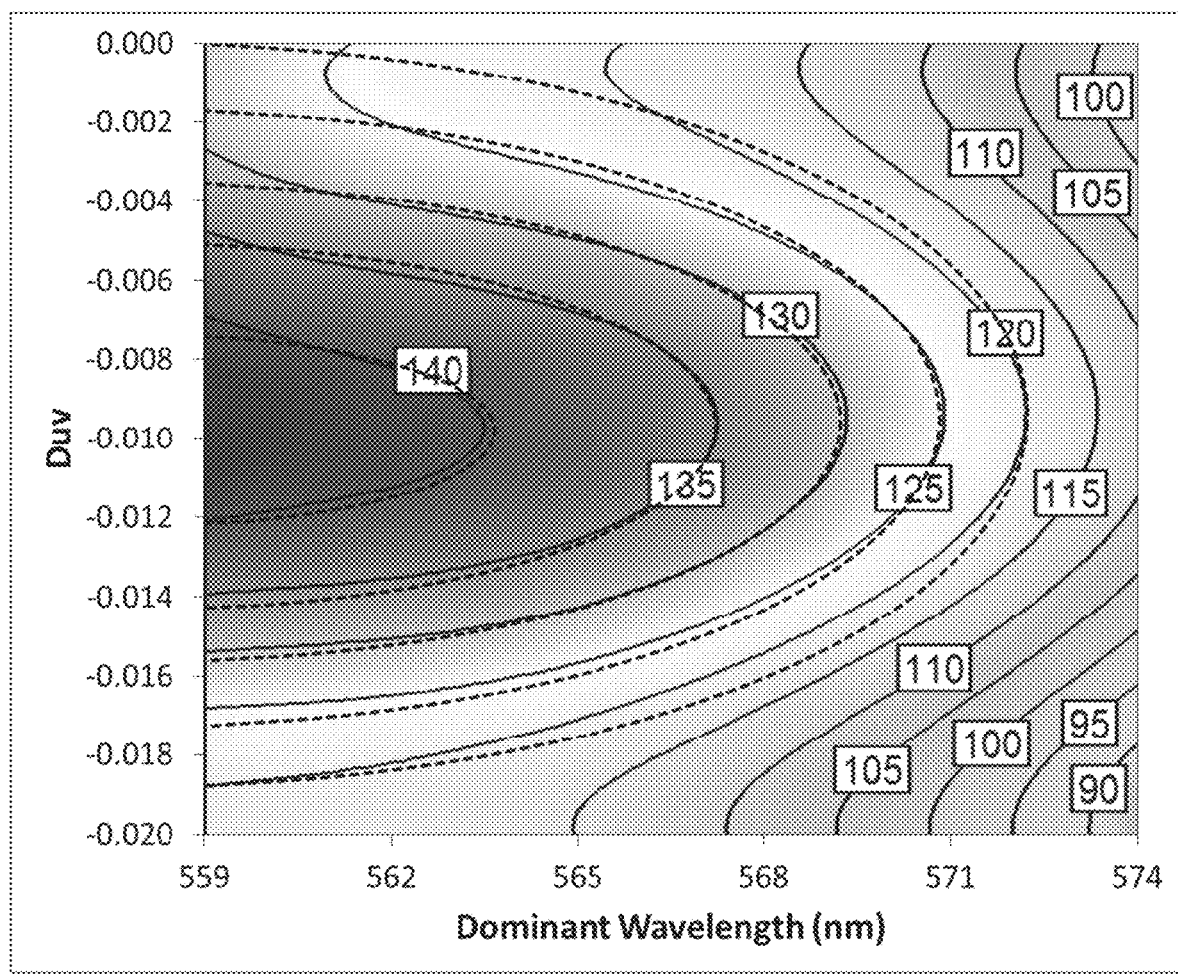
Figure 32A:
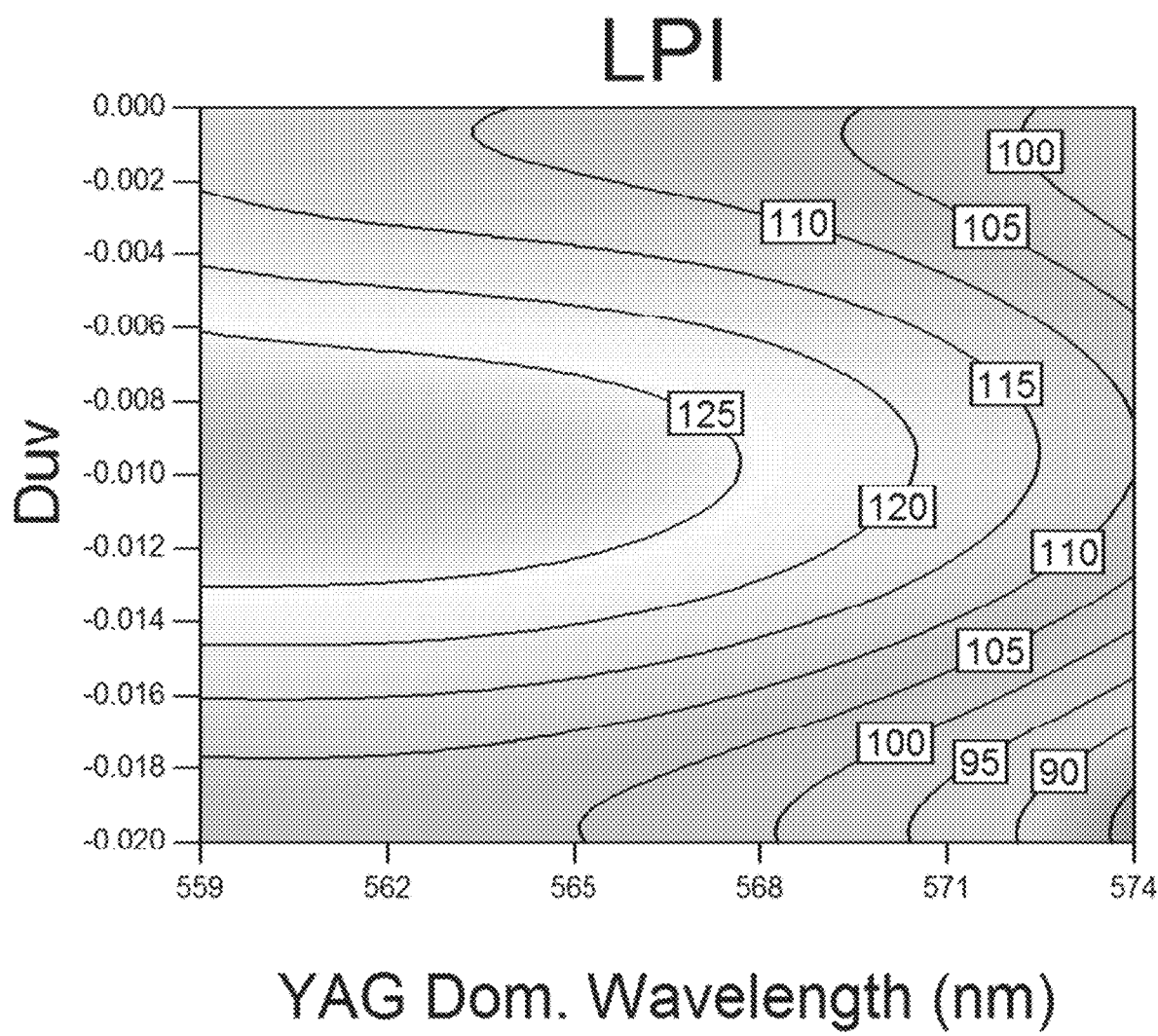
Figure 32B:
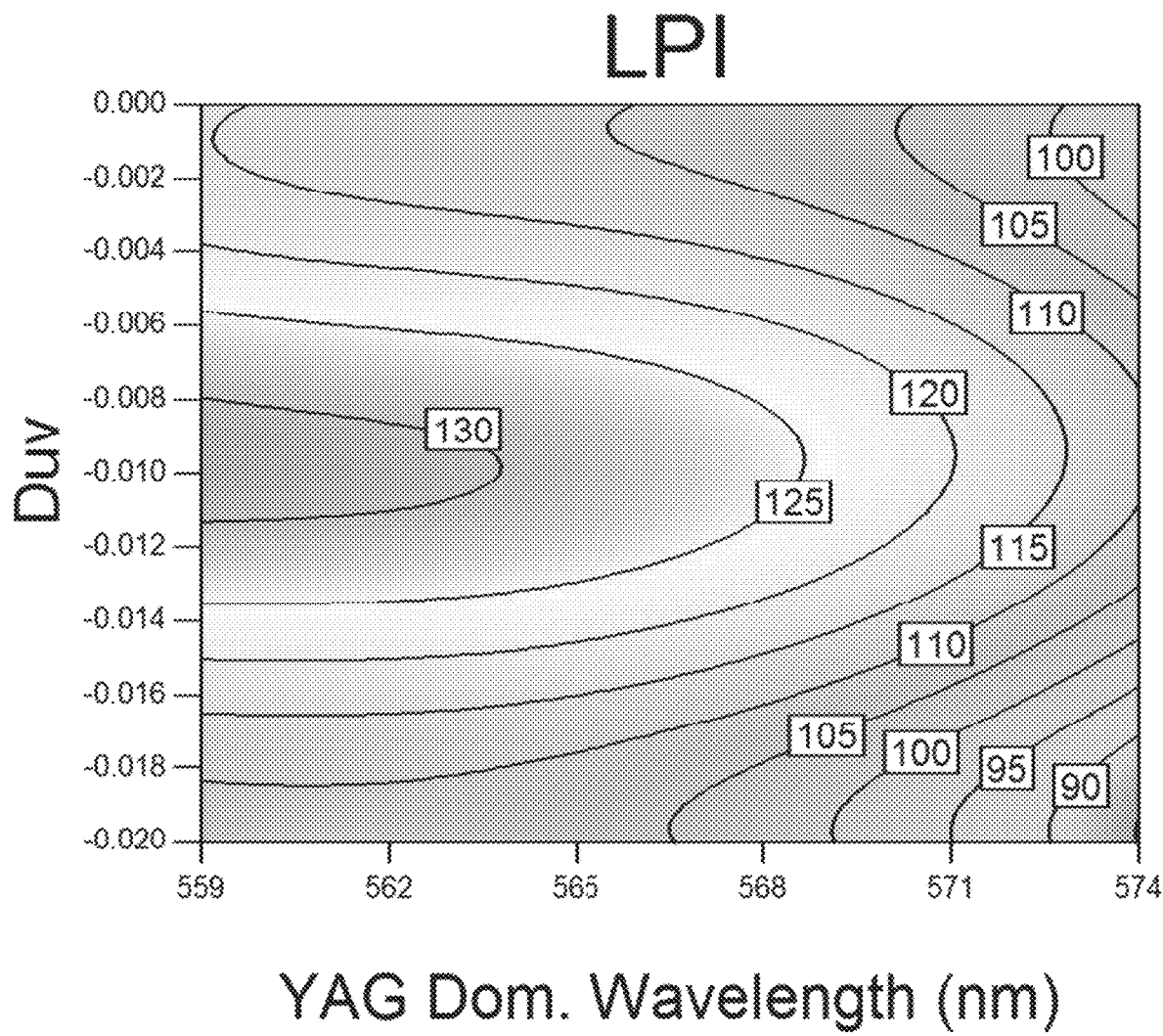
Figure 32C:
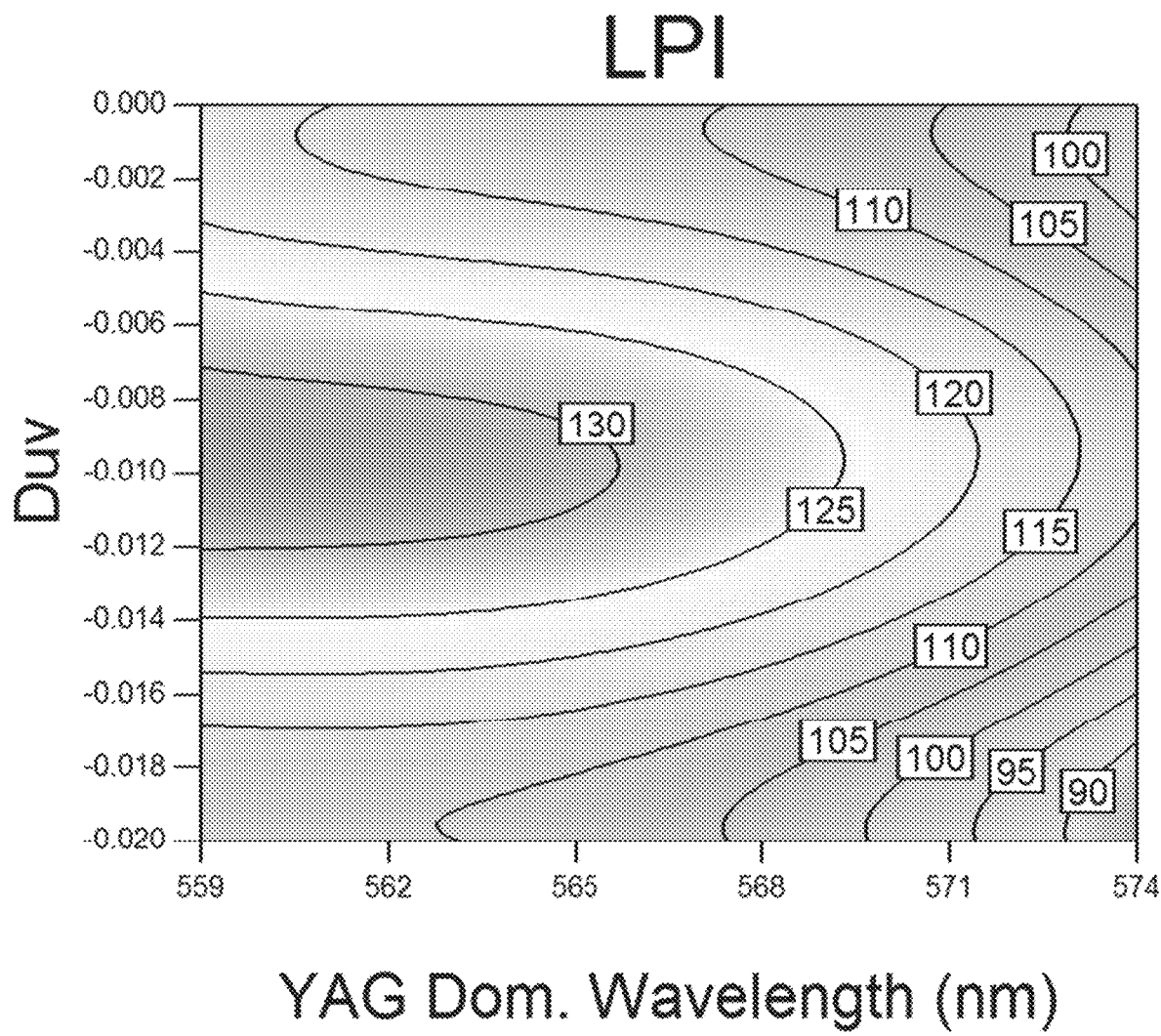
Figure 32D:
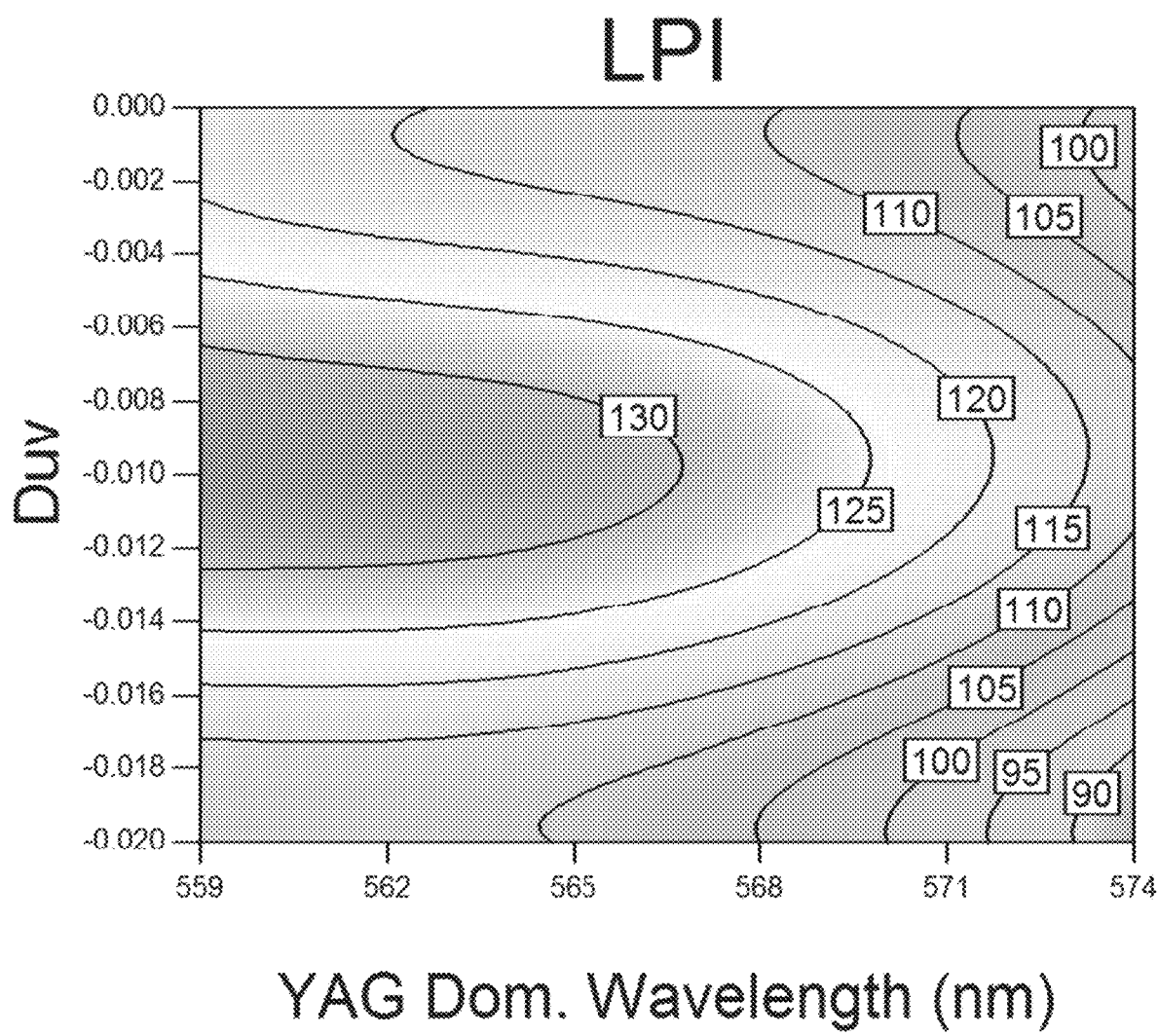
Figure 32C:
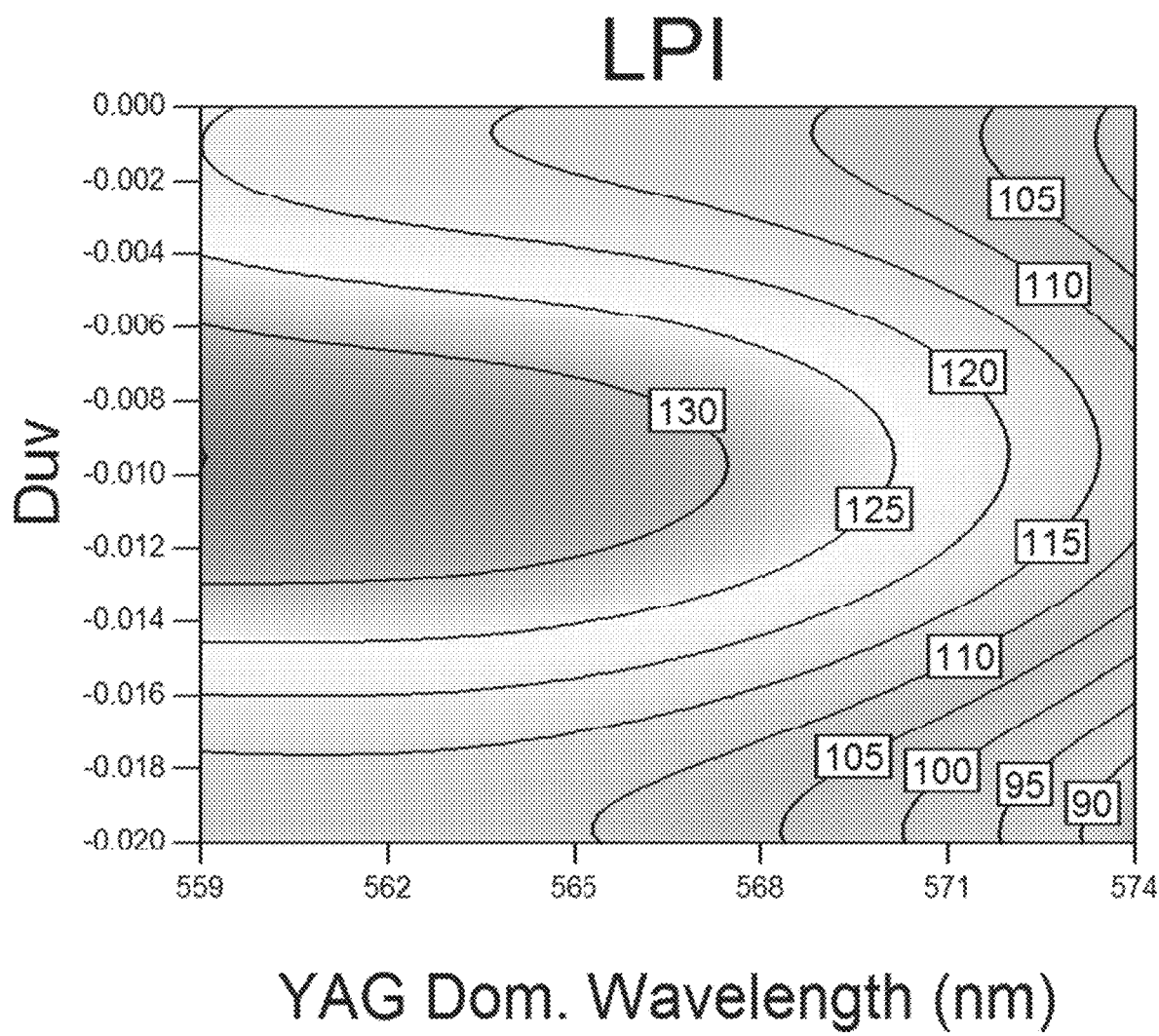
Figure 32F:
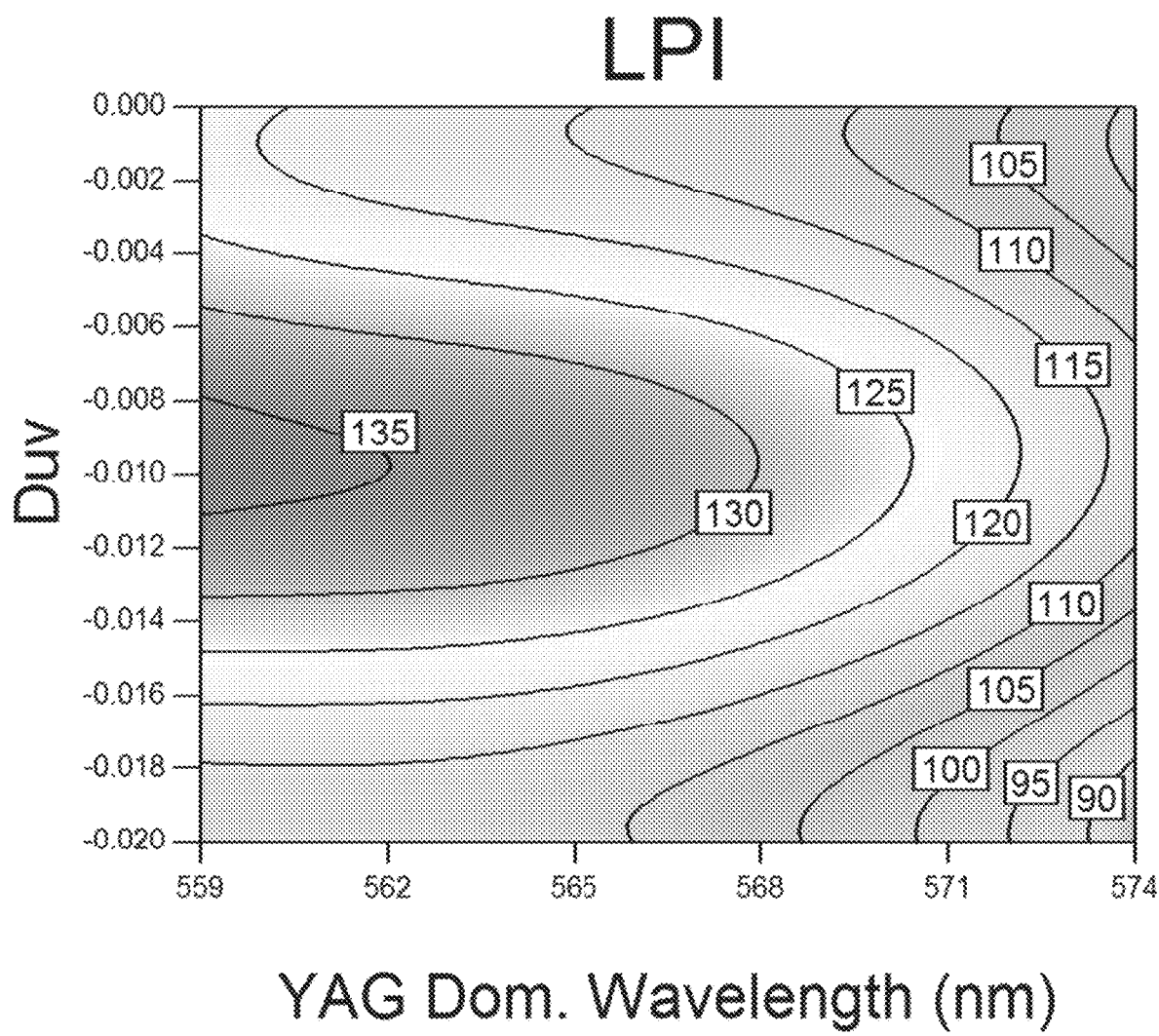
Figure 32G:
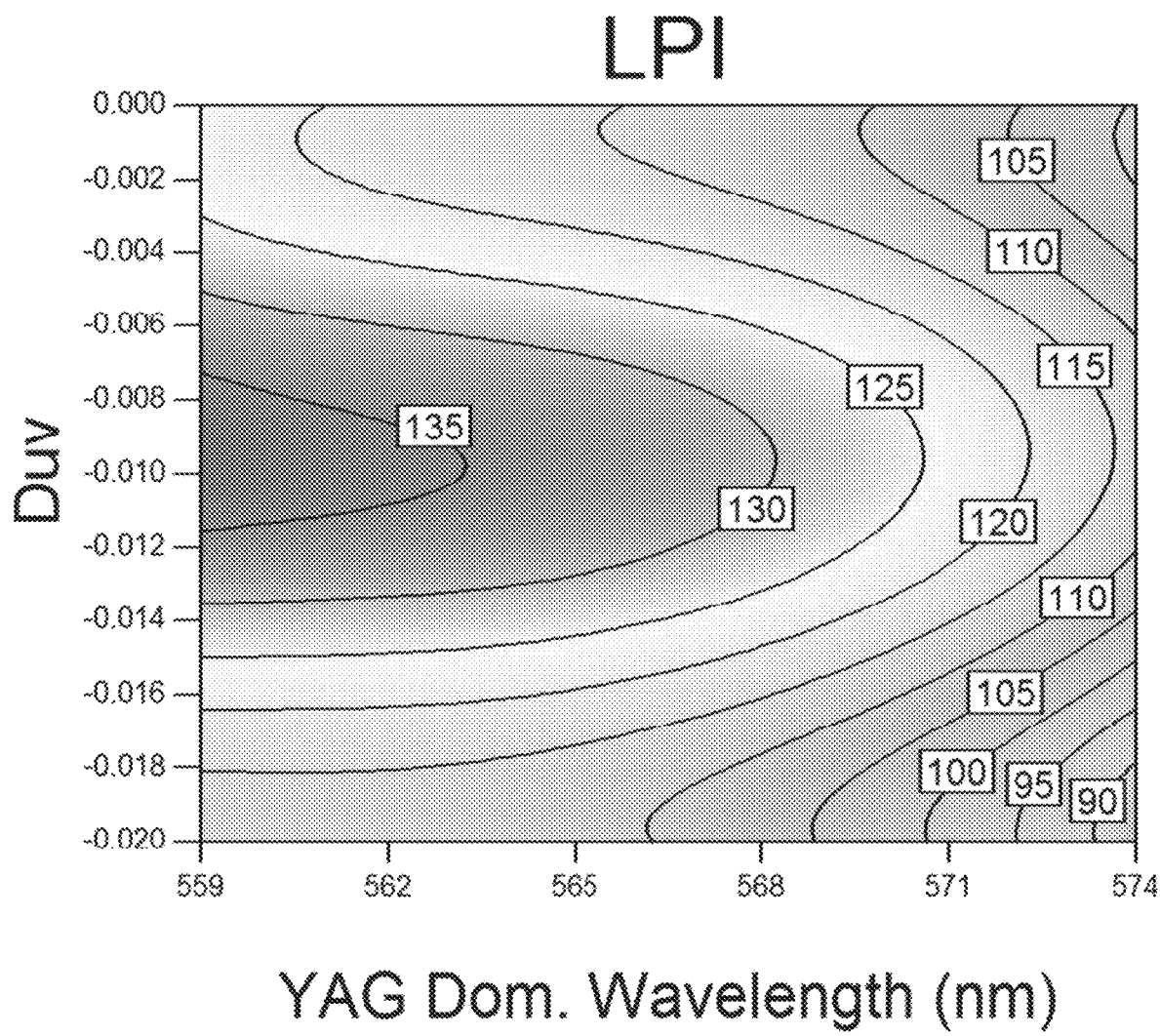
Figure 32H:
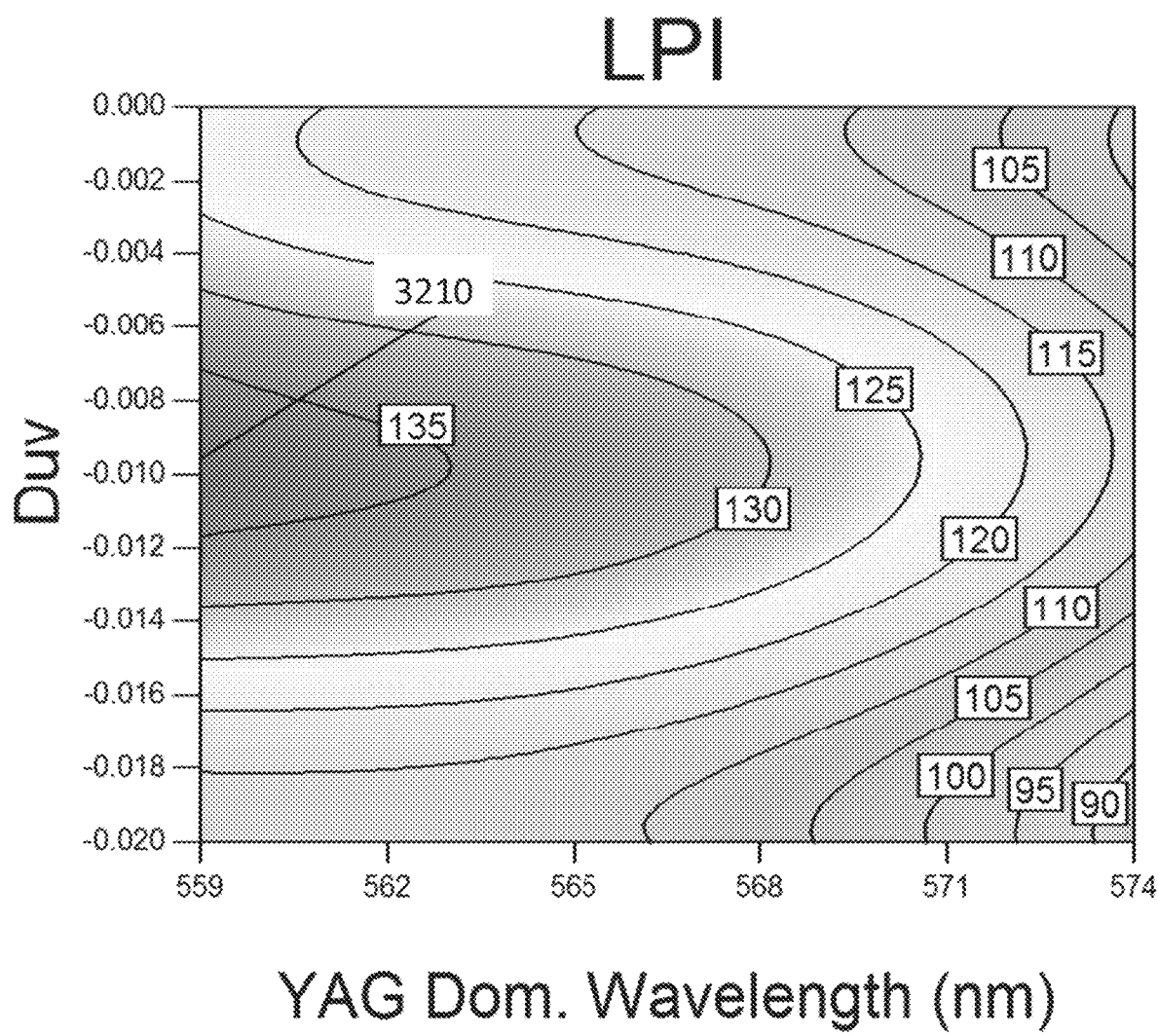
Figure 33A:
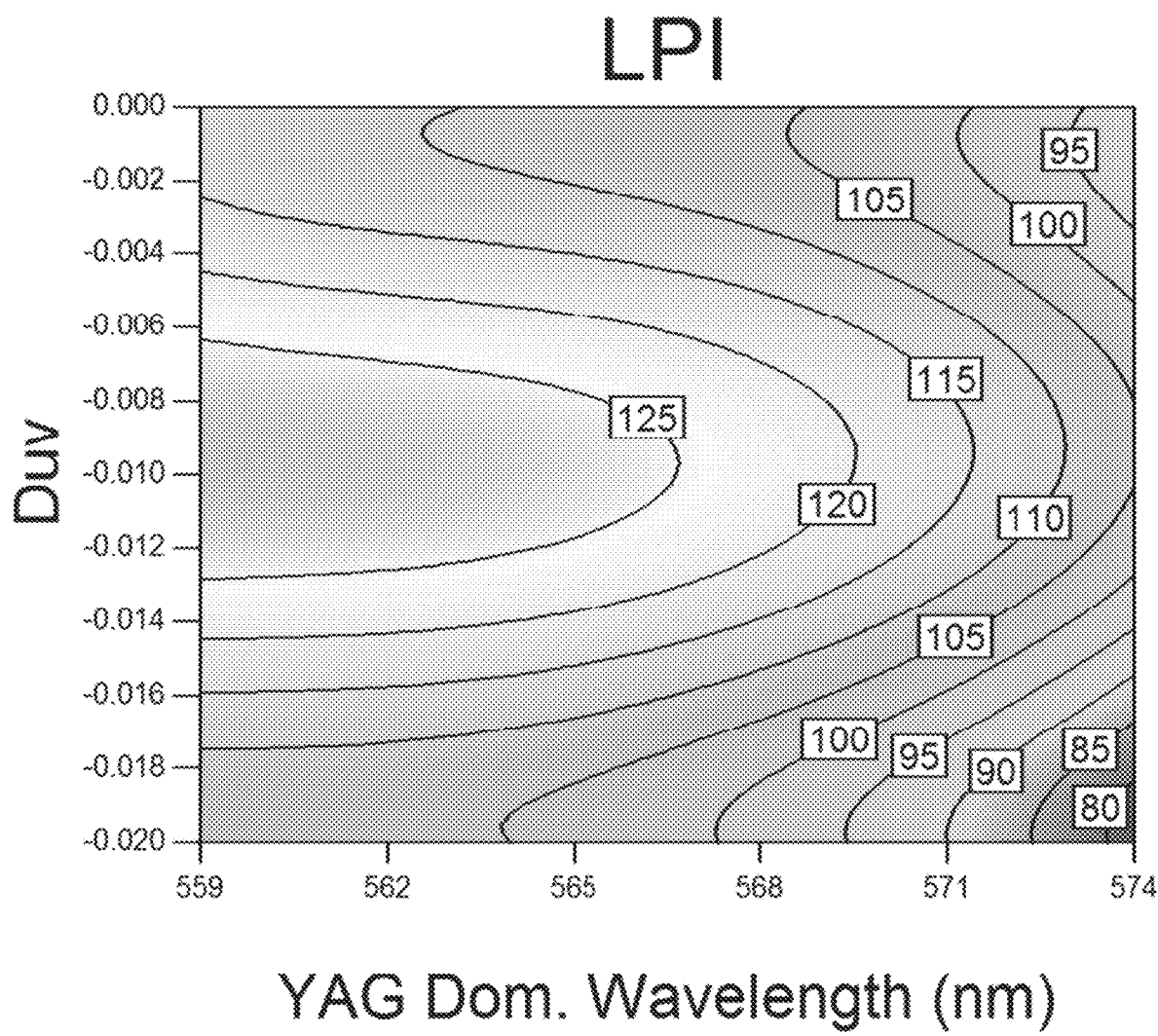
FIGS. 33a-h illustrate the contour plots at 3000 K of LPI versus dominant wavelength of the YG YAG phosphor on the x-axis, and Duv on the y-axis, where the red emitter is comprised of 75% the NR phosphor of FIGS. 16 and 25% the broad red nitride phosphor of FIG. 15 having peak wavelength of 610 nm (FIG. 33a), 620 nm (FIG. 33b), 630 nm (FIG. 33c), 640 nm (FIG. 33d), 650 nm (FIG. 33e), 660 nm (FIG. 33f), 670 nm (FIG. 33g), 680 nm (FIG. 33h) according to some embodiments.
Figure 33B:
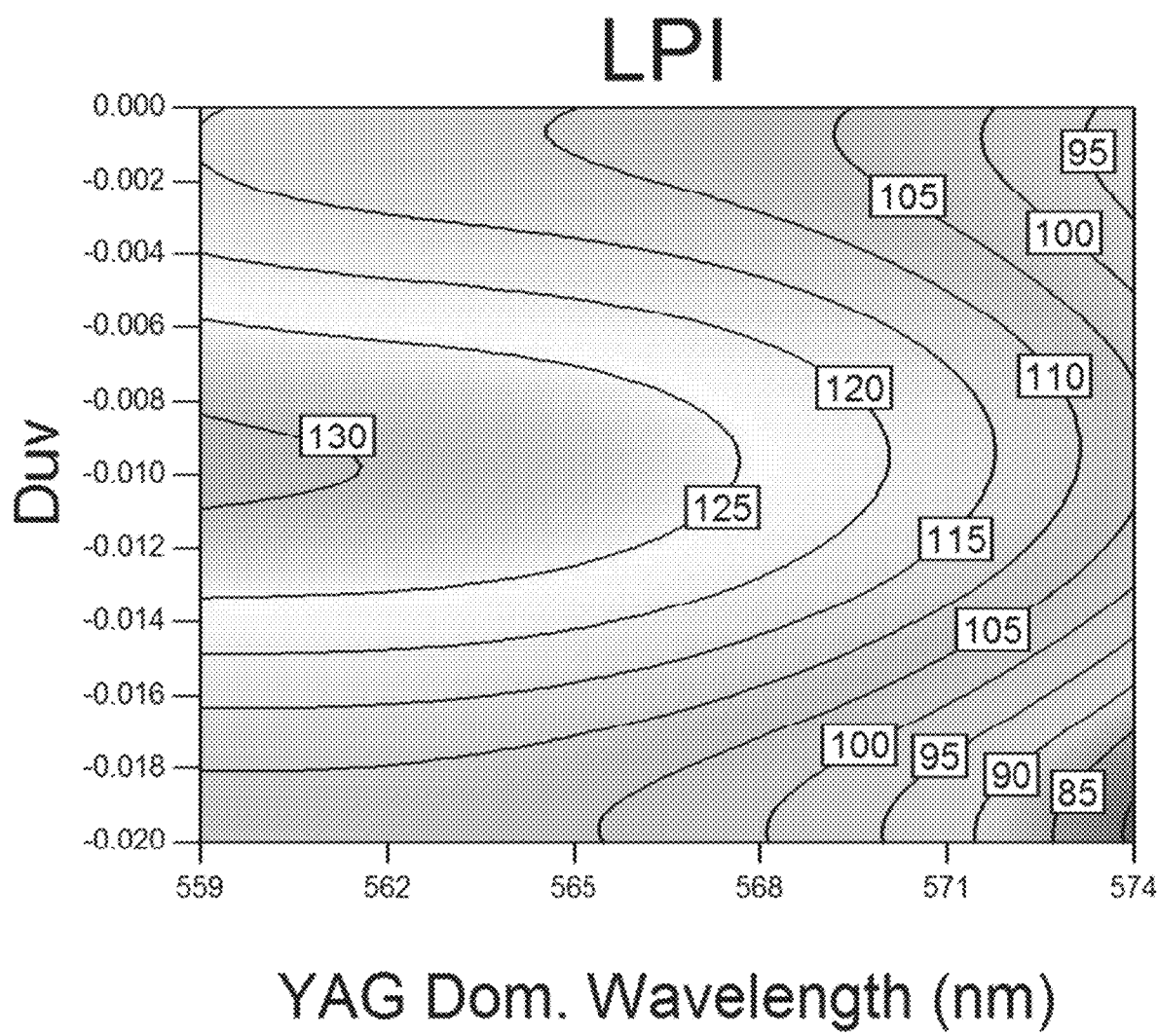
Figure 33C:
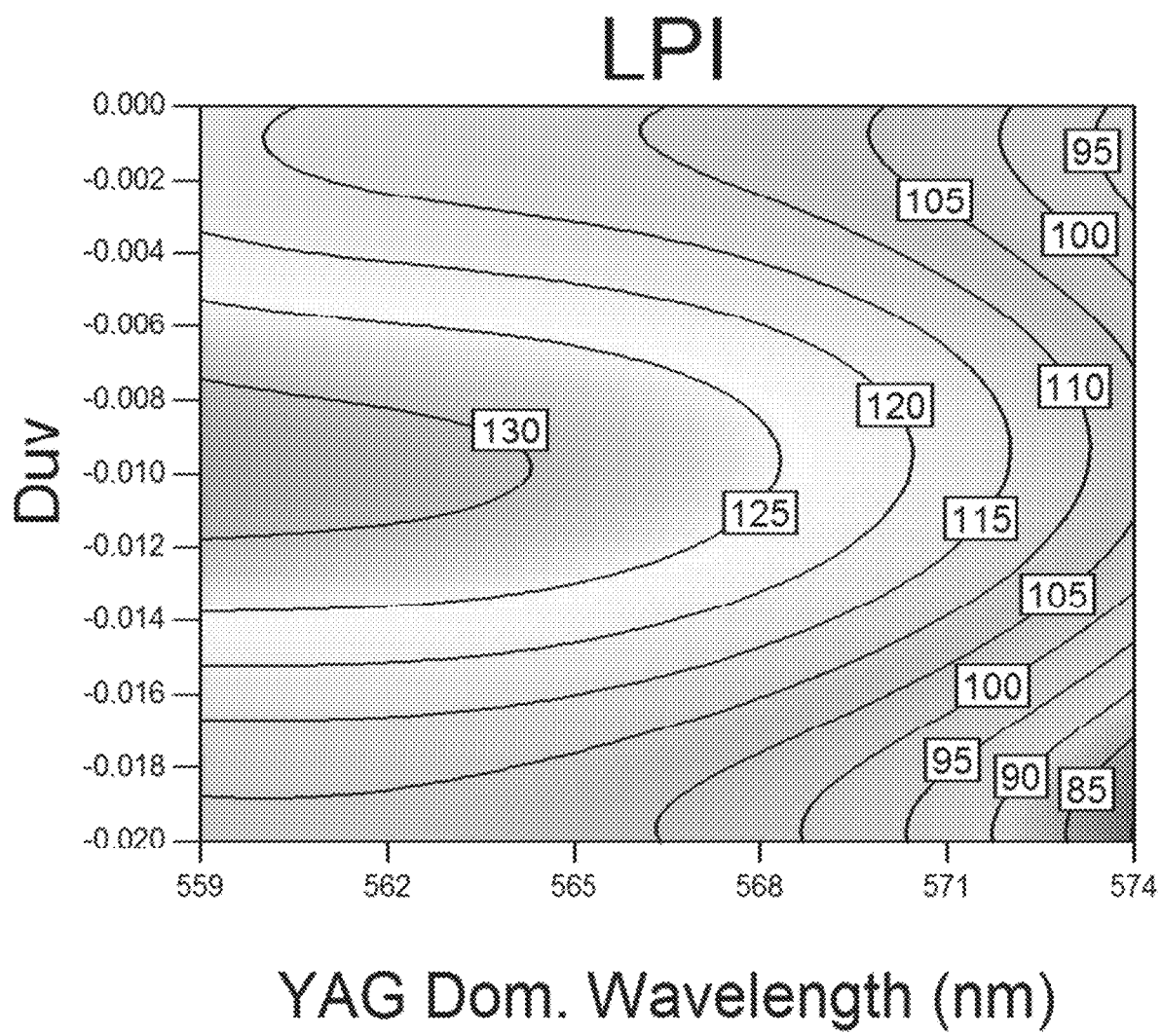
Figure 33D:
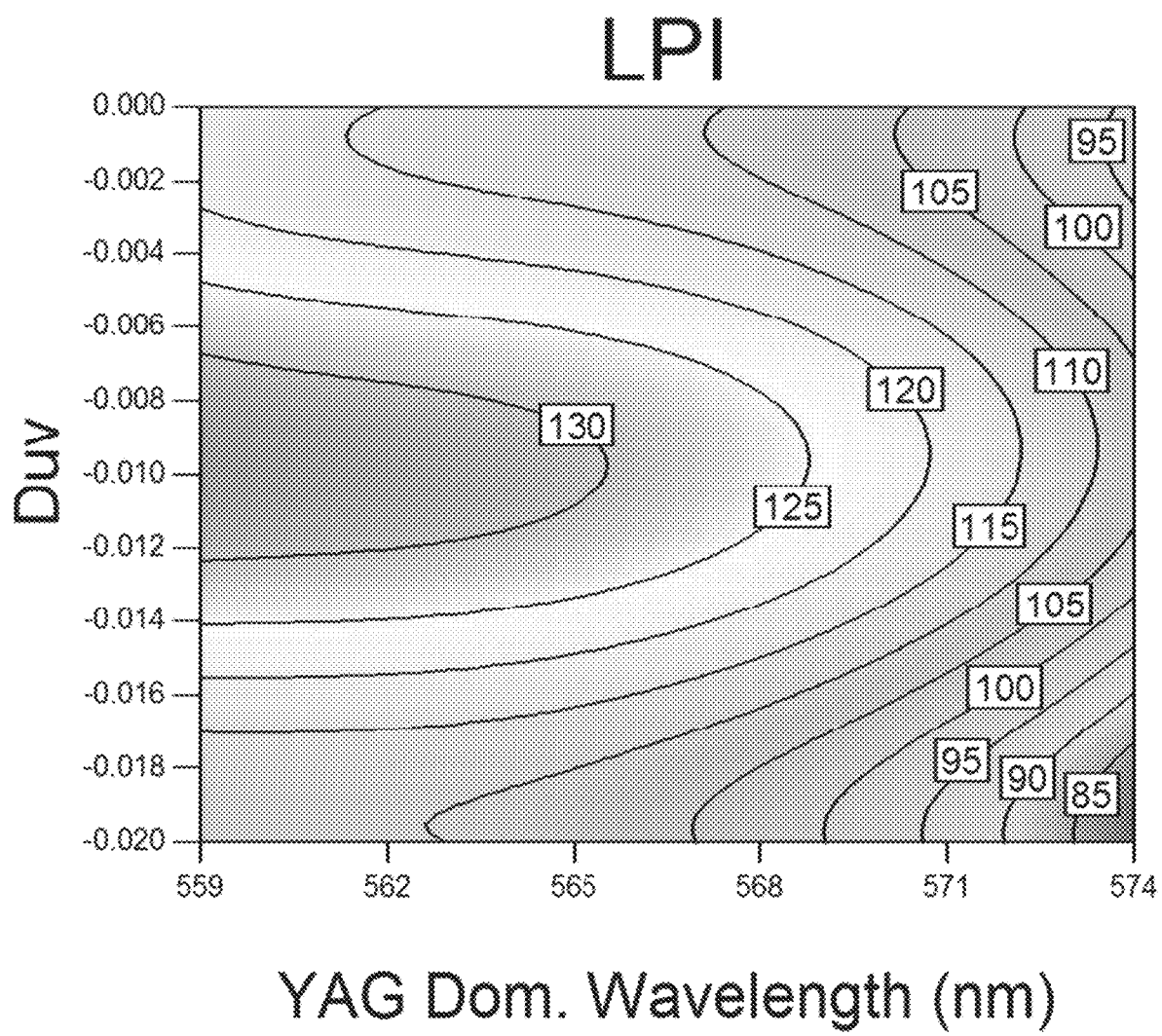
Figure 33E:
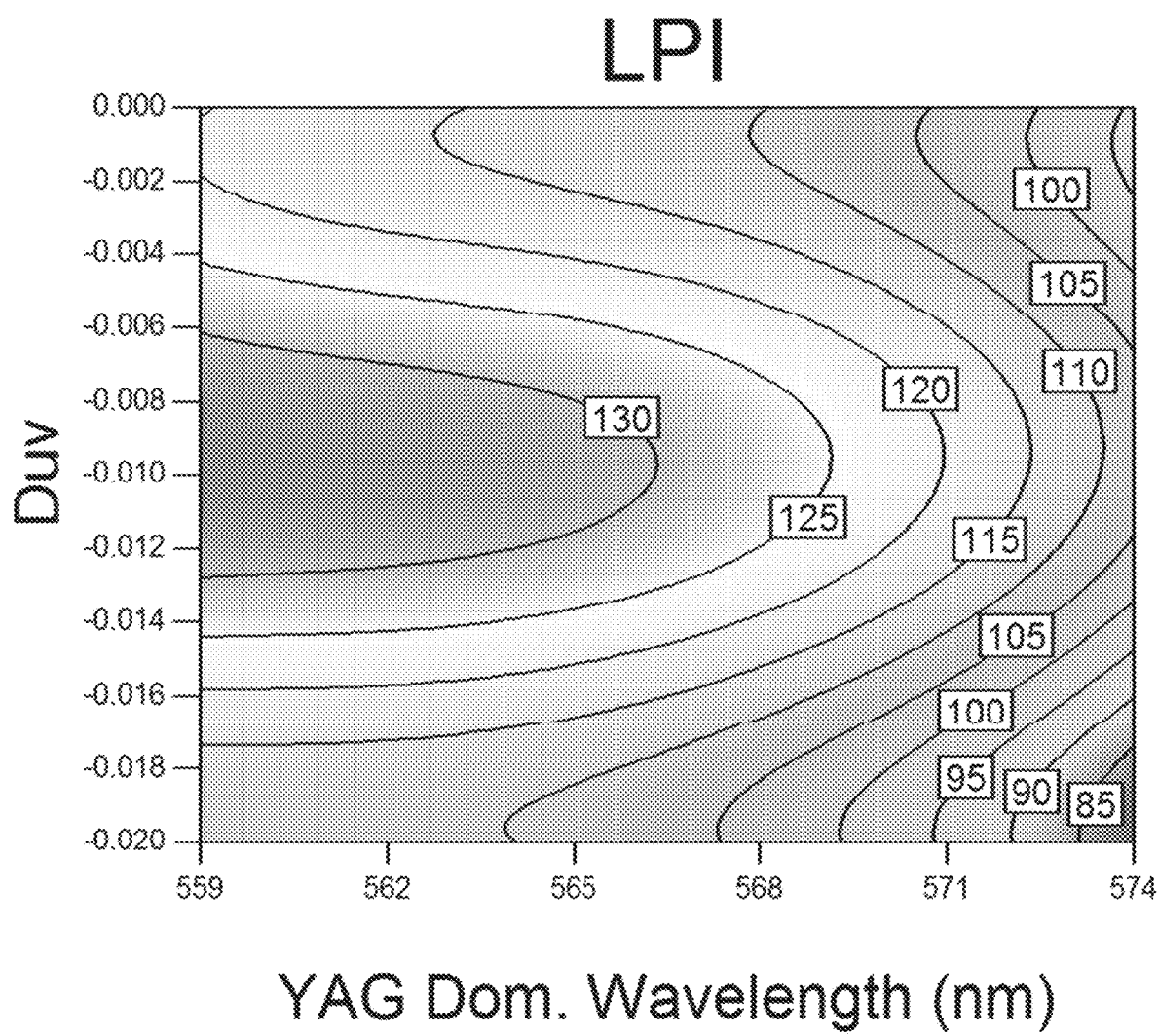
Figure 33F:
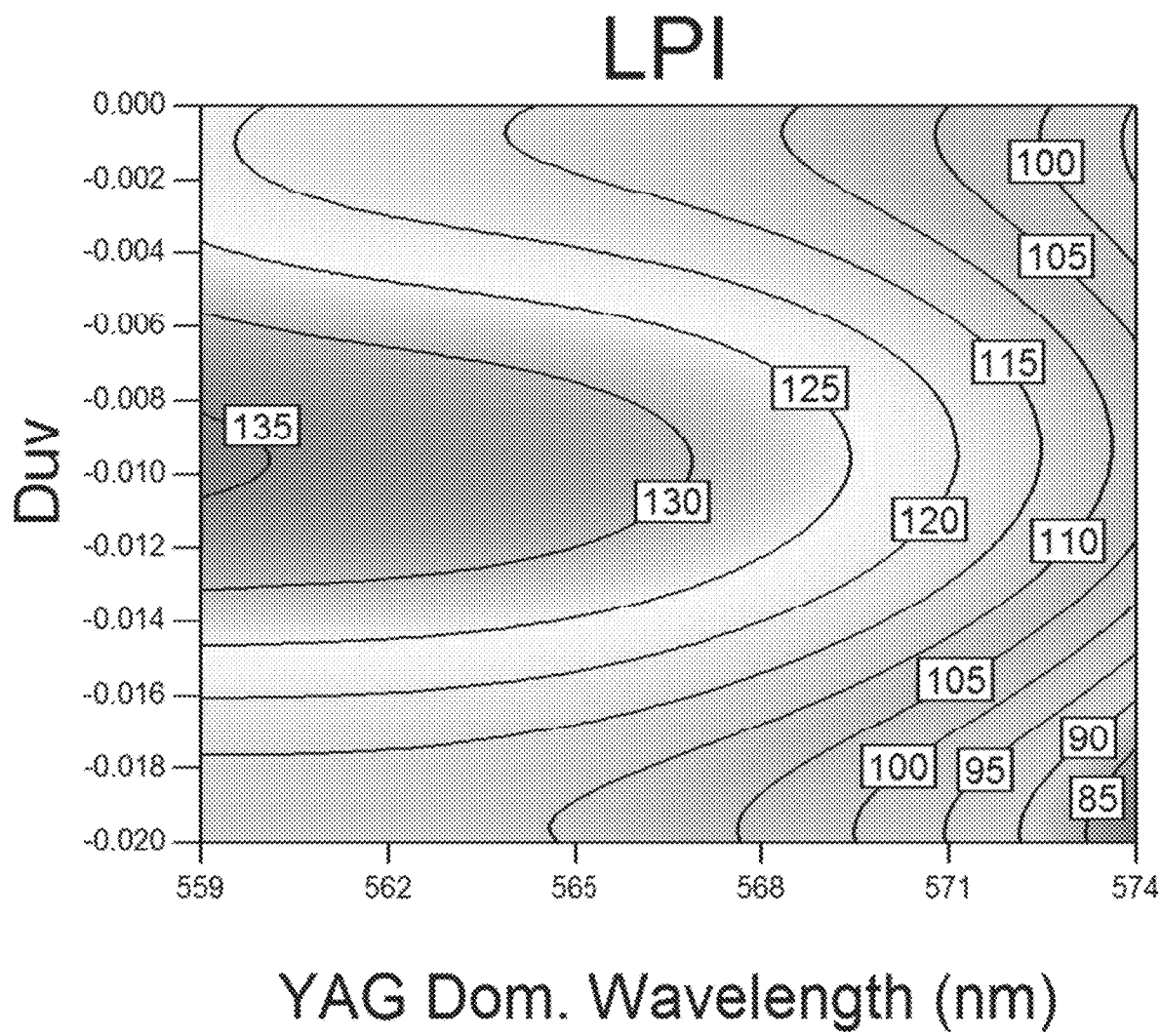
Figure 33G:
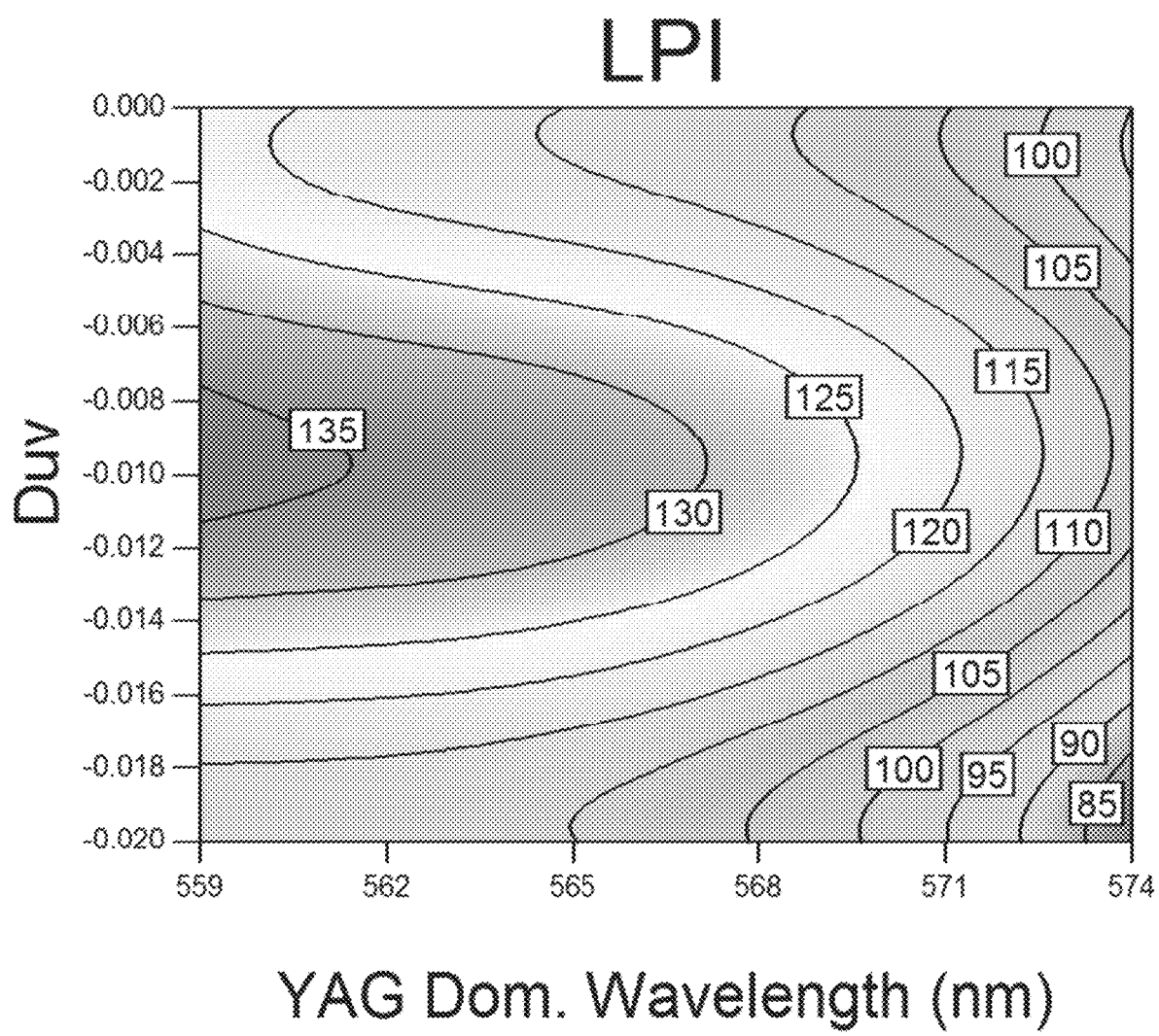
Figure 33H:
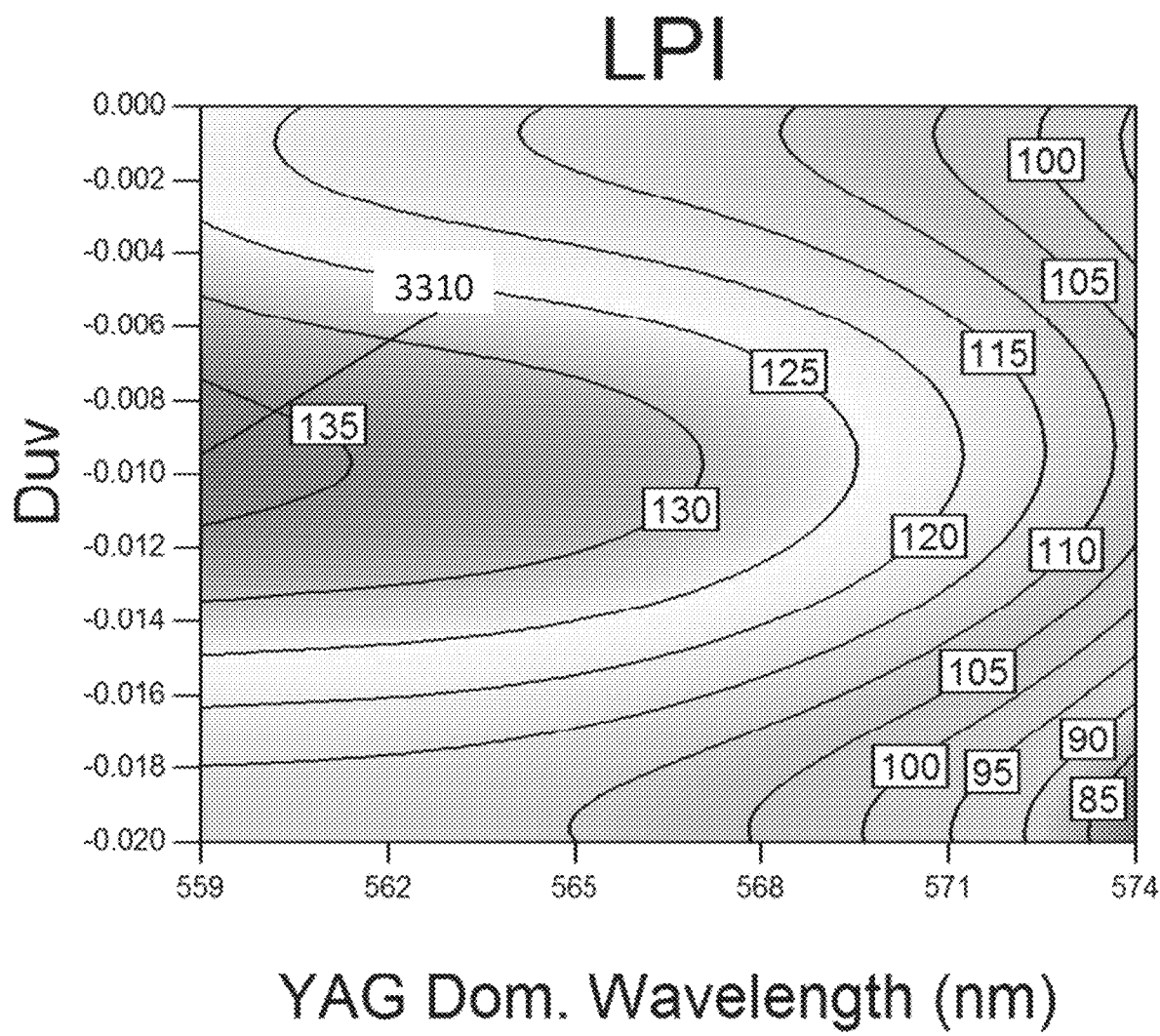

Equation (10) may be used, for example, to plot the dashed line labeled 120 in FIG. 30a for the case of 2700 K and $Peak_{Nit}$=640 nm. The values for coefficients, $a_i$ and $b_i$ (i=1, 2, 3), and $\lambda_0$=630 (so that $Peak_{Nit}$−$\lambda_0$=10) in the 120 column of Table 3 below when inserted into Equation (10), along with CCT=2700, result in Equation (10a) below.

TABLE 3

|  | LPI | | | | |
| --- | --- | --- | --- | --- | --- |
|  | 120 | 125 | 130 | 135 | 140 |
| $a_1$ | −0.155 | −0.229 | −0.227 | −0.328 | −0.828 |
| $a_2$ | 2.91 | 3.50 | 3.12 | 3.56 | 5.61 |
| $a_3$ | 1.6 | 0.0 | 1.1 | 0.0 | −3.6 |
| $b_1$ | 0.00001 | −0.00002 | −0.00004 | −0.00010 | −0.00030 |
| $b_2$ | 0.0014 | 0.0015 | 0.0014 | 0.0016 | 0.0020 |
| $b_3$ | −0.0010 | −0.0010 | −0.0005 | −0.0006 | −0.0009 |
| $\lambda_0$ | 630 | 639 | 649 | 659 | 670 |

$$Dom_{YAG} < \left(-0.155(10) + 2.91\sqrt{10} + 1.6\right)$$
$$\sqrt{1 - \left(\frac{Duv + .0099 - .00001*(10)}{0.00001(10) + 0.0014\sqrt{10} - 0.001}\right)^2} +$$
$$569.8 - 0.004*2700$$
$$Dom_{YAG} < (9.22)\sqrt{1 - \left(\frac{Duv + .0098}{0.00353}\right)^2} + 559$$

Equation (10a)

Similarly, the values for coefficients, $a_i$ and $b_i$ (i=1, 2, 3), and $\lambda_0$ in Table 3 when substituted into Equation (10) produce each of the dashed-line curves in FIGS. 30a-e for CCT=2700 K, and FIGS. 31a-e for CCT=3000 K, corresponding to each LPI value of 120 and higher from FIGS. 27d-h and FIGS. 28d-h. Since there are not values of LPI of 120 or higher for the cases where $Peak_{Nit}$=610, 620, and 630 nm, as apparent in FIGS. 27a-c and 28a-c, FIGS. 30a-e and 31a-e correspond to the values of $Peak_{Nit}$=640, 650, 660, 670, and 680 nm.

The Group 3 DoE (YAG+PFS+Nit) included all combinations of the 1 blue LED, 25 YG YAG:Ce phosphors, and 20 BR Nitride phosphors, described above, resulting in 500 unique combinations of emitters (1 B×25 YG×1 NR×20 BR) at each of 3 different ratios of BR power to NR power (emitted power summed over the full wavelength range of red emission, as provided in FIG. 15 and FIG. 16), in increments of 25%, so that (Nit power)/(Nit power+PFS power) n=0.25, 0.50, 0.75; and (PFS power)/(Nit power+PFS power) p=0.75, 0.50, 0.25; where n+p=1, for each of the 20 BR nitride phosphors. As used here, these 3 subsets of the Group 3 DoE may be referred to as Group 3a (n=0.25), Group 3b (n=0.50), and Group 3c (n=0.75). In one or more embodiments, the limiting cases of n=0 and n=1 correspond to the Group 1 (YAG+PFS) and Group 2 (YAG+Nit) DoE's, respectively. In one or more embodiments, the ratios of the blue:green:red emitted power for each of the 500 unique emitter combinations at each of 3 different ratios of BR power to NR power are varied to achieve each of 10 color points (2700 K and 3000 K; Duv=0.000, −0.005, −0.010, −0.015, −0.020), resulting in 15000 unique SPDs. In one or more embodiments, each normalized SPD is sufficient for calculation of all colorimetric characteristics of the light source, assuming that the illuminance of the lighted object or space is in the range of normal photopic vision (i.e., greater than about 10-100 lux, up to about 1,000-10,000 lux (lux=lumens/m$^2$). The range of Peak$_{Nit}$ used in the Group 3 DoE, as shown in FIG. 21, is from about 610 nm to about 680 nm, including 20 different BR phosphors in that range.

The colorimetric response of interest, LPI, is plotted in FIGS. 32a-h vs. Dom$_{YAG}$ (x-axis) and Duv (y-axis) of the color point at 2700 K, for the case of the NR phosphor having peak wavelength of 631 nm, and a BR phosphor having peak wavelengths (Peak$_{Nit}$) of 610 nm (FIG. 32a) through 680 nm (FIG. 32h), in increments of 10 nm, and the ratio of Nit power to PFS power given by n=0.25, so that p=0.75.

The colorimetric response of interest, LPI, is plotted in FIGS. 33a-h vs. Dom$_{YAG}$ (x-axis) and Duv (y-axis) of the color point at 3000 K, for the case of the NR phosphor having peak wavelength of 631 nm, and a BR phosphor having peak wavelengths (Peak$_{Nit}$) of 610 nm (FIG. 33a) through 680 nm (FIG. 33h), in increments of 10 nm, and the ratio of Nit power to PFS power given by n=0.25, so that p=0.75.

Figure 34:
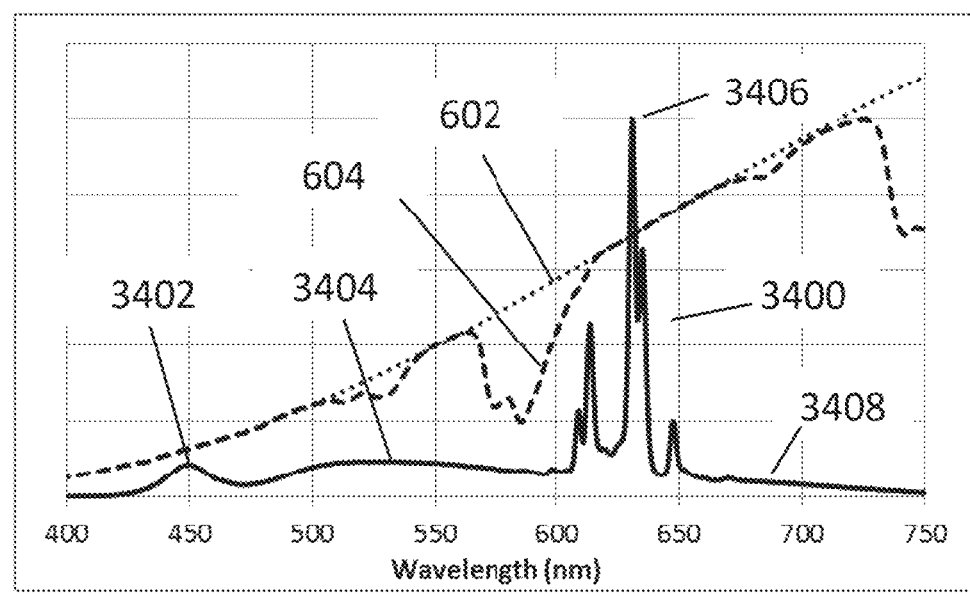
FIG. 34 illustrates the SPD of the discrete run having the highest LPI value for a light source comprising a blue LED, a YG YAG phosphor, and a red emitter comprised of 75% NR phosphor and 25% broad red nitride phosphor at 2700 K according to some embodiments.
Figure 35A:
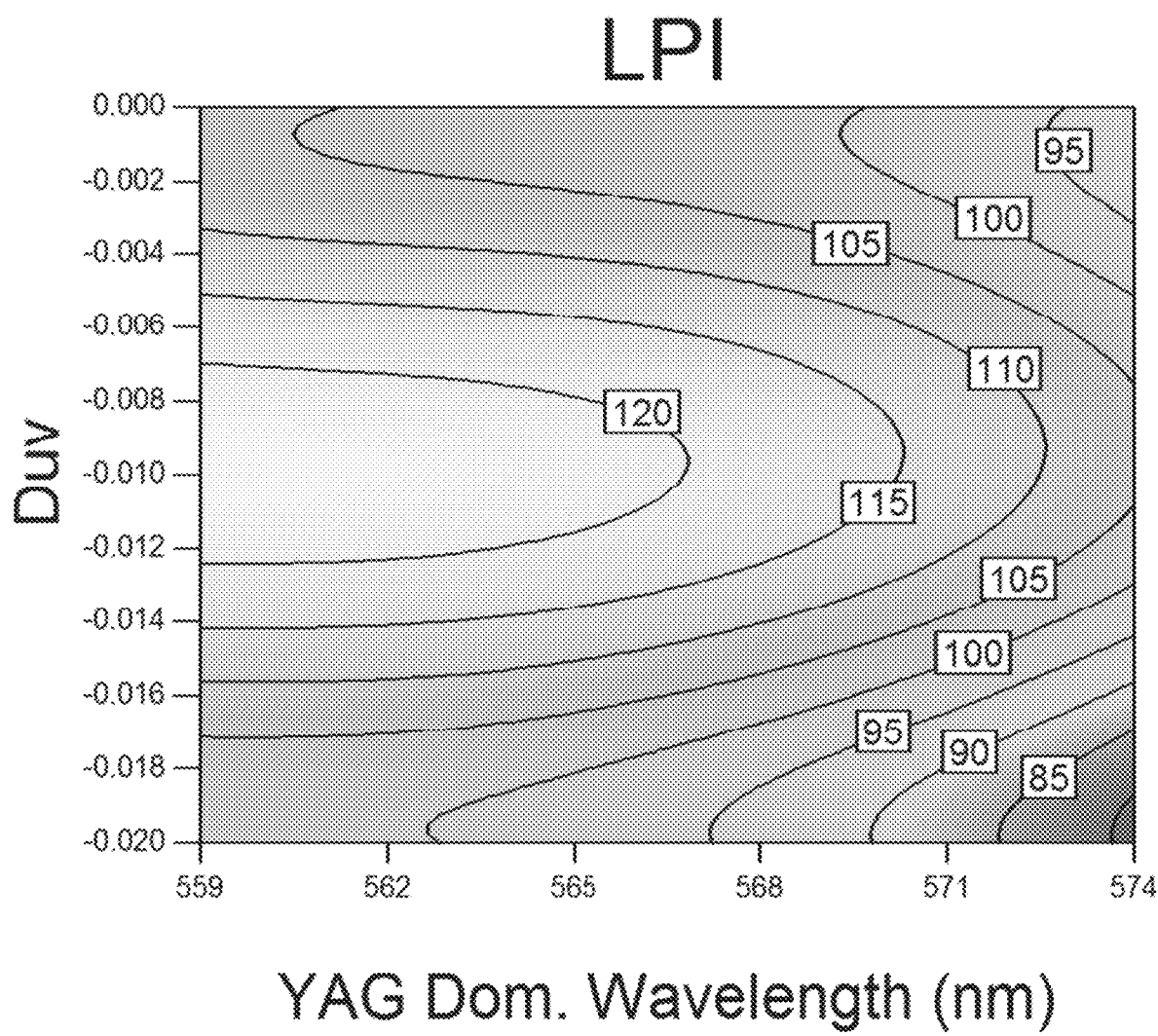
FIGS. 35a-h illustrate the contour plots at 2700 K of LPI versus dominant wavelength of the YG YAG phosphor on the x-axis, and Duv on the y-axis, where the red emitter is comprised of 50% the NR phosphor of FIGS. 16 and 50% the broad red nitride phosphor of FIG. 15 having peak wavelength of 610 nm (FIG. 35a), 620 nm (FIG. 35b), 630 nm (FIG. 35c), 640 nm (FIG. 35d), 650 nm (FIG. 35e), 660 nm (FIG. 35f), 670 nm (FIG. 35g), 680 nm (FIG. 35h) according to some embodiments.
Figure 35B:
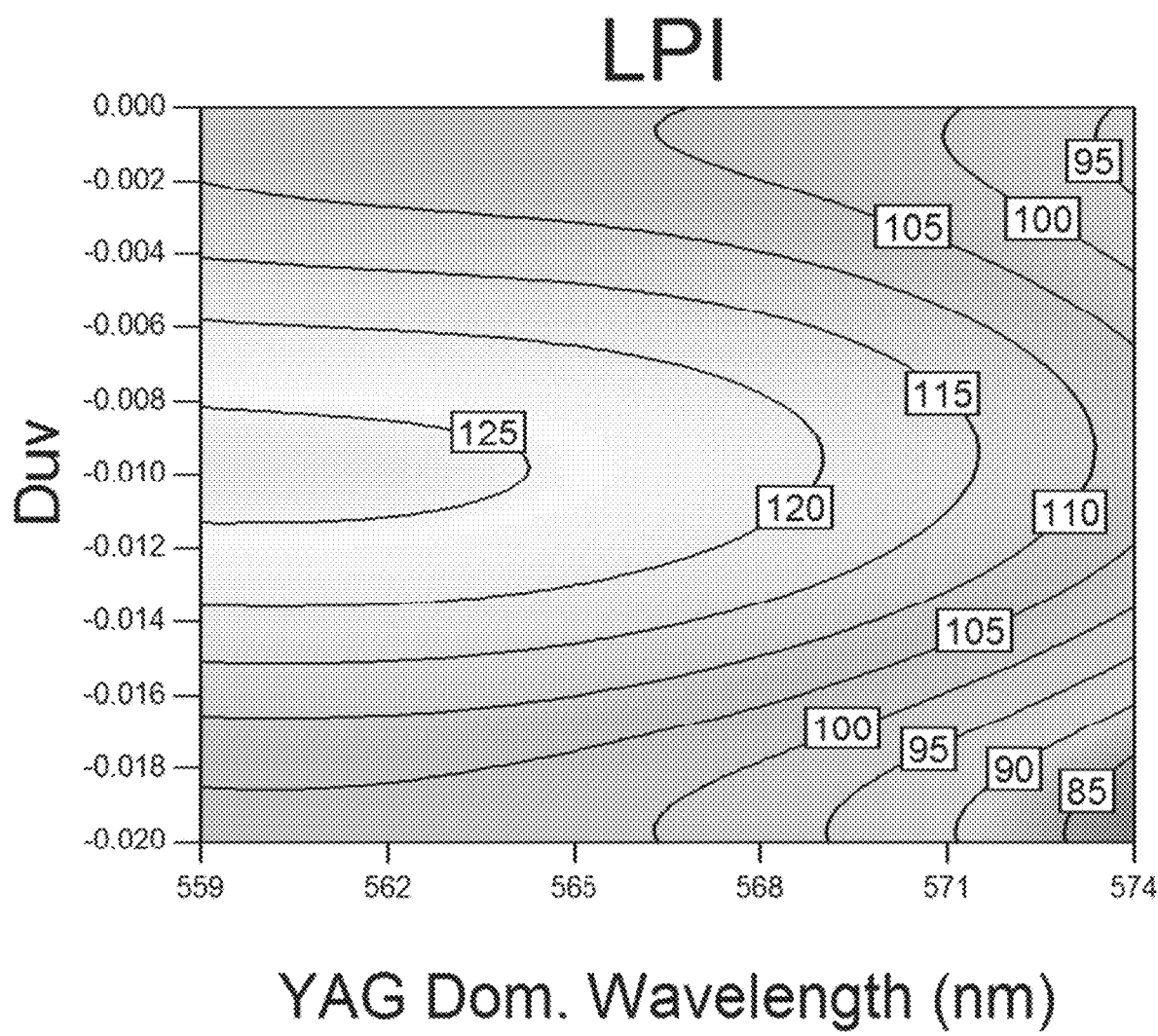
Figure 35C:
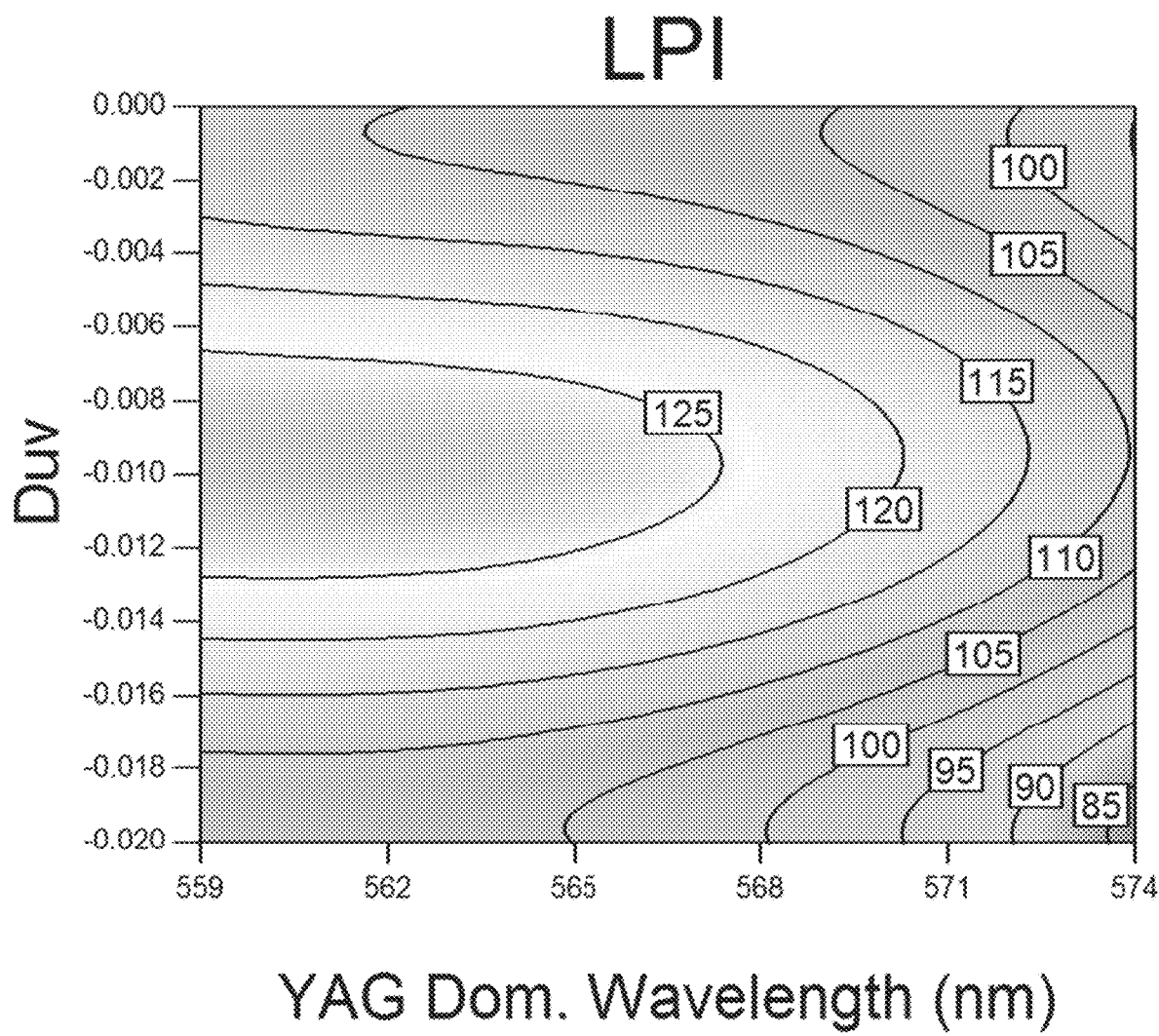
Figure 35D:
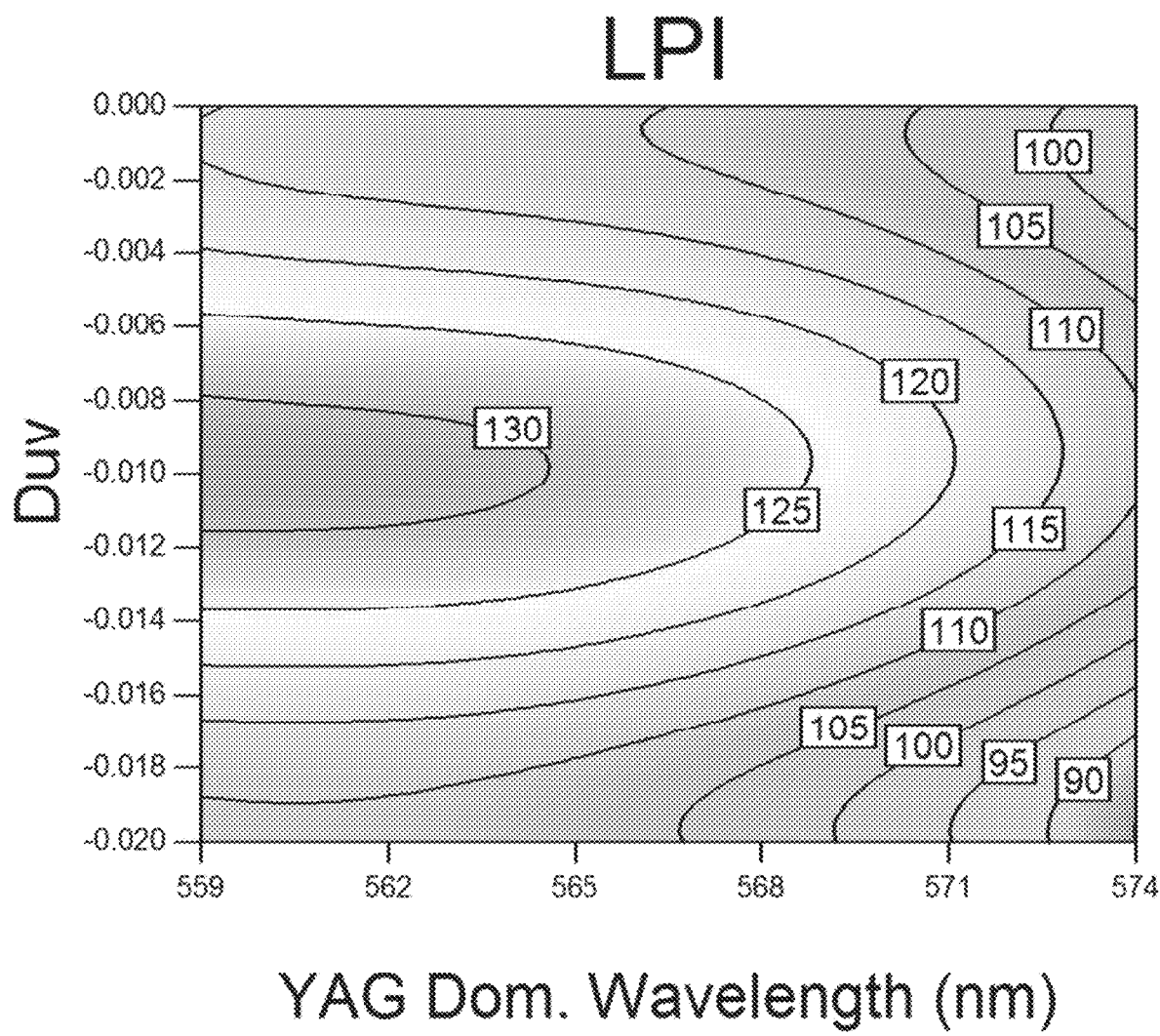
Figure 35E:
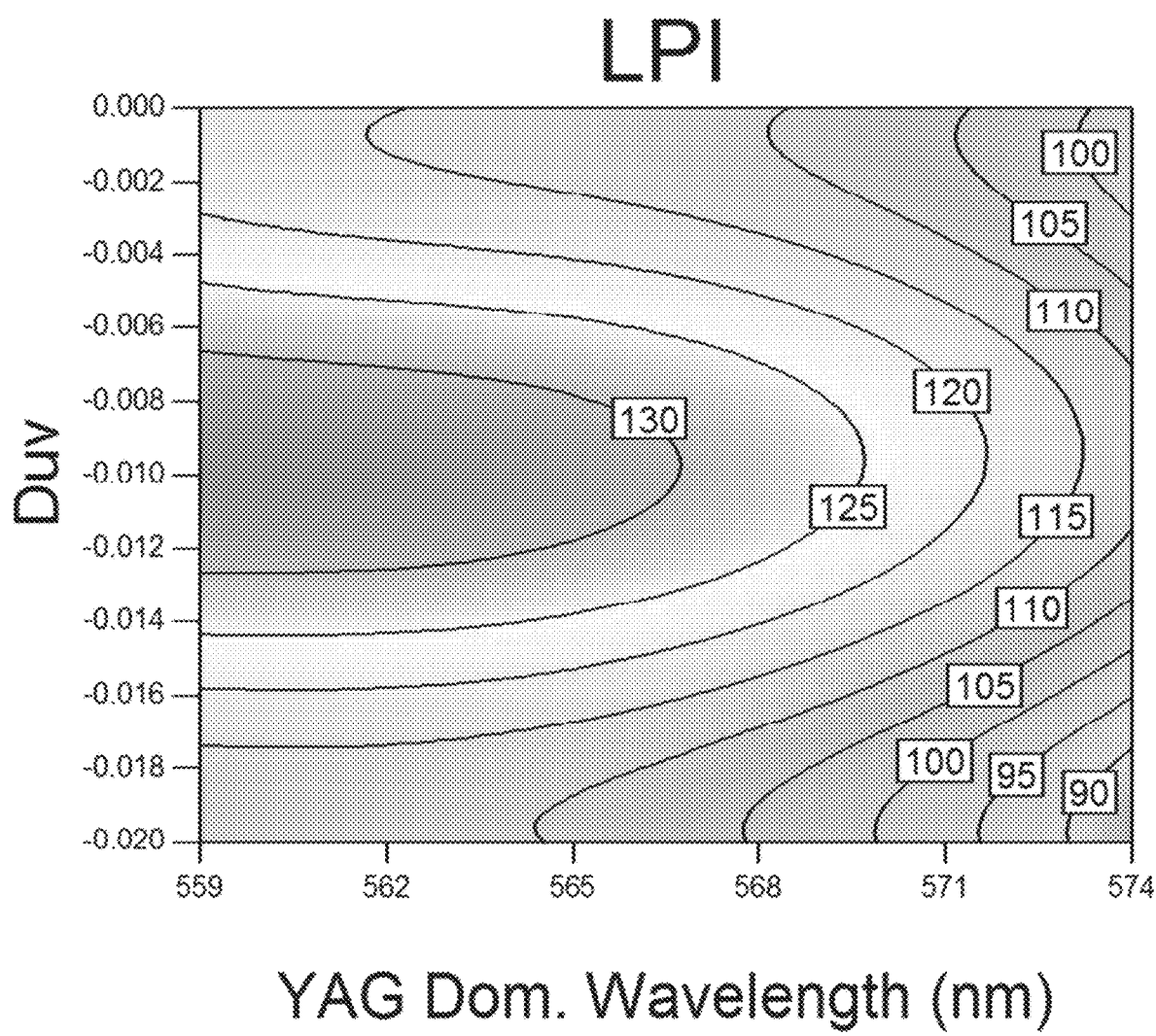
Figure 35F:
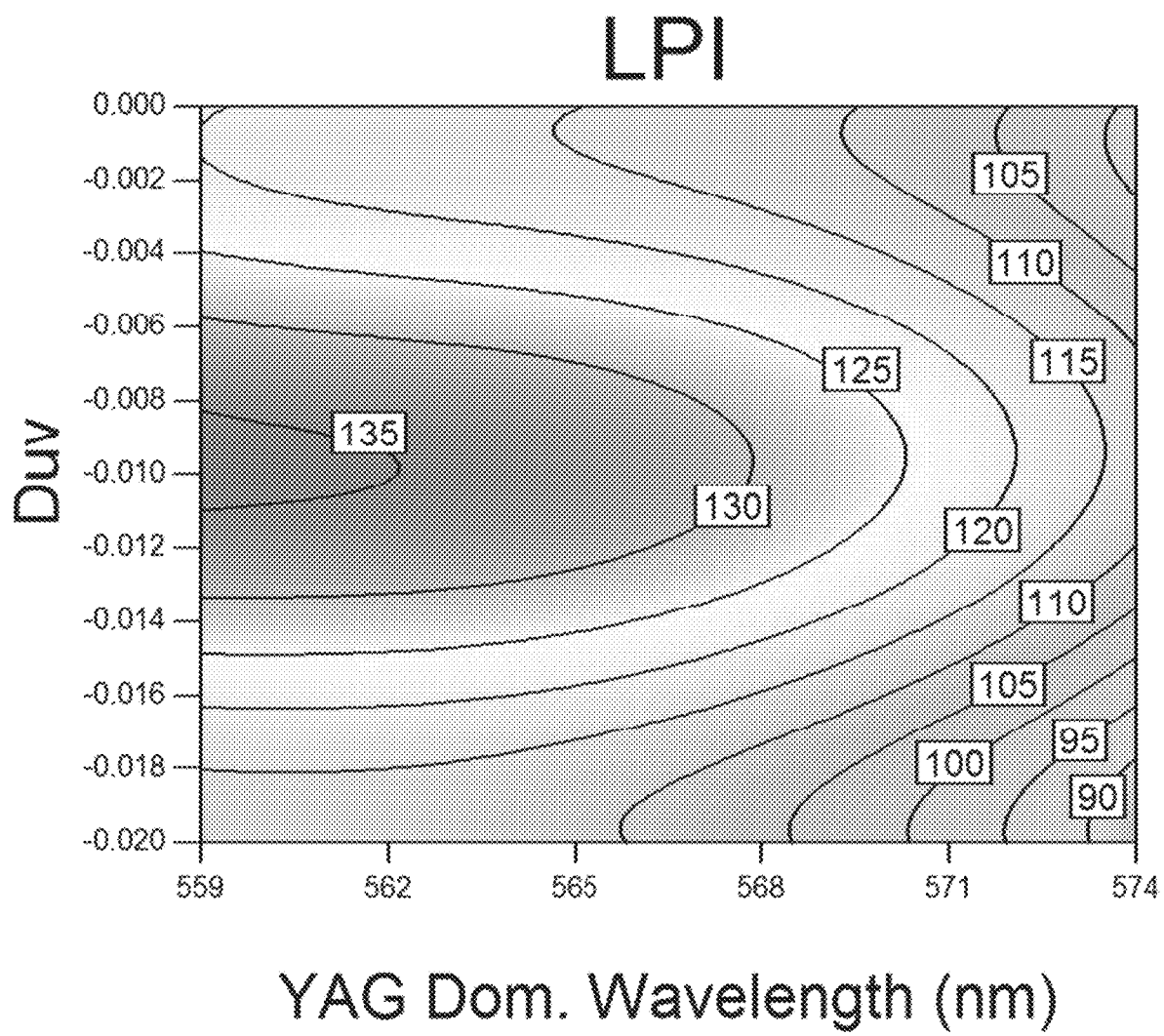
Figure 35G:
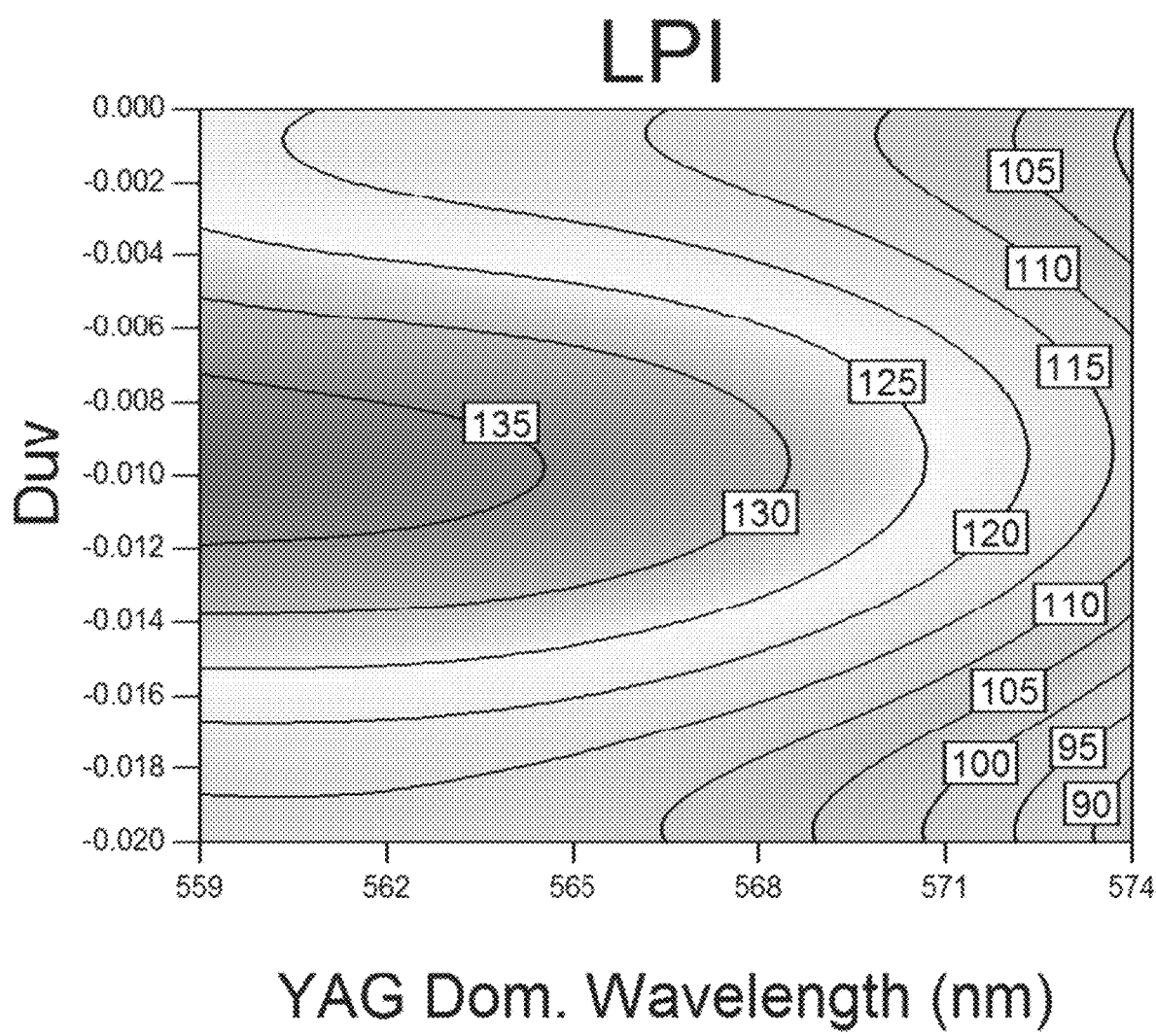
Figure 35H:
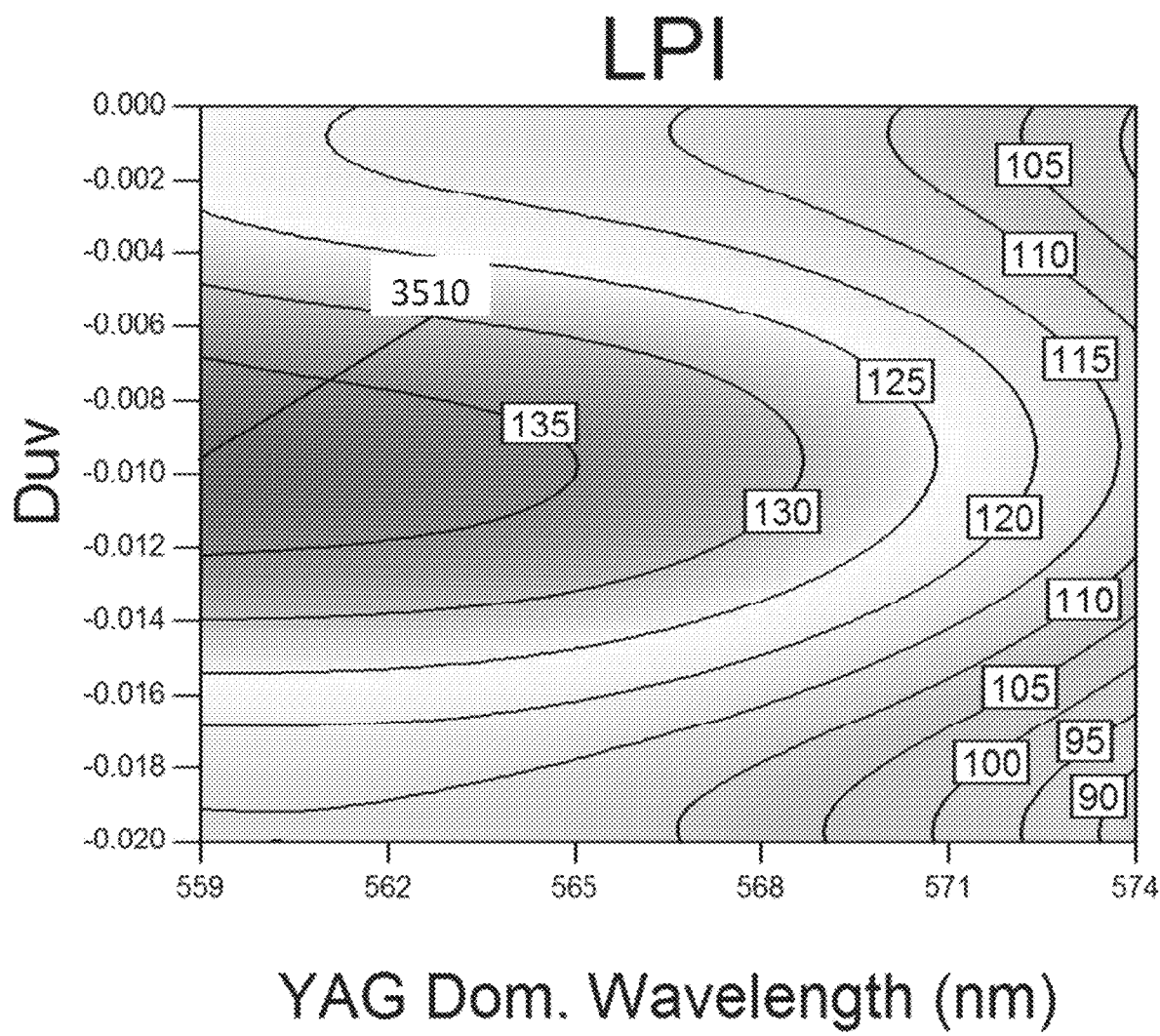
Figure 36A:
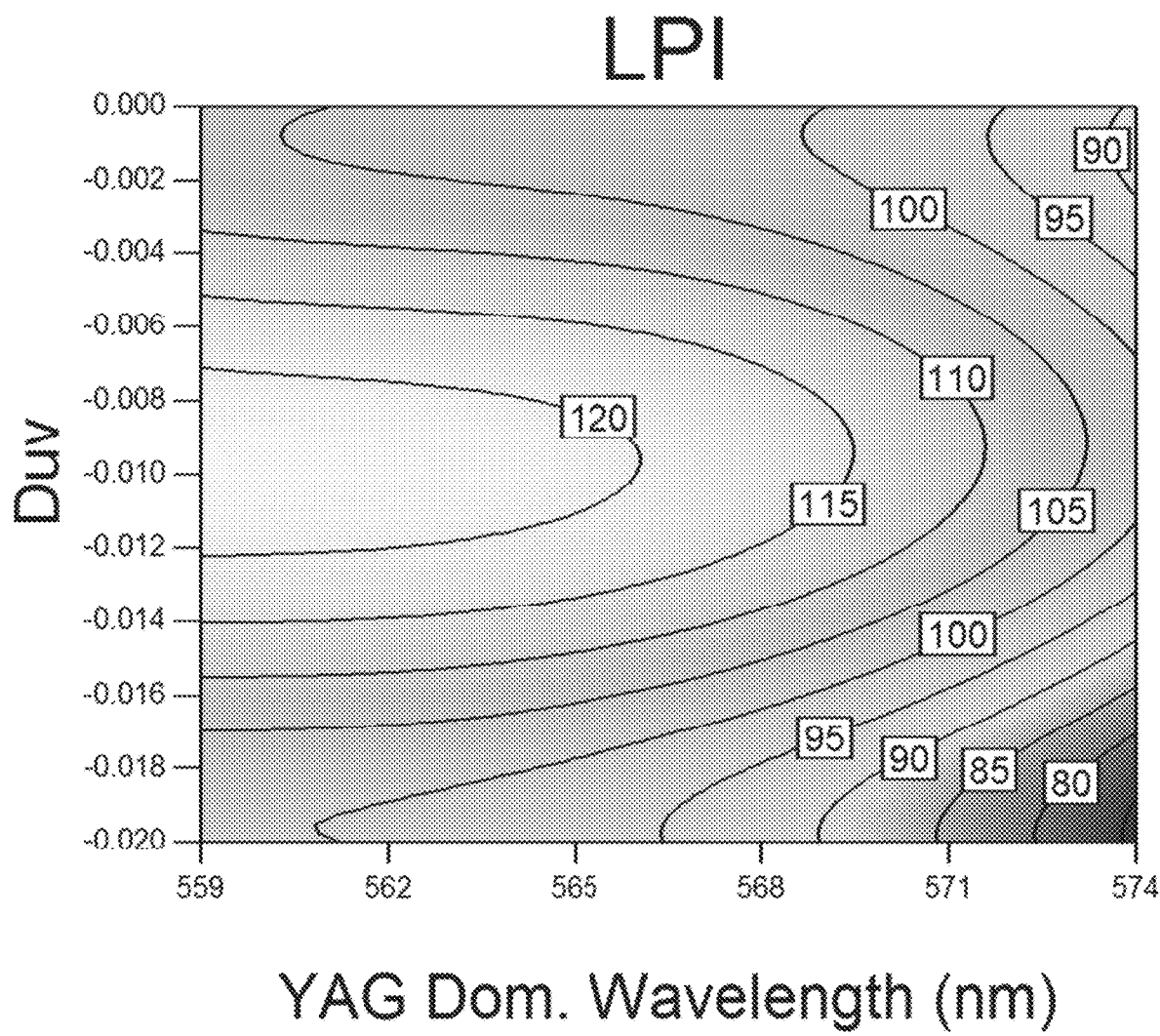
FIGS. 36a-h illustrate the contour plots at 3000 K of LPI versus dominant wavelength of the YG YAG phosphor on the x-axis, and Duv on the y-axis, where the red emitter is comprised of 50% the NR phosphor of FIGS. 16 and 50% the broad red nitride phosphor of FIG. 15 having peak wavelength of 610 nm (FIG. 36a), 620 nm (FIG. 36b), 630 nm (FIG. 36c), 640 nm (FIG. 36d), 650 nm (FIG. 36e), 660 nm (FIG. 36f), 670 nm (FIG. 36g), 680 nm (FIG. 36h) according to some embodiments.
Figure 36B:
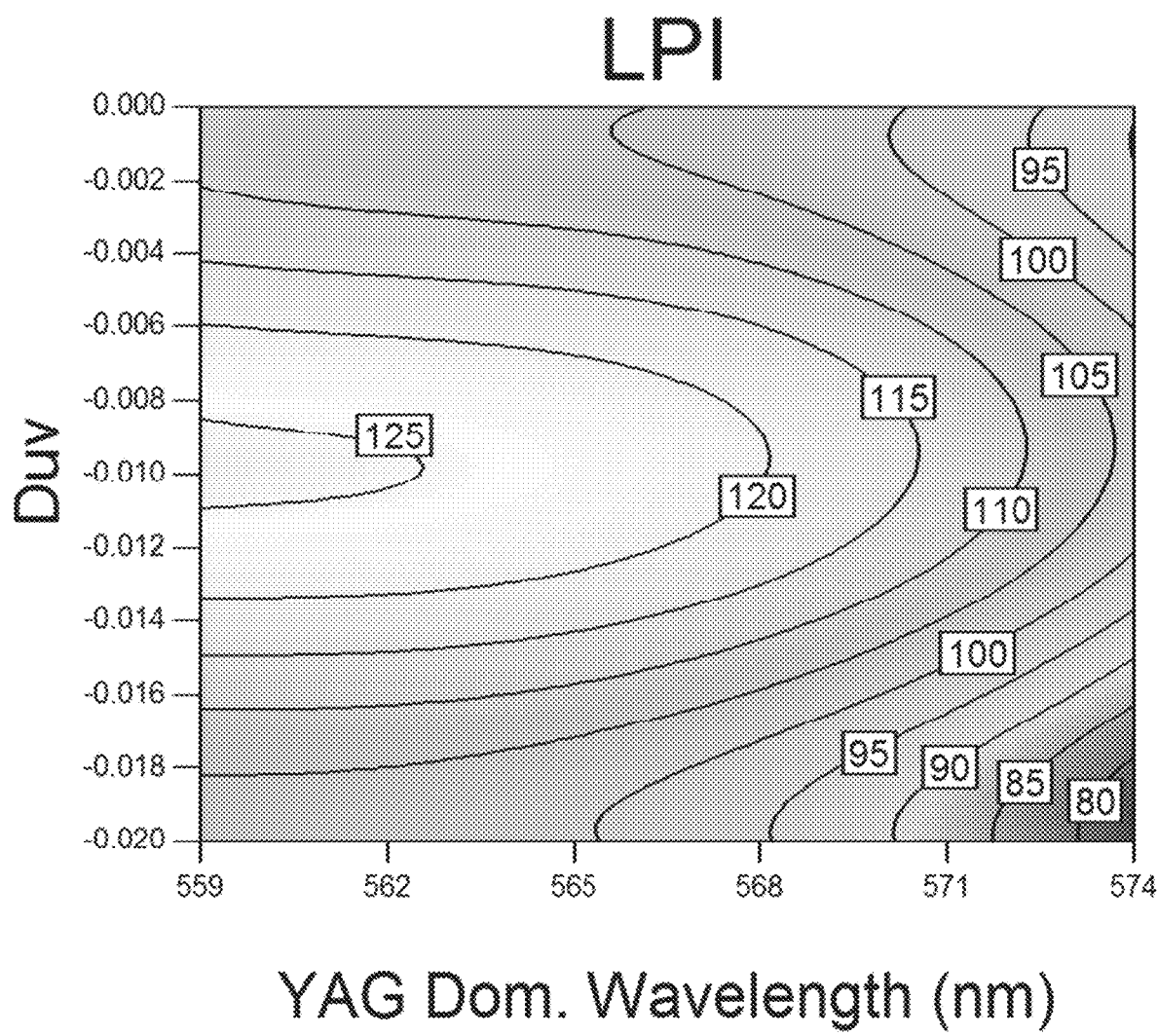
Figure 36C:
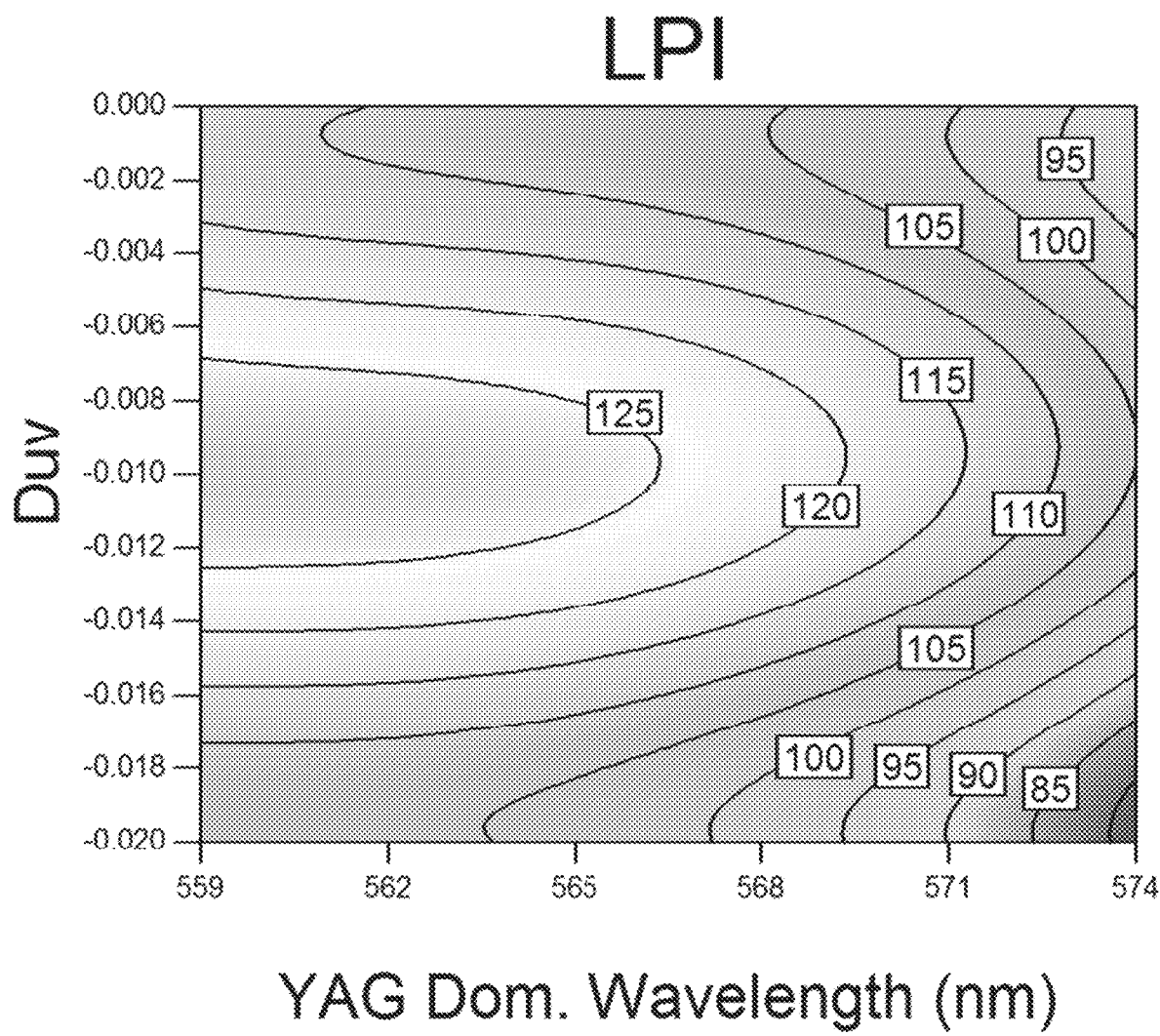
Figure 36D:
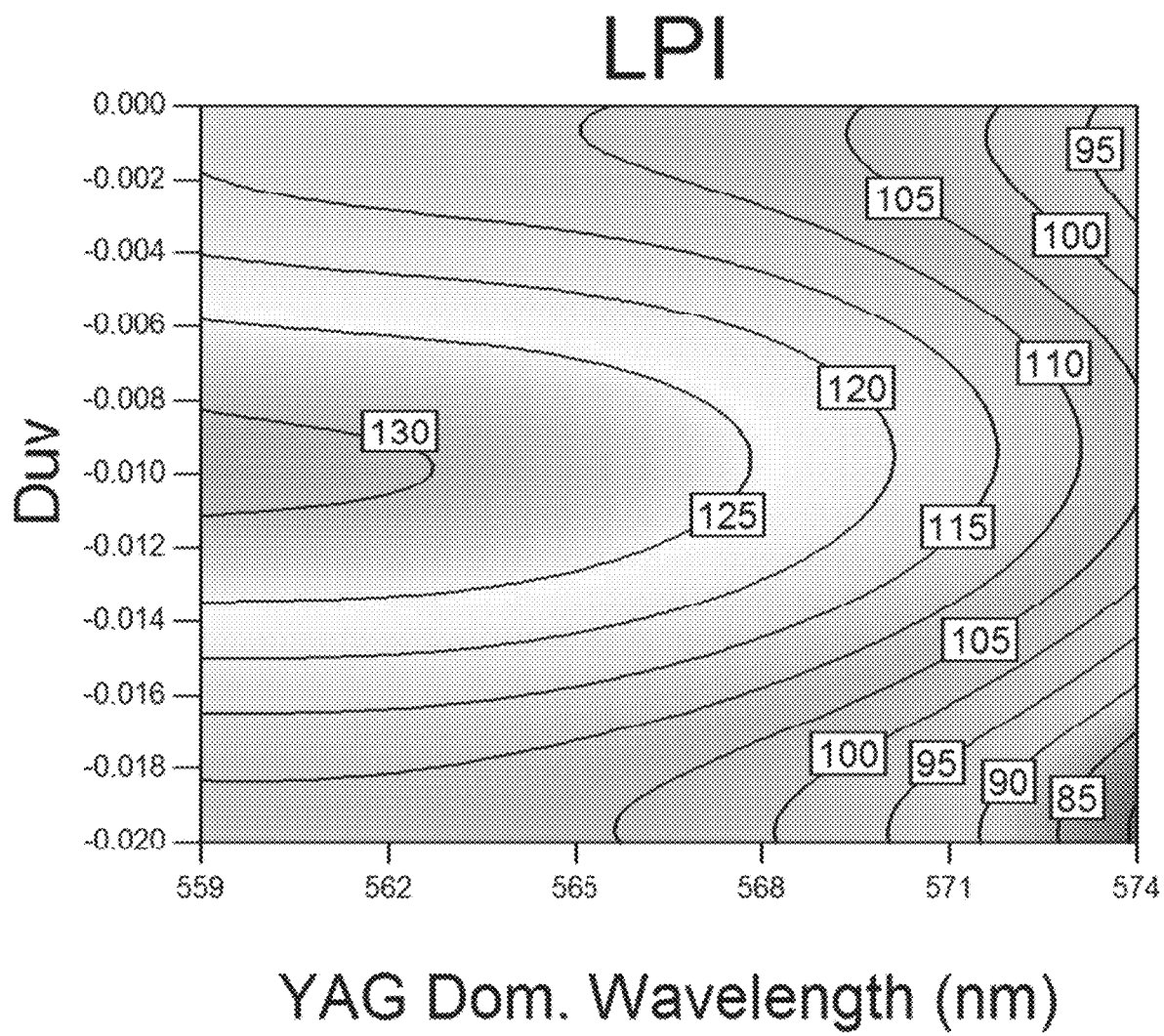
Figure 36E:
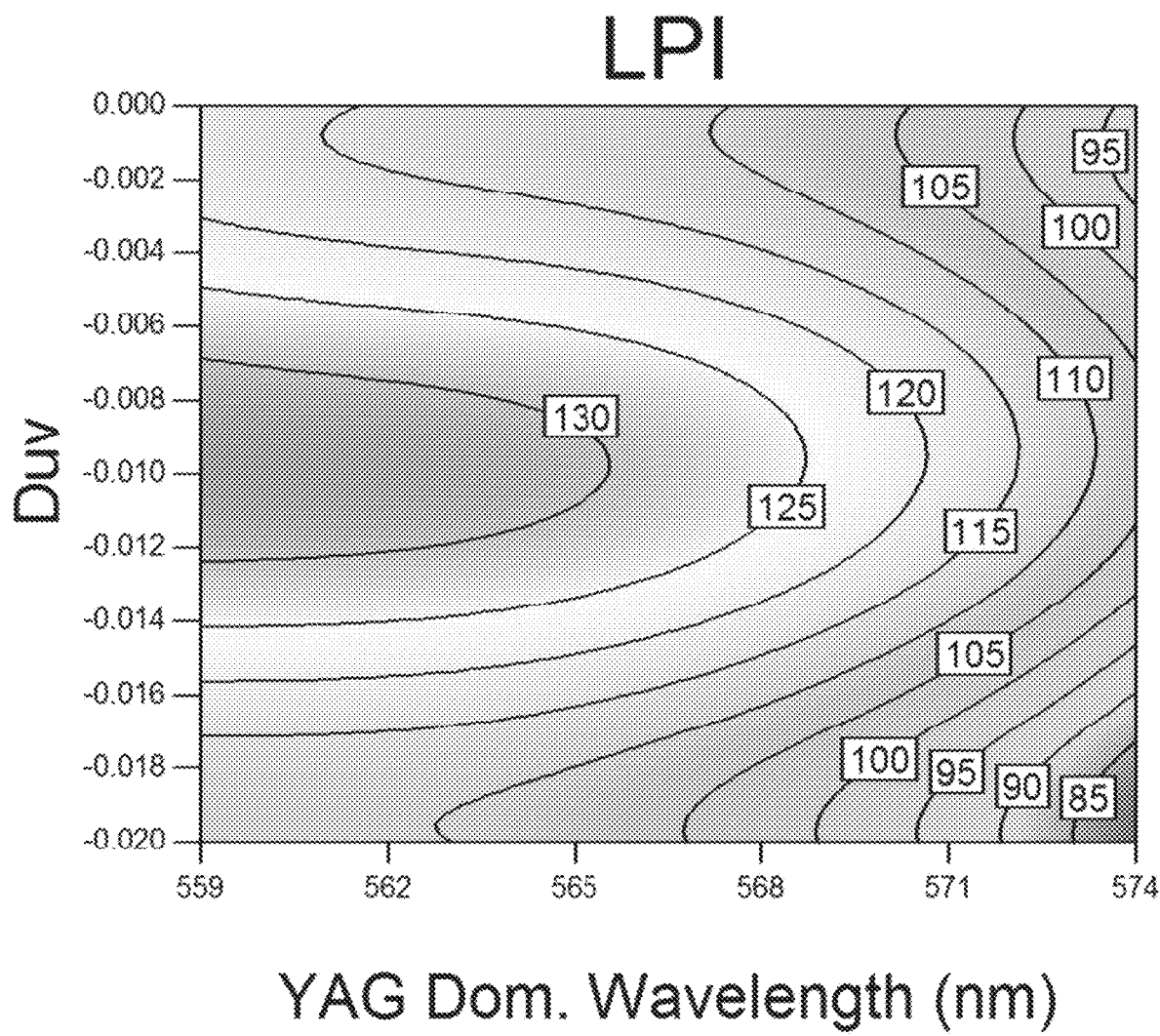
Figure 36F:
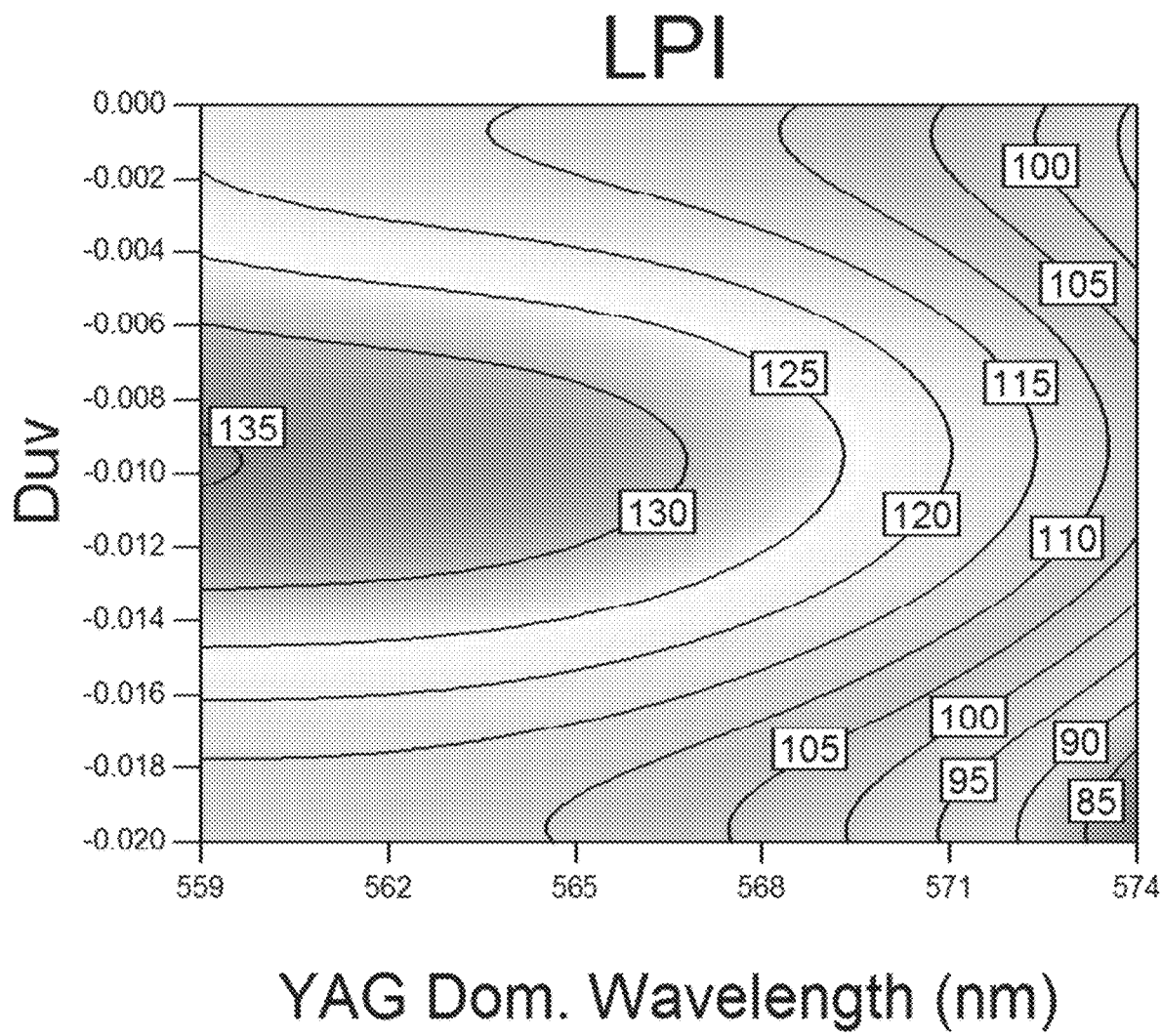
Figure 36G:
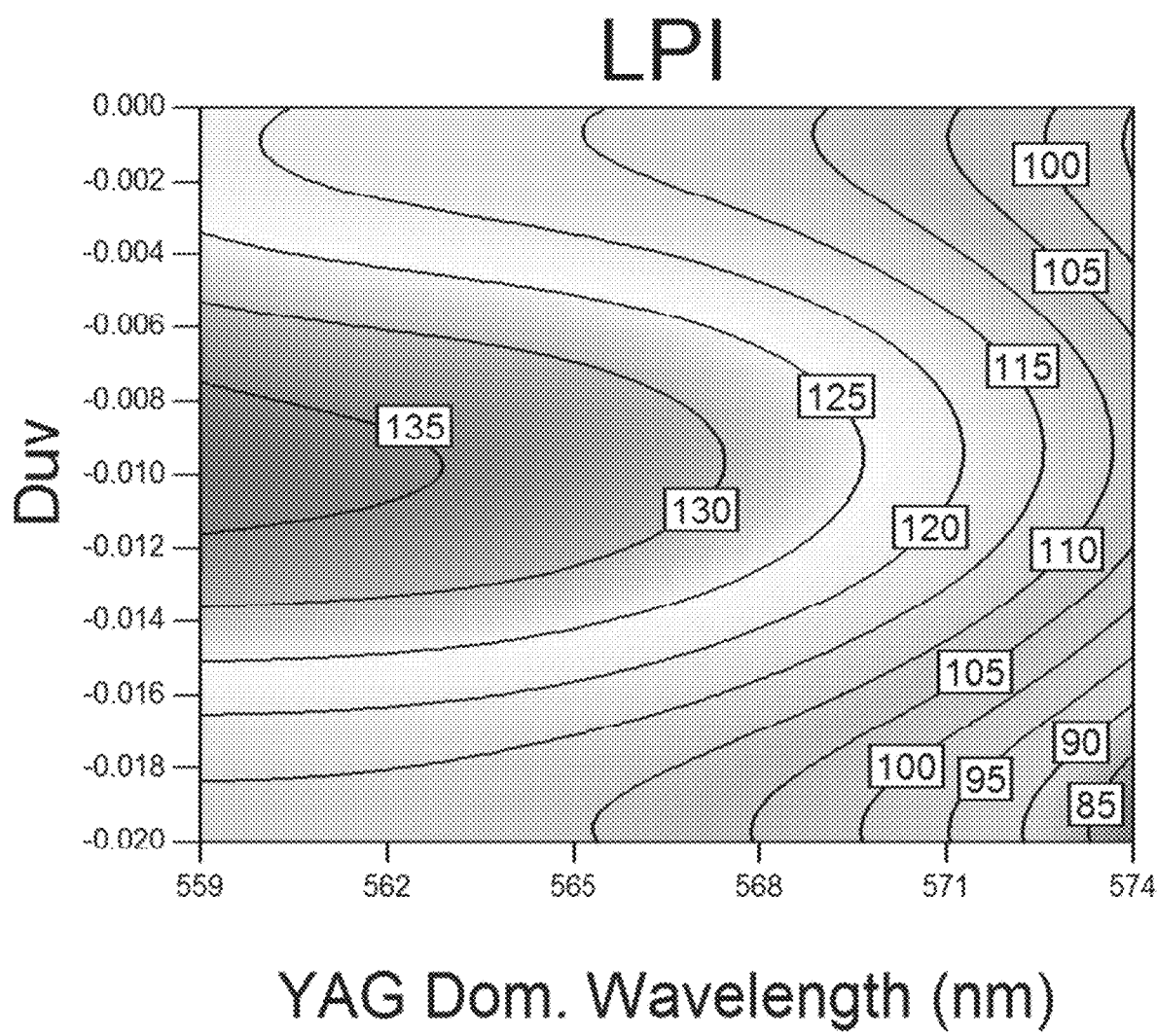
Figure 36H:
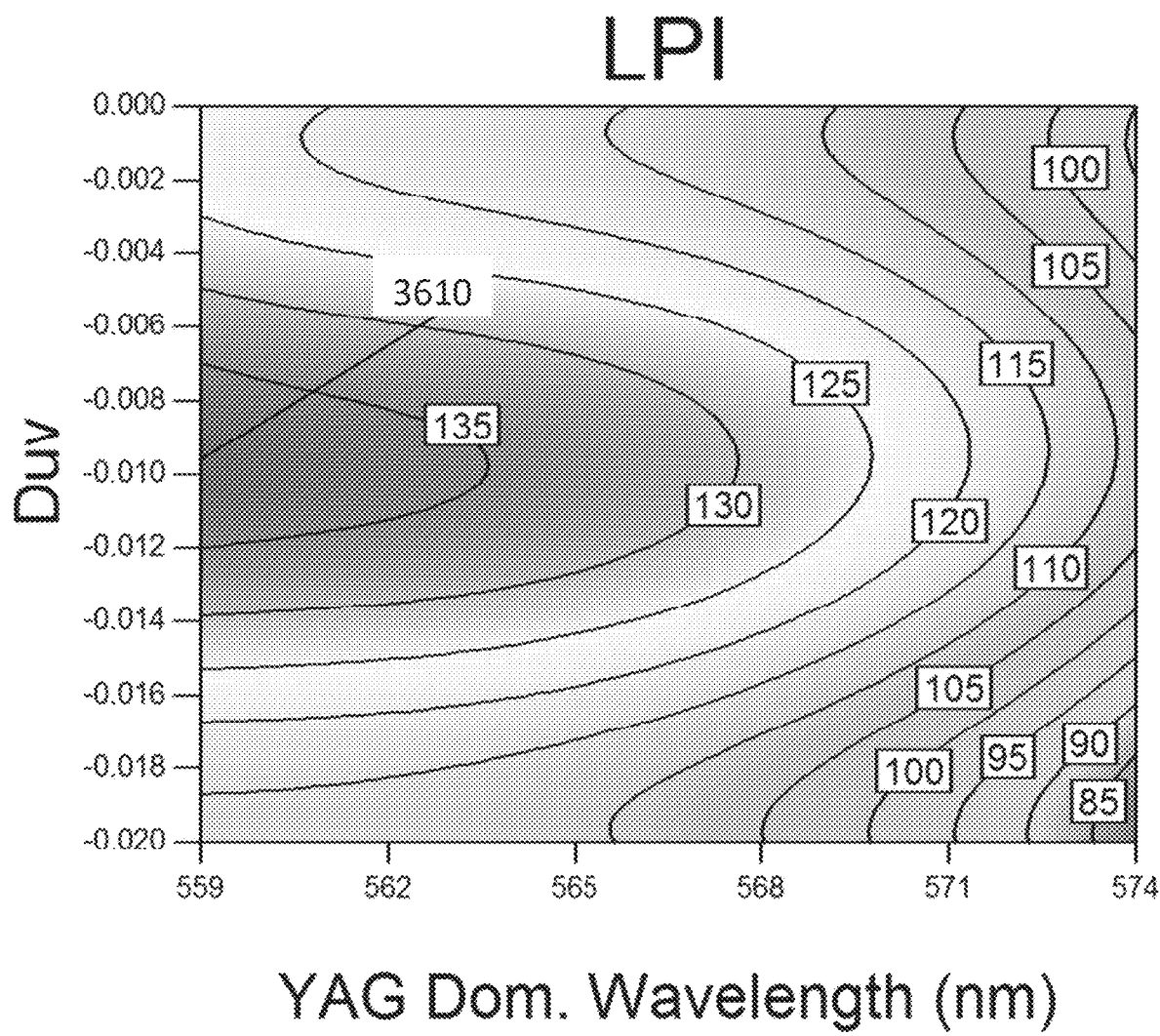

The SPD having the highest LPI (about 137) among the 2500 SPDs at 2700 K in the Group 3a DoE is shown in FIG. 34. The particular SPD 3400 in the Group 3a DoE (YAG+ PFS+Nit, where n=0.25) having the highest LPI value of about 137, corresponding to Dom$_{YAG}$ of about 559 nm, and Duv at about −0.010, with CCT=2700 K, is illustrated in FIG. 34, showing the peak wavelength of the blue LED 3402 at about 450 nm, the peak wavelength of the YG YAG:Ce phosphor 3404 at about 531 nm, the peak wavelength of the NR PFS phosphor 3406 at about 631 nm, the peak wavelength of the BR nitride phosphor 3408 at about 680 nm; and is compared with the SPD 604 of a Reveal® incandescent lamp and with the SPD 602 of a blackbody emitter, each having similar CCT.

The colorimetric response of interest, LPI, is plotted in FIGS. 35a-h vs. Dom$_{YAG}$ (x-axis) and Duv (y-axis) of the color point at 2700 K, and FIGS. 36a-h for 3000 K, for the case of the NR phosphor having peak wavelength of 631 nm, and a BR phosphor having peak wavelengths (Peak$_{Nit}$) of 610 nm (FIG. 35a and FIG. 36a) through 680 nm (FIG. 35h and FIG. 36h), in increments of 10 nm, and the ratio of Nit power to PFS power given by n=0.5, so that p=0.5.

Figure 37:
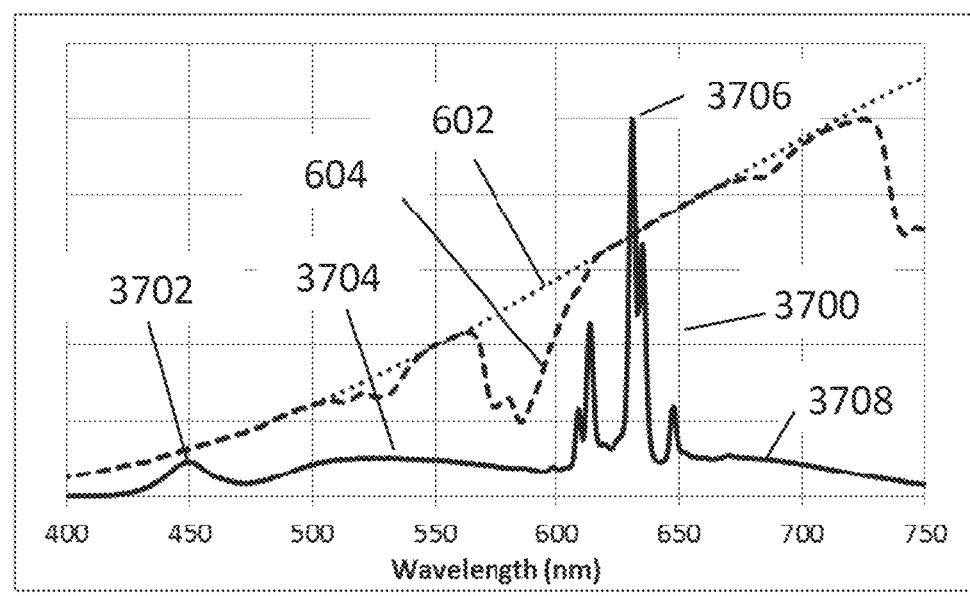
FIG. 37 illustrates the SPD of the discrete run having the highest LPI value for a light source comprising a blue LED, a YG YAG phosphor, and a red emitter comprised of 50% NR phosphor and 50% broad red nitride phosphor at 2700 K according to some embodiments.
Figure 38A:
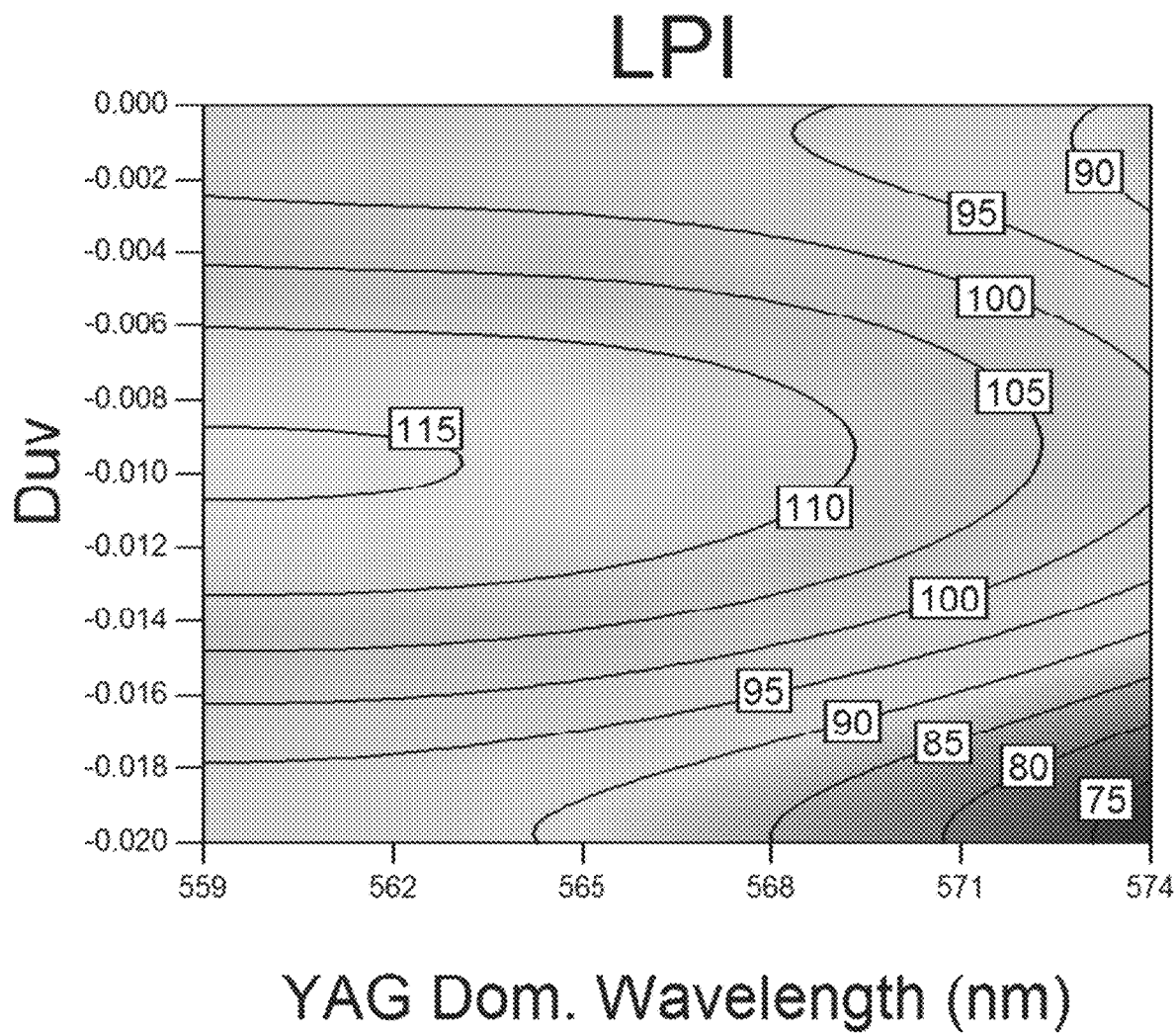
FIGS. 38a-h illustrate the contour plots at 2700 K of LPI versus dominant wavelength of the YG YAG phosphor on the x-axis, and Duv on the y-axis, where the red emitter is comprised of 25% the NR phosphor of FIGS. 16 and 75% the broad red nitride phosphor of FIG. 15 having peak wavelength of 610 nm (FIG. 38a), 620 nm (FIG. 38b), 630 nm (FIG. 38c), 640 nm (FIG. 38d), 650 nm (FIG. 38e), 660 nm (FIG. 38f), 670 nm (FIG. 38g), 680 nm (FIG. 38h) according to some embodiments.
Figure 38B:
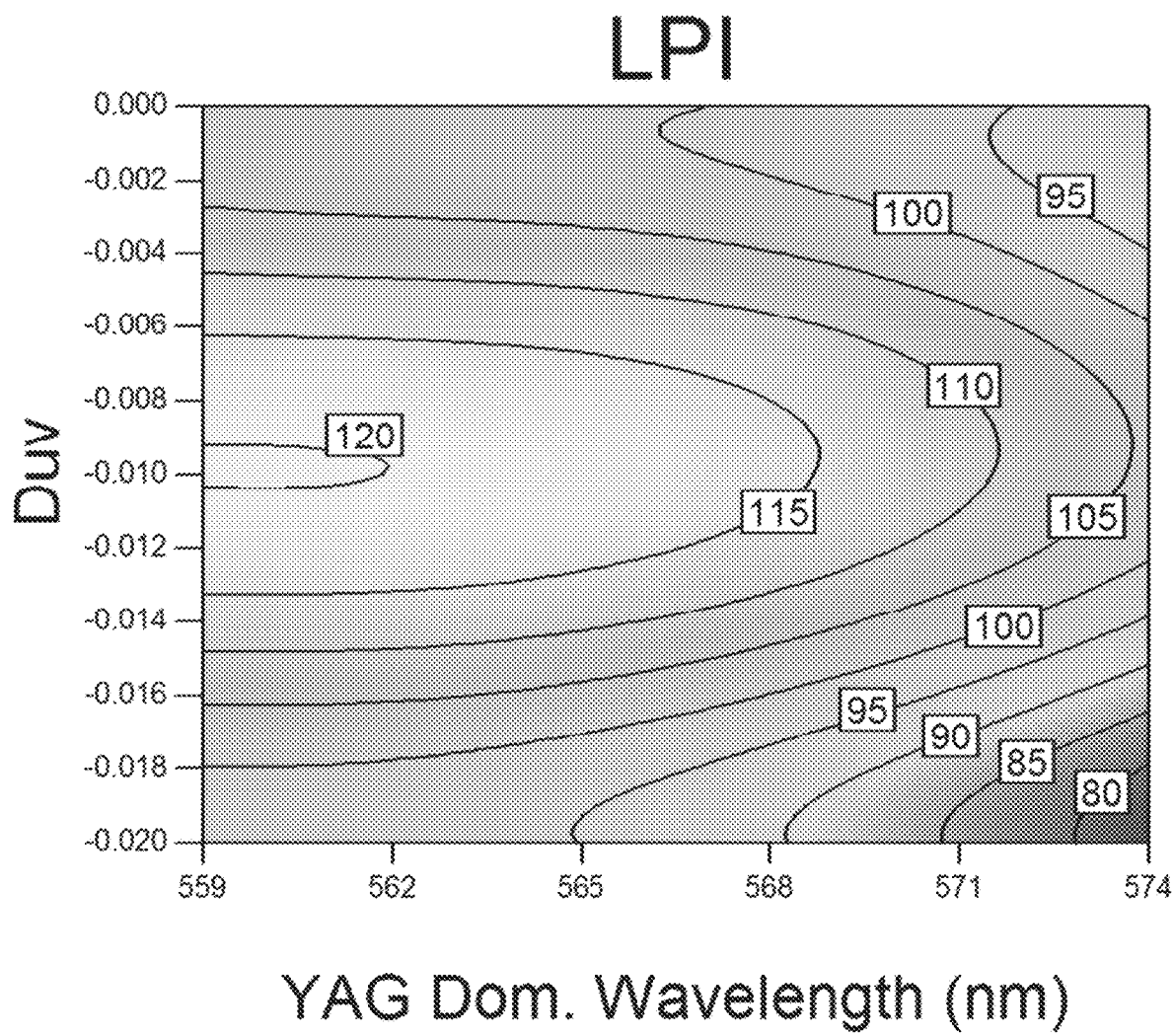
Figure 38C:
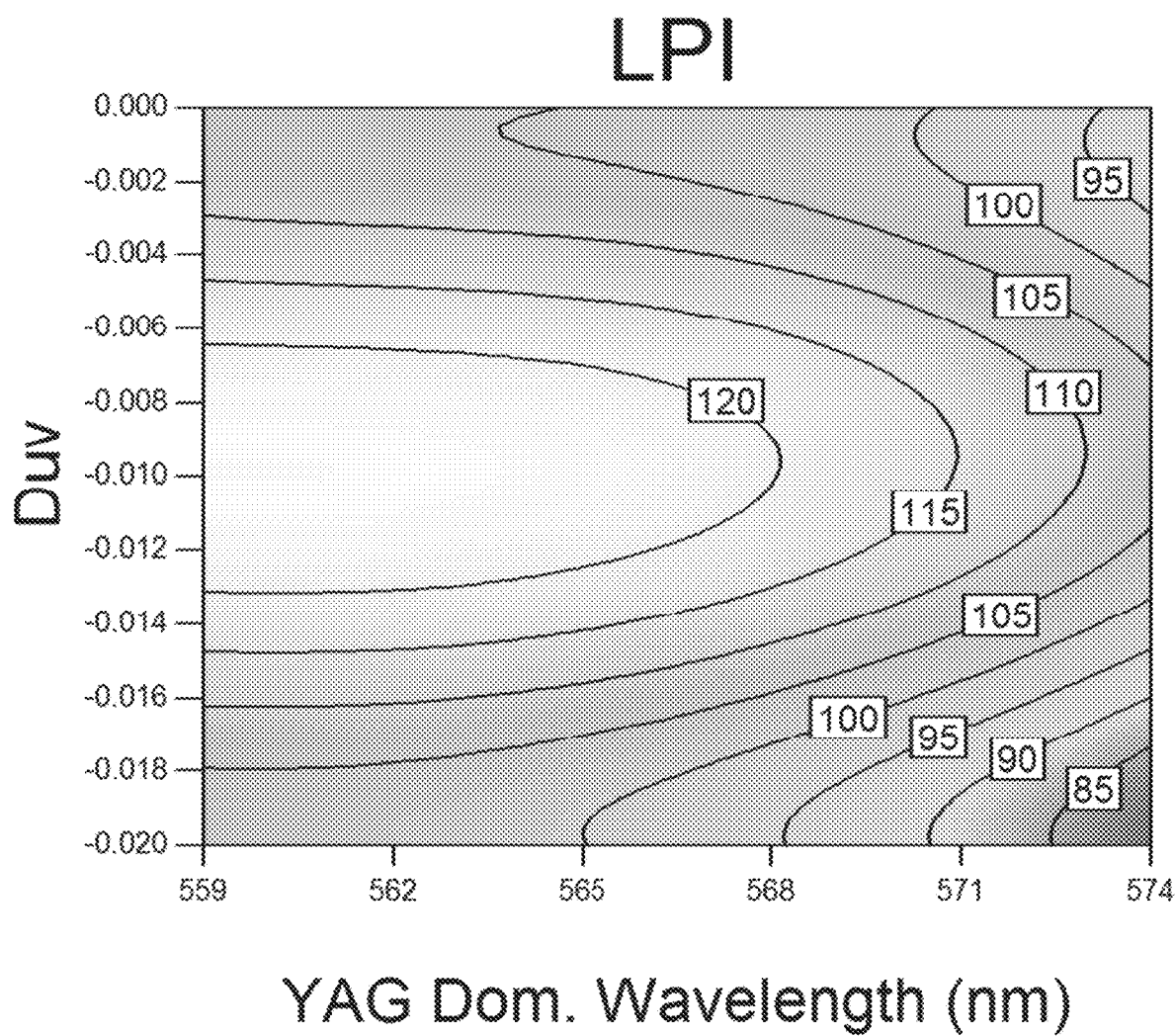
Figure 38D:
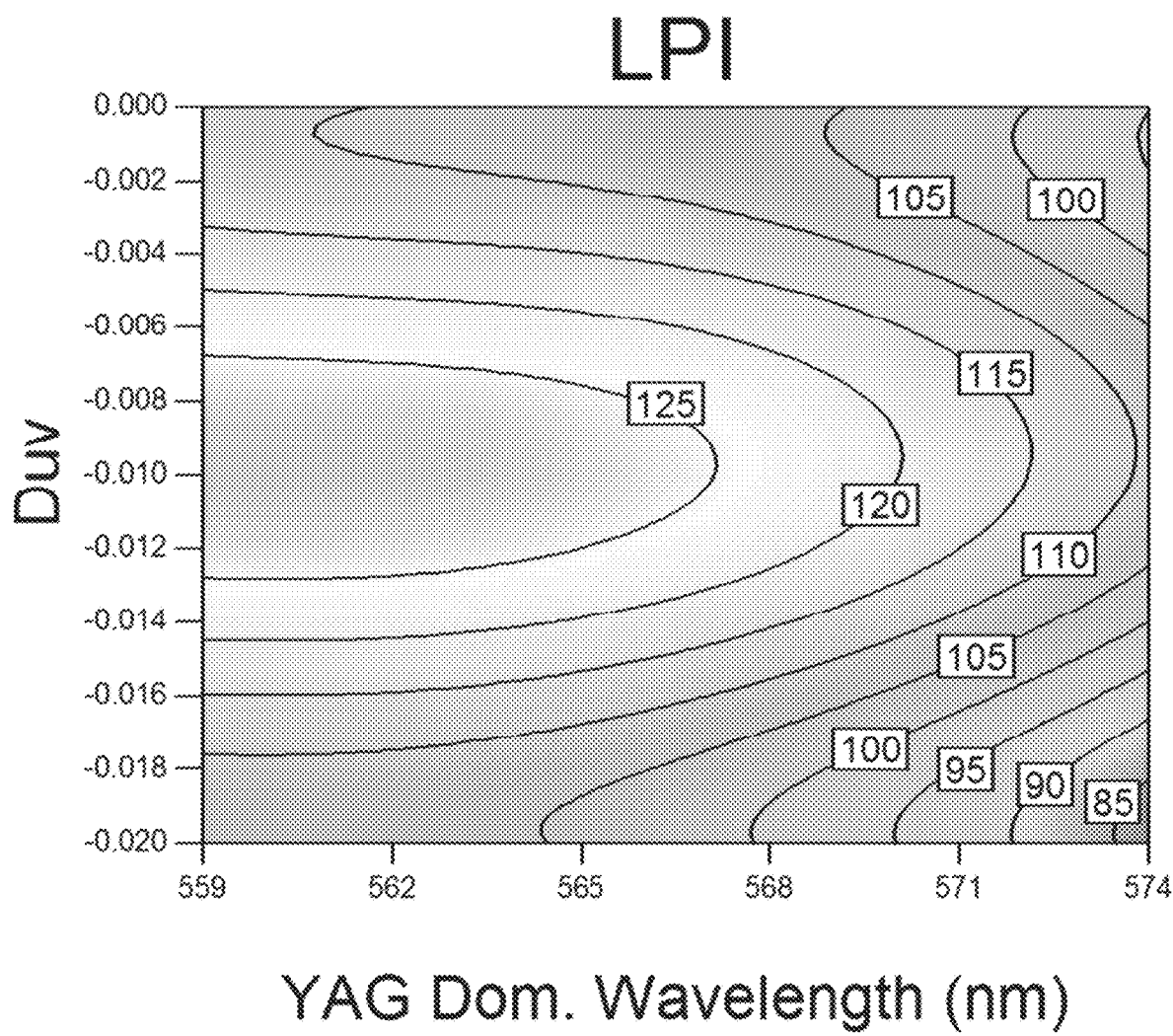
Figure 38E:
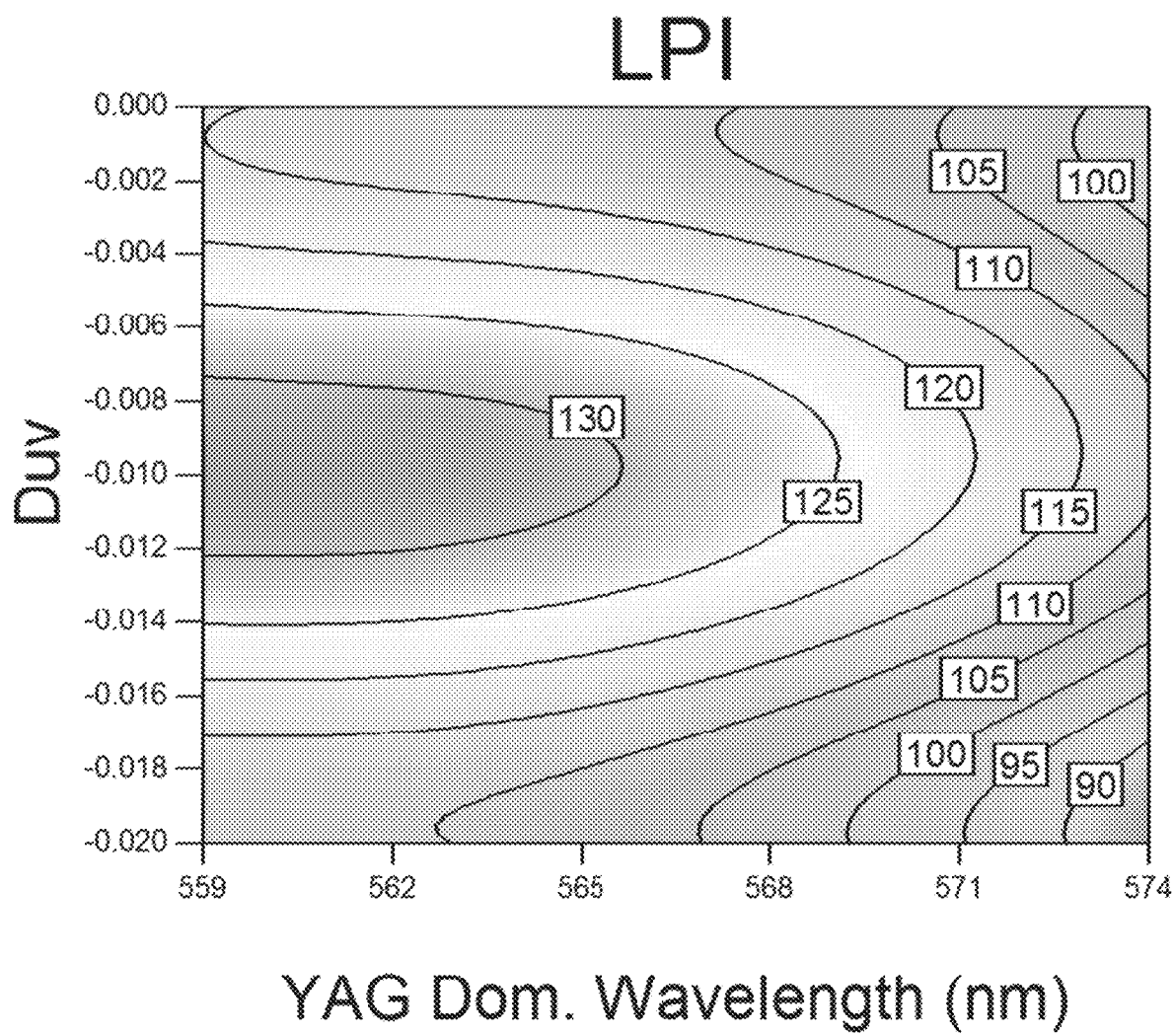
Figure 38F:
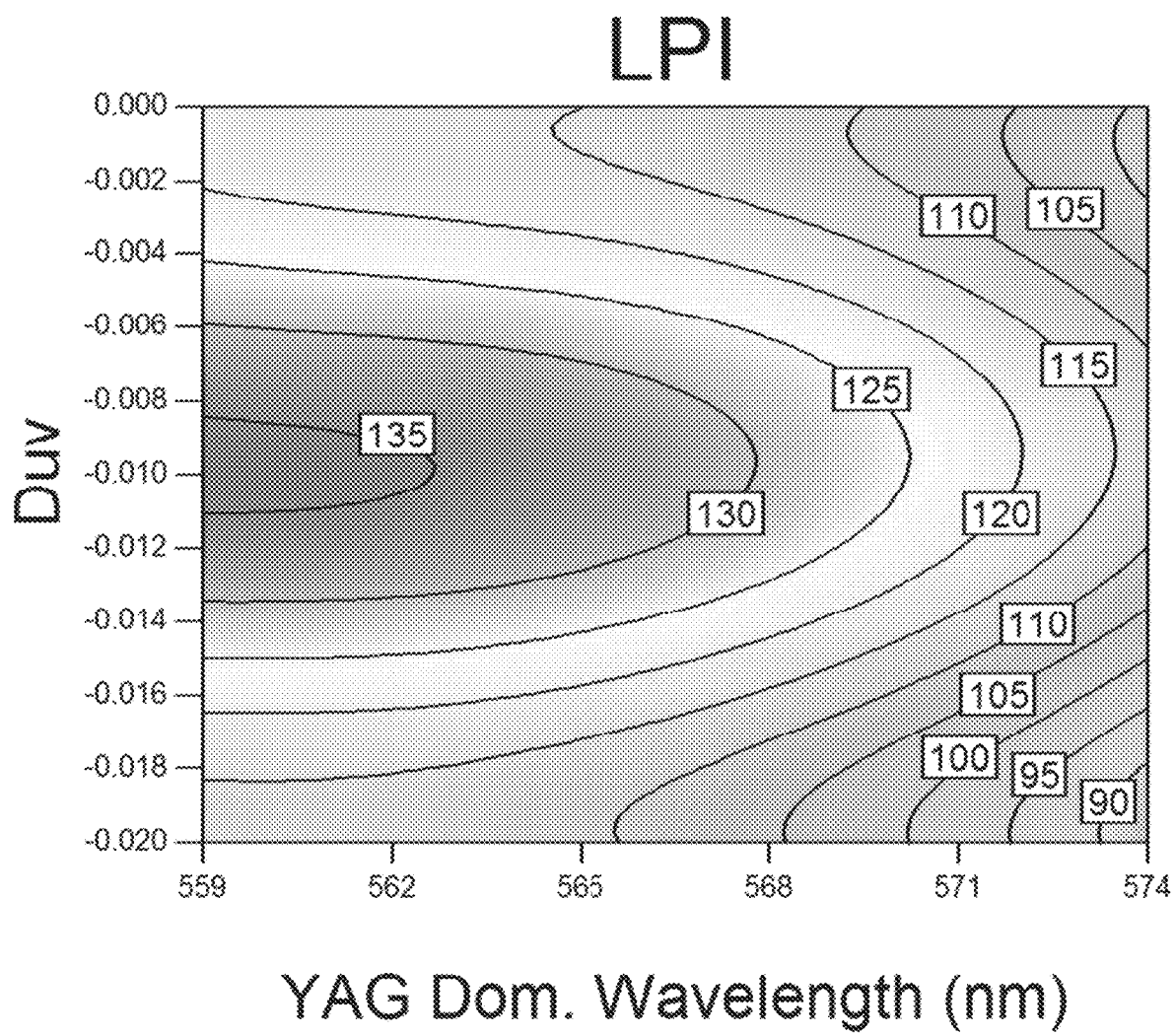
Figure 38G:
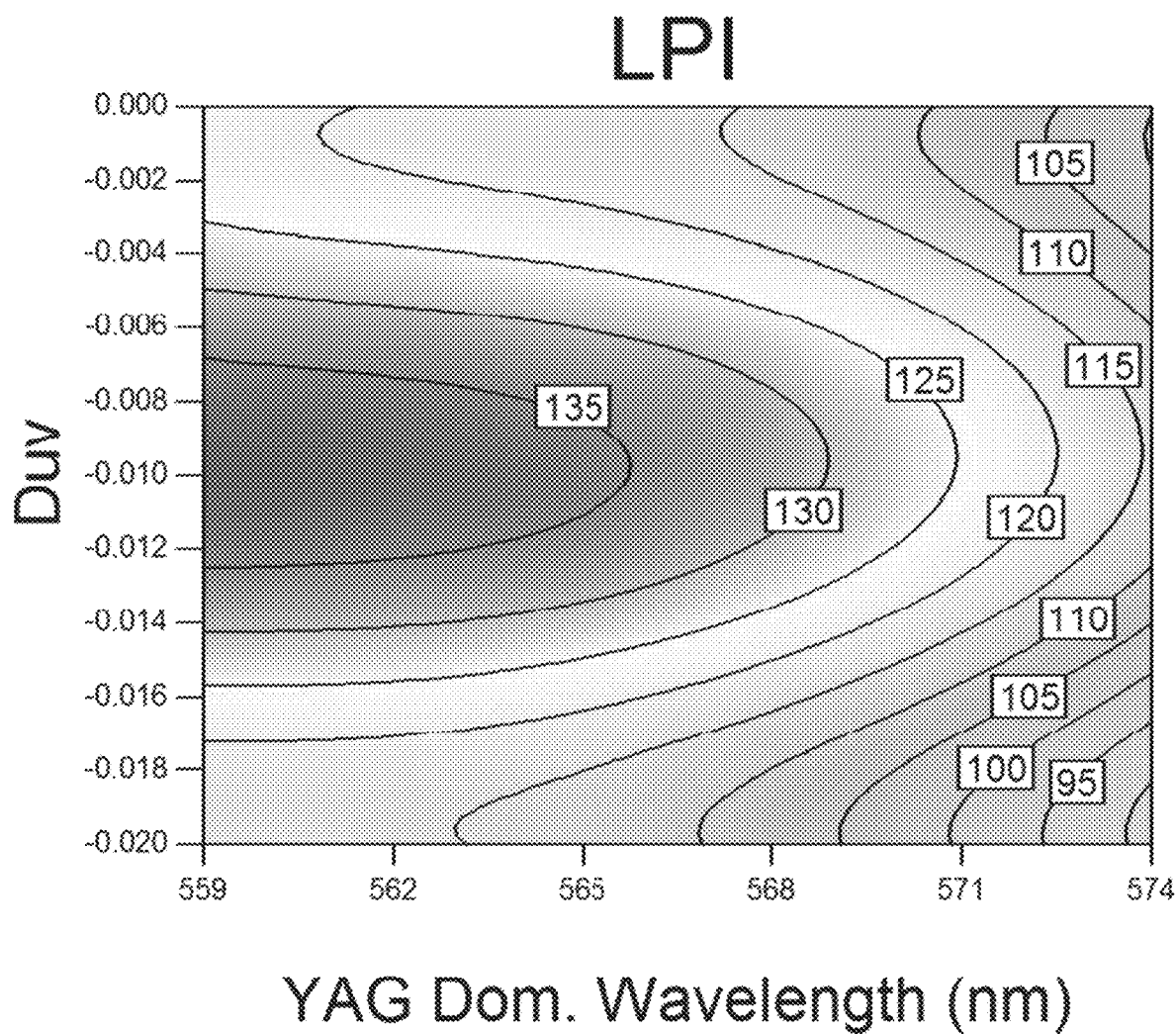
Figure 38H:
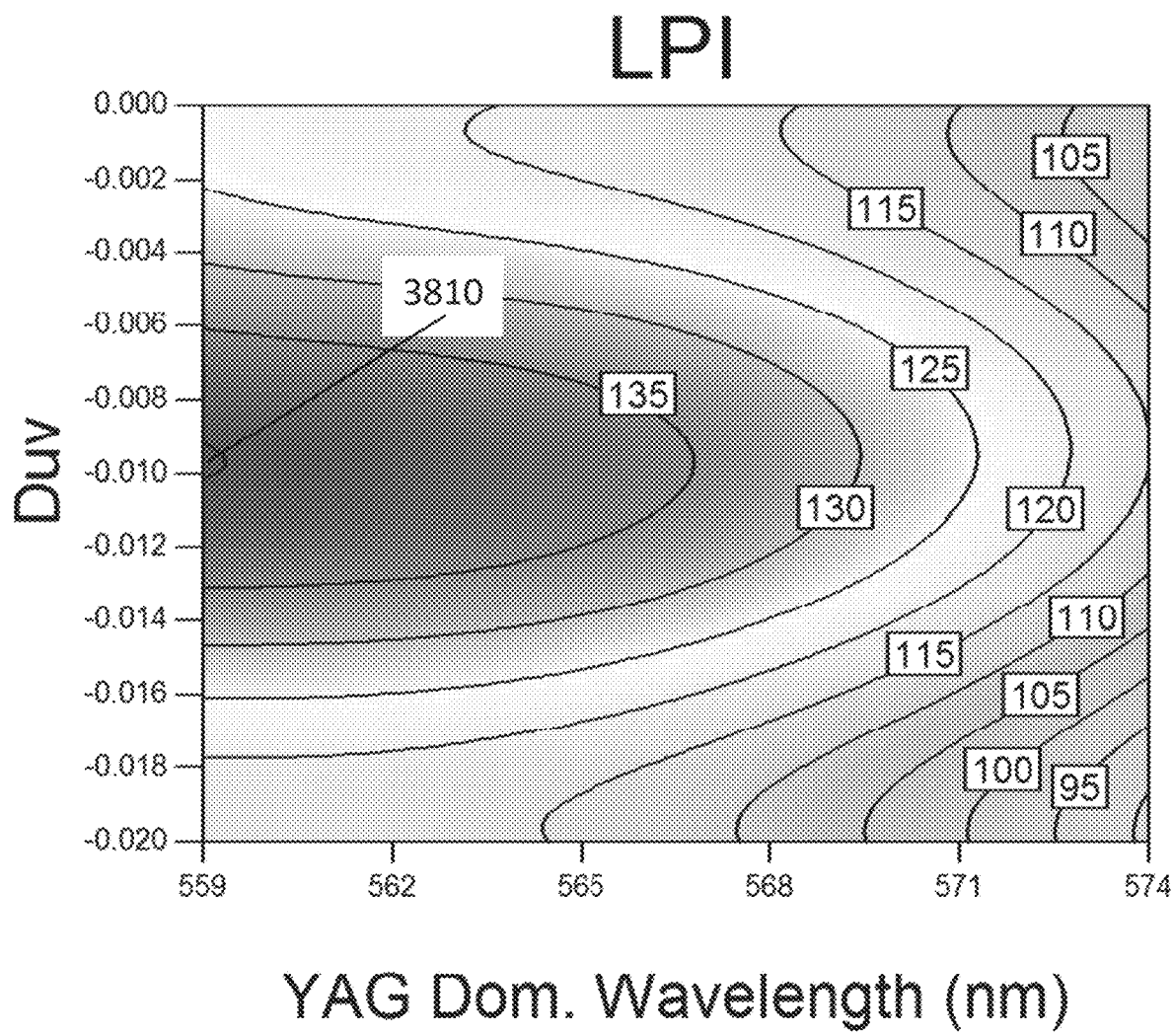
Figure 39A:
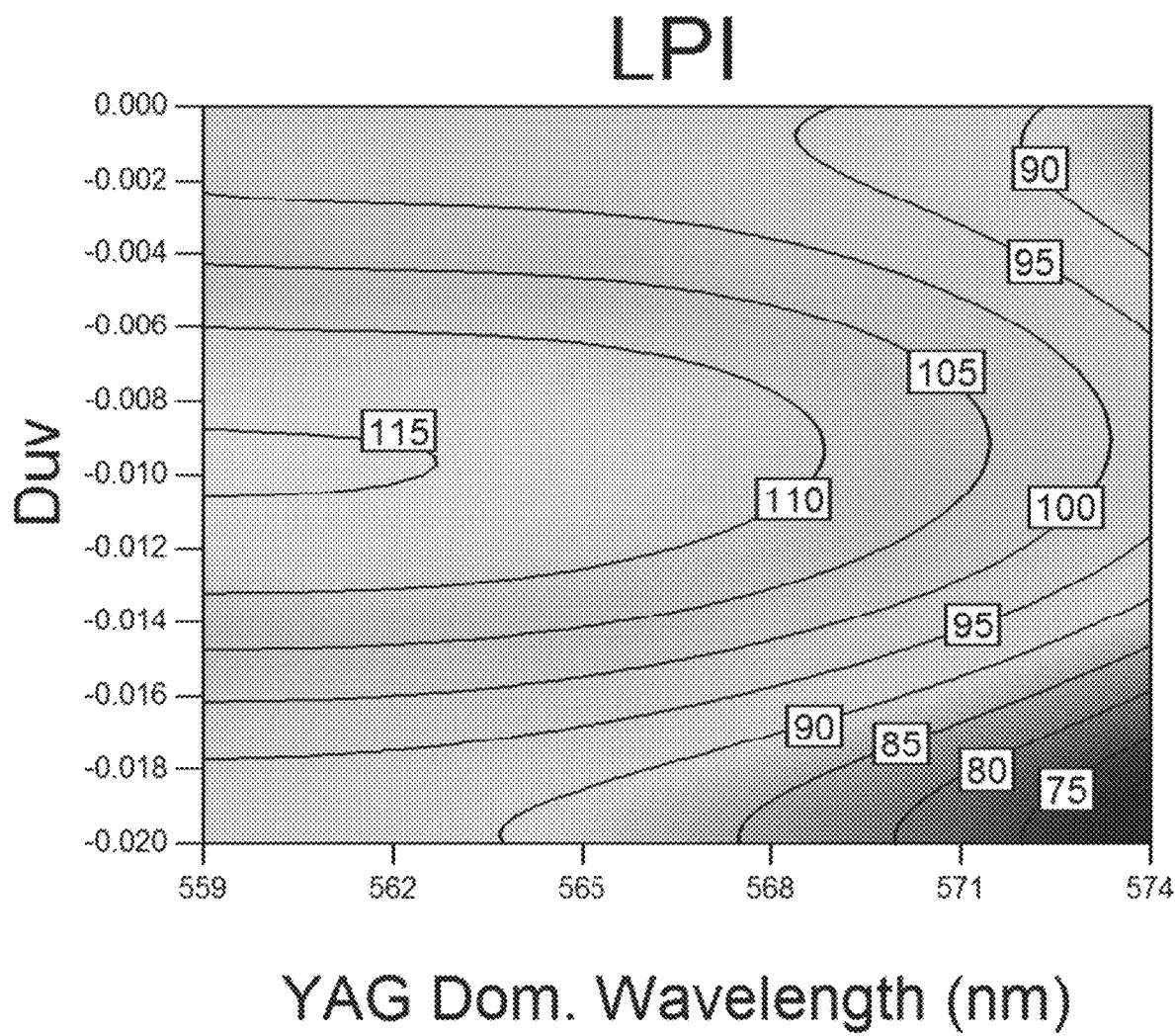
FIGS. 39a-h illustrate the contour plots at 3000 K of LPI versus dominant wavelength of the YG YAG phosphor on the x-axis, and Duv on the y-axis, where the red emitter is comprised of 25% the NR phosphor of FIGS. 16 and 75% the broad red nitride phosphor of FIG. 15 having peak wavelength of 610 nm (FIG. 39a), 620 nm (FIG. 39b), 630 nm (FIG. 39c), 640 nm (FIG. 39d), 650 nm (FIG. 39e), 660 nm (FIG. 39f), 670 nm (FIG. 39g), 680 nm (FIG. 39h) according to some embodiments.
Figure 39B:
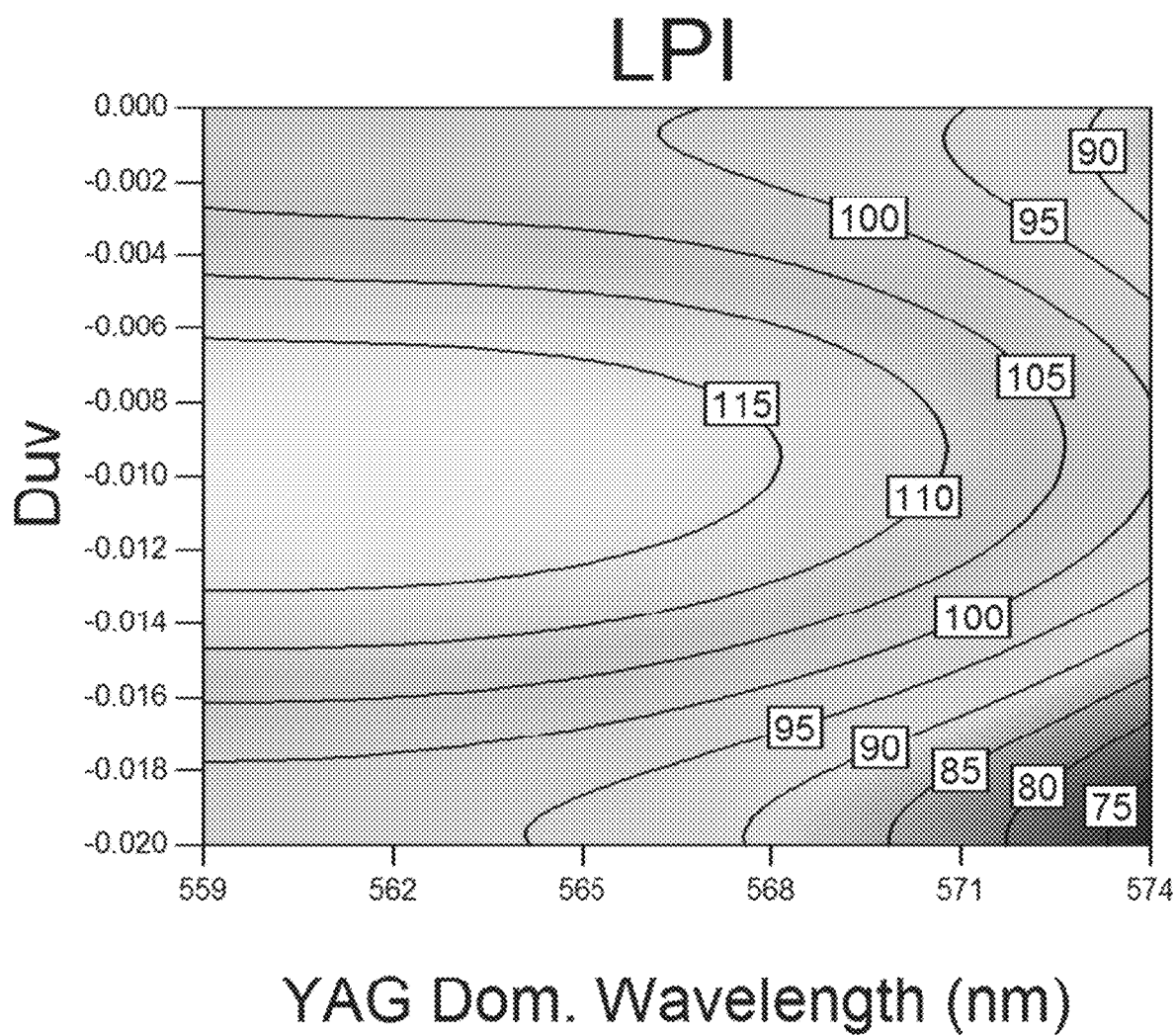
Figure 39C:
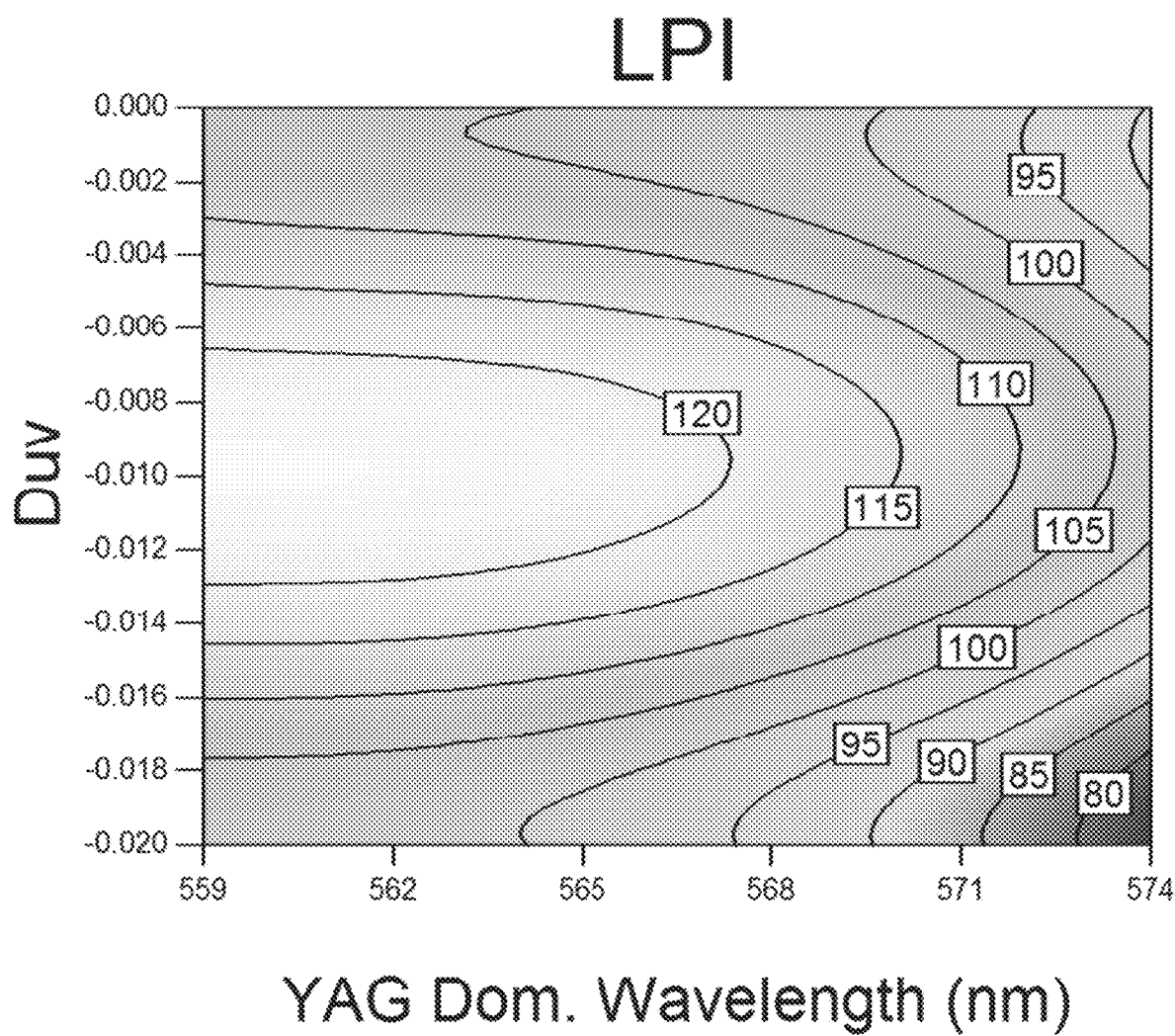
Figure 39D:
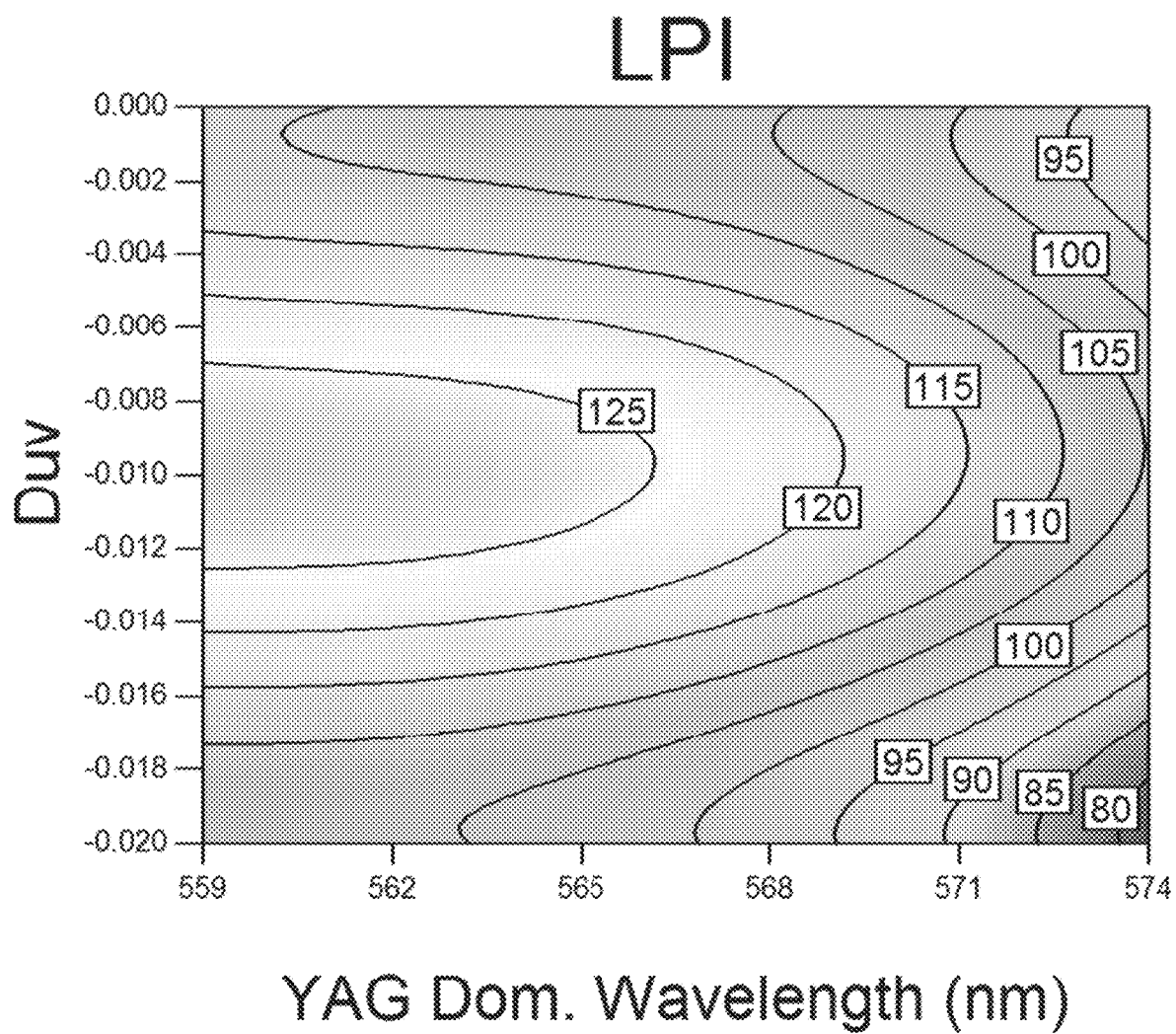
Figure 39E:
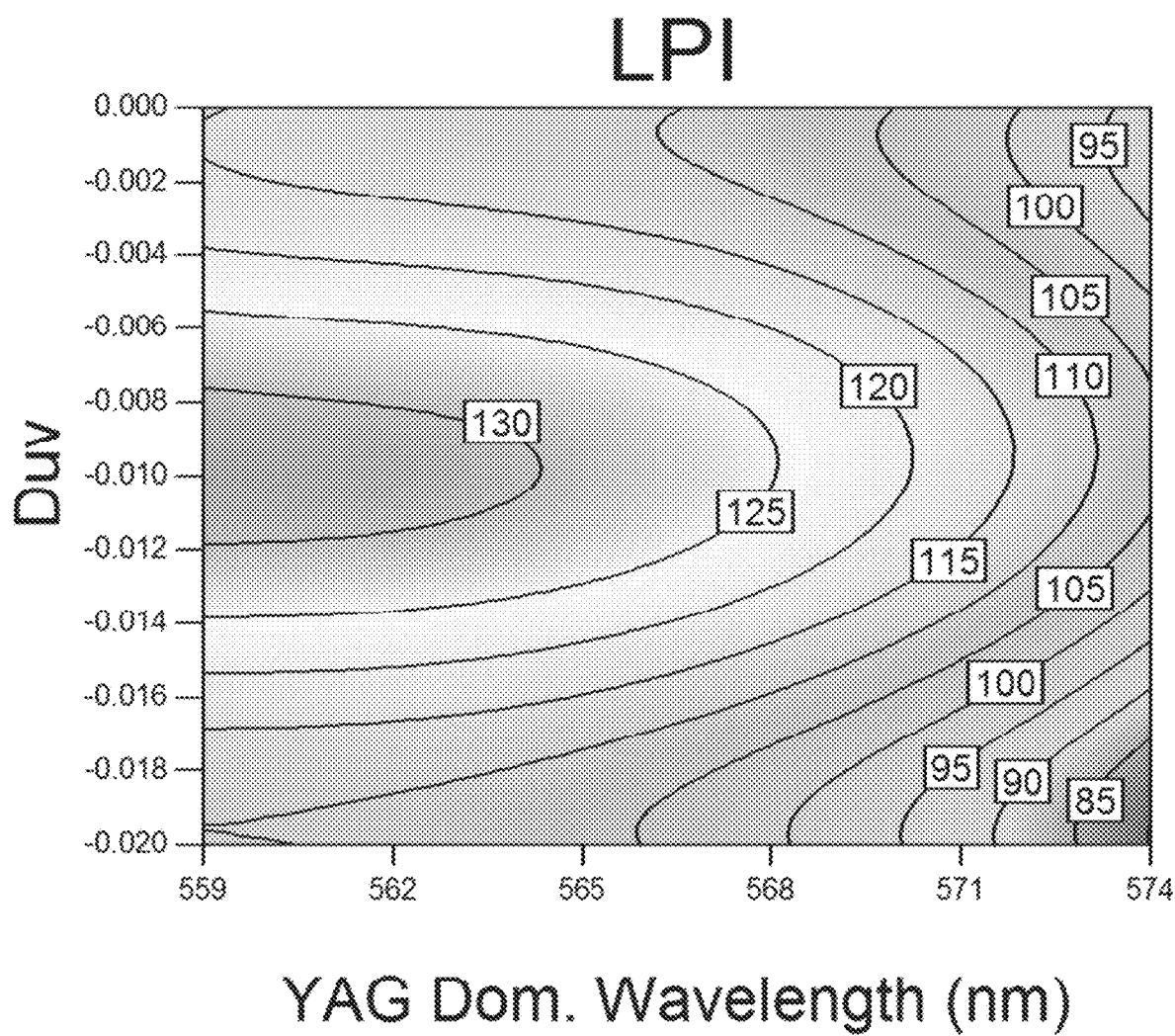
Figure 39F:
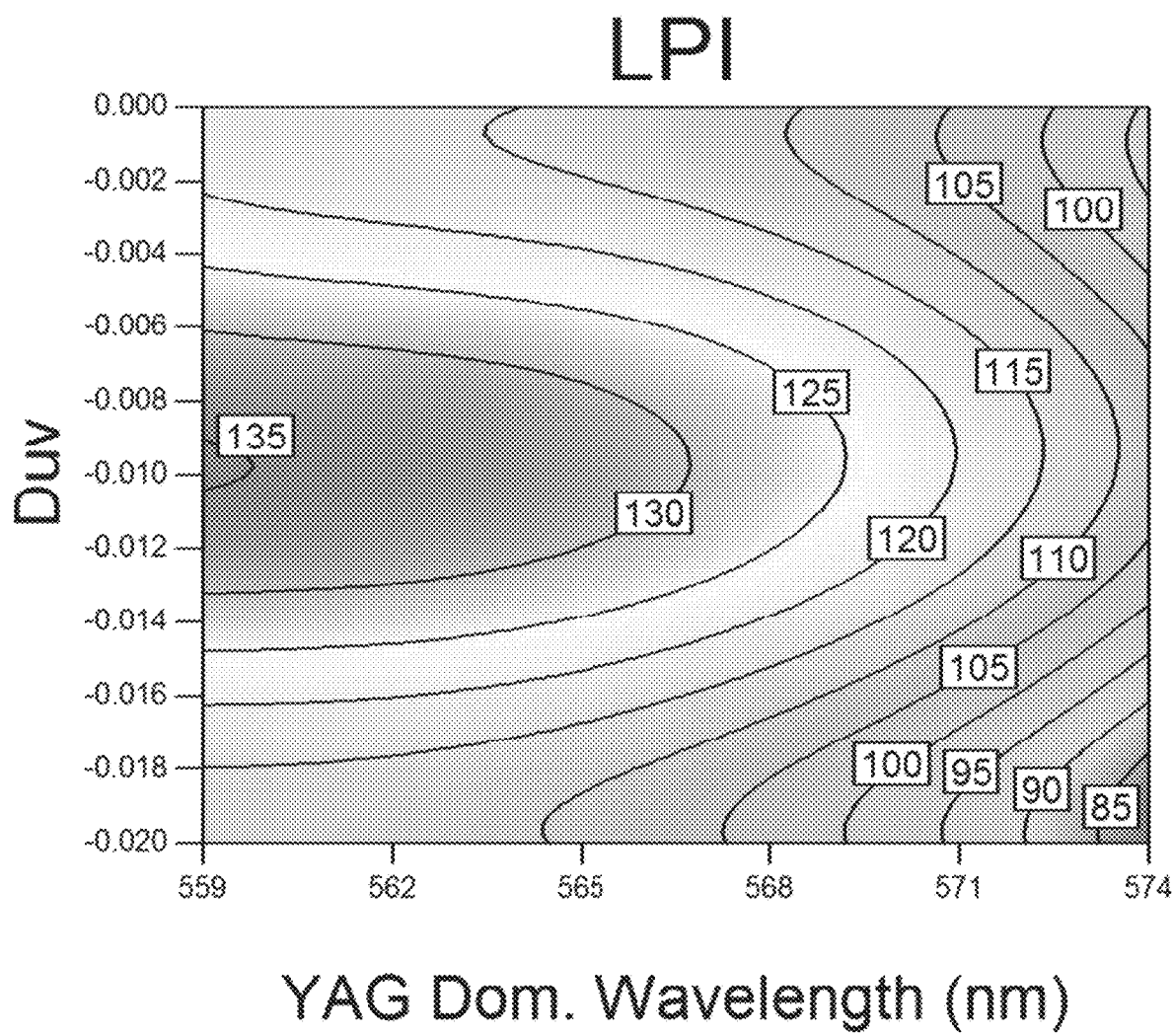
Figure 39G:
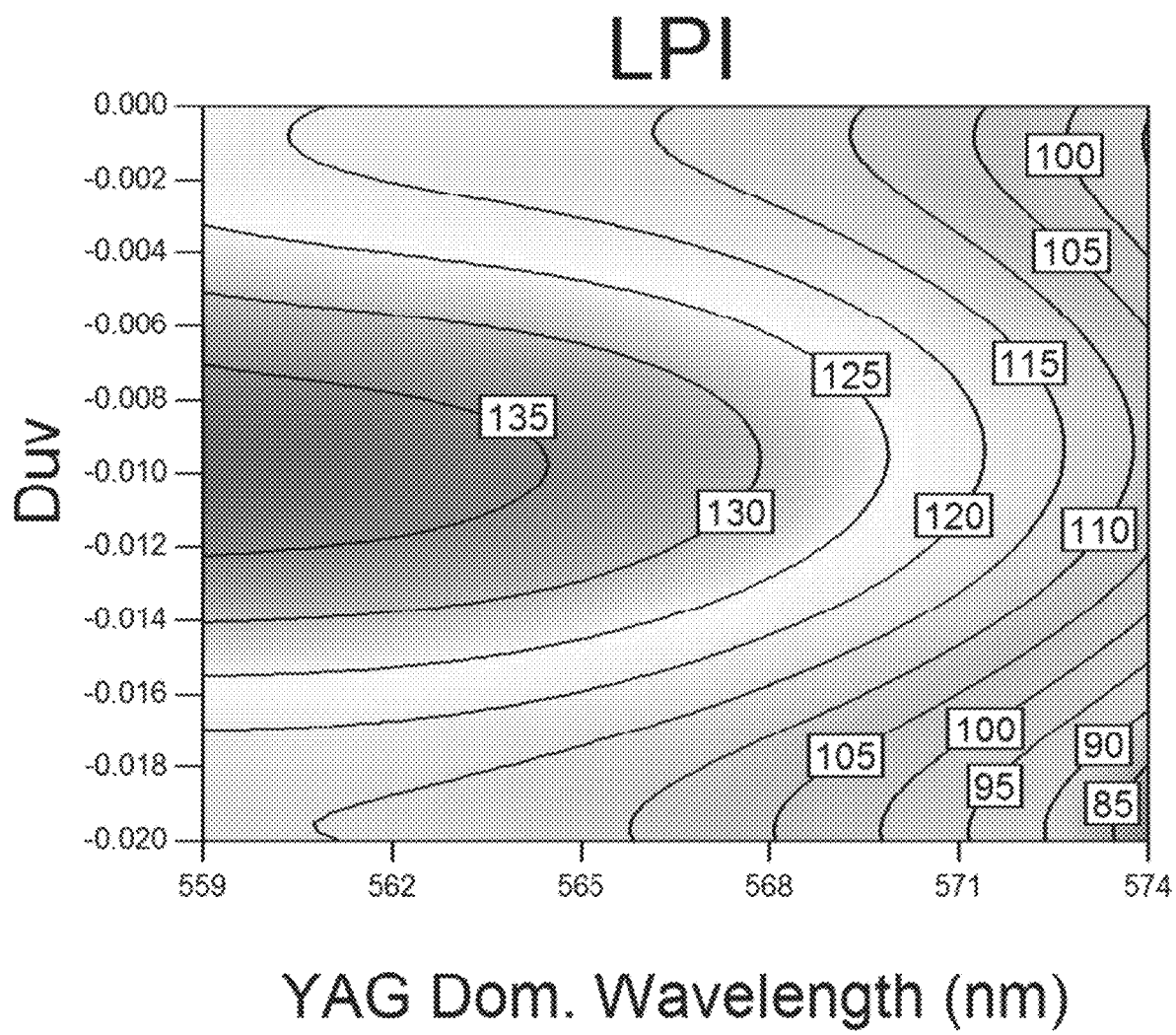
Figure 39H:
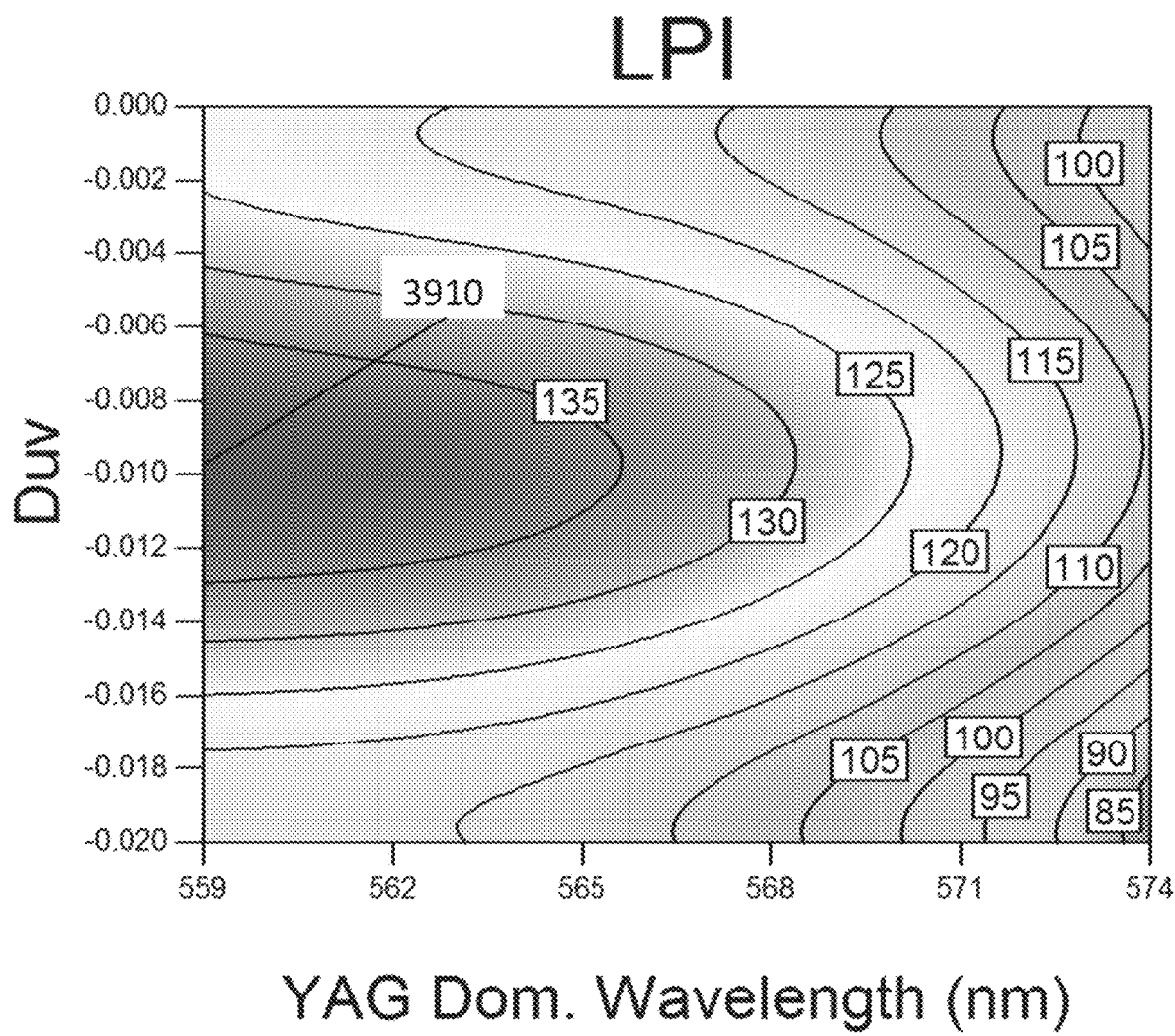

The SPD having the highest LPI (about 138) among the 2500 SPDs at 2700 K in the Group 3b DoE is shown in FIG. 37. The particular SPD 3700 in the Group 3b DoE (YAG+ PFS+Nit, where n=0.50) having the highest LPI value of about 138, corresponding to Dom$_{YAG}$ of about 559 nm, and Duv at about −0.010, with CCT=2700 K, is illustrated in FIG. 37, showing the peak wavelength of the blue LED 3702 at about 450 nm, the peak wavelength of the YG YAG:Ce phosphor 3704 at about 531 nm, the peak wavelength of the NR PFS phosphor 3706 at about 631 nm, the peak wavelength of the BR nitride phosphor 3708 at about 680 nm; and is compared with the SPD 604 of a Reveal® incandescent lamp and with the SPD 602 of a blackbody emitter, each having similar CCT.

The colorimetric response of interest, LPI, is plotted in FIGS. 38a-h vs. Dom$_{YAG}$ (x-axis) and Duv (y-axis) of the color point at 2700 K and FIGS. 39a-h for 3000 K, for the case of the NR phosphor having peak wavelength of 631 nm, and a BR phosphor having peak wavelengths (Peak$_{Nit}$) of 610 nm (FIG. 38a and FIG. 39a) through 680 nm (FIG. 38h and FIG. 39h), in increments of 10 nm, and the ratio of Nit power to PFS power given by n=0.75, so that p=0.25.

Figure 40:
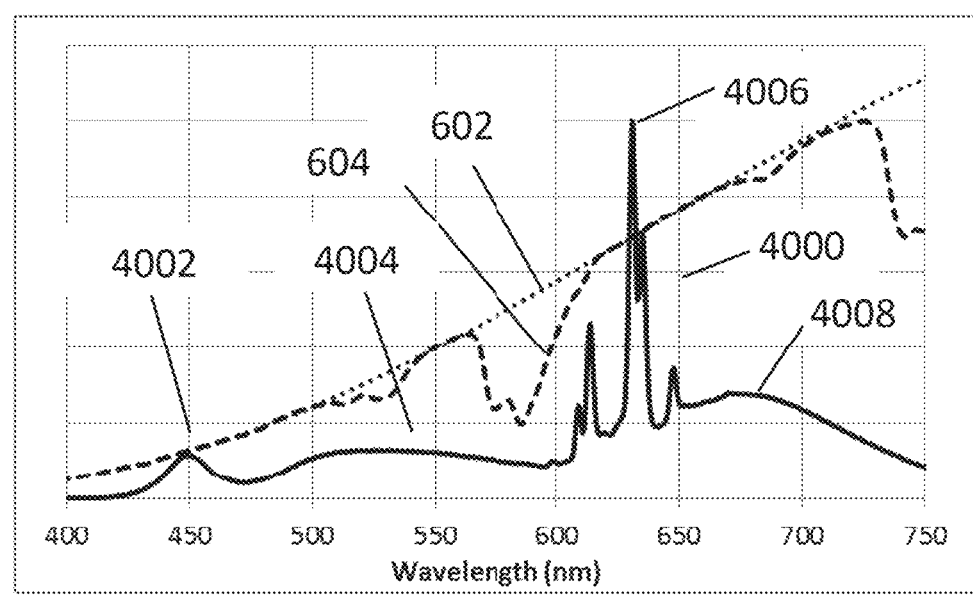
FIG. 40 illustrates the SPD of the discrete run having the highest LPI value for a light source comprising a blue LED, a YG YAG phosphor, and a red emitter comprised of 25% NR (narrow red) phosphor and 75% broad red nitride phosphor at 2700 K according to some embodiments.

The SPD having the highest LPI (about 140) among the 2500 SPDs at 2700 K in the Group 3c DoE is shown in FIG. 40. The particular SPD 4000 in the Group 3c DoE (YAG+ PFS+Nit, where n=0.75) having the highest LPI value of about 140, corresponding to Dom$_{YAG}$ of about 559 nm, and Duv at about −0.010, with CCT=2700 K, is illustrated in FIG. 40, showing the peak wavelength of the blue LED 4002 at about 450 nm, the peak wavelength of the YG YAG:Ce phosphor 4004 at about 531 nm, the peak wavelength of the NR PFS phosphor 4006 at about 631 nm, the peak wavelength of the BR nitride phosphor 4008 at about 680 nm; and is compared with the SPD 604 of a Reveal® incandescent lamp and with the SPD 602 of a blackbody emitter, each having similar CCT.

The Dom$_{YAG}$ and Duv values of the 250 unique combinations of 25 different Dom$_{YAG}$ values at each of five different Duv values as shown in FIG. 23 and used in the Group 1 DoE and Group 2 DoE are the same 250 unique combinations of Dom$_{YAG}$ and Duv that were used in the Group 3 DoE, in combination with each of the 20 different BR phosphors. The fine spacing between Dom$_{YAG}$ values on the x-axis and the Duv values on the y-axis of the 250 unique SPDs used in the Group 3 DoE have been found to provide smooth interpolations between discrete SPDs actually used in the DoE. While five Duv levels were used herein to illustrate the effect of color point, or Duv, on LPI, other suitable Duv levels may be used. For example, similar contour plots may be presented for a continuum of Duv levels within the range of Duv presented herein, with similar trends being realized. The smooth curves for LPI shown in FIGS. 32, 33, 35, 36, 38, and 39 are obtained from the statistically optimized ANOVA regression fit to the data, where LPI=f(CCT, Duv, DOM$_{YAG}$, Peak$_{Nit}$, n), including polynomial terms as high as quartic, and all resultant variable interactions, providing a transfer function having Adjusted $R^2$>0.99. One skilled in the art will recognize that there is a lack of features having higher order than quadratic in the LPI contours having LPI values of 120 and higher, and that there are smooth transitions between the contours presented; and will understand that the solutions representing all 15000 combinations of SPDs comprised of a blue LED, a YG YAG:Ce phosphor, a NR PFS phosphor, and a BR phosphor, with a ratio of red power, n, are quantitatively described with very low error ($R^2$>0.99) by the transfer function LPI=f(CCT, Duv, Dom$_{YAG}$, Peak$_{Nit}$, n) as represented by the LPI contour plots in FIGS. 32, 33, 35, 36, 38, and 39.

FIGS. 32, 33, 35, 36, 38, and 39 demonstrate that at both 2700 K and 3000 K, if the color point of the light source is on the blackbody locus (Duv=0.000), then it is difficult to achieve LPI>120, at all Dom$_{YAG}$ (i.e., for any commercially available YG YAG:Ce phosphor). Only long wavelength nitride (Peak$_{Nit}$>660 nm) and short wavelength YAG (Dom$_{YAG}$<562 nm) will allow for LPI>120 on the blackbody. As Duv is reduced, LPI generally increases at all Dom$_{YAG}$, and reaches a maximum value for Duv of about −0.010, the value of Duv where the Whiteness component of LPI is maximized, per Equation (1), resulting in a significant degree of vertical symmetry in the iso-contours of LPI about a horizontal line at about Duv=−0.010. As Duv goes from Duv=0.000 to Duv=−0.010, the Whiteness component of the LPI equation increases from 0 to 1, resulting in a 19 point increase in LPI based on Equation (7). Similarly, as Duv goes from Duv=−0.010 to Duv=−0.020, the Whiteness component decreases from 1 to 0, resulting in a 19 point decrease in LPI.

The nearly monotonically increasing LPI with decreasing $Dom_{YAG}$ and increasing $Peak_{Nit}$, at a given Duv and n, may be primarily due to the separation in wavelength between the YG emitter and the BR emitter, diminishing the typically large emission in the yellow, or even creating a depression in the yellow portion of the spectrum (e.g. about 570 to about 600 nm) which enhances the perceived saturation of red-green opponent colors, and blue-yellow opponent colors.

Figure 41:
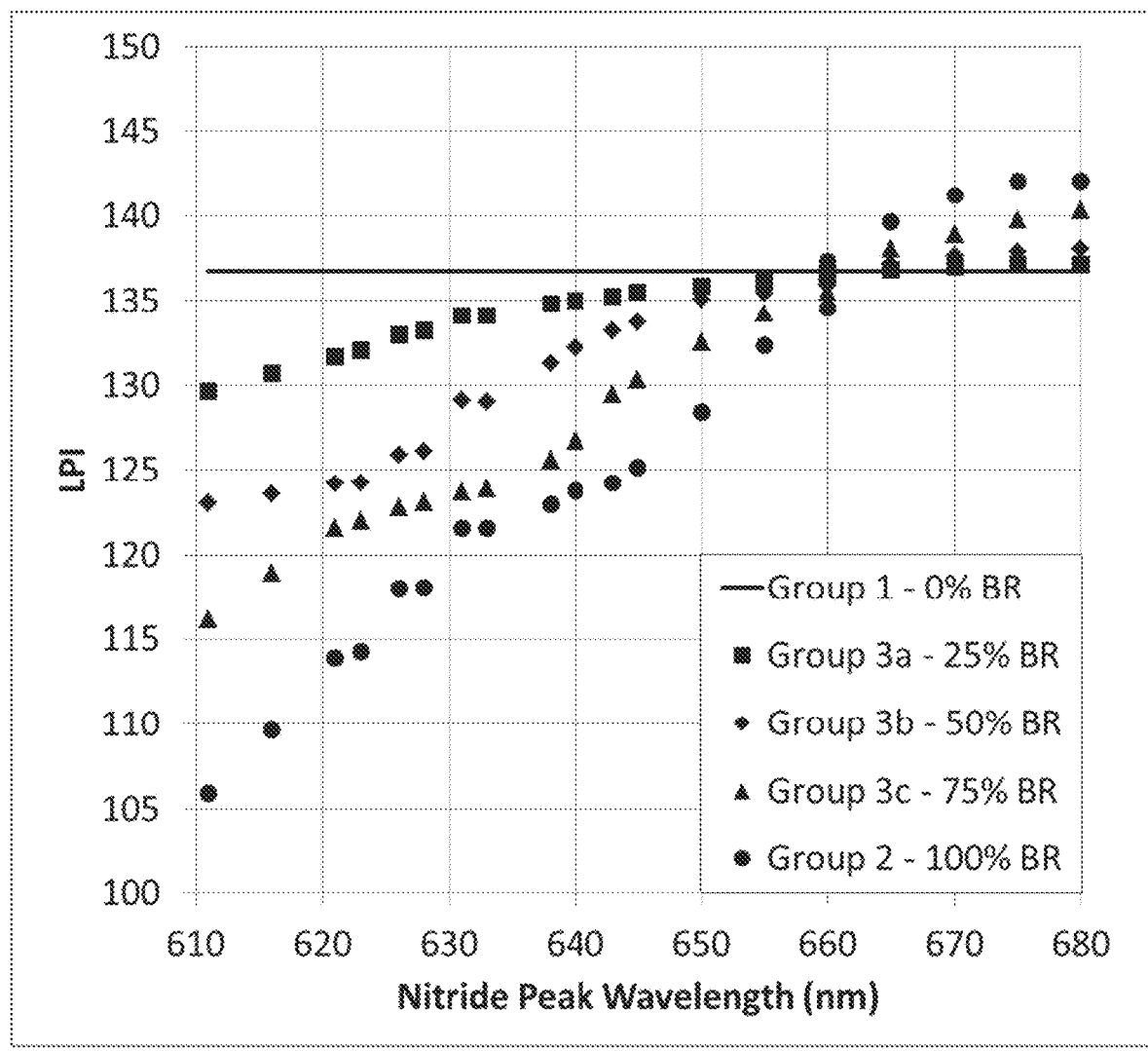
FIG. 41 illustrates the maximum LPI achievable at 2700 K as a function of the BR (broad red) nitride peak wavelength for different compositions of the red emitter according to some embodiments.

The effect of the ratio of broad red to total red emission, or "n", can be seen by comparing the different sets of contour plots (i.e. FIGS. 32, 33 vs. FIGS. 35, 36 vs. FIGS. 38, 39). For shorter $Peak_{Nit}$ values ($Peak_{Nit}$<660 nm) corresponding to contour plots a-e in the figures mentioned above, as n increases from n=0.25 to n=0.50 to n=0.75, the LPI values attainable at a given Duv and $Peak_{Nit}$ decrease. For example, in FIG. 32a (n=0.25), the highest LPI achievable (at Duv=−0.010 and $Dom_{YAG}$=559) is about LPI=129, while in FIG. 35a (n=0.50) and FIG. 38a (n=0.75), the LPI at the same Duv and $Dom_{YAG}$ is about LPI=123 and about LPI=116, respectively. For longer $Peak_{Nit}$ values ($Peak_{Nit}$>660 nm) corresponding to contour plots g and h in the figures mentioned above, as n increases from n=0.25 to n=0.50 to n=0.75, the LPI values attainable at a given Duv and $Peak_{Nit}$ increase. For example, in FIG. 32h (n=0.25), the highest LPI achievable (at Duv=−0.010 and $Dom_{YAG}$=559) is about LPI=137, while in FIG. 35h (n=0.50) and FIG. 38h (n=0.75), the LPI at the same Duv and $Dom_{YAG}$ is about LPI=138 and about LPI=140, respectively. This relationship is summarized in FIG. 41, which plots the LPI value for all combinations of red emitters, including Group 1 and Group 2, at Duv=−0.010 and $Dom_{YAG}$=559 nm at 2700 K.

Similar to Equation (9) for the Group 1 DoE and Equation (10) for the Group 2 DoE, a general form for an elliptical approximation to the LPI curves of the Group 3 DoE, may be produced. However due to higher order terms in some of the LPI curves, those equations may not provide agreement to within 1 or 2 points in LPI between the exact LPI contour and the elliptical approximation for every LPI contour in FIGS. 32, 33, 35, 36, 38, and 39, for all values of LPI=120 or higher, and therefore those equations may not provide precise enough approximations to the exact LPI contours to serve as substitutes for the exact contours. Therefore, in the Group 3 DoE, color preference will be quantified by reference to the regions inside of a given LPI contour in FIGS. 32, 33, 35, 36, 38, and 39.

In a first exemplary embodiment of a light source, the LED light source 700 may include one or more groups of LEDs 706 and 708 (numbering adopted from FIGS. 7a and 7b for convenience) that may each consist of one or more blue LEDs coated with YG YAG:Ce phosphor and a NR phosphor. This first exemplary embodiment is termed "YAG+PFS". In one or more embodiments, where the portion of the blue light generated by the blue LED that is not absorbed by the phosphor materials, combined with the light emitted by the phosphor materials may provide light which appears to the human eye as being nearly white in color. The spectrum of a YAG+PFS light source having enhanced color preference may be composed of a blue LED peak emission in the range of about 400 nm to about 460 nm, a YG peak emission in the range of about 530 nm to about 557 nm created by the excitation of a YAG:Ce phosphor by the blue emission from the LED, and a red peak emission at about 631 nm created by the excitation of a NR phosphor by the blue emission from the LED, as depicted in FIG. 24. The spectrum may differ from that of a blackbody in that it may include a depression in the wavelength range between the blue LED emission and the YG phosphor emission, and may include a depression in the yellow wavelength range between the YG phosphor and the NR phosphor. The light source in this first exemplary embodiment may have a CCT between about 2700 K and about 3200 K. In one or more embodiments, the light source may have a higher CCT (e.g., as high as about 10,000 K or higher), or a lower CCT (e.g., as low as about 1800 K or lower). The reduced emission in the yellow portion of the color spectrum may result from the separation of the peaks of the YG phosphor and the NR phosphor that may be created by the relatively narrow width and relatively long peak wavelength of the NR PFS phosphor. The reduced emission may be further enhanced in the yellow portion of the color spectrum by a relatively short peak wavelength of the YG phosphor, compared with a typical YG YAG:Ce phosphor. The depression of the spectrum in the yellow portion, if sufficiently deep, and the enhanced emission in the red and green relative to a blackbody emitter, may provide a light source having an enhanced color preference, or color saturation, or color contrast capability that is typically preferred by a human observer relative to light emitted from the same light source employing a typical blue and YG and red phosphor combinations that do not produce a sufficiently deep depression in the yellow portion.

FIG. 24 illustrates a graph including a plot 2400 of the SPD of a YAG+PFS type of LED light source discussed immediately above, having CCT=2700 K; and for comparison, a plot 602 of the SPD of a blackbody having CCT=2700 K, and a plot 604 of the SPD of a Reveal® type incandescent light source having a CCT=2755 K. The curve 2400 is the particular SPD that provided the maximum LPI of 137 from among the 250 combinations of SPDs in Group 1 (YAG+PFS) of the DoE. The peak wavelength of the blue LEDs 2402 occurs at about 450 nm, the peak and dominant wavelengths of the YG phosphor 2404 occur at about 531 nm and 559 nm respectively, and the peak wavelength of the NR phosphor 2406 occurs at about 631 nm, corresponding to the location 2210 in FIG. 22a (for CCT=2700 K) or 2212 in FIG. 22b (for CCT=3000 K) at $Dom_{YAG}$ of about 559 nm, and Duv about −0.010. SPD plot 2400 represents a light source having CCT=2700 K, CRI=69, and LPI=137. The corresponding SPD at 3000 K would appear very similar, with similar CRI and LPI values.

In this first exemplary embodiment, an LPI of about 137 is obtained, so that a human observer may perceive more saturated colors, enhanced whiteness, and a much more preferred color appearance when utilizing the YAG+PFS spectrum 2400 than is possible by using light sources typically having LPI of 120 or less.

In a second exemplary embodiment of a light source, providing slightly reduced color preference (LPI) for a YAG+PFS light source than the first embodiment, the peak and dominant wavelengths of the YG YAG:Ce phosphor 2404 in FIG. 24 are shifted slightly to a longer wavelength than the optimal peak and dominant wavelengths of 531 nm and 559 nm of the first embodiment. In this second exemplary embodiment, $Dom_{YAG}$ may be as long as about 563 nm, while Duv of the color point remains near −0.010 (between about −0.008 and about −0.012), with CCT of about 2700 K to about 3000 K, and the combination of $Dom_{YAG}$ and Duv satisfies Equation 9d, $$Dom_{YAG} < 3.8\sqrt{1 - \left(\frac{Duv + .0095}{.0020}\right)^2} + 569.8 - 0.004 * CCT,$$

describing the LPI=135 contour in FIGS. 25*a,b*.

In this second exemplary embodiment, an LPI of about 135 or greater is obtained, so that a human observer may perceive more saturated colors, enhanced whiteness, and a much more preferred color appearance when utilizing the YAG+PFS spectrum 2400 than is possible by using light sources typically having LPI of 120 or less, and only very slightly less so than the first embodiment having LPI of about 137.

In a third exemplary embodiment of a light source, providing further reduced color preference (LPI) for a YAG+PFS light source than the first and second embodiments, but still exceeding that of the prior art, the peak and dominant wavelengths of the YG YAG:Ce phosphor 2404 in FIG. 24 are shifted to even longer wavelengths than the optimal peak and dominant wavelengths of 531 nm and 559 nm of the first embodiment. In this third exemplary embodiment $Dom_{YAG}$ may be as long as about 572 nm, while Duv of the color point lies between about −0.002 and about −0.016, with CCT of about 2700 K to about 3000 K, and the combination of $Dom_{YAG}$ and Duv satisfies Equation 9a, $$Dom_{YAG} < 13.3\sqrt{1 - \left(\frac{Duv + .0095}{.0070}\right)^2} + 569.8 - 0.004 * CCT,$$

describing the LPI=120 contour in FIGS. 25*a,b*.

In this third exemplary embodiment, an LPI of about 120 or greater is obtained, so that a human observer may perceive more saturated colors, enhanced whiteness, and a more preferred color appearance when utilizing the YAG+PFS spectrum 2400 than is possible by using light sources typically having LPI of 120 or less, although noticeably less so than the first embodiment having LPI of about 137.

In a fourth exemplary embodiment of a light source, providing the highest color preference (LPI) for a YAG+Nit light source, the LED light source 700 may include one or more groups of LEDs 706 and 708 that may each consist of one or more blue LEDs coated with YG YAG:Ce phosphor and a BR nitride phosphor (YAG+Nit), where the portion of the blue light generated by the blue LED that is not absorbed by the phosphor materials, combined with the light emitted by the phosphor materials provides light which appears to the human eye as being nearly white in color (again, figure element numbers are adopted from FIGS. 7*a* and 7*b* solely for convenience). The spectrum of a YAG+Nit light source having enhanced color preference may be composed of a blue LED peak emission in the range of about 400 nm to about 460 nm, a YG peak emission in the range of about 530 nm to about 557 nm created by the excitation of a YAG:Ce phosphor by the blue emission from the LED, and a red peak emission in the range of about 610 nm to about 680 nm created by the excitation of a BR nitride phosphor by the blue emission from the LED, as depicted in FIG. 29. The spectrum may differ from that of a blackbody in that it may include a depression in the wavelength range between the blue LED emission and the YG phosphor emission, and it may include a depression in the yellow wavelength range between the YG phosphor and the BR phosphor. The light source may have a CCT between about 2700 K and about 3200 K. In one or more embodiments the light source may have a higher CCT (e.g., as high as about 10,000 K or higher), or a lower CCT (e.g., as low as about 1800 K or lower). The reduced emission in the yellow portion of the color spectrum may result from the separation of the peaks of the YG phosphor and the BR phosphor that may be created primarily by the relatively long peak wavelength of the BR nitride phosphor. The reduced emission in the yellow portion of the color spectrum may be further enhanced by a relatively short peak wavelength of the YG phosphor, compared with a typical YG YAG:Ce phosphor. The depression of the spectrum in the yellow, if sufficiently deep, and the enhanced emission in the red and green relative to a blackbody emitter, may provide a light source having an enhanced color preference, or color saturation, or color contrast capability that may be preferred by a human observer relative to light emitted from the same light source employing a typical blue and YG and red phosphor combinations that do not produce a sufficiently deep depression in the yellow.

FIG. 29 illustrates a graph including a plot 2900 of the SPD of a YAG+Nit type of LED light source, having CCT=2700 K; and for comparison, FIG. 29 also illustrates a plot 602 of the SPD of a blackbody having CCT=2700 K, and a plot 604 of the SPD of a Reveal® type incandescent light source having a CCT=2755 K. The plot 2900 is the particular SPD that provided the maximum LPI of 142 from among the 5000 combinations of SPDs in Group 2 (YAG+Nit) of the DoE. The peak wavelength of the blue LEDs 2902 occurs at about 450 nm, the peak and dominant wavelengths of the YG phosphor 2904 occur at about 531 nm and 559 nm respectively, and the peak wavelength of the BR phosphor 2906 occurs at about 680 nm, corresponding to the location 2710 in FIG. 27*h* (for CCT=2700 K) or 2810 in FIG. 28*h* (for CCT=3000 K) at $Dom_{YAG}$ of about 559 nm, and Duv about −0.010. SPD plot 2900 represents a light source having CCT=2700 K, CRI=57, and LPI=142. The corresponding SPD at 3000 K would appear very similar, with similar CRI and LPI values. The LPI score of 142 is very high (in one or more embodiments, the maximum possible LPI may be about 150), meaning that a human observer will perceive more saturated colors, enhanced whiteness, and a much more preferred color appearance when utilizing the YAG+PFS spectrum 2900 than is possible by using light sources typically having LPI of 120 or less.

In this fourth exemplary embodiment, an LPI of about 142 is obtained, so that a human observer may perceive more saturated colors, enhanced whiteness, and a much more preferred color appearance when utilizing the YAG+Nit spectrum 2900 than is possible by using light sources typically having LPI of 120 or less.

In a fifth exemplary embodiment of a light source, providing slightly reduced color preference (LPI) for a YAG+Nit light source than the fourth exemplary embodiment, the peak and dominant wavelengths of the YG YAG:Ce phosphor 2904 in FIG. 29 are shifted slightly to longer wavelengths than the optimal peak and dominant wavelengths of 531 nm and 559 nm of the fourth embodiment, and the peak wavelength of the nitride red phosphor 2906 in FIG. 29 is shifted to a shorter wavelength than the optimal peak wavelength of 680 nm of the fourth embodiment. In the fifth exemplary embodiment, $Dom_{YAG}$ may be as long as about 568 nm, and $Peak_{Nit}$ may be as short as about 660 nm, while Duv of the color point remains near −0.010 (between about −0.005 and about −0.014), with CCT of about 2700 K to about 3000 K, and the combination of $Dom_{YAG}$ and Duv satisfies Equation 10, $$Dom_{YAG} < \left(a_1(Peak_{Nit} - \lambda_o) + a_2\sqrt{Peak_{Nit} - \lambda_o} + a_3\right) *$$

$$\sqrt{1 - \left(\frac{Duv + .0099 - .00001*(Peak_{Nit} - \lambda_o)}{b_1(Peak_{Nit} - \lambda_o) + b_2\sqrt{Peak_{Nit} - \lambda_o} + b_3}\right)^2} +$$

$$569.8 - 0.004*CCT,$$

using the coefficients in the LPI=135 column in Table 3. Evaluating this equation with the coefficients in the LPI=135 column in Table 3, describing the LPI=135 contours in FIGS. 30c-e and 31c-e:

$$Dom_{YAG} < \left(-0.328(Peak_{Nit} - 659) + 3.56\sqrt{Peak_{Nit} - 659}\right) *$$

$$\sqrt{1 - \left(\frac{Duv + .0099 - .00001*(Peak_{Nit} - 659)}{-0.0001(Peak_{Nit} - 659) + 0.0016\sqrt{Peak_{Nit} - 659} - 0.0006}\right)^2} +$$

$$569.8 - 0.004*CCT$$

In this embodiment, an LPI of about 135 or greater is obtained, so that a human observer may perceive more saturated colors, enhanced whiteness, and a much more preferred color appearance when utilizing the YAG+Nit spectrum 2900 than is possible by using light sources typically having LPI of 120 or less, and only very slightly less so than the fourth embodiment having LPI of about 142.

In a sixth exemplary embodiment of a light source, providing further reduced color preference (LPI) for a YAG+Nit light source than the fourth or fifth embodiments, but still exceeding that of the prior art, the peak and dominant wavelengths of the YG YAG:Ce phosphor 2904 in FIG. 29 are shifted slightly to longer wavelengths than the optimal peak and dominant wavelengths of 531 nm and 559 nm of the fourth embodiment, and the peak wavelength of the nitride red phosphor 2906 in FIG. 29 is shifted to a shorter wavelength than the optimal peak wavelength of 680 nm of the fourth embodiment. In the sixth embodiment, $Dom_{YAG}$ may be as long as about 573 nm, and $Peak_{Nit}$ may be as short as about 630 nm or 640 nm, while Duv of the color point is ideally near −0.010, but may be anywhere in the range of about 0.000 to about −0.019, with CCT of about 2700 K to about 3000 K, and the combination of $Dom_{YAG}$ and Duv satisfy Equation 10, $$Dom_{YAG} < \left(a_1(Peak_{Nit} - \lambda_o) + a_2\sqrt{Peak_{Nit} - \lambda_o} + a_3\right) *$$

$$\sqrt{1 - \left(\frac{Duv + .0099 - .00001*(Peak_{Nit} - \lambda_o)}{b_1(Peak_{Nit} - \lambda_o) + b_2\sqrt{Peak_{Nit} - \lambda_o} + b_3}\right)^2} +$$

$$569.8 - 0.004*CCT,$$

using the coefficients in the LPI=120 column in Table 3. Evaluating this equation with the coefficients in the LPI=120 column in Table 3, describing the LPI=120 contours in FIGS. 30a-e and 31a-e:

$$Dom_{YAG} < \left(-0.155(Peak_{Nit} - 630) + 2.91\sqrt{Peak_{Nit} - 630} + 1.6\right) *$$

$$\sqrt{1 - \left(\frac{Duv + .0099 - .00001*(Peak_{Nit} - 630)}{0.00001(Peak_{Nit} - 630) + 0.0014\sqrt{Peak_{Nit} - 630} - 0.0010}\right)^2} +$$

$$569.8 - 0.004*CCT$$

In this sixth exemplary embodiment, an LPI of about 120 or greater is obtained, meaning that a human observer will perceive more saturated colors, enhanced whiteness, and a more preferred color appearance when utilizing the YAG+Nit spectrum 2900 than is possible by using light sources typically having LPI of 120 or less.

In a seventh exemplary embodiment of a light source, providing the highest color preference (LPI) for a YAG+PFS+Nit light source, the LED light source may include one or more groups of LEDs and that may each consist of one or more blue LEDs coated with YG YAG:Ce phosphor and a combination of NR PFS phosphor and BR nitride phosphor (YAG+PFS+Nit), where the portion of the blue light generated by the blue LED that is not absorbed by the phosphor materials, combined with the light emitted by the phosphor materials, may provide light which appears to the human eye as being nearly white in color. The spectrum of a YAG+PFS+Nit light source having enhanced color preference may be composed of a blue LED peak emission in the range of about 400 nm to about 460 nm, a YG peak emission in the range of about 530 nm to about 557 nm created by the excitation of a YAG:Ce phosphor by the blue emission from the LED, a red peak emission at about 631 nm created by the excitation of a NR PFS phosphor by the blue emission from the blue LED, and additional red emission having a peak in the range of about 610 nm to about 680 nm created by the excitation of a BR nitride phosphor by the blue emission from the blue LED, as depicted in FIGS. 34, 37, and 40. The spectrum shown in FIGS. 34, 37 and 40 may differ from that of a blackbody spectrum in that it may include a depression in the wavelength range between the blue LED emission and the YG phosphor emission, and it may include a depression in the yellow wavelength range between the YG phosphor and the red phosphors. The light source may have a CCT between about 2700 K and about 3200 K. In one or more embodiments, the light source may have a higher CCT (e.g., as high as about 10,000 K or higher), or a lower CCT (e.g., as low as about 1800 K or lower). The reduced emission in the yellow portion of the color spectrum (as indicated by the depression in the yellow wavelength range between the YG phosphor and the red phosphors) may result from the separation of the peaks of the YG phosphor and the red phosphors that may be created by the relatively narrow width and relatively long peak wavelength of the NR PFS phosphor and the relatively long peak wavelength of the BR nitride phosphor. The reduced emission in the yellow portion may be further enhanced by a relatively short peak wavelength of the YG phosphor, compared with a typical YG YAG:Ce phosphor. The depression of the spectrum in the yellow portion, if sufficiently deep, and the enhanced emission in the red and green portions relative to a blackbody emitter, may provide a light source having an enhanced color preference, or color saturation, or color contrast capability that may be typically preferred by a human observer relative to light emitted from the same light source employing typical blue and YG and red phosphor combinations that do not produce a sufficiently deep depression in the yellow.

The division of the DoE into 3 groups is a matter of convenience for communicating the results. In fact the ratio BR/R=n can have a continuous range from 0.0 to 1.0, where the limiting cases of n=0 and n=1 correspond to the Group 1 (YAG+PFS) and Group 2 (YAG+Nit) parts of the DoE, represented by the first through third, and fourth through sixth embodiments, respectively. The Group 3 DoE, although represented herein as having 3 discrete levels of n=0.25, 0.50, and 0.75, provides transfer functions for LPI for the entire continuous range of 0.0≤n<1.0 when the responses of Groups 1 and 2, are combined with Group 3. The seventh through ninth embodiments (some of which are described below) may represent any combination of the Nit and PFS red phosphors described herein, in the entire continuous range of 0.0≤n<1.0 other than n=0 or n=1, i.e., 0.0<n<1.0. The highest LPI in the first embodiment (n=0.0) is 137, and in the fourth embodiment (n=1.0) is 142, corresponding to $Dom_{YAG}$=559 nm and $Peak_{Nit}$=680 nm. The highest LPI using any combination of PFS and Nit (0.0<n<1.0), as described herein, is also found from the DoE to occur at $Dom_{YAG}$=559 nm and $Peak_{Nit}$=680 nm, and may occur near n=1 (i.e., mostly Nit, small amount PFS) with LPI about 142. In one or more embodiments, the highest LPI at any arbitrary value of 0<n<1 per the DoE occurs at $Dom_{YAG}$=559 nm and $Peak_{Nit}$=680 nm. The inventors note that this is because the extreme separation of the red nitride peak from the YG YAG peak exceeds the separation between the PFS red peak and the YG YAG peak, so that a 680 nm red nitride phosphor emission may potentially provide greater color contrast, and potentially higher color preference than a PFS phosphor emission, although with severe penalties in efficacy. LPI is found in the DoE to fall monotonically vs. decreasing n (more PFS) to a value of 137 at n=0, for $Dom_{YAG}$=559 nm and $Peak_{Nit}$=680 nm.

FIGS. 34, 37, and 40 include SPD curves 3400, 3700, and 4000 of the SPDs of a YAG+PFS+Nit type of LED light source with n=0.25, 0.50, and 0.75 respectively, having CCT=2700 K. For comparison, FIGS. 34, 37 and 40 also include a plot 602 of the SPD of a blackbody having CCT=2700 K, and a plot 604 of the SPD of a Reveal® type incandescent light source having a CCT=2755 K. The curves 3400, 3700, and 4000 are the particular SPDs that provided the maximum LPI of 137, 138, and 140, for n=0.25, 0.50, and 0.75, respectively, from among the 5000 combinations of SPDs in Groups 3a,b,c, respectively, of the DoE. The peak wavelength of the blue LEDs 3402, 3702, and 4002 occurs at about 450 nm, the peak and calculated dominant wavelengths of the YG phosphor 3404, 3704, and 4004 occur at about 531 nm and 559 nm respectively, the peak wavelength of the NR phosphor 3406, 3706, and 4006 occurs at about 631 nm, and the peak wavelength of the BR phosphor 3408, 3708, and 4008 occurs at about 680 nm, corresponding to the location 3210, 3510, and 3810 in FIGS. 32h, 35h, and 38h, respectively, (for CCT=2700 K) or 3310, 3610, and 3910 in FIGS. 33h, 36h, and 39h, respectively, (for CCT=3000 K) at $Dom_{YAG}$ of about 559 nm, and Duv about −0.010. SPDs 3400, 3700, and 4000 represent light sources having CCT=2700 K, CRI=68, 67, 65 and LPI=137, 138, and 140, for n=0.25, 0.50, and 0.75, respectively. In one or more embodiments, the corresponding SPD at 3000 K may appear very similar, with similar CRI and LPI values. LPI scores of 137, 138, and 140, for n=0.25, 0.50, and 0.75, respectively, are high (in one or more embodiments, the maximum possible LPI may be about 150), so that a human observer may perceive more saturated colors, enhanced whiteness, and a much more preferred color appearance when utilizing the YAG+PFS spectra 3400, 3700, and 4000 than is possible by using light sources typically having LPI of 120 or less.

In this seventh embodiment, an LPI of about 140 to 142 is obtained, so that a human observer may perceive more saturated colors, enhanced whiteness, and a much more preferred color appearance when utilizing the YAG+PFS+Nit spectra 3400, 3700, and 4000 than is possible by using light sources typically having LPI of 120.

In an eighth exemplary embodiment of a light source, providing slightly reduced color preference (LPI) for a YAG+Nit light source than the seventh embodiment, the peak and dominant wavelengths of the YG YAG:Ce phosphor 3404, 3704, and 4004 in FIGS. 34, 37 and 40 are shifted slightly to longer wavelengths than the optimal peak and dominant wavelengths of 531 nm and 559 nm of the seventh embodiment, and the peak wavelengths of the nitride red phosphor 3408, 3708, and 4008 in FIGS. 34, 37 and 40 are shifted to a shorter wavelength than the optimal peak wavelength of 680 nm of the seventh embodiment. In the eighth embodiment, $Dom_{YAG}$ may be as long as about 566 nm, and $Peak_{Nit}$ may be as short as about 660 nm while Duv of the color point remains near −0.010 (between about −0.008 and about −0.012), with CCT of about 2700 K to about 3000 K. In this embodiment, an LPI of about 135 or greater is obtained, so that a human observer may perceive more saturated colors, enhanced whiteness, and a much more preferred color appearance when utilizing the YAG+PFS+Nit spectra 3400, 3700, and 4000 than is possible by using light sources typically having LPI of 120 or less, and only very slightly less so than the seventh embodiment having LPI of about 142.

In a ninth exemplary embodiment of a light source, providing further reduced color preference (LPI) for a YAG+PFS+Nit light source than the seventh embodiment, but still exceeding that of light sources typically having LPI of 120 or greater, the peak and calculated dominant wavelengths of the YG YAG:Ce phosphor 3404, 3704, and 4004 in FIGS. 34, 37 and 40 are shifted slightly to longer wavelengths than the optimal peak and dominant wavelengths of 531 nm and 559 nm of the seventh embodiment, and the peak wavelength of the nitride red phosphor 3408, 3708, and 4008 in FIGS. 34, 37 and 40 is shifted to a shorter wavelength than the optimal peak wavelength of 680 nm of the seventh embodiment. In the ninth embodiment, $Dom_{YAG}$ may be as long as about 572 nm, and $Peak_{Nit}$ may be as short as about 620 nm, while Duv of the color point is ideally near −0.010, but may be anywhere in the range of about 0.000 to about −0.018, with CCT of about 2700 K to about 3000 K. In this embodiment, an LPI of about 120 or greater is obtained, so that a human observer may perceive more saturated colors, enhanced whiteness, and a more preferred color appearance when utilizing the YAG+PFS+Nit spectra 3400, 3700, and 4000 than is possible by using light sources typically having LPI of 120 or less.

Further, in some embodiments a yellow-absorbing filter, such as neodymium (Nd) glass, or a Nd compound, or a comparable yellow filter, may be incorporated in the light source, for example a neodymium (Nd) glass dome may be placed over the LED light engine, and the Nd glass dome may function to suppress yellow light to further enhance the perception of red and green vibrancy. While the above embodiments demonstrate the ability to achieve high LPI without the use of a yellow filter, the use of such may allow for selection of other available phosphor materials that may not achieve high values of LPI without the Nd absorption. This may allow, for example, the peak wavelength of the red phosphor to be moved to shorter wavelengths or the FWHM of the red phosphor to be increased. Or the inclusion of a yellow filter may provide further enhanced color preference (higher LPI) by further enhancing the depression in the yellow.

It should be understood that the above descriptions and/or the accompanying drawings are not meant to imply a fixed order or sequence of steps for any process referred to herein; rather any process may be performed in any order that is practicable, including but not limited to simultaneous performance of steps indicated as sequential.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A composite light source comprising:
    at least one blue light source having peak wavelength in the range of about 400 nanometer (nm) to about 460 nm;
    at least one yellow-green garnet phosphor; and
    at least one red quantum dot down-converter;
    wherein the composite light source has a Lighting Preference Index (LPI) of at least 120 and the LPI is defined by the following equation:

$$LPI = 100 + 19 \times [1 - 100 \sqrt{(Duv + 0.010)^2}] + 0.62 \times [NSV - HDV/2.5]$$

where Duv is a distance of a color point from Planckian locus in u-v space, NSV is Net Saturation Value of an illumination source, and HDV is Hue Distortion Value.

2. The composite light source of claim 1, wherein the LPI is at least 140.

3. The composite light source of claim 1, wherein the at least one red quantum dot down-converter light source has a peak wavelength in the range of about 610 nm and about 660 nm.

4. The composite light source of claim 1, wherein the at least one yellow-green garnet phosphor has a full-width at half-maximum (FWHM) in the range from about 110 nm to about 115 nm.

5. The composite light source of claim 1, wherein the at least one yellow-green garnet phosphor is a YAG:Ce phosphor, the YAG:Ce phosphor has a dominant wavelength in the range from about 559 nm to about 572 nm, and Duv is in the range from about −0.002 to −0.016.

6. The composite light source of claim 1, wherein the at least one yellow-green garnet phosphor is a YAG:Ce phosphor, the YAG:Ce phosphor has a dominant wavelength in the range from about 559 nm to about 563 nm, and Duv is in the range from about −0.008 to about −0.012.

7. The composite light source of claim 1, wherein the composite light source emits a color spectrum including a blue wavelength range portion emitted by the blue light source, a yellow wavelength range portion emitted by the yellow-green garnet phosphor, and a red wavelength range portion emitted by the at least one red quantum dot down-converter; and wherein the color spectrum includes a depression in the yellow wavelength range portion compared to a blackbody spectrum, wherein the depression in the yellow wavelength range portion is about 570 nm to 600 nm.

8. The composite light source of claim 1, further comprising a neodymium filter placed over the at least one blue light source, the at least one yellow-green garnet phosphor, and the at least one red quantum dot down-converter, such that most or all of the light emitted by the composite light source passes through the filter.

9. A composite light source comprising:
    at least one blue light source having peak wavelength in the range of about 400 nanometer (nm) to about 460 nm;
    at least one YAG:Ce phosphor; and
    at least one red quantum dot down-converter;
    wherein a color appearance of the composite light source is represented as $$Dom_{YAG} < 13.3 \sqrt{1 - \left(\frac{Duv + .0095}{.0070}\right)^2} + 569.8 - 0.004 * CCT,$$

where Duv is a measure of the whiteness of the composite light source and $Dom_{YAG}$ is the dominant wavelength of the at least one YAG:Ce phosphor.

10. A composite light source comprising:
    at least one blue light source having peak wavelength in the range of about 400 nanometer (nm) to about 460 nm;
    at least one yellow-green garnet phosphor;

at least one red quantum dot down-converter; and
at least one broad red down-converter having a full-width at-half maximum (FWHM) >about 60 nm;
wherein the composite light source has a Lighting Preference Index (LPI) of at least 120 and the LPI is defined by the following equation:

$$LPI = 100 + 19 \times [1 - \frac{100}{\sqrt{(Duv+0.010)^2}}] + 0.62 \times [NSV - HDV/2.5]$$

where Duv is a distance of a color point from Planckian locus in u-v space, NSV is Net Saturation Value of an illumination source, and HDV is Hue Distortion Value.

11. The composite light source of claim 10, wherein the blue light source having peak wavelength in the range of about 400 nanometer (nm) to about 460 nm is a semiconductor light source.

12. The composite light source of claim 9, wherein the blue light source having peak wavelength in the range of about 400 nanometer (nm) to about 460 nm is a semiconductor light source.

13. The composite light source of claim 1, wherein the blue light source having peak wavelength in the range of about 400 nanometer (nm) to about 460 nm is a semiconductor light source.

* * * * *